United States Patent
Gupta et al.

(10) Patent No.: US 12,255,637 B2
(45) Date of Patent: Mar. 18, 2025

(54) 5.1-7.1GHz Wi-Fi6E COEXISTENCE ACOUSTIC WAVE RESONATOR RF DIPLEXER CIRCUIT

(71) Applicant: Akoustis, Inc., Huntersville, NC (US)

(72) Inventors: Saurabh Gupta, Mooresville, NC (US); Guillermo Moreno Granado, Huntersville, NC (US); Rohan W. Houlden, Oak Ridge, NC (US); David M. Aichele, Huntersville, NC (US); Jeffrey B. Shealy, Davidson, NC (US); Bradford R. Bersin, Cornelius, NC (US)

(73) Assignee: Akoustis, Inc., Huntersville, NC (US)

( * ) Notice: Subject to any disclaimer, the term of this patent is extended or adjusted under 35 U.S.C. 154(b) by 583 days.

(21) Appl. No.: 17/566,038

(22) Filed: Dec. 30, 2021

(65) Prior Publication Data

US 2022/0231666 A1   Jul. 21, 2022

Related U.S. Application Data

(63) Continuation-in-part of application No. 17/151,552, filed on Jan. 18, 2021, now Pat. No. 11,901,880.

(51) Int. Cl.
*H03H 9/70* (2006.01)
*H03H 9/00* (2006.01)
(Continued)

(52) U.S. Cl.
CPC .......... *H03H 9/706* (2013.01); *H03H 9/0095* (2013.01); *H03H 9/13* (2013.01); *H03H 9/205* (2013.01); *H03H 9/56* (2013.01)

(58) Field of Classification Search
CPC ........ H03H 9/706; H03H 9/0095; H03H 9/13; H03H 9/205; H03H 9/56; H03H 2003/021;
(Continued)

(56) References Cited

U.S. PATENT DOCUMENTS

| 5,231,327 A | 7/1993 | Ketcham |
| 5,894,647 A | 4/1999 | Lakin |

(Continued)

FOREIGN PATENT DOCUMENTS

| CN | 1929302 | 3/2007 |
| JP | H09321361 | 12/1997 |

(Continued)

OTHER PUBLICATIONS

International Search Report for PCT/US2015/034560, mailed Sep. 18, 2015.
(Continued)

*Primary Examiner* — Jorge L Salazar, Jr.
(74) *Attorney, Agent, or Firm* — Richard T. Ogawa; Ogawa P.C.

(57) ABSTRACT

An RF diplexer circuit device using modified lattice, lattice, and ladder circuit topologies. The diplexer can include a pair of filter circuits, each with a plurality of series resonator devices and shunt resonator devices. In the ladder topology, the series resonator devices are connected in series while shunt resonator devices are coupled in parallel to the nodes between the resonator devices. In the lattice topology, a top and a bottom serial configurations each includes a plurality of series resonator devices, and a pair of shunt resonators is cross-coupled between each pair of a top serial configuration resonator and a bottom serial configuration resonator. The modified lattice topology adds baluns or inductor devices between top and bottom nodes of the top and bottom serial configurations of the lattice configuration. A multiplexing device or inductor device can be configured to select between the signals coming through the first and second filter circuits.

30 Claims, 77 Drawing Sheets

(51) Int. Cl.
*H03H 9/13* (2006.01)
*H03H 9/205* (2006.01)
*H03H 9/56* (2006.01)

(58) Field of Classification Search
CPC ....... H03H 2003/023; H03H 2003/025; H03H 9/02031; H03H 9/0523; H03H 9/0533; H03H 9/105; H03H 9/173; H03H 9/175; H03H 9/176; H03H 9/562; H03H 9/564; H03H 9/566; H03H 9/703; H03H 3/02
USPC .......................................... 333/133, 186–188
See application file for complete search history.

(56) References Cited

U.S. PATENT DOCUMENTS

| | | |
|---|---|---|
| 6,051,907 A | 4/2000 | Ylilammi |
| 6,114,635 A | 9/2000 | Lakin et al. |
| 6,262,637 B1 | 7/2001 | Bradley et al. |
| 6,377,137 B1 | 4/2002 | Ruby |
| 6,384,697 B1 | 5/2002 | Ruby |
| 6,472,954 B1 | 10/2002 | Ruby et al. |
| 6,617,060 B2 | 9/2003 | Weeks, Jr. et al. |
| 6,812,619 B1 | 11/2004 | Kaitila et al. |
| 6,841,922 B2 | 1/2005 | Aigner et al. |
| 6,864,619 B2 | 3/2005 | Aigner et al. |
| 6,879,224 B2 | 4/2005 | Frank |
| 6,909,340 B2 | 6/2005 | Aigner et al. |
| 6,933,807 B2 | 8/2005 | Marksteiner et al. |
| 7,112,860 B2 | 9/2006 | Saxler |
| 7,250,360 B2 | 7/2007 | Shealy et al. |
| 7,268,436 B2 | 9/2007 | Aigner et al. |
| 7,365,619 B2 | 4/2008 | Aigner et al. |
| 7,514,759 B1 | 4/2009 | Mehta et al. |
| 7,777,777 B2 | 8/2010 | Bowman et al. |
| 7,875,910 B2 | 1/2011 | Sheppard et al. |
| 7,982,363 B2 | 7/2011 | Chitnis |
| 8,304,271 B2 | 11/2012 | Huang et al. |
| 11,901,880 B2 * | 2/2024 | Granado ............. H03H 9/0523 |
| 2005/0219012 A1 | 10/2005 | Milsom et al. |
| 2005/0255234 A1 | 11/2005 | Kanda et al. |
| 2007/0080611 A1 | 4/2007 | Yamada et al. |
| 2008/0024042 A1 | 1/2008 | Atsushi et al. |
| 2008/0284541 A1 | 11/2008 | Chitnis |
| 2009/0033177 A1 | 2/2009 | Itaya et al. |
| 2011/0114968 A1 | 5/2011 | Sheppard et al. |
| 2012/0287575 A1 | 11/2012 | Nelson |
| 2013/0176086 A1 | 7/2013 | Bradley et al. |
| 2014/0132117 A1 | 5/2014 | Larson, III |
| 2015/0097638 A1 | 4/2015 | Yu et al. |
| 2015/0357993 A1 | 12/2015 | Shealy |
| 2016/0028367 A1 | 1/2016 | Shealy |
| 2016/0036580 A1 | 2/2016 | Shealy |
| 2017/0264256 A1 | 9/2017 | Gibb et al. |
| 2018/0013405 A1 | 1/2018 | Takata |
| 2018/0054176 A1 | 2/2018 | Kim et al. |
| 2018/0275485 A1 * | 9/2018 | Hurwitz ................. H03H 9/605 |
| 2019/0149129 A1 * | 5/2019 | Ueda ........................ H03H 3/10 |
| | | 333/186 |
| 2021/0313962 A1 * | 10/2021 | Sugaya ................ H03H 9/0523 |

FOREIGN PATENT DOCUMENTS

| | | |
|---|---|---|
| JP | 2009100197 A | 5/2009 |
| JP | 2010068109 A | 3/2010 |
| WO | WO2005034349 A1 | 4/2005 |
| WO | WO2016122877 A1 | 8/2016 |
| WO | WO2017171856 A1 | 5/2017 |
| WO | WO2017222990 A1 | 12/2017 |

OTHER PUBLICATIONS

International Search Report and Written Opinion for PCT/US2019/040729, mailed Oct. 22, 2019.
International Search Report and Written Opinion for PCT/US2019/048412, mailed Nov. 19, 2019.
International Search Report and Written Opinion for PCT/US2018/050521 mailed Jan. 28, 2019.
International Search Report for PCT/US2019/018550, mailed May 30, 2019.

* cited by examiner

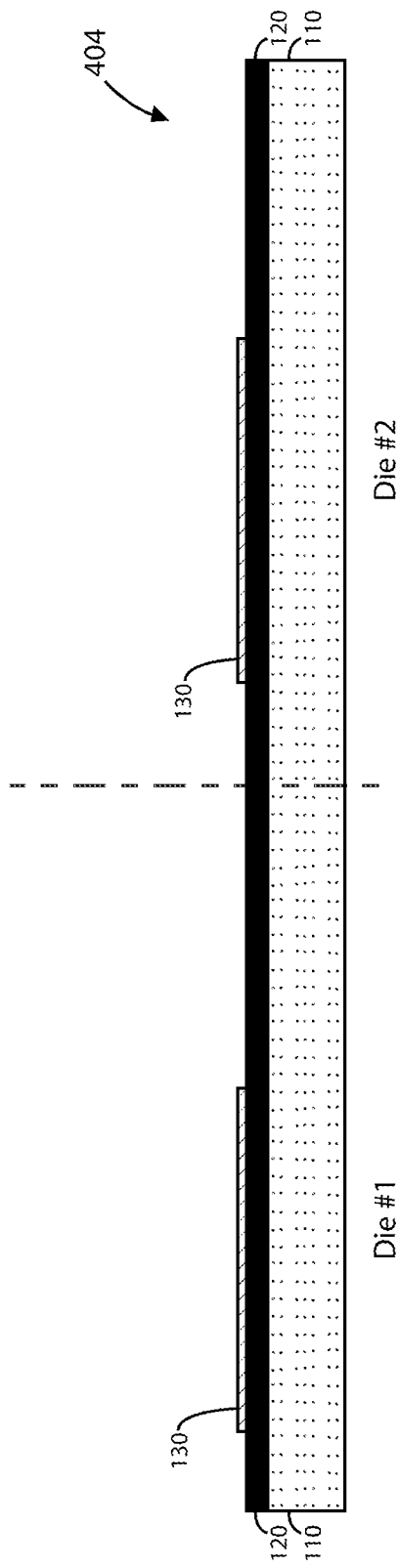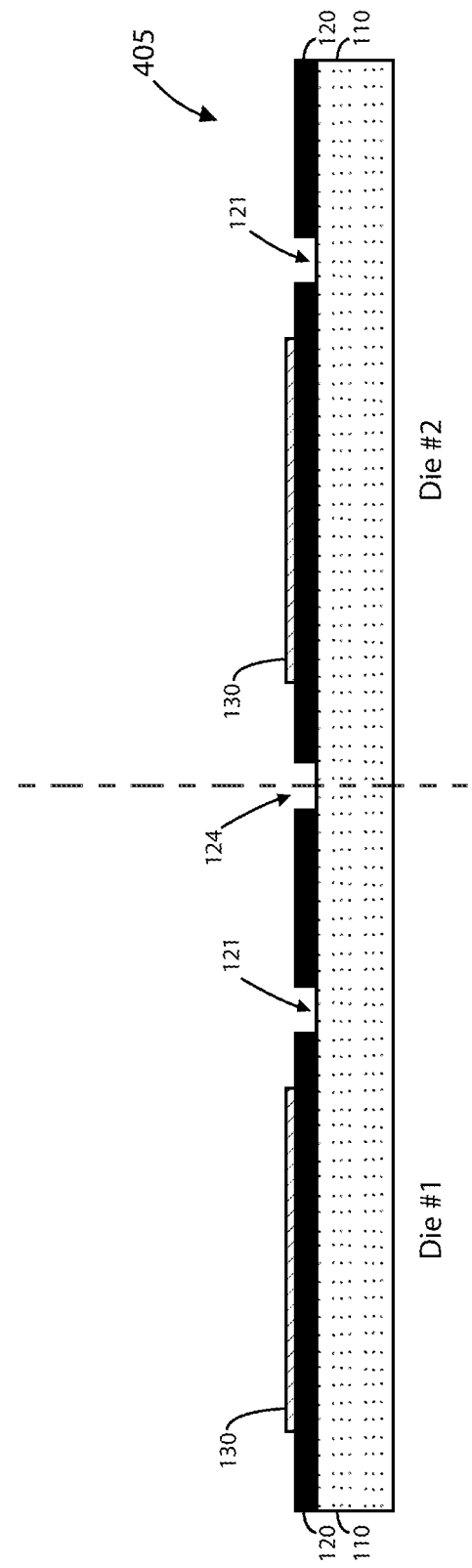

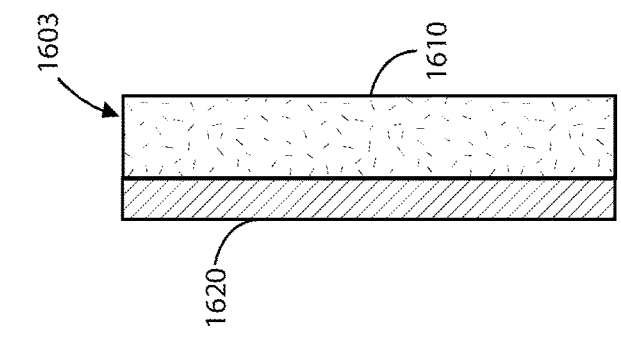
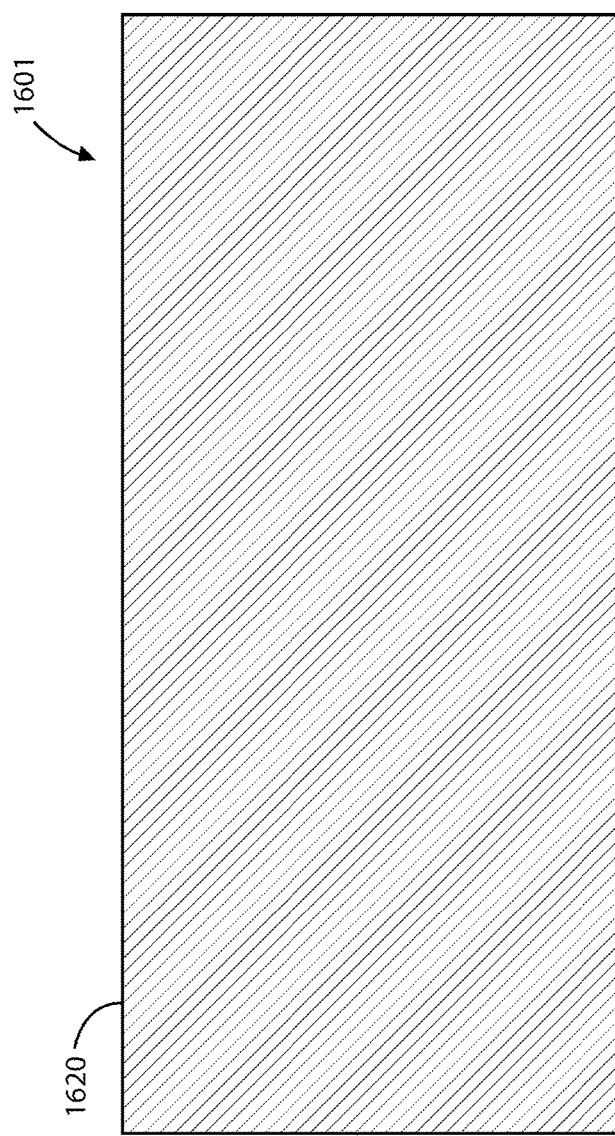
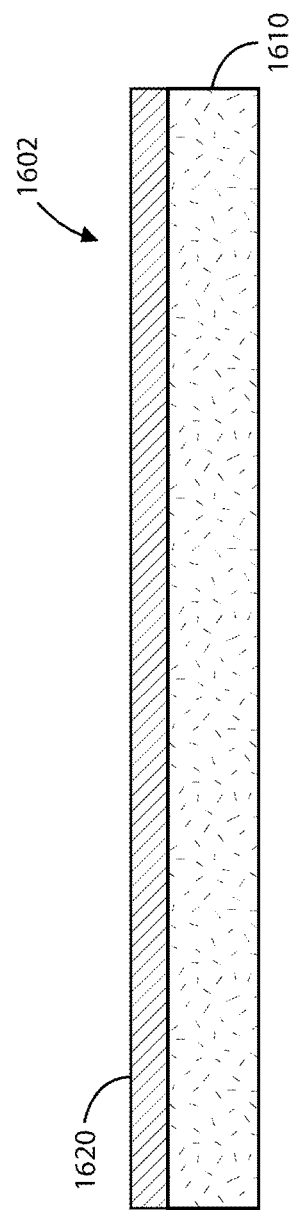

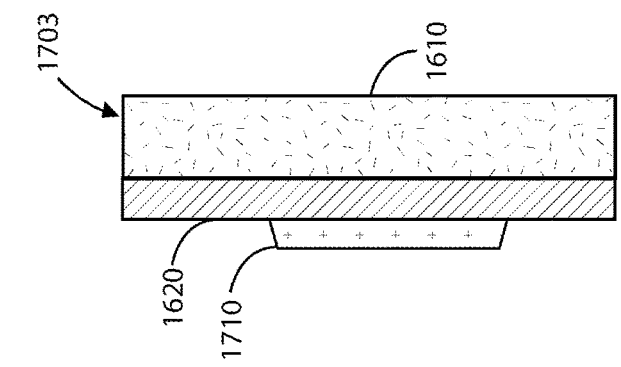
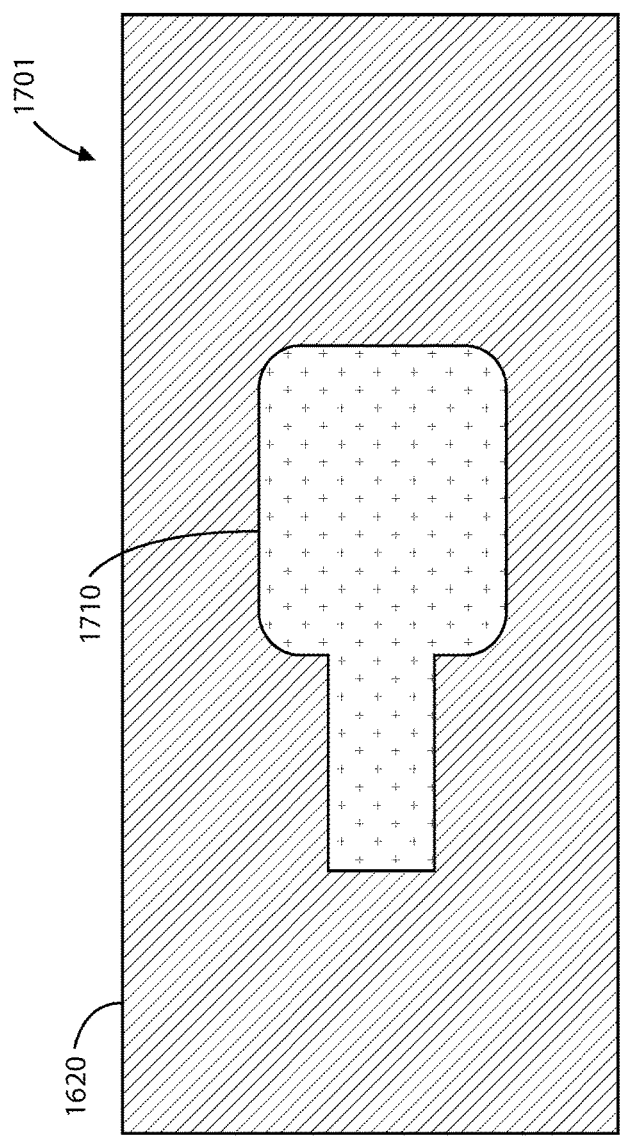
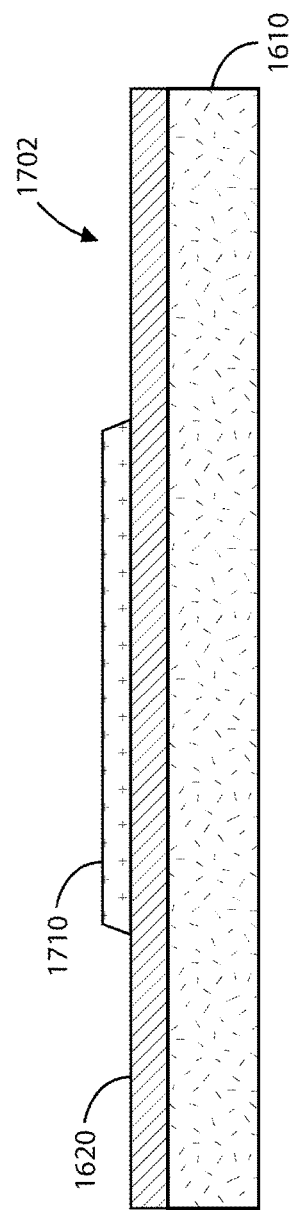
FIG. 17C
FIG. 17A
FIG. 17B

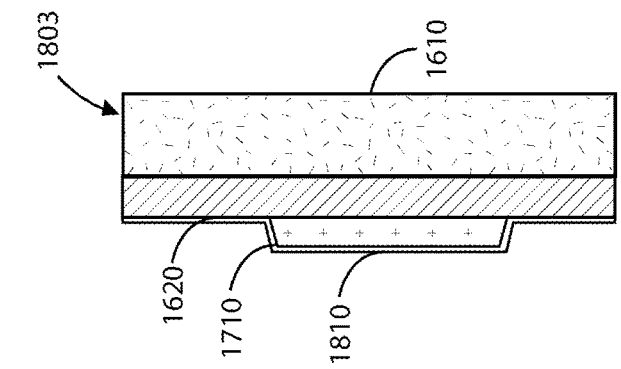
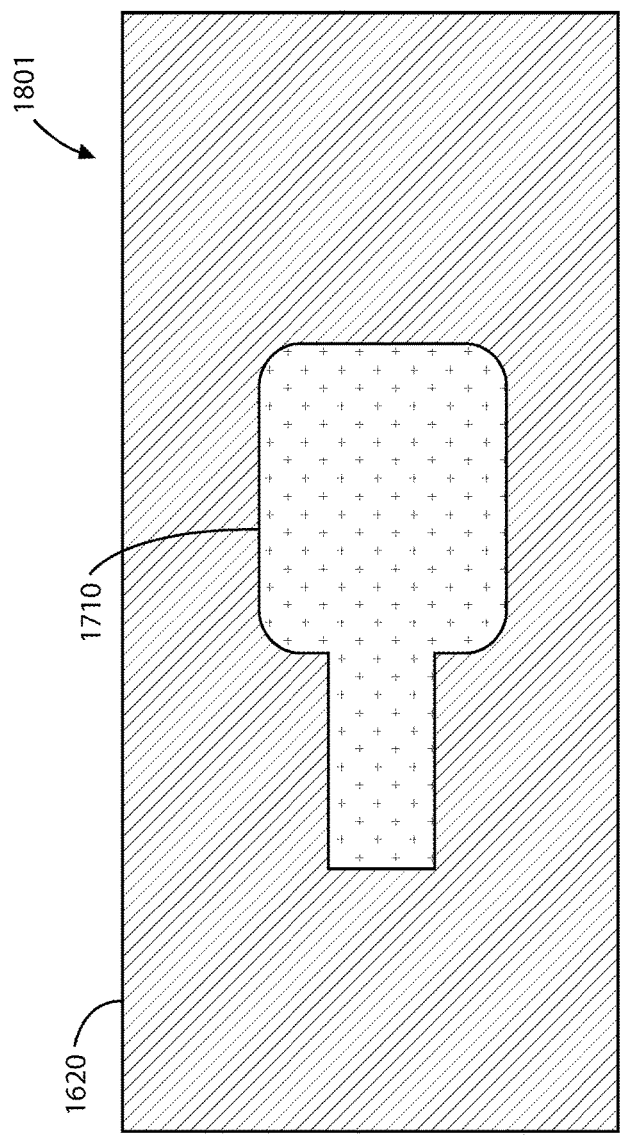
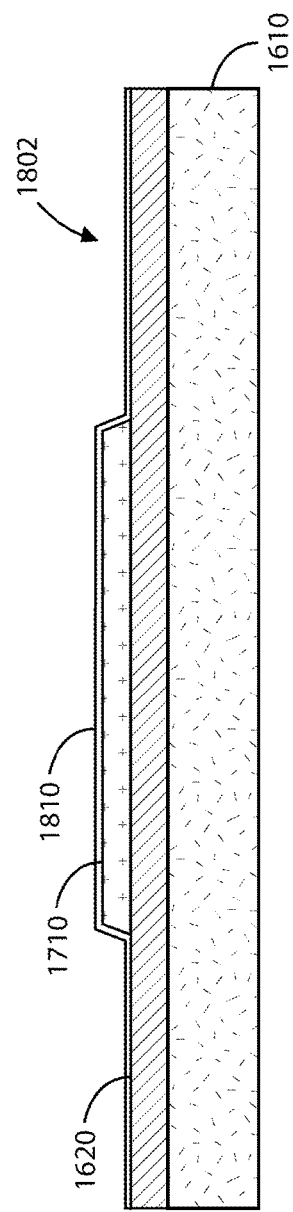
FIG. 18C
FIG. 18A
FIG. 18B

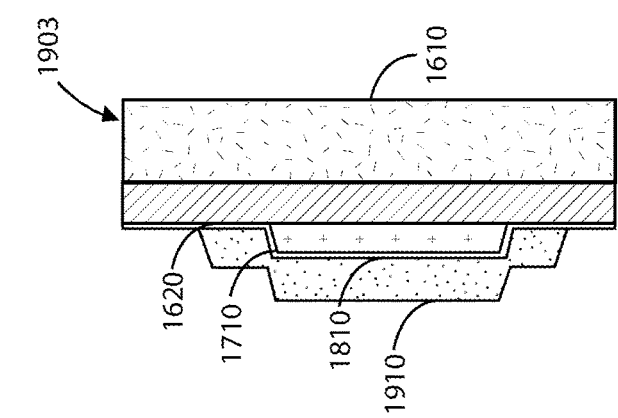
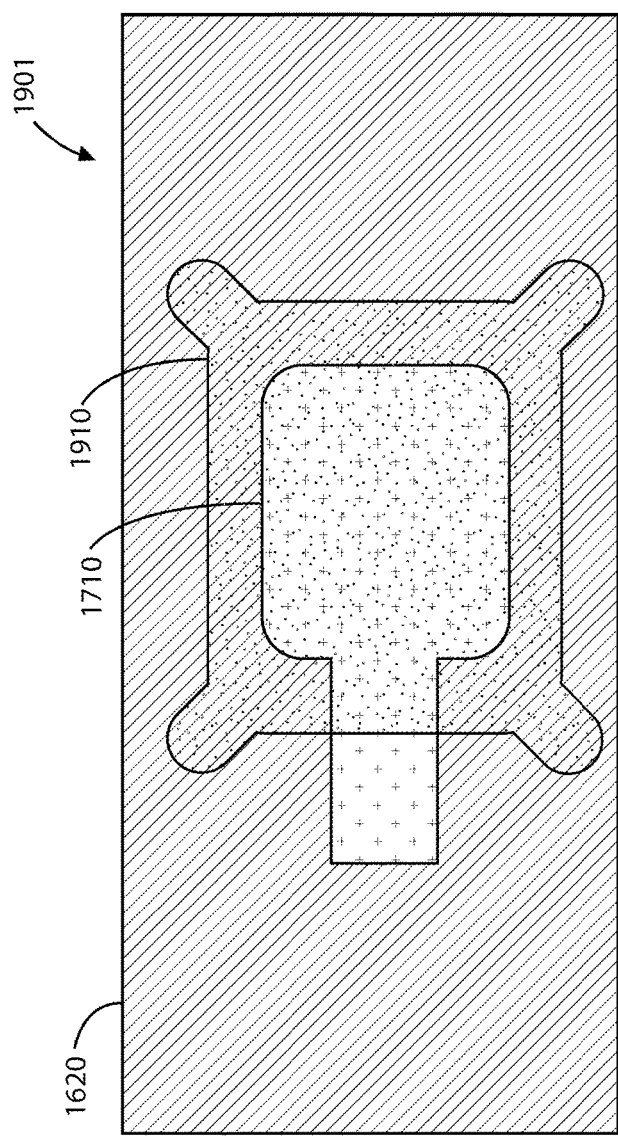
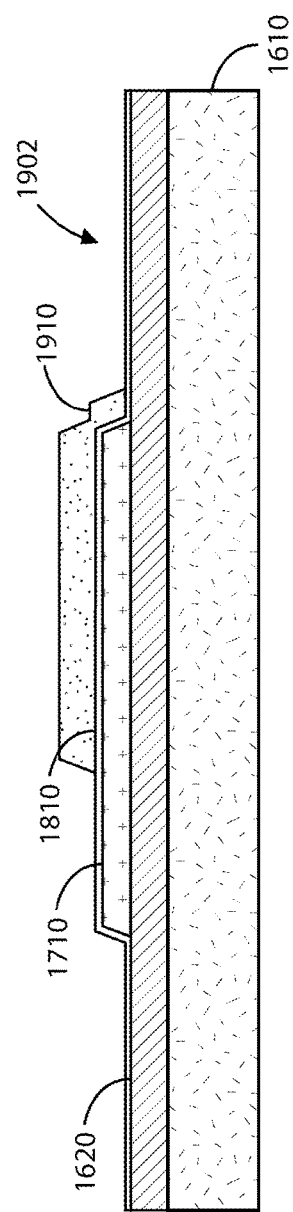
FIG. 19C
FIG. 19A
FIG. 19B

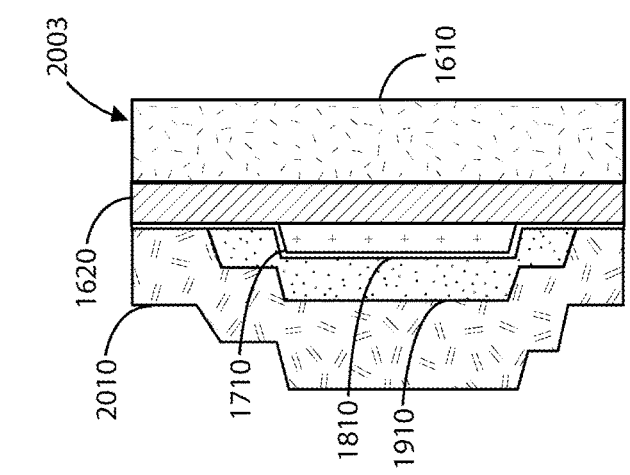
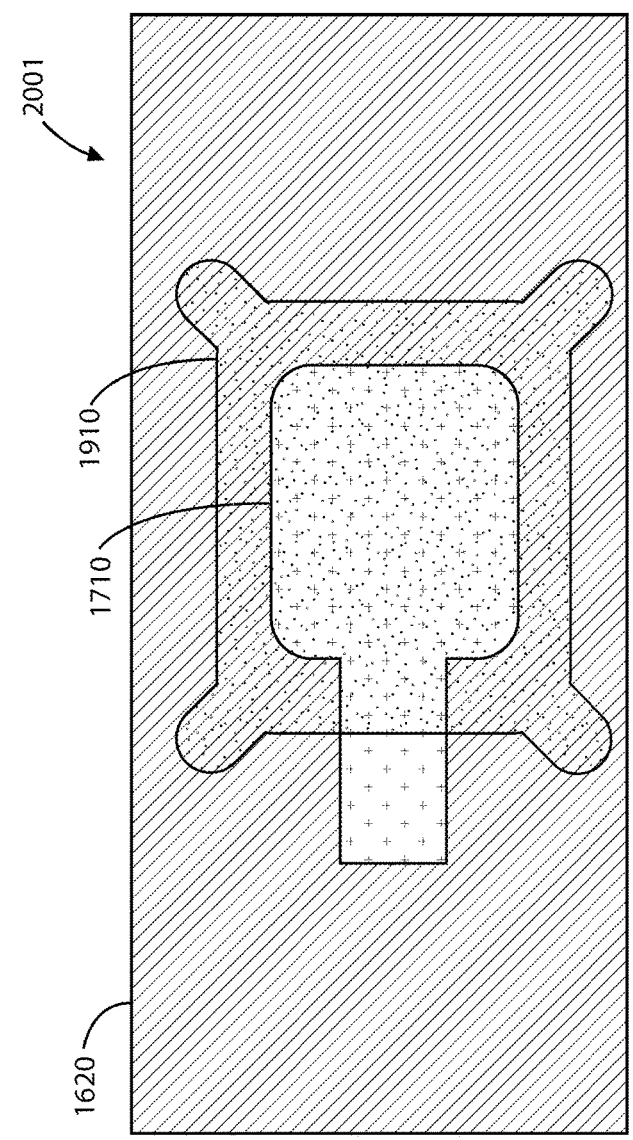
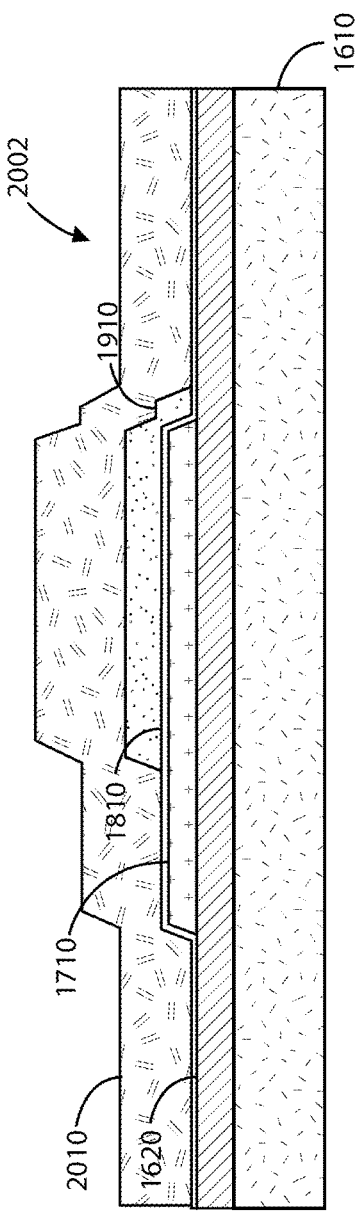
FIG. 20A
FIG. 20B
FIG. 20C

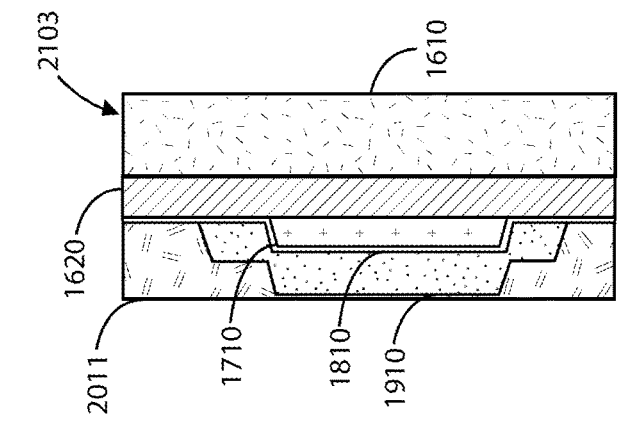
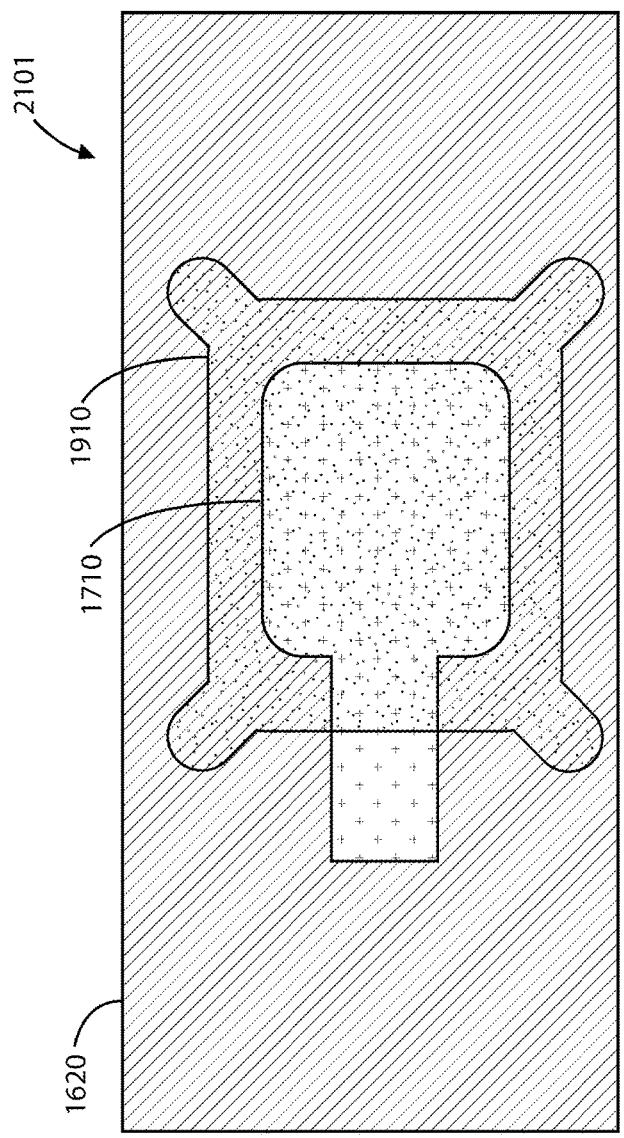
FIG. 21A
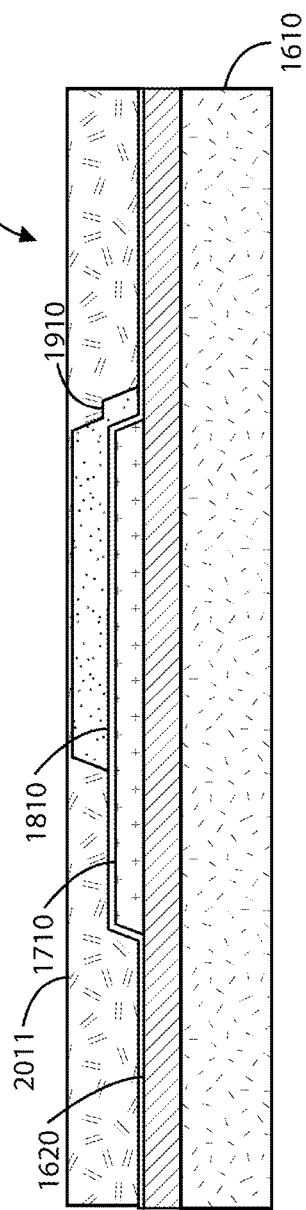
FIG. 21B
FIG. 21C

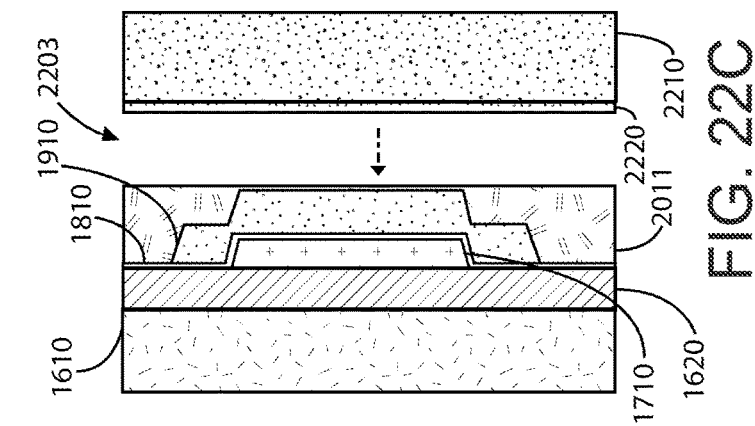
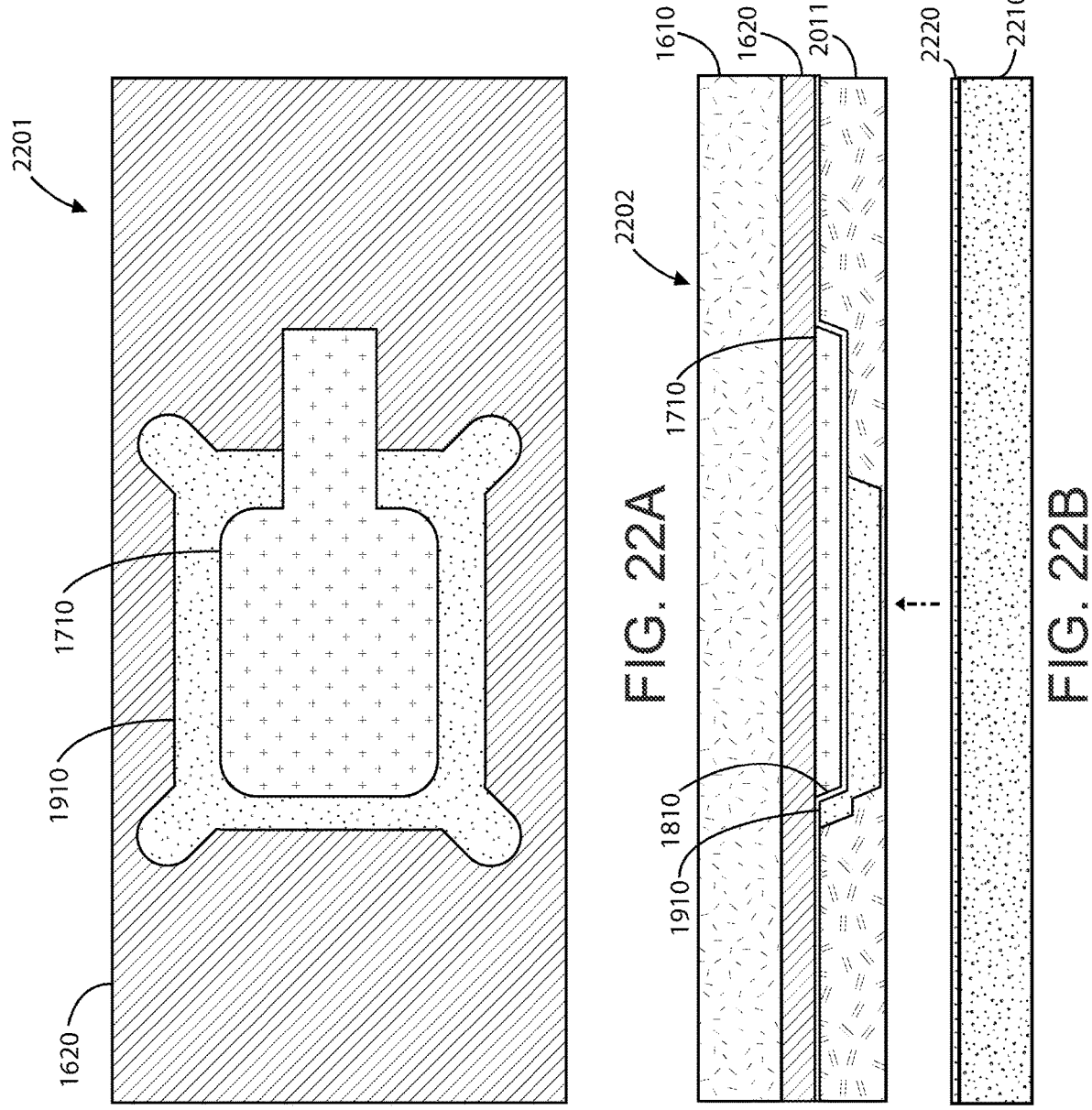
FIG. 22C
FIG. 22A
FIG. 22B

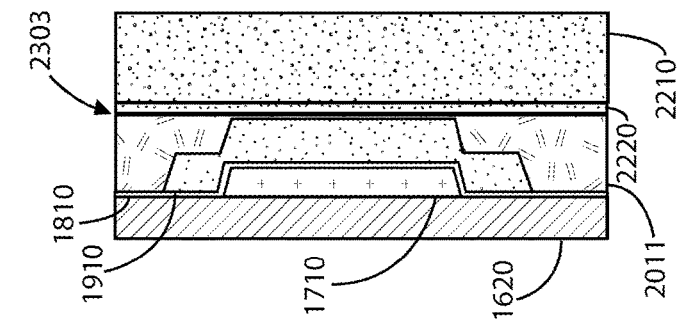
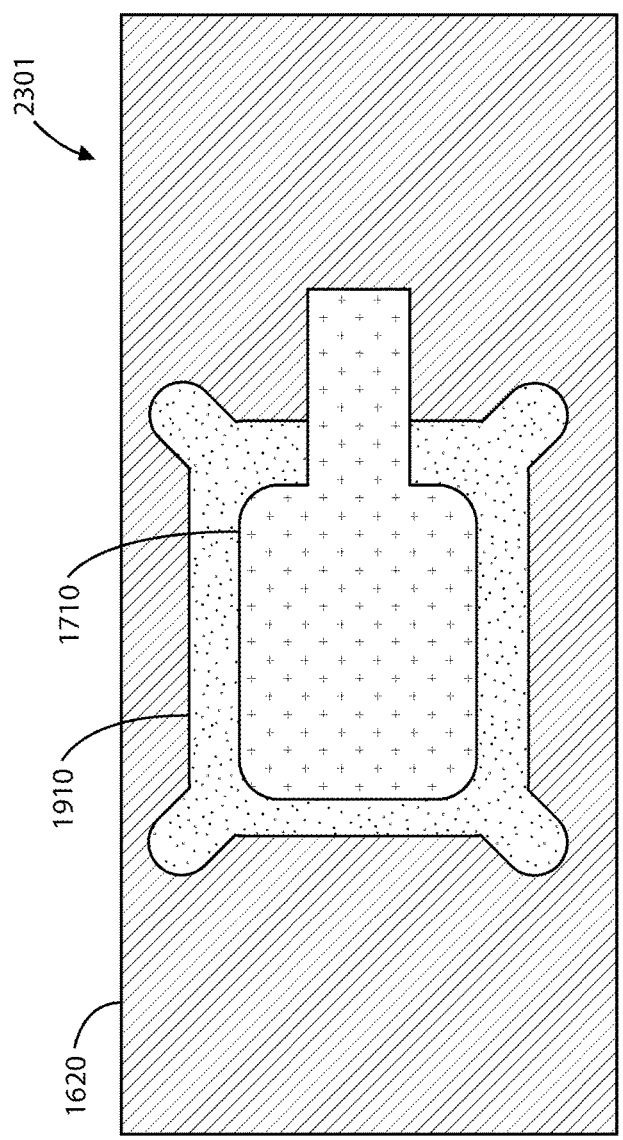
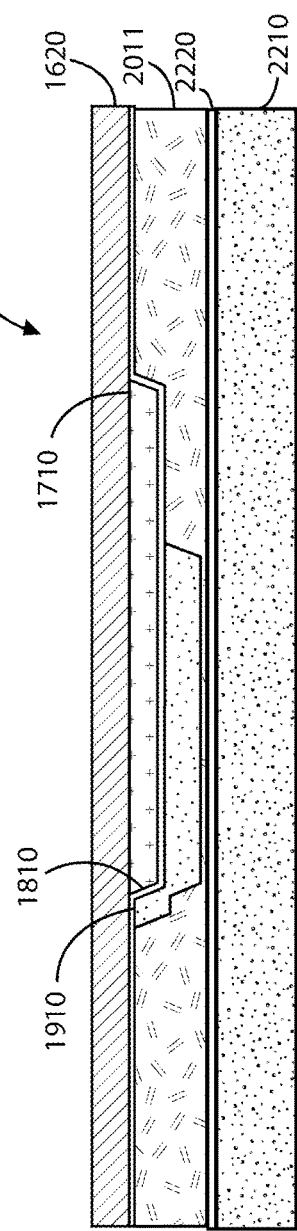
FIG. 23A
FIG. 23B
FIG. 23C

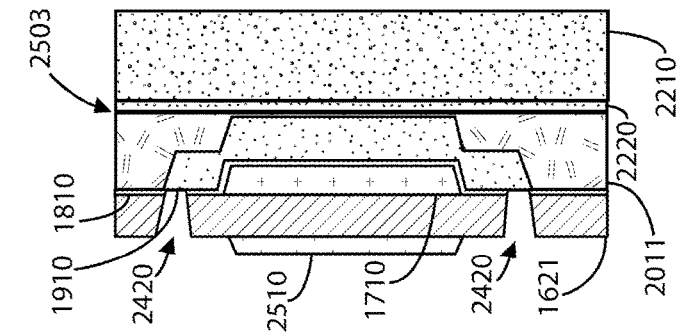
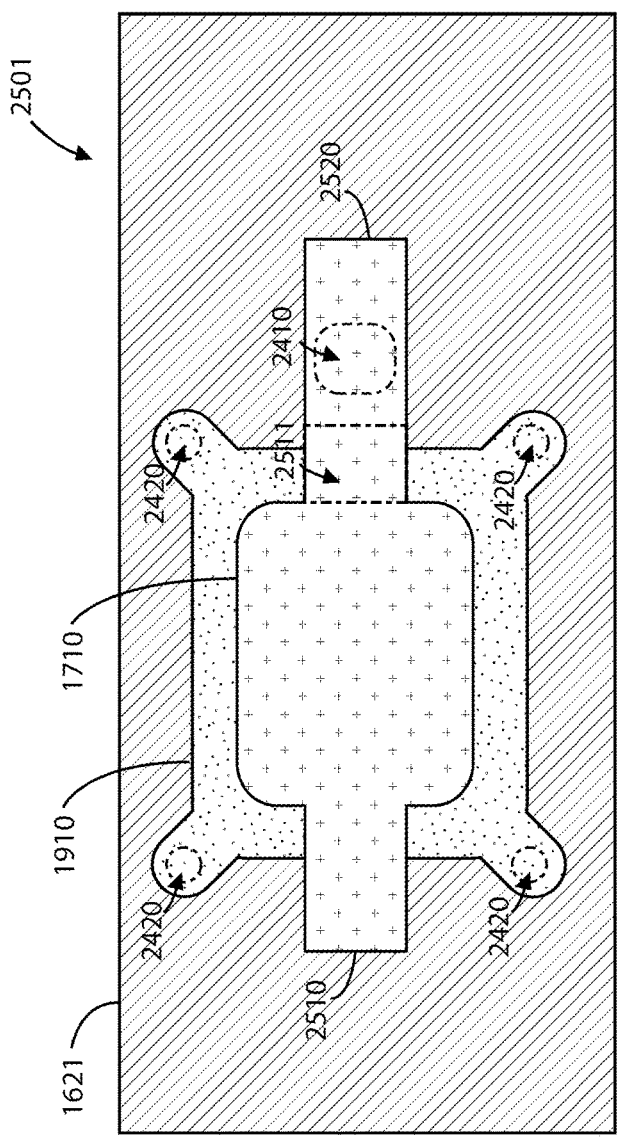
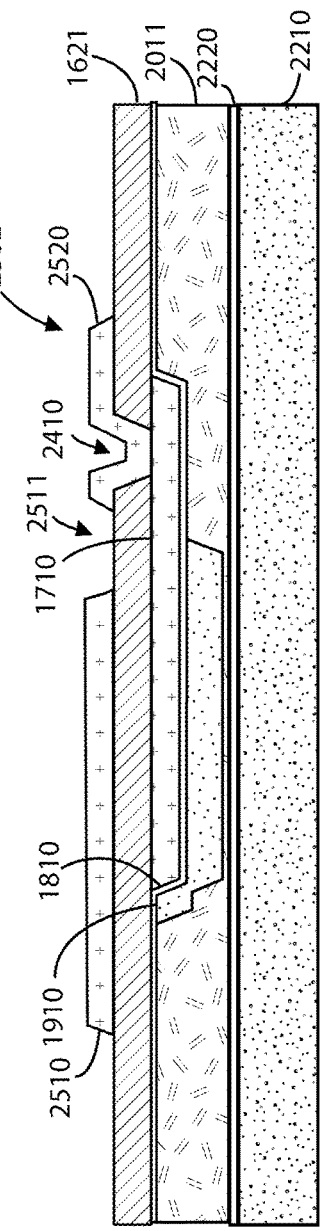
FIG. 25C
FIG. 25A
FIG. 25B

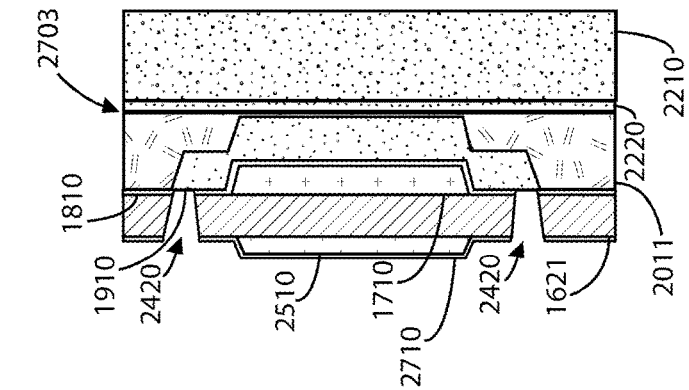
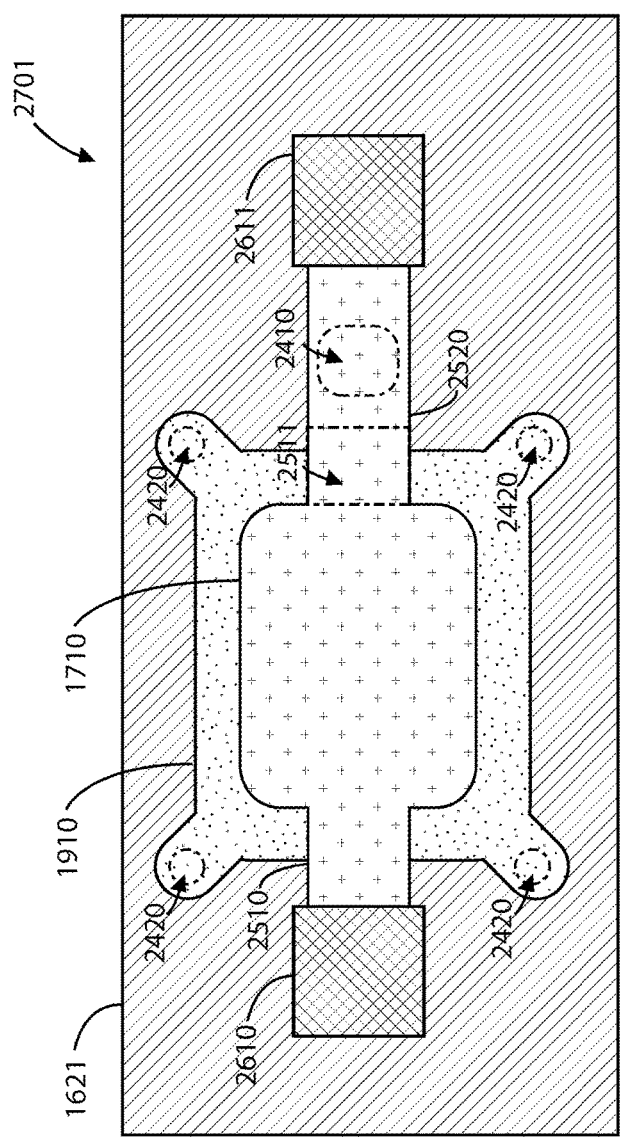
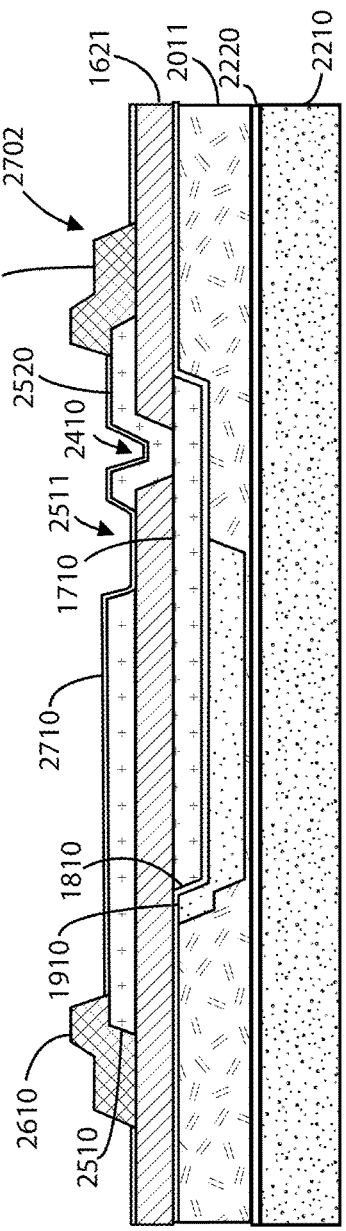
FIG. 27C
FIG. 27A
FIG. 27B

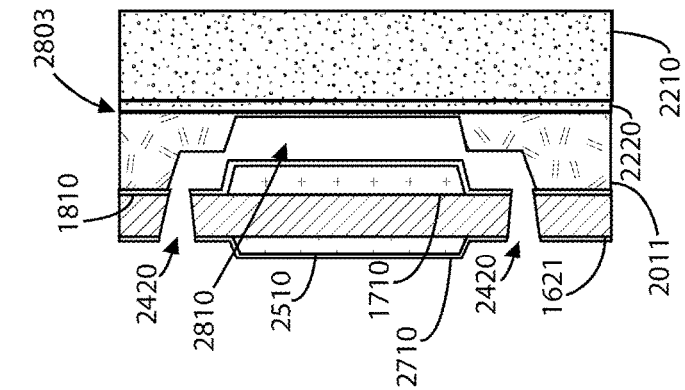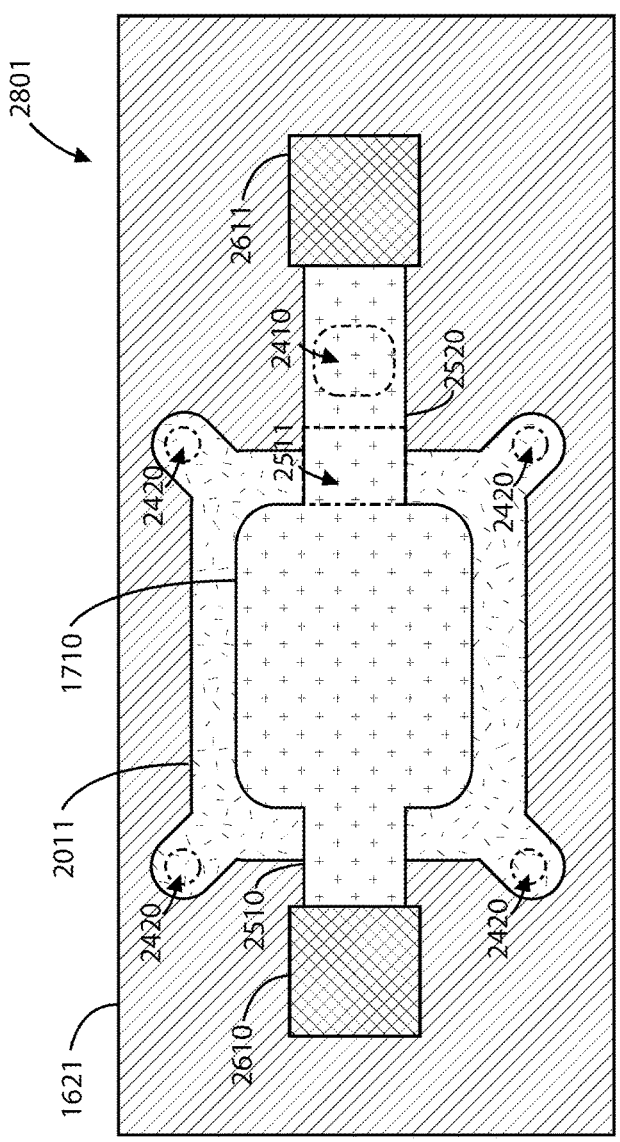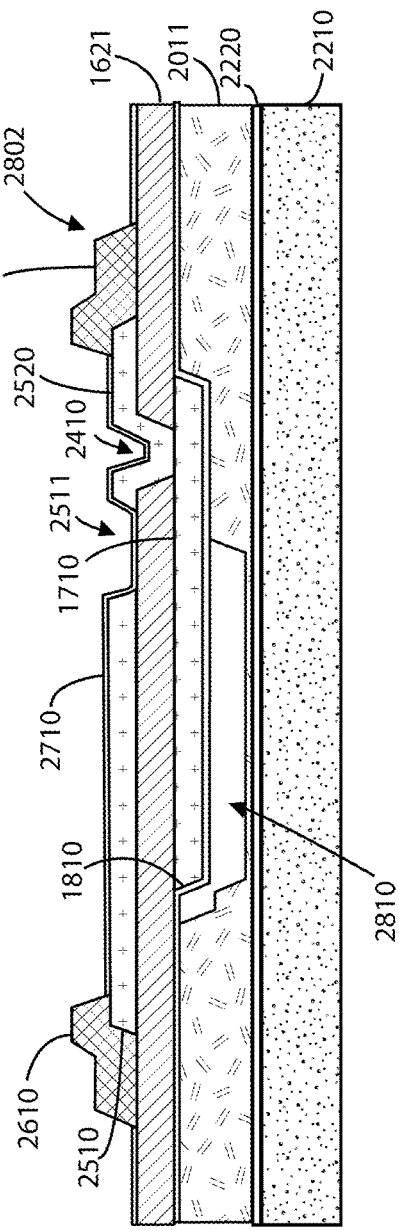

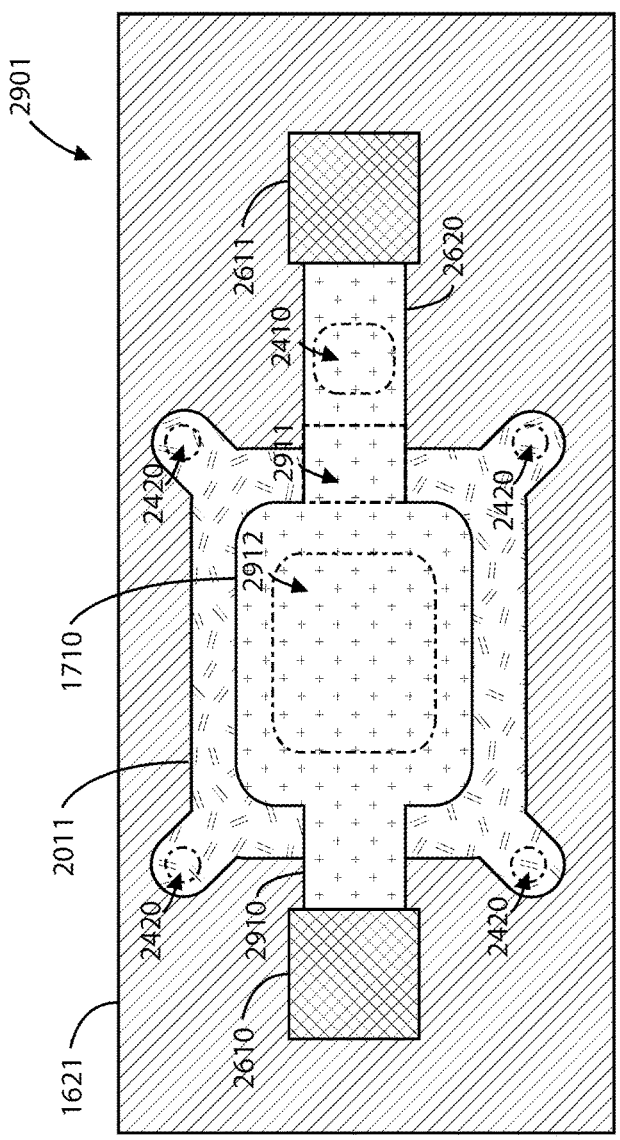
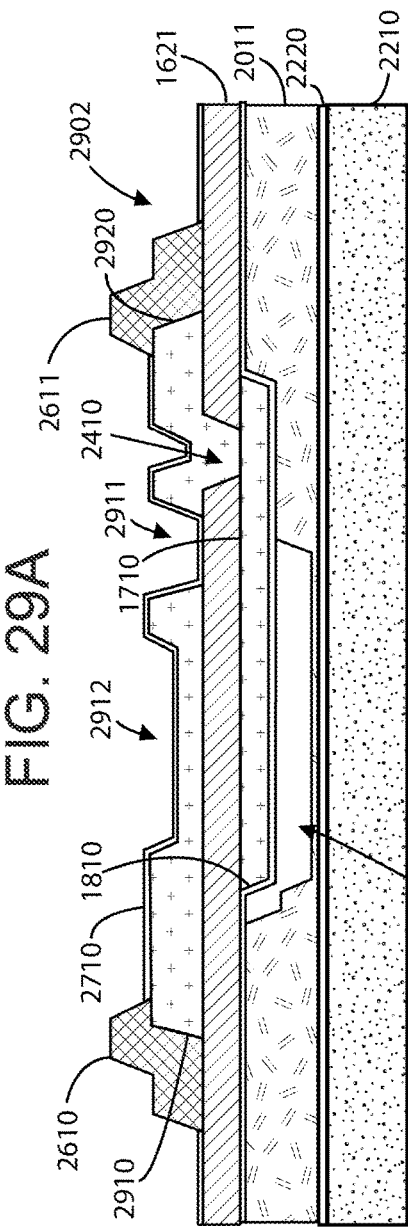
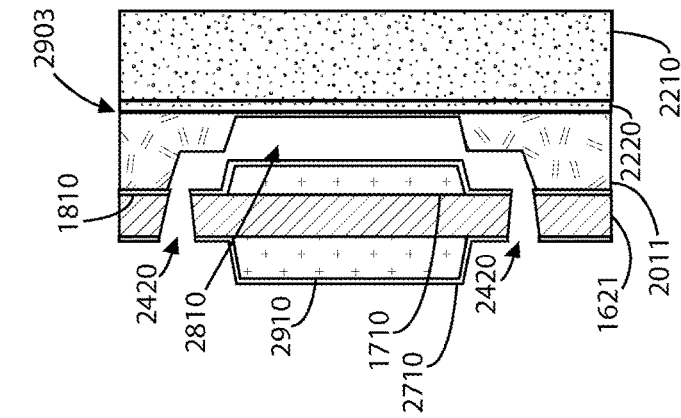
FIG. 29A
FIG. 29B
FIG. 29C

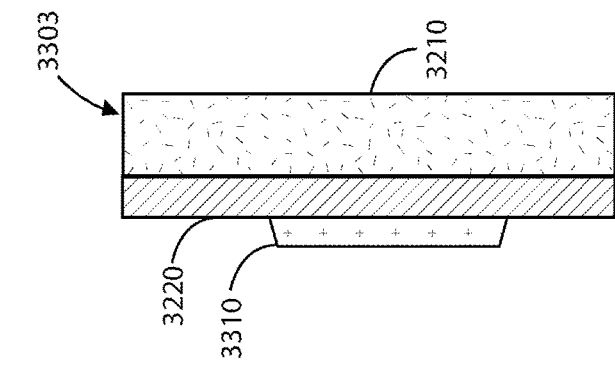
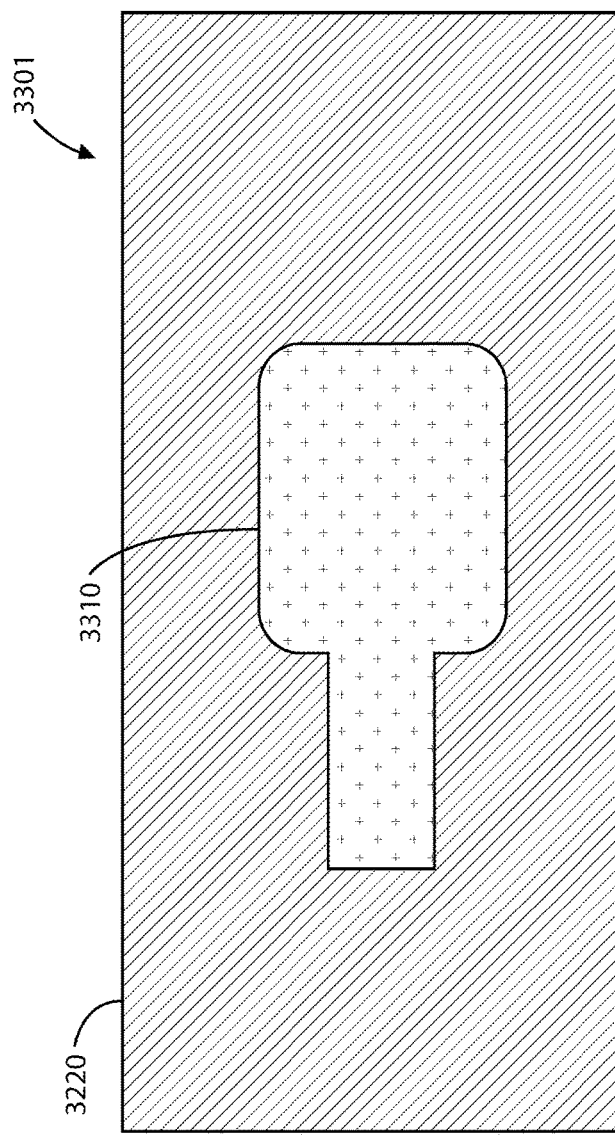
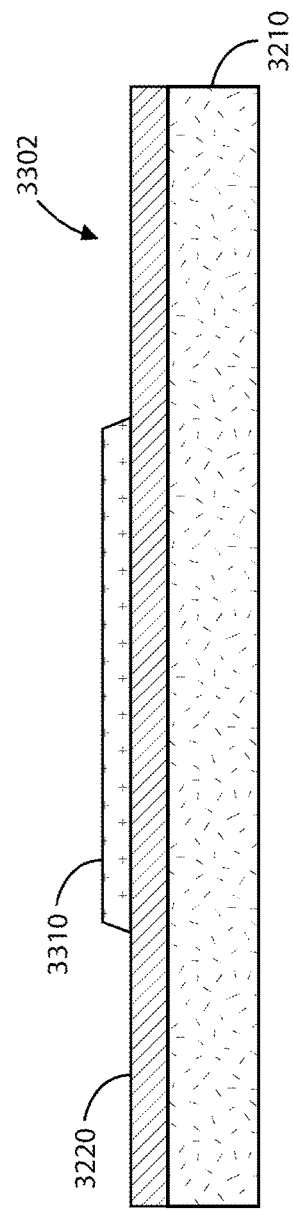

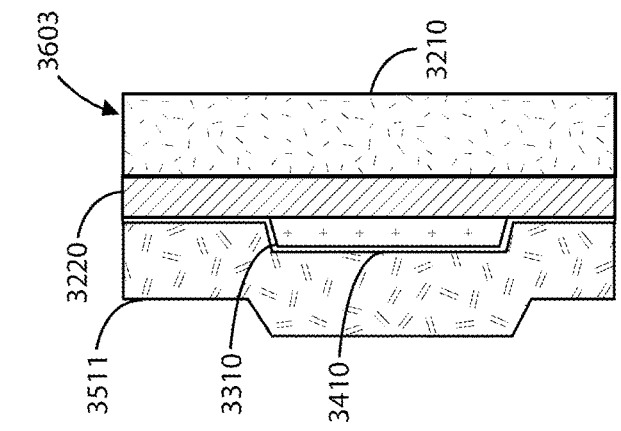
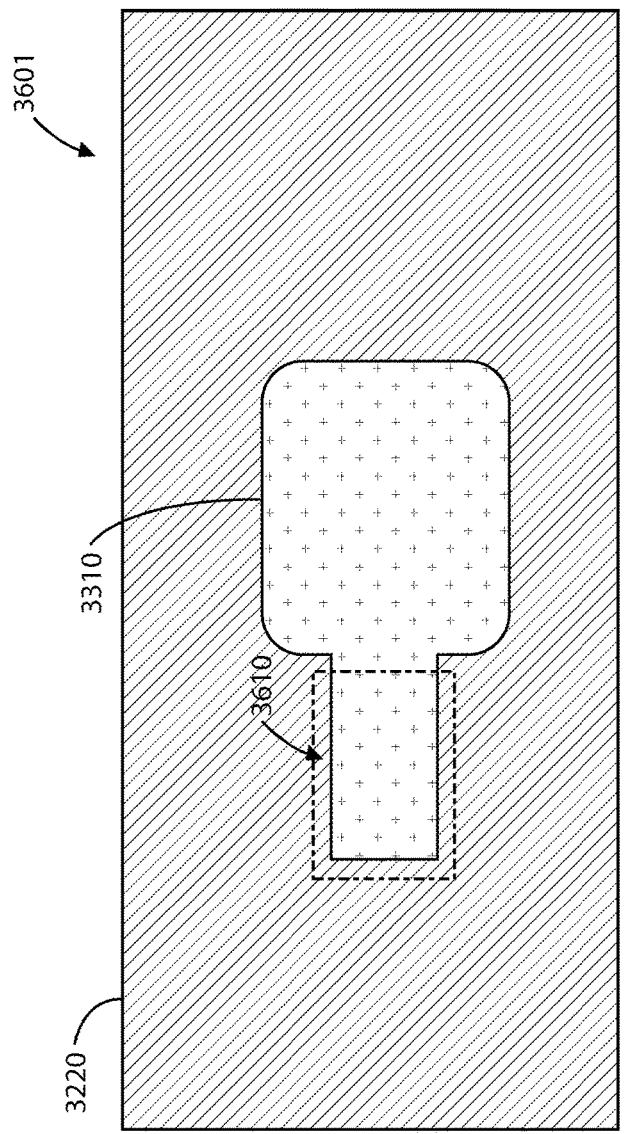
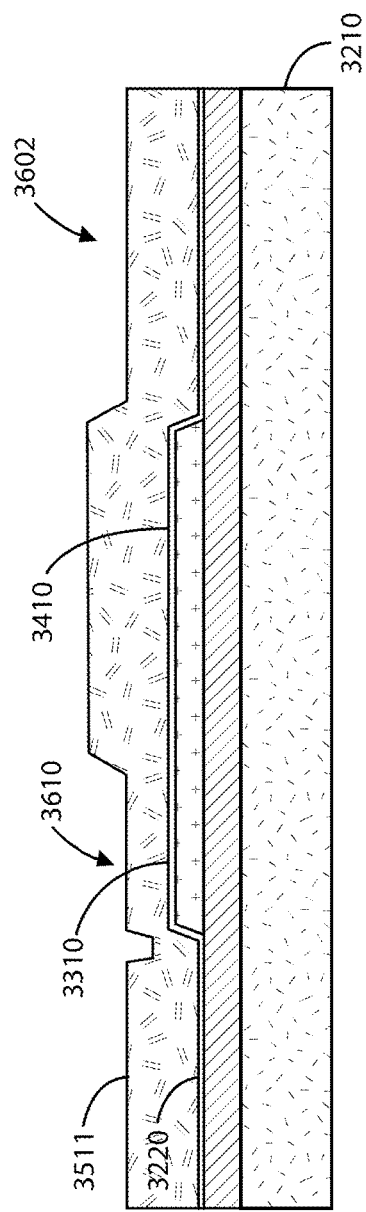
FIG. 36C
FIG. 36A
FIG. 36B

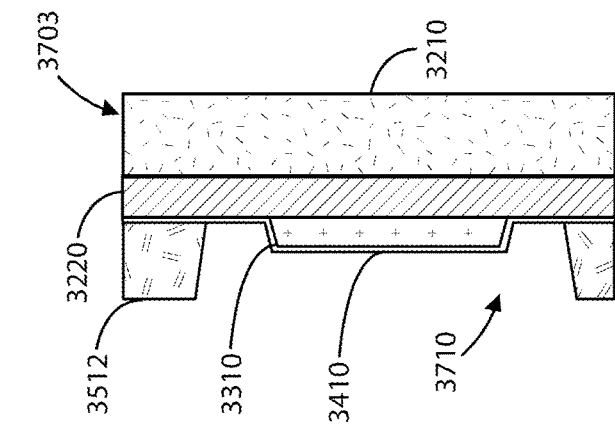
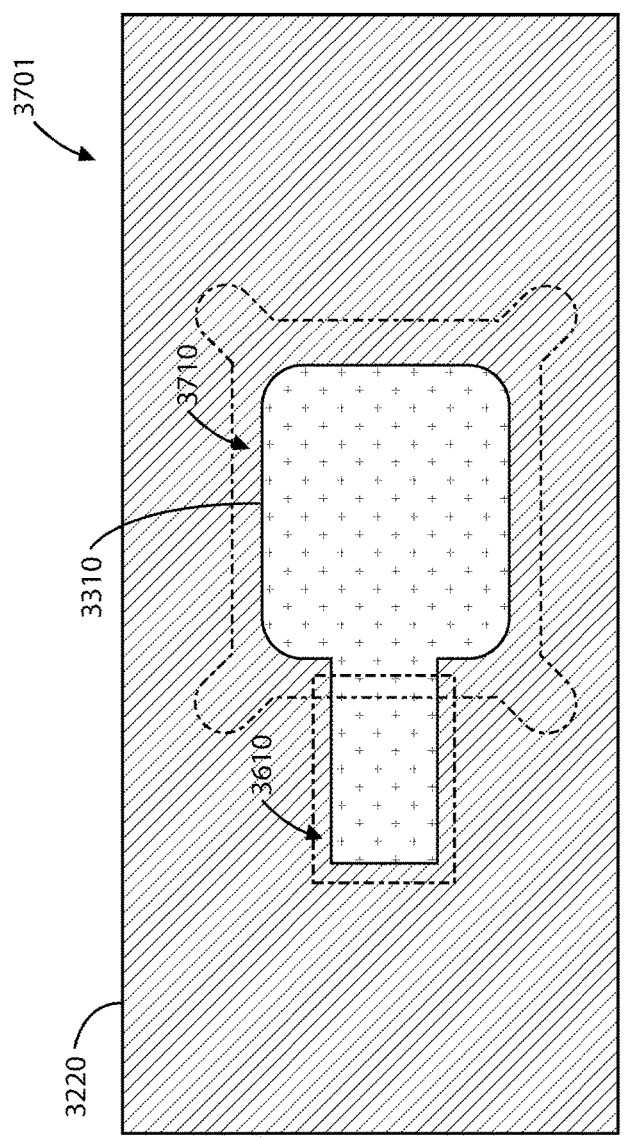
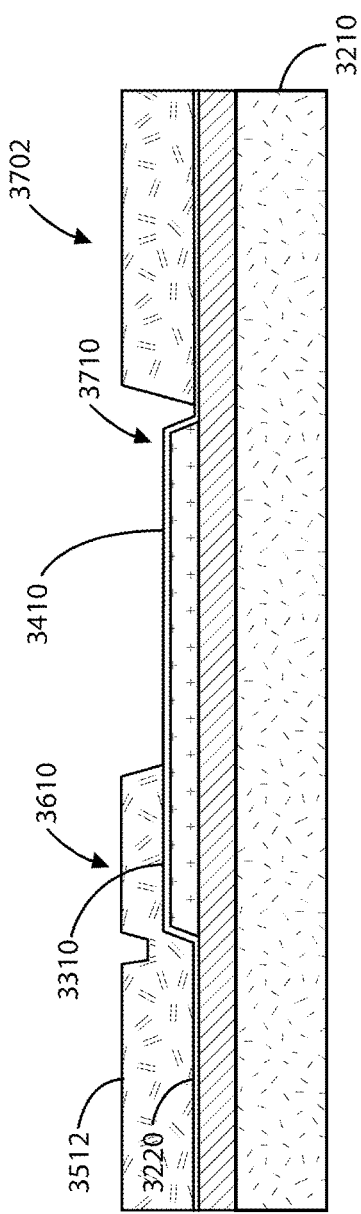

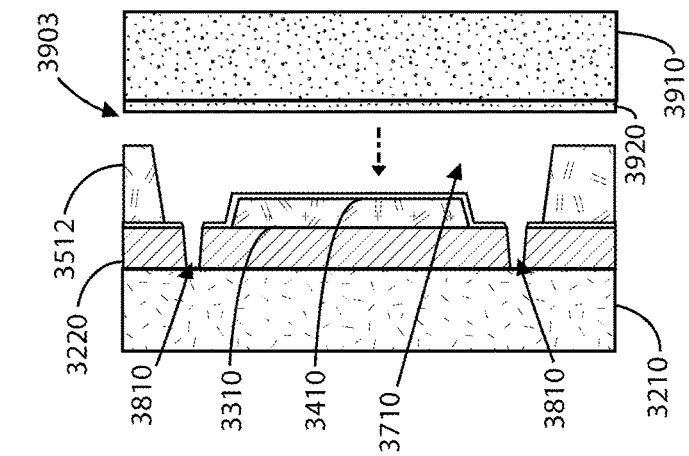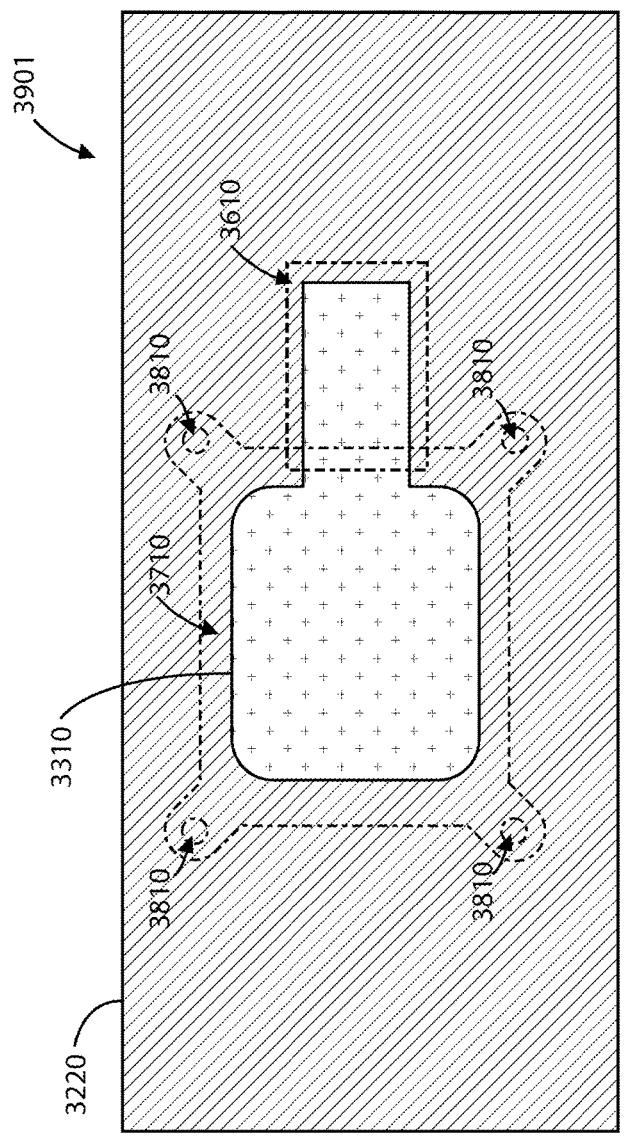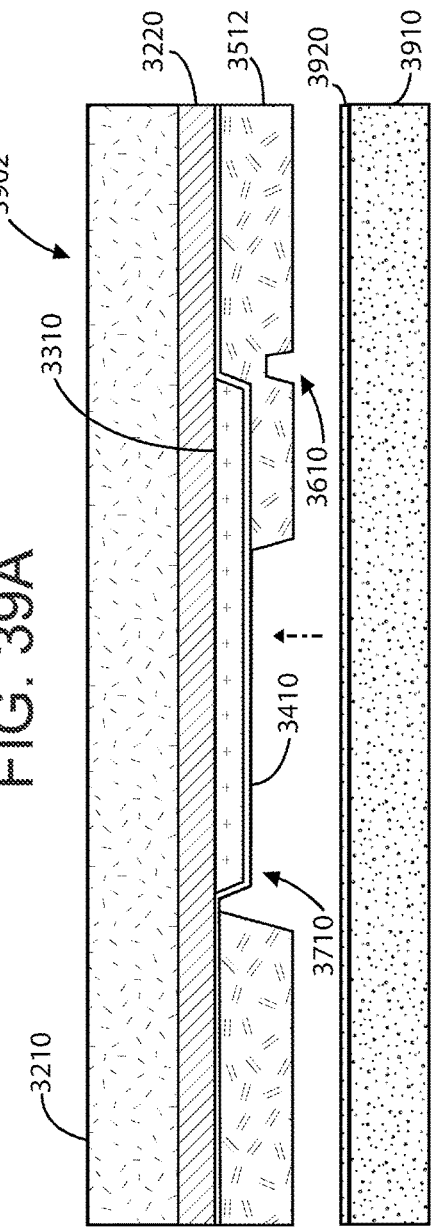

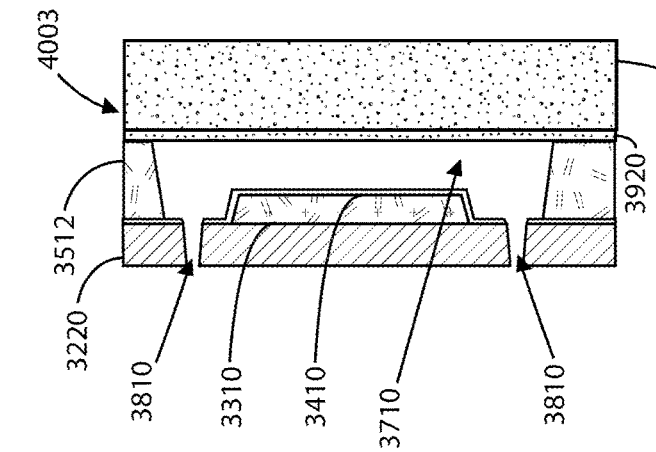
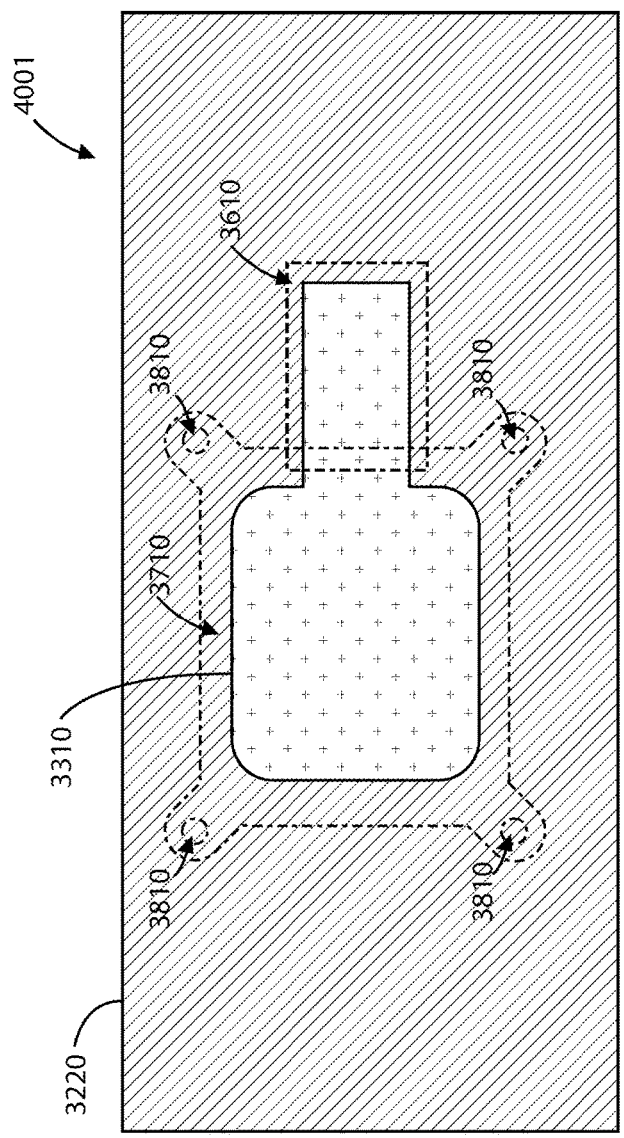
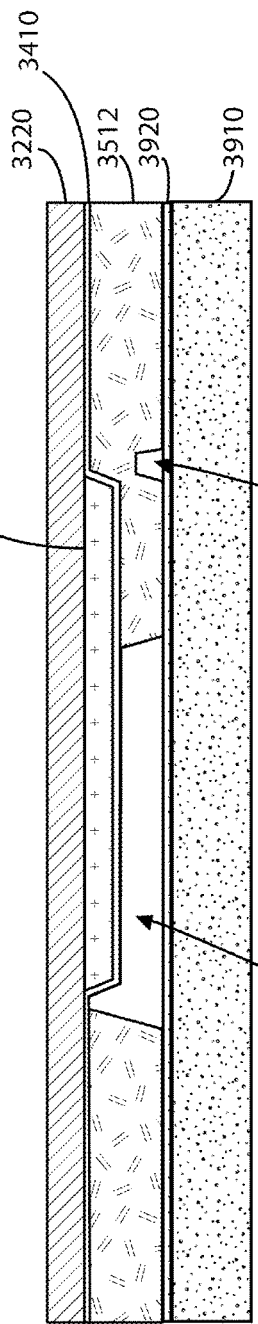

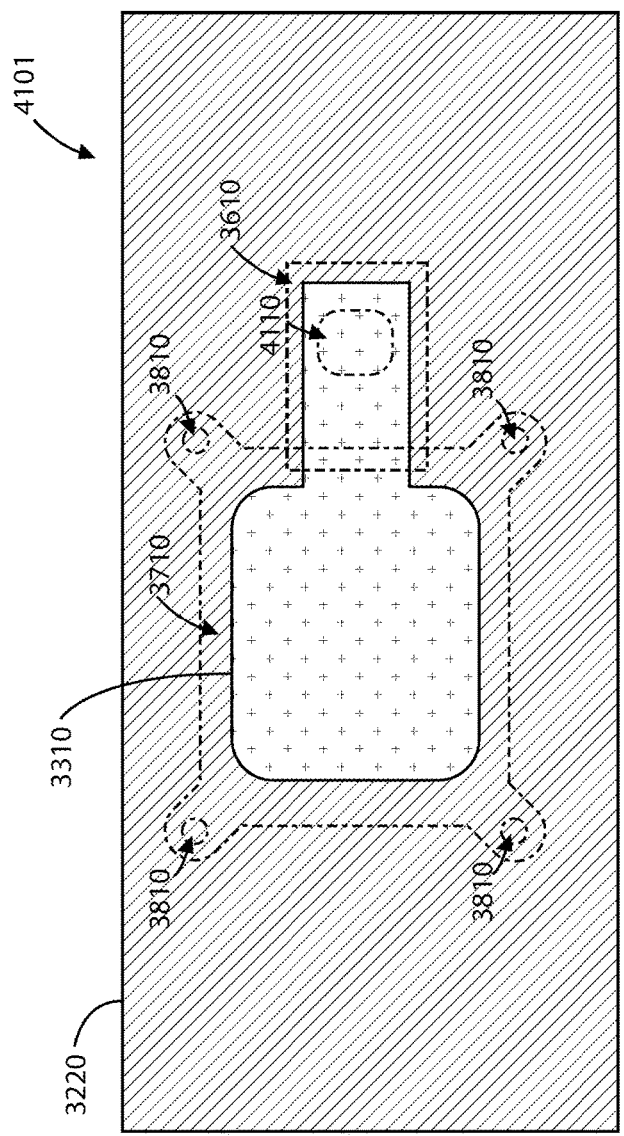
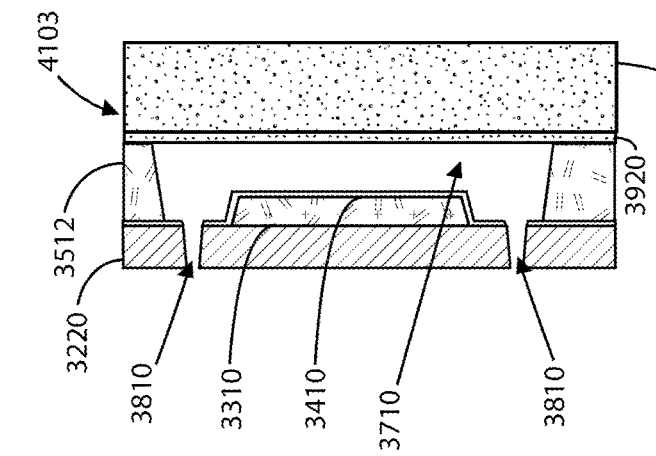
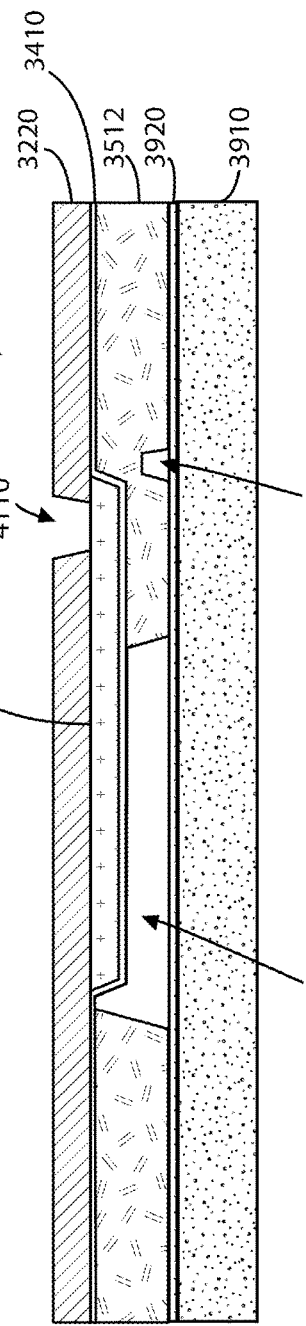
FIG. 41A
FIG. 41B
FIG. 41C

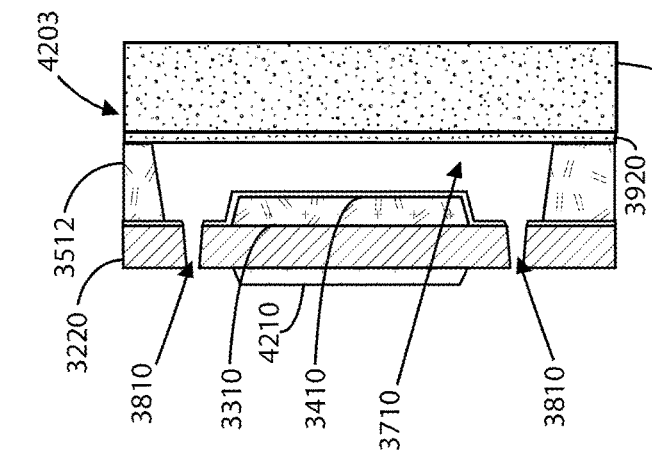
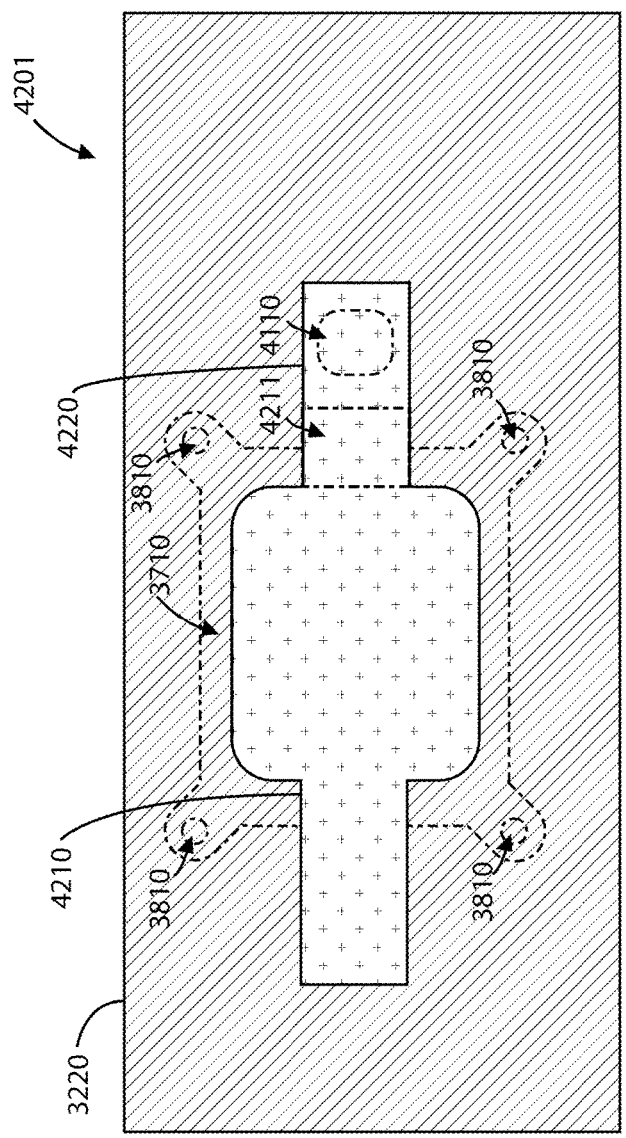
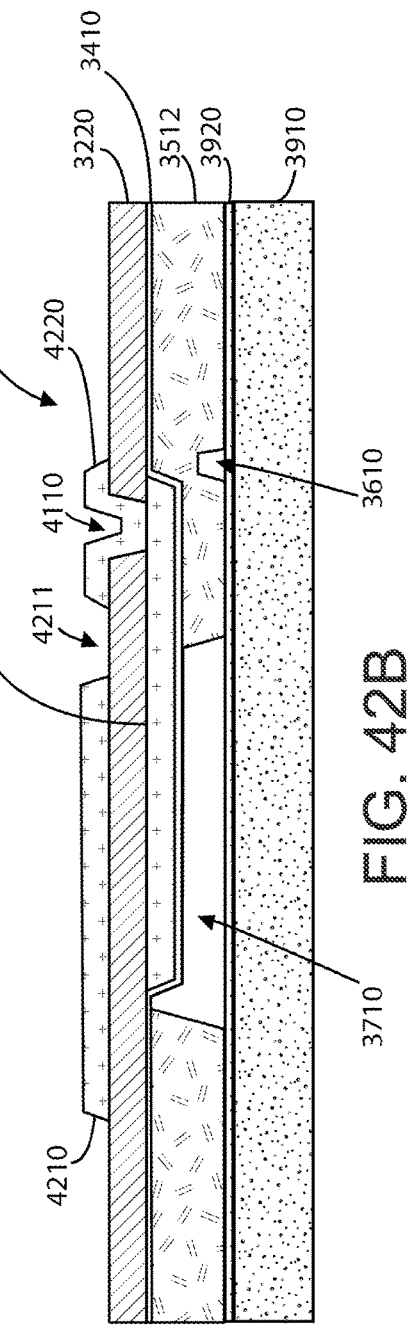
FIG. 42A
FIG. 42B
FIG. 42C

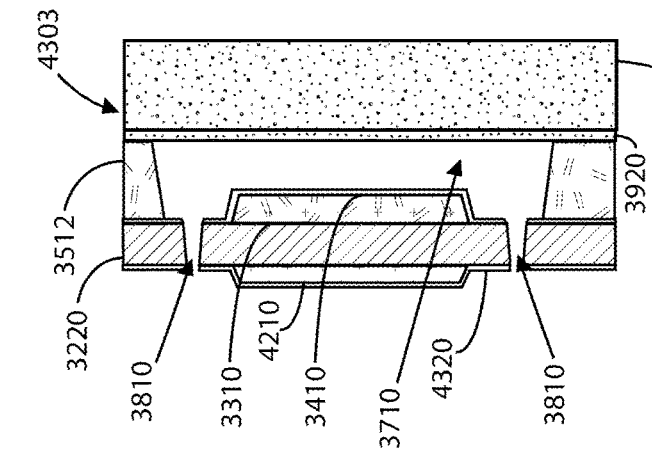
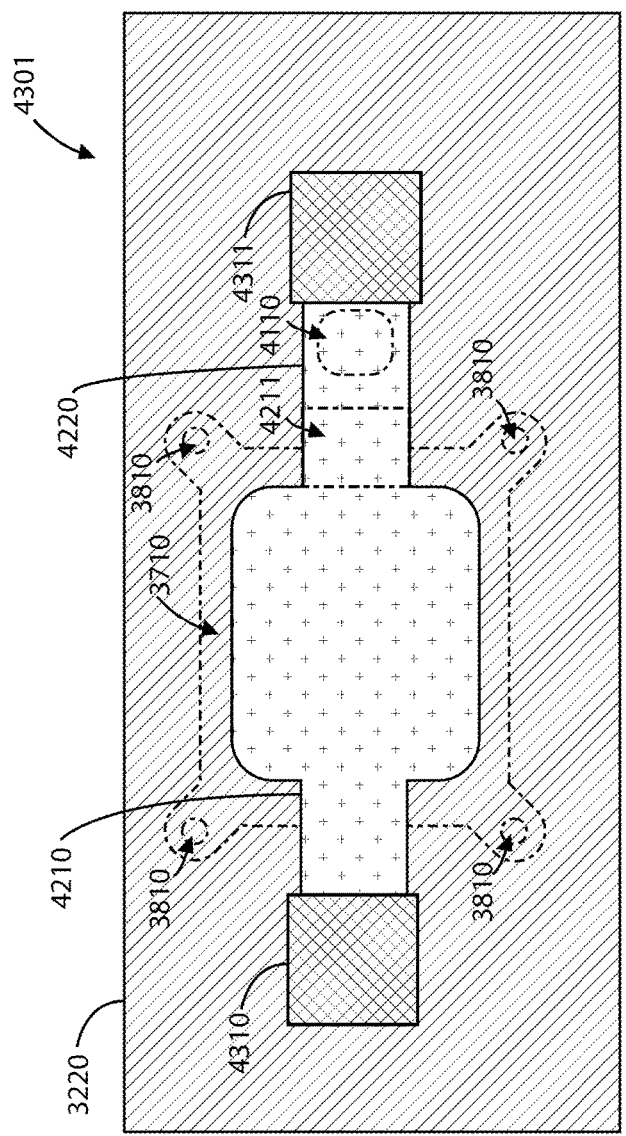
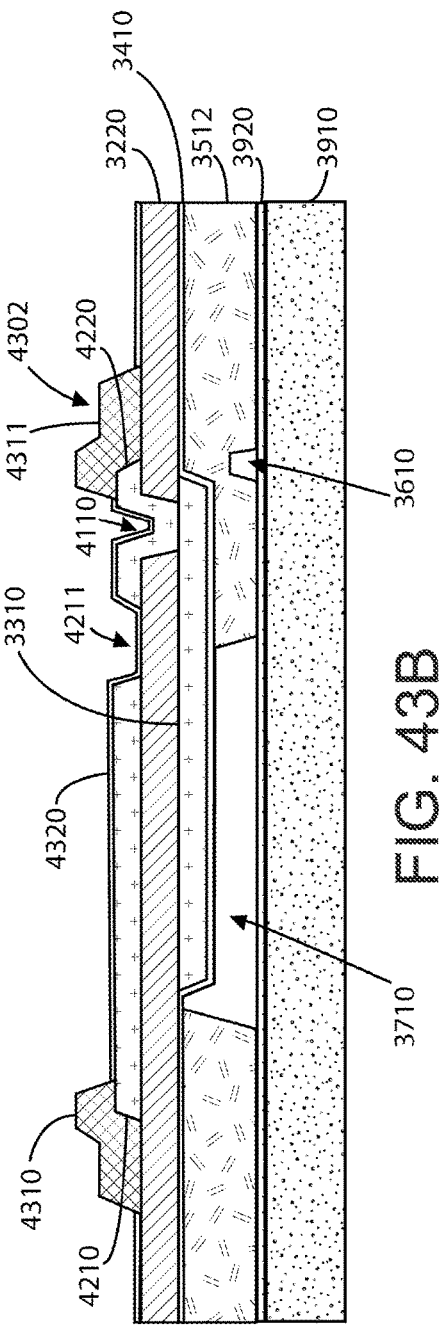
FIG. 43C
FIG. 43A
FIG. 43B

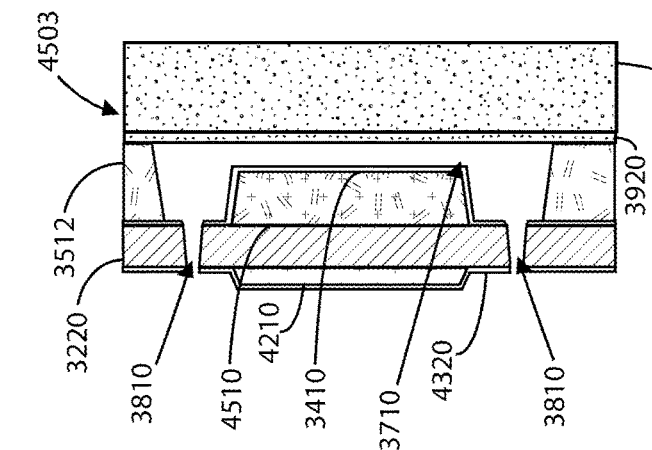
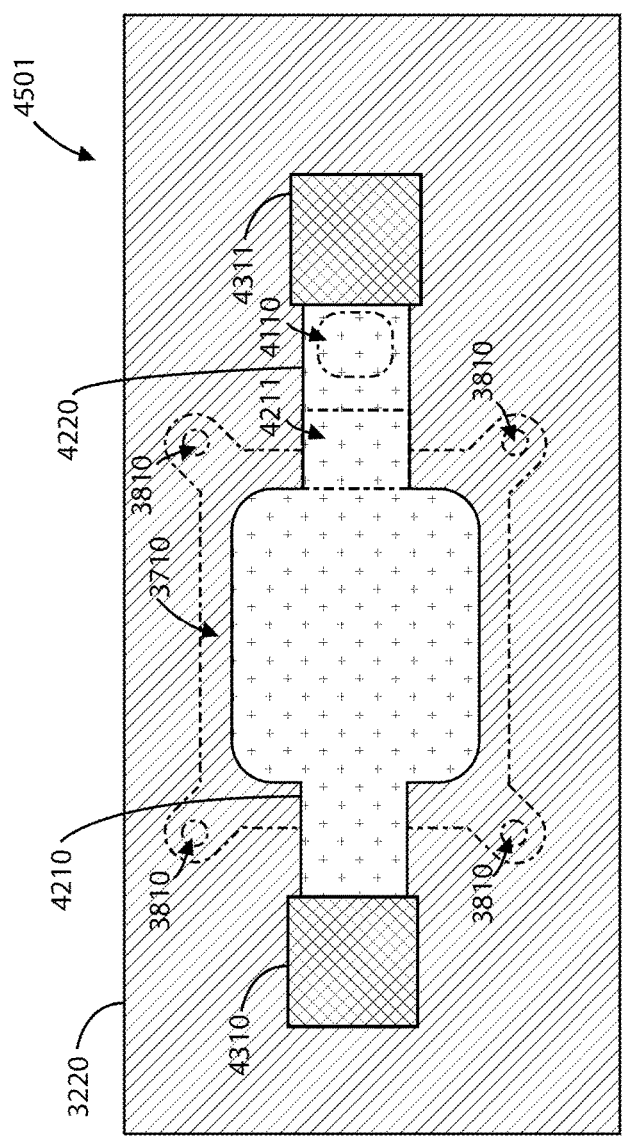
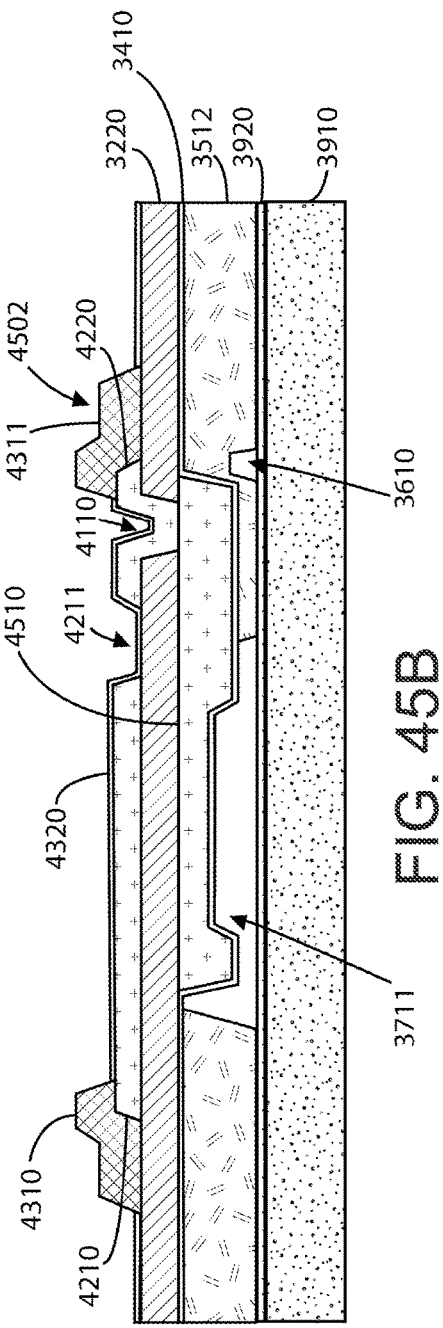
FIG. 45A
FIG. 45B
FIG. 45C

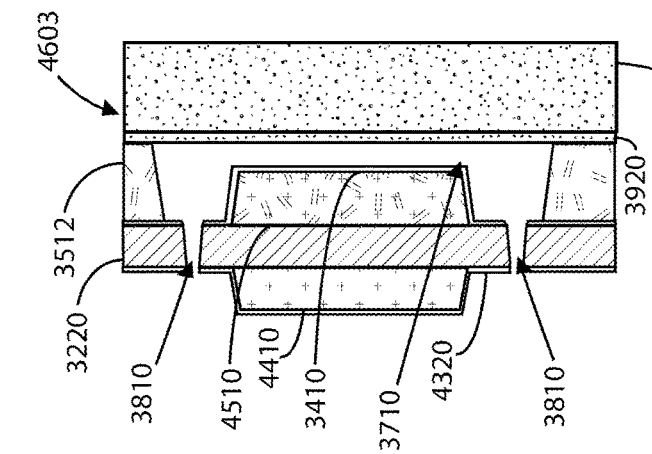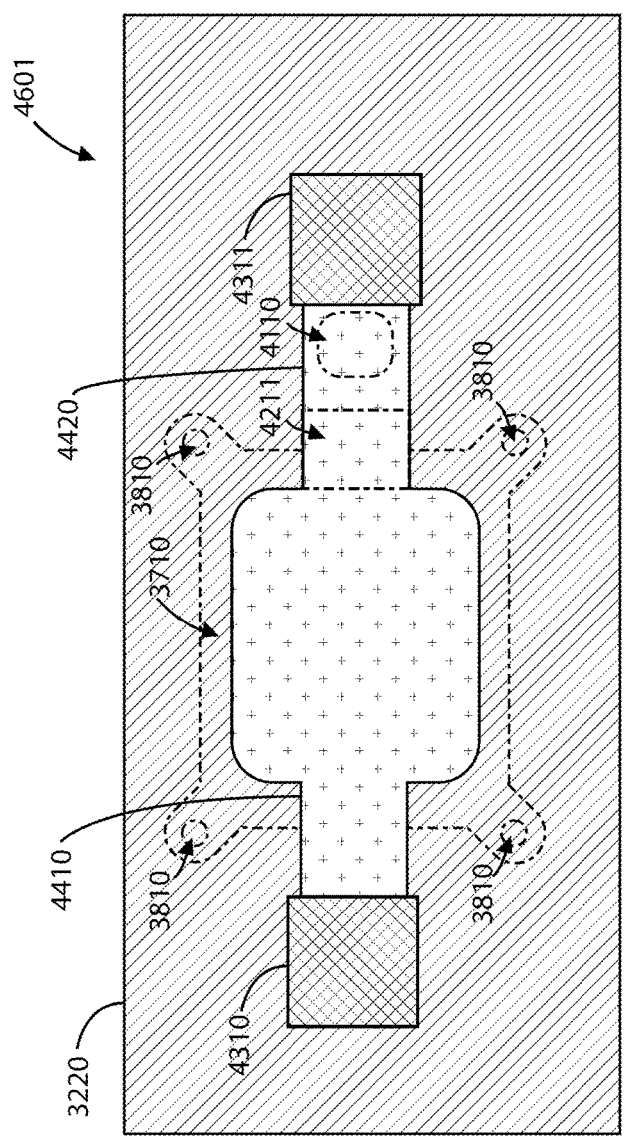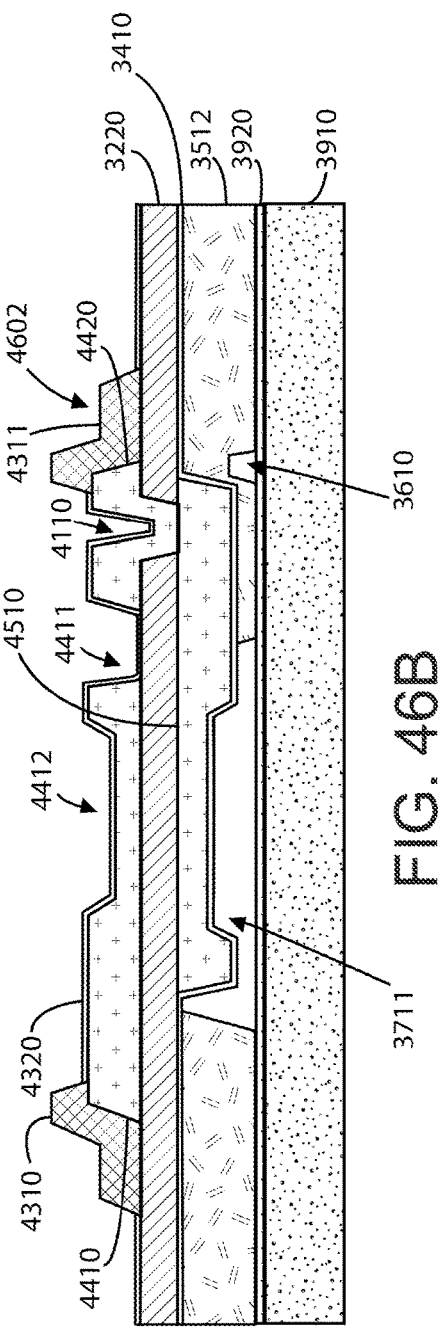

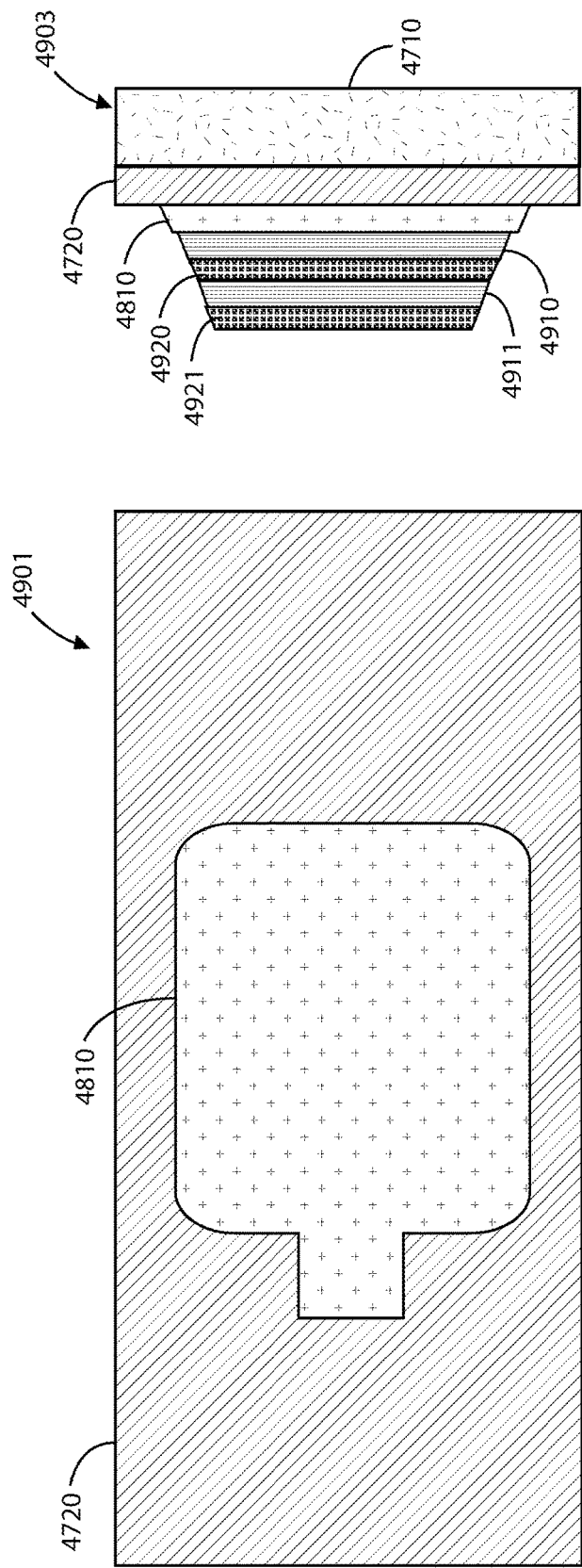

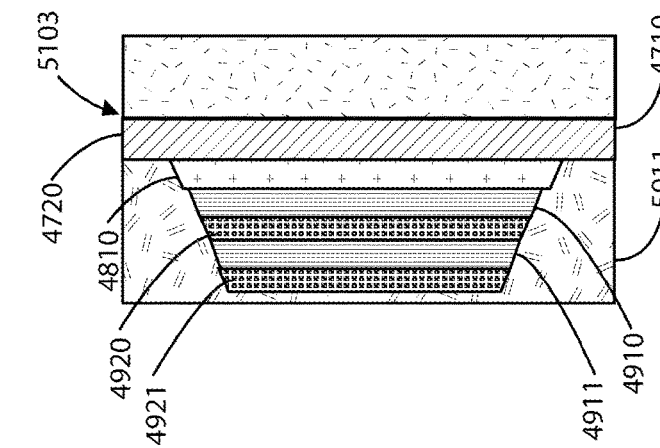
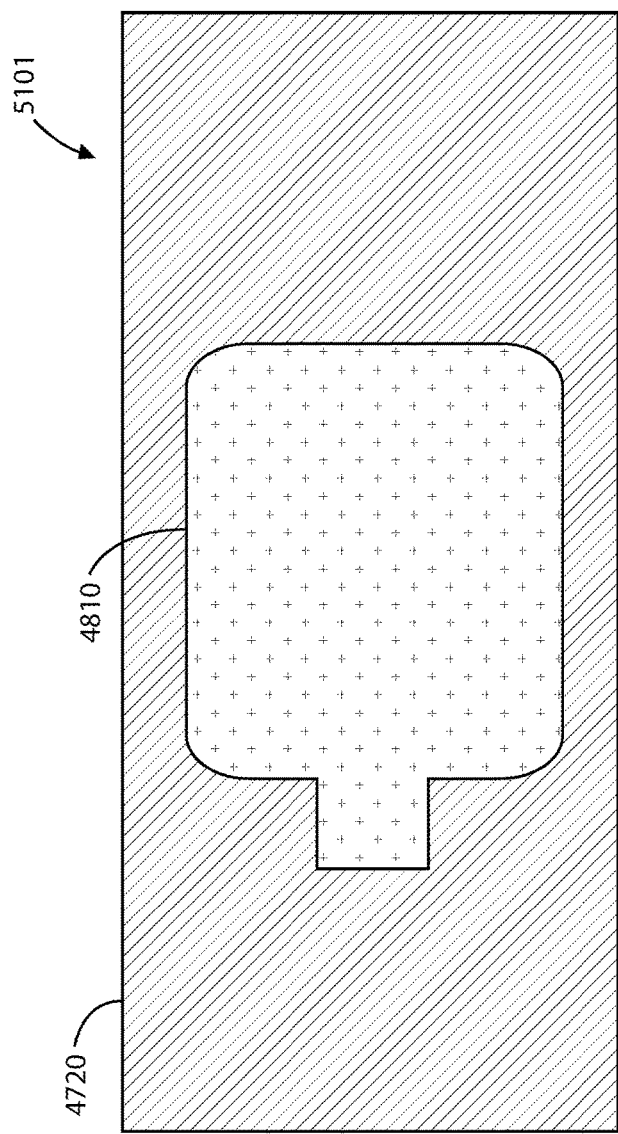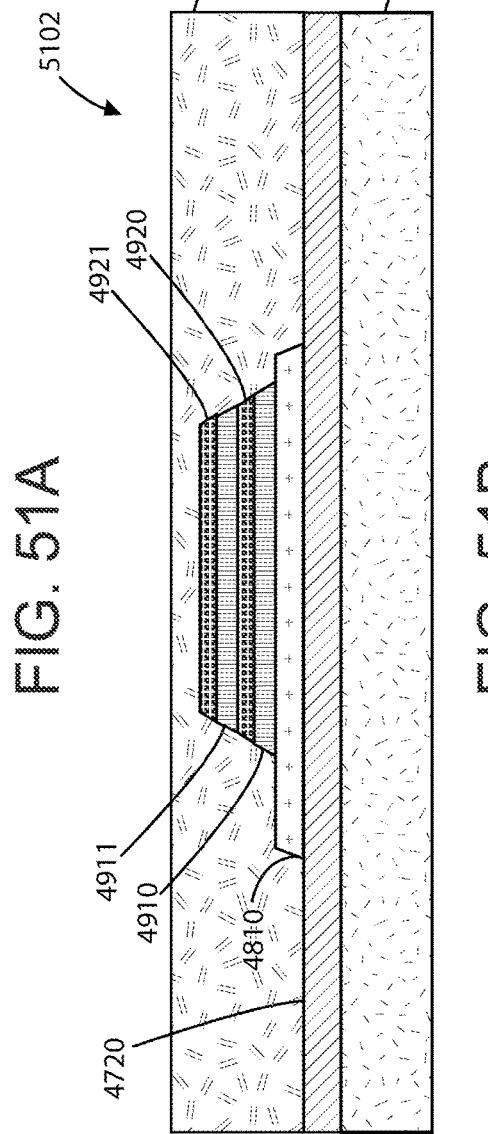

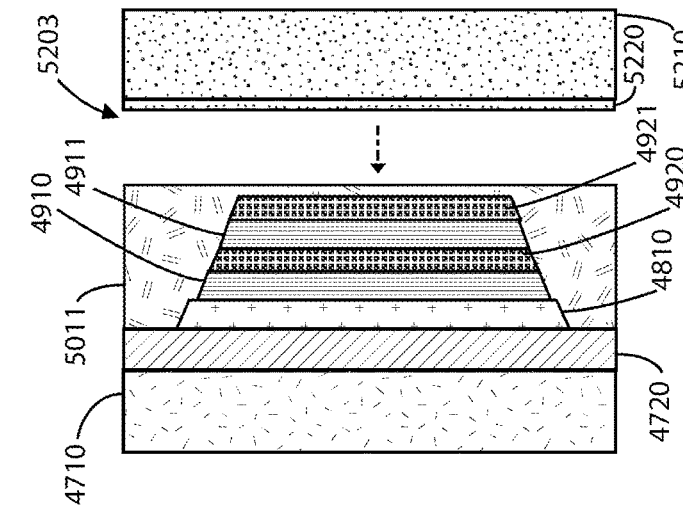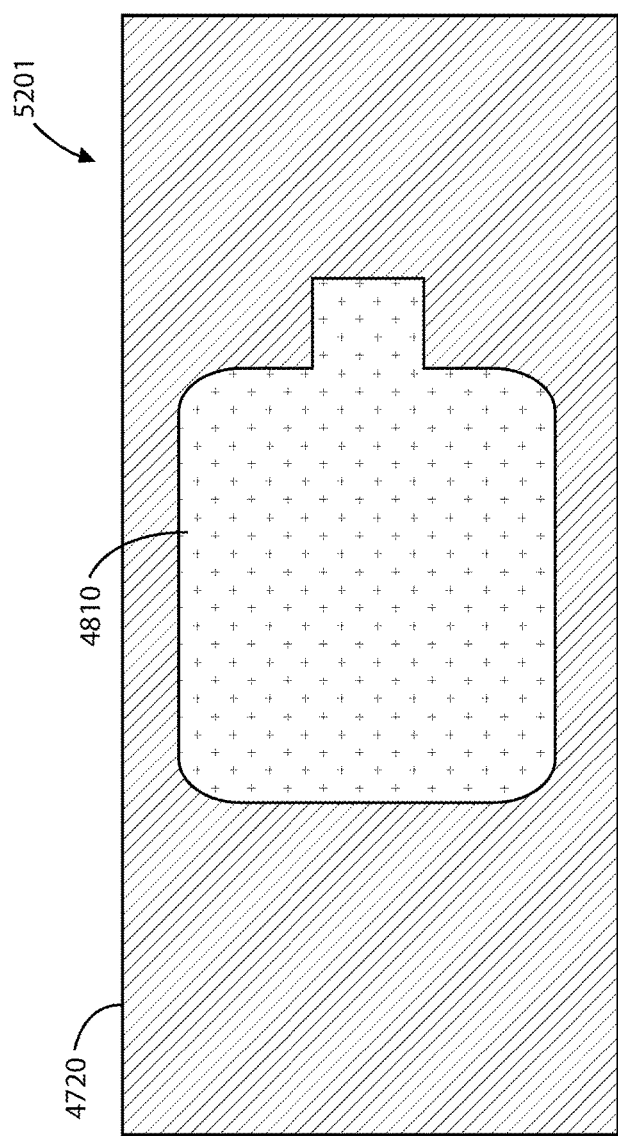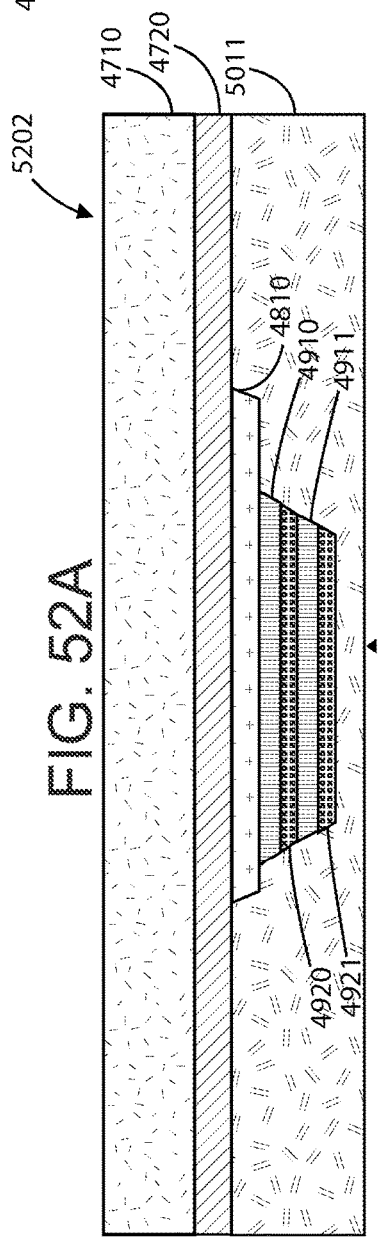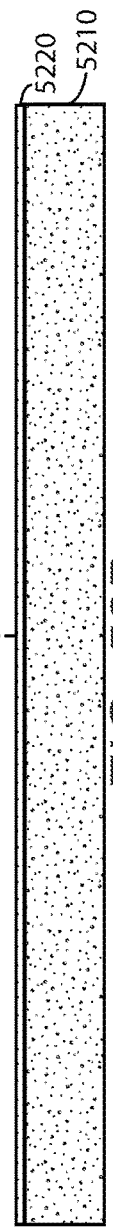
FIG. 52A
FIG. 52B
FIG. 52C

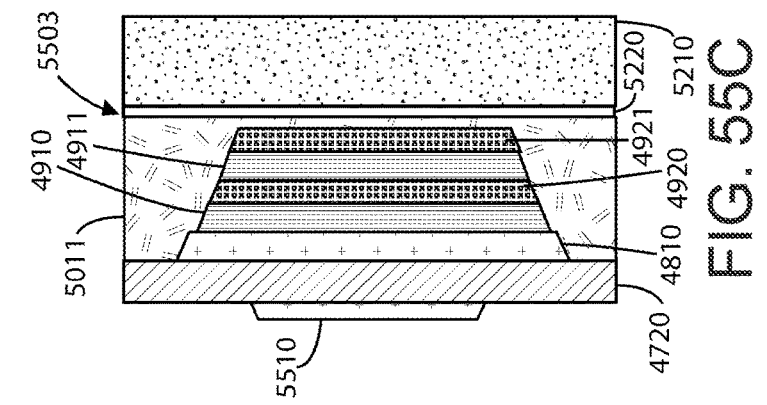
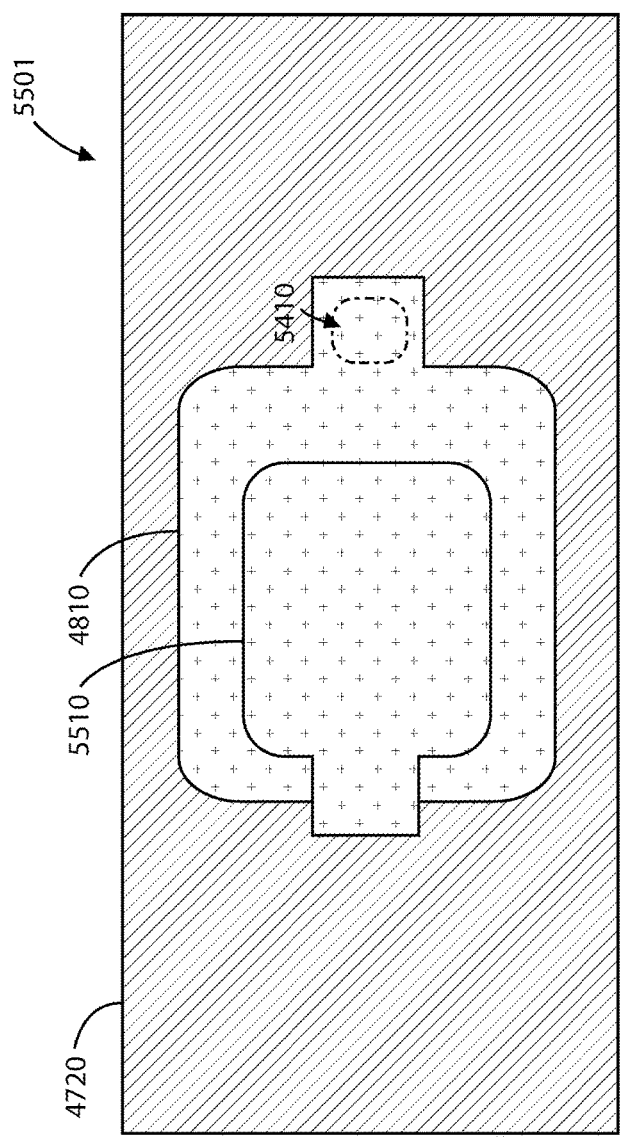
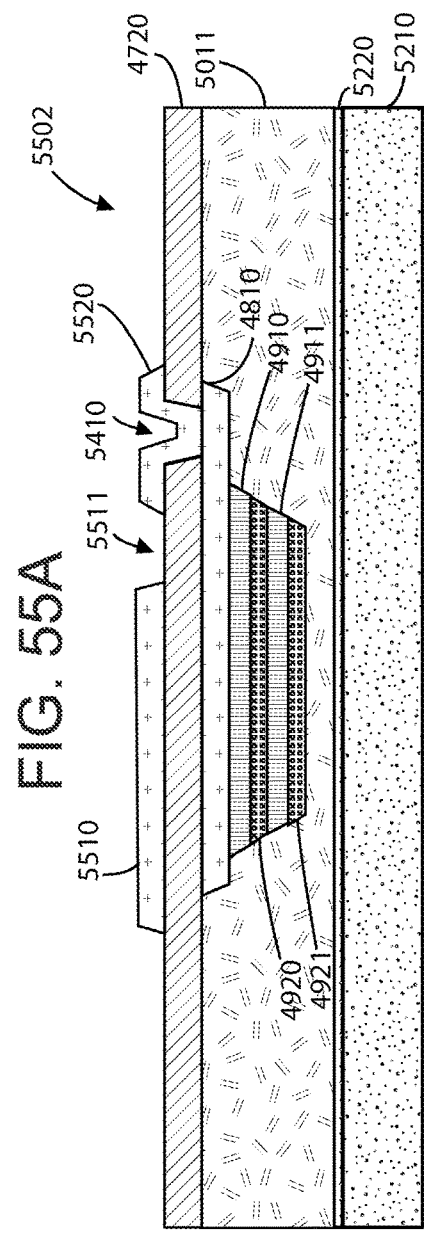
FIG. 55A
FIG. 55B
FIG. 55C

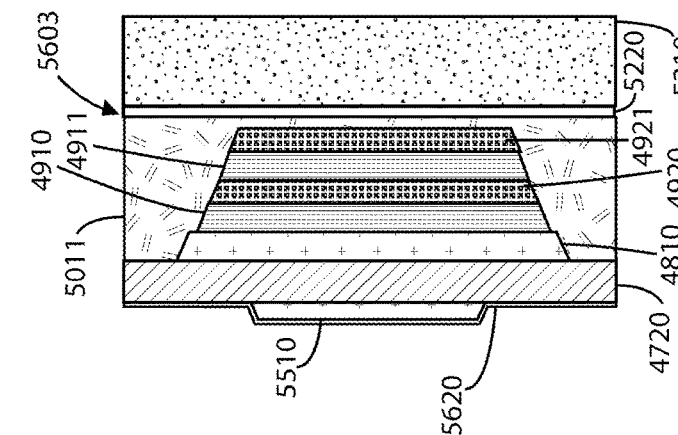
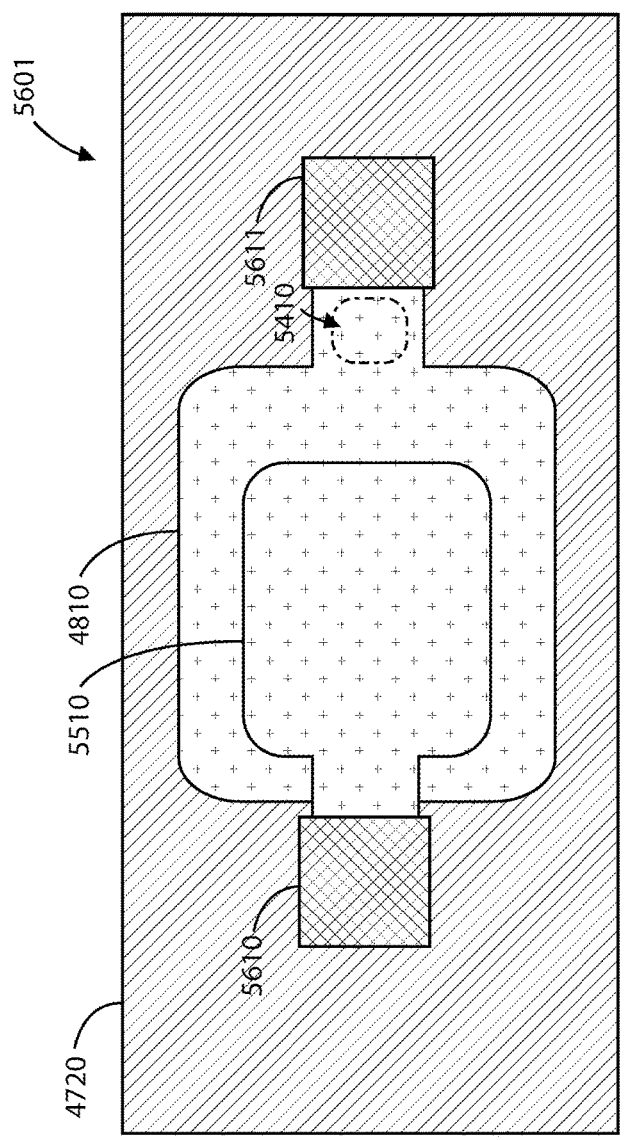
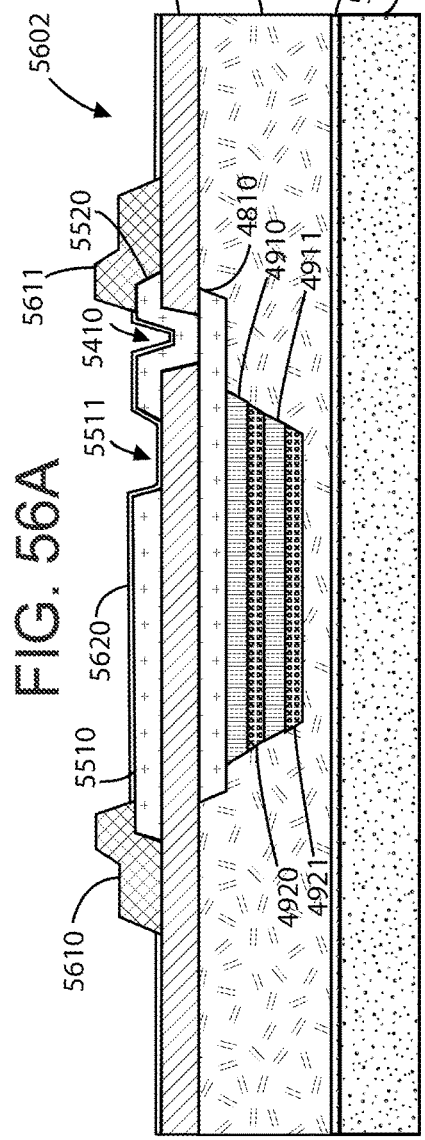
FIG. 56A
FIG. 56B
FIG. 56C

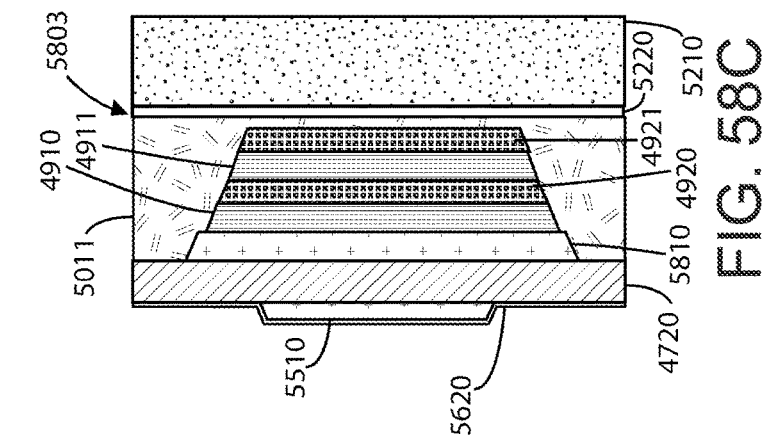
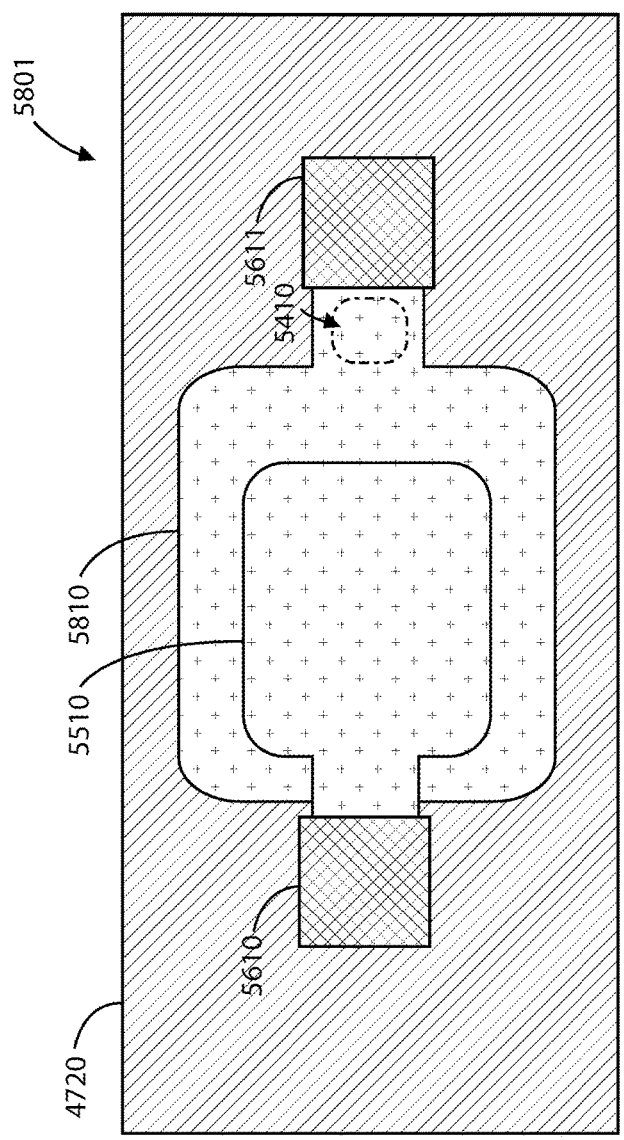
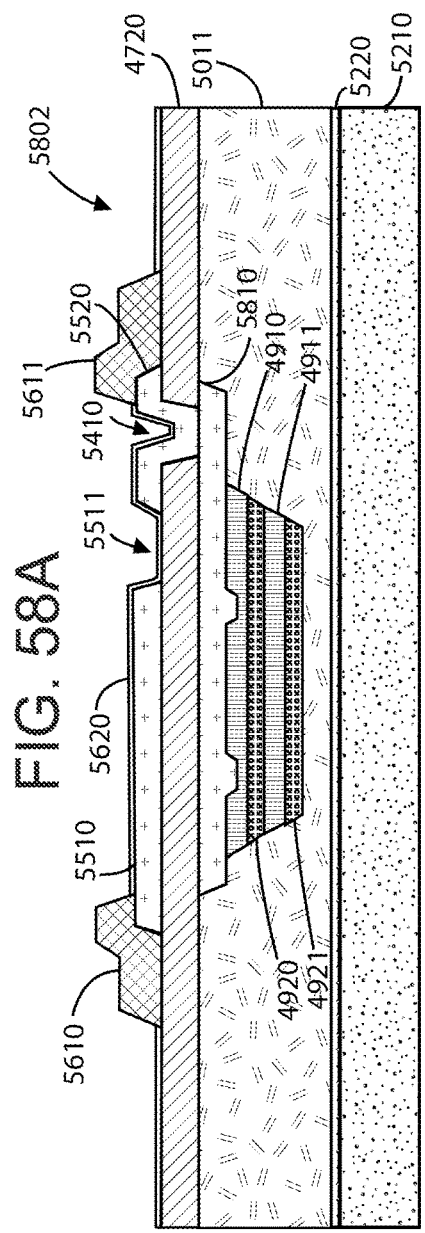
FIG. 58A
FIG. 58B
FIG. 58C

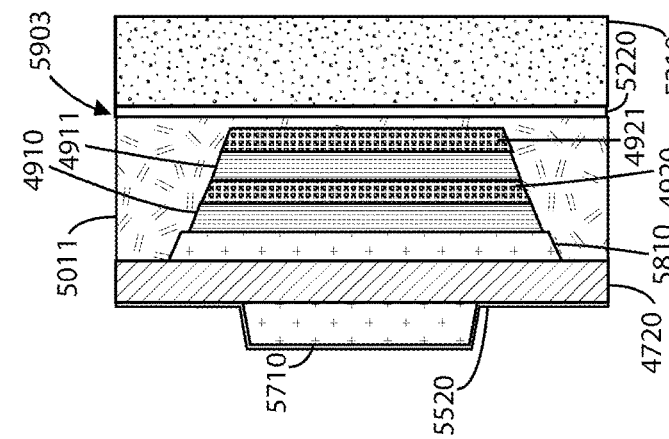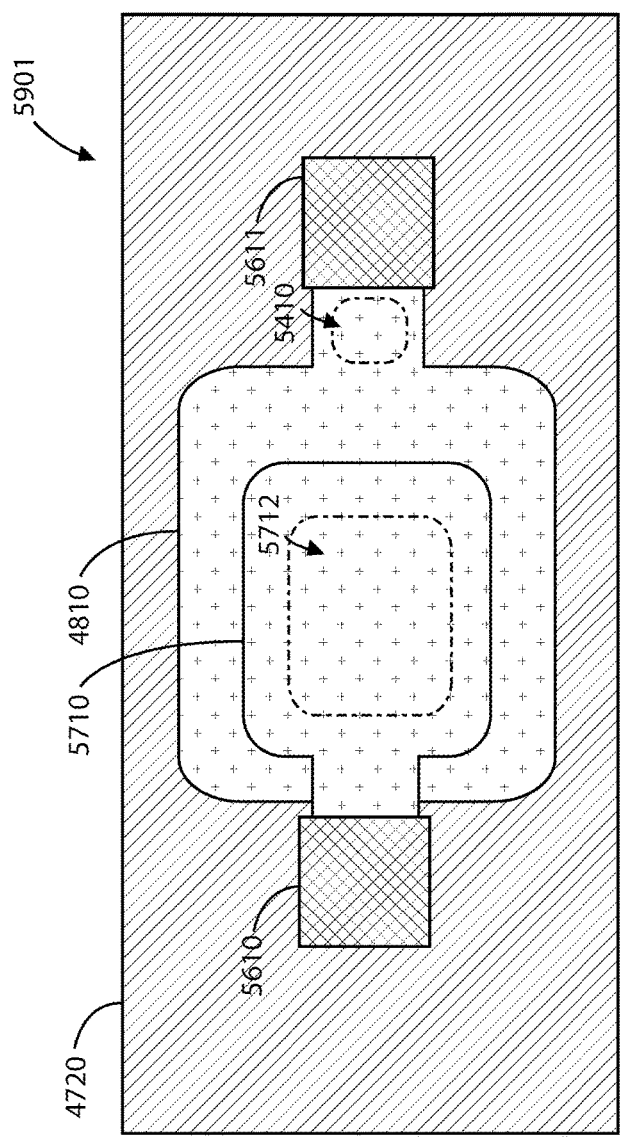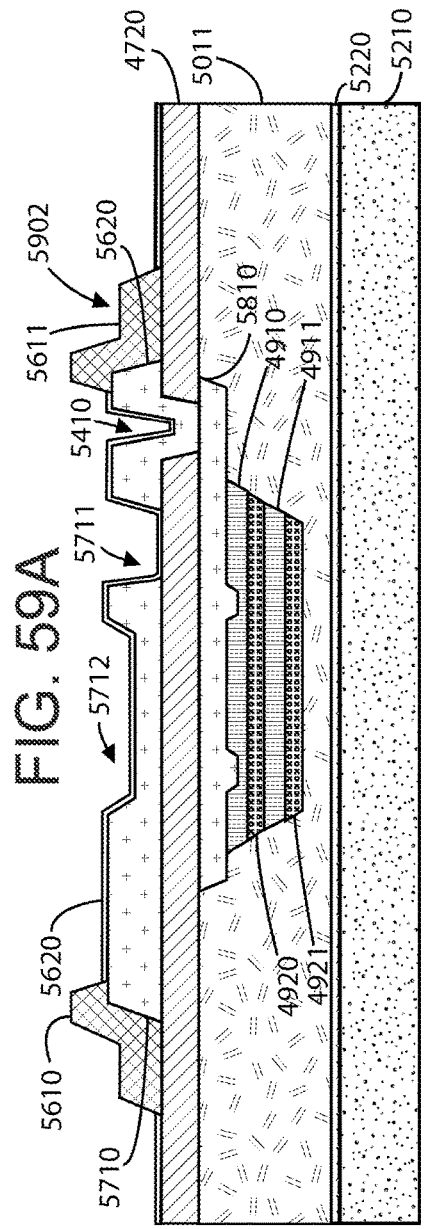
FIG. 59A
FIG. 59B
FIG. 59C

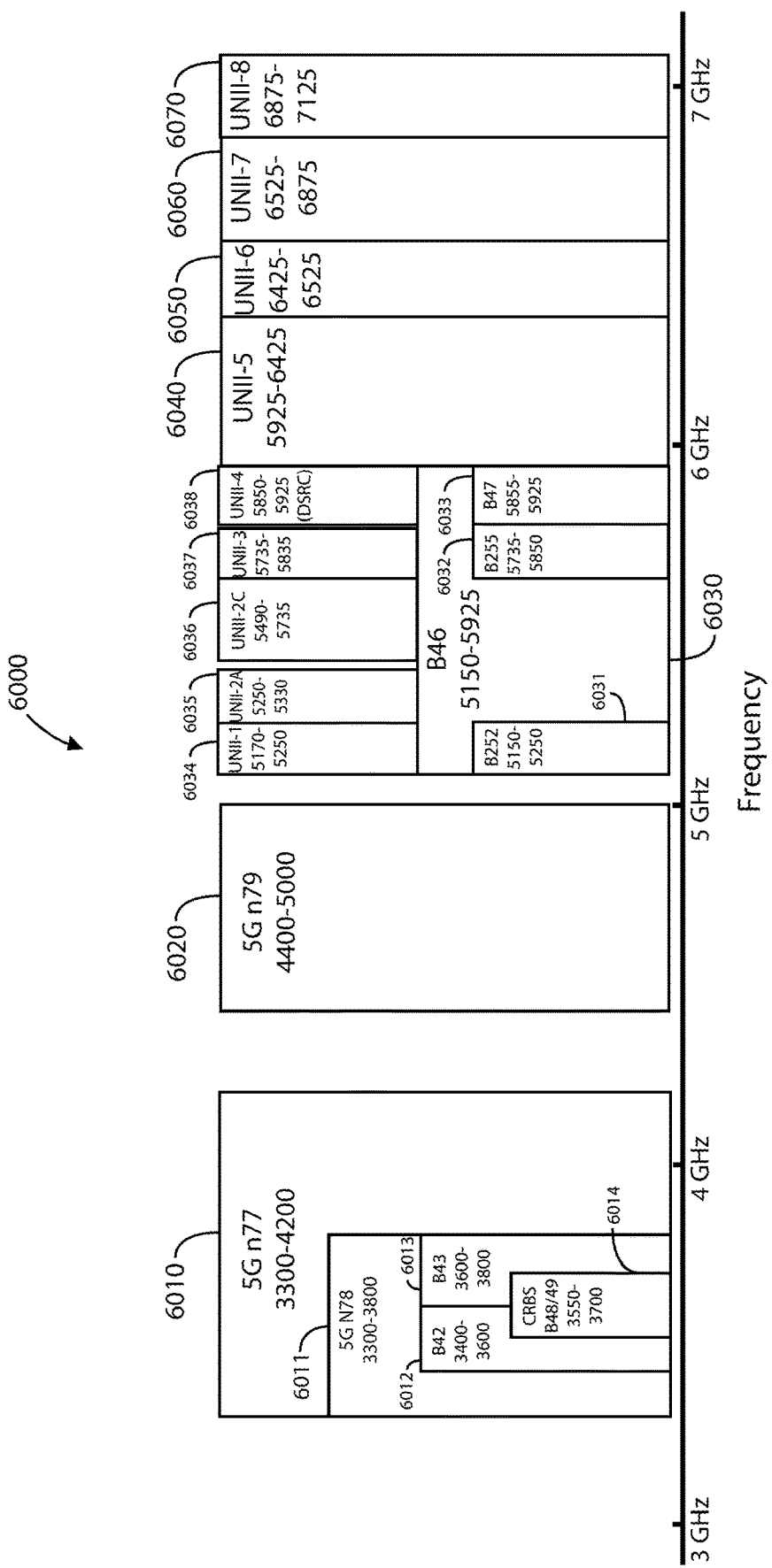

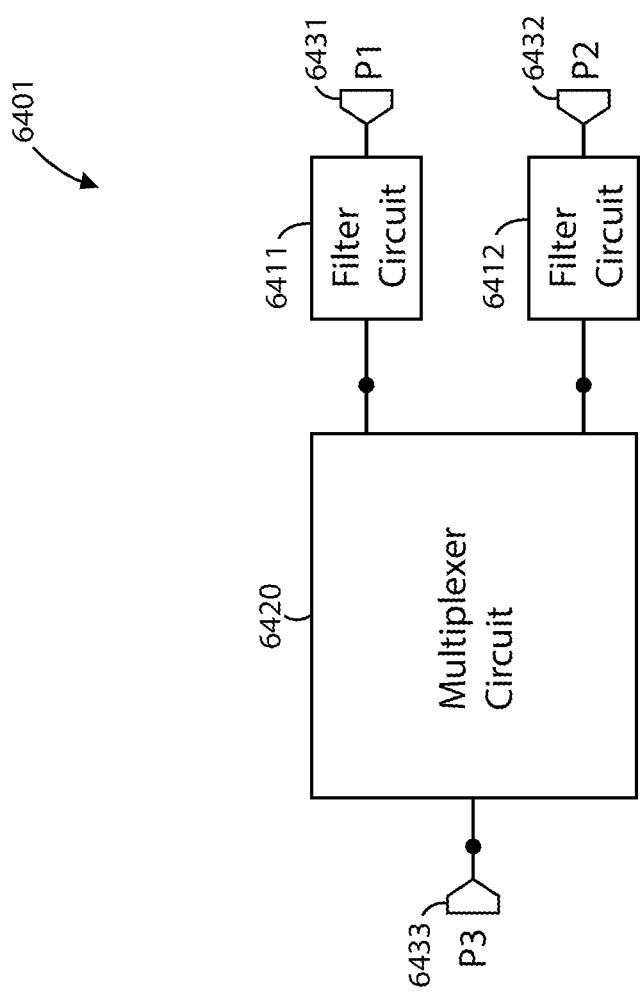

|  | Parameter | Frequency (MHz) | Unit | 5.1-7.1GHz Diplexer | | |
|---|---|---|---|---|---|---|
|  |  |  |  | Min. | Typ. | Max |
| Filter 1 | Center Freq | 5492.5 |  |  |  |  |
| Filter 1 | Passband Freq | 5150-5835 |  |  |  |  |
| Filter 1 | IL in PB |  | dB |  | 2 | 3.0 |
| Filter 1 | Ripple in PB |  | dB |  | 1 | 2 |
| Filter 1 | RL in PB |  | dB | 10 | 12 |  |
| Filter 1 | Attenuation | 700 to 2400 | dB | 25 | 35 |  |
| Filter 1 | Attenuation | 2400 to 2500 | dB | 30 | 40 |  |
| Filter 1 | Attenuation | 3300 to 5000 | dB | 25 | 35 |  |
| Filter 1 | Attenuation | 5935 to 6015 | dB | 35 | 40 |  |
| Filter 1 | Attenuation | 6015 to 7125 | dB | 45 | 50 |  |
| Filter 1 | Attenuation | 7200 to 12000 | dB | 25 | 35 |  |
| Filter 2 | Center Freq | 6535 |  |  |  |  |
| Filter 2 | Passband Freq | 5945-7125 |  |  |  |  |
| Filter 2 | IL in PB |  | dB |  | 2 | 3.0 |
| Filter 2 | Ripple in PB |  | dB |  | 1 | 2 |
| Filter 2 | RL in PB |  | dB | 10 | 12 |  |
| Filter 2 | Attenuation | 700 to 2400 | dB | 25 | 35 |  |
| Filter 2 | Attenuation | 2400 to 2500 | dB | 30 | 40 |  |
| Filter 2 | Attenuation | 3300 to 5000 | dB | 25 | 35 |  |
| Filter 2 | Attenuation | 5150 to 5815 | dB | 45 | 50 |  |
| Filter 2 | Attenuation | 5815 to 5895 | dB | 35 | 40 |  |
| Filter 2 | Attenuation | 6000 to 12000 | dB | 45 | 50 |  |
|  | Third Order Intercept |  | dBm | 49 |  |  |
|  | RF Input Power |  | dBm |  |  | 1 W |
|  | I/O |  |  | 50 ohms nominal all three ports | | |
|  | Operating Temp |  |  | -40 C |  | 85 C |
|  | Package Size |  |  | 2.7mm x 2.7mm x 0.8mm | | |

FIG. 69A

|  | Parameter | Frequency (MHz) | Unit | 5.1-7.1GHz Diplexer | | |
|---|---|---|---|---|---|---|
|  |  |  |  | Min. | Typ. | Max |
| Filter 1 | Center Freq | 5522.5 |  |  |  |  |
|  | Passband Freq | 5150-5895 |  |  |  |  |
|  | IL in PB |  | dB |  | 2 | 2.5 |
|  | Ripple in PB |  | dB |  | 0.8 | 1.2 |
|  | RL in PB |  | dB | 12 | 15 |  |
|  | Attenuation | 30 to 1000 | dB | 40 | 45 |  |
|  |  | 1000 to 2700 |  | 35 | 40 |  |
|  |  | 3300 to 4200 |  | 30 | 35 |  |
|  |  | 4400 to 5000 |  | 30 | 35 |  |
|  |  | 6105 to 7125 |  | 50 | 55 |  |
|  |  | 7300 to 8000 |  | 25 | 25 |  |
|  |  | 10000 to 11750 |  | 30 | 35 |  |
| Filter 2 | Center Freq | 6615 |  |  |  |  |
|  | Passband Freq | 6105-7125 |  |  |  |  |
|  | IL in PB |  | dB |  | 2 | 2.5 |
|  | Ripple in PB |  | dB |  | 0.8 | 1.2 |
|  | RL in PB |  | dB | 12 | 15 |  |
|  | Attenuation | 30 to 1000 | dB | 40 | 45 |  |
|  |  | 1000 to 2700 |  | 35 | 40 |  |
|  |  | 3300 to 4200 |  | 30 | 35 |  |
|  |  | 4400 to 5000 |  | 30 | 35 |  |
|  |  | 5170 to 5895 |  | 50 | 55 |  |
|  |  | 7300 to 8000 |  | 25 | 25 |  |
|  |  | 11500 to 14300 |  | 30 | 35 |  |
|  | Input Power |  | dBm |  | 28 | 30 |
|  | I/O |  |  | 50 ohms nominal all three ports | | |
|  | Operating Temp |  |  | -40 C |  | 85 C |
|  | Package Size |  |  | 2.5mm x 2.5mm x 0.8mm | | |

FIG. 69B

5.1-7.1GHz Wi-Fi6E COEXISTENCE ACOUSTIC WAVE RESONATOR RF DIPLEXER CIRCUIT

CROSS-REFERENCES TO RELATED APPLICATIONS

The present application is a continuation-in-part application of the following commonly owned patent application: U.S. patent application Ser. No. 17/151,552, filed Jan. 18, 2021. The present application also incorporates by reference, for all purposes, the following patent applications, all commonly owned: U.S. patent application Ser. No. 14/298,057, titled "RESONANCE CIRCUIT WITH A SINGLE CRYSTAL CAPACITOR DIELECTRIC MATERIAL", filed Jun. 6, 2014, now U.S. Pat. No. 9,673,384; U.S. patent application Ser. No. 14/298,076, titled "METHOD OF MANUFACTURE FOR SINGLE CRYSTAL CAPACITOR DIELECTRIC FOR A RESONANCE CIRCUIT", filed Jun. 6, 2014, now U.S. Pat. No. 9,537,465; U.S. patent application Ser. No. 14/298,100, titled "INTEGRATED CIRCUIT CONFIGURED WITH TWO OR MORE SINGLE CRYSTAL ACOUSTIC RESONATOR DEVICES", filed Jun. 6, 2014, now U.S. Pat. No. 9,571,061; U.S. patent application Ser. No. 14/341,314, titled "WAFER SCALE PACKAGING", filed Jul. 25, 2014, now U.S. Pat. No. 9,805,966; U.S. patent application Ser. No. 14/449,001, titled "MOBILE COMMUNICATION DEVICE CONFIGURED WITH A SINGLE CRYSTAL PIEZO RESONATOR STRUCTURE", filed Jul. 31, 2014, now U.S. Pat. No. 9,716,581; U.S. patent application Ser. No. 14/469,503, titled "MEMBRANE SUBSTRATE STRUCTURE FOR SINGLE CRYSTAL ACOUSTIC RESONATOR DEVICE", filed Aug. 26, 2014, now U.S. Pat. No. 9,917,568; and U.S. patent application Ser. No. 16/995,598, titled "RF BAW RESONATOR FILTER ARCHITECTURE FOR 6.5 GHZ WI-FI 6E COEXISTENCE AND OTHER ULTRA-WIDEBAND APPLICATIONS", filed Aug. 17, 2020.

BACKGROUND OF THE INVENTION

The present invention relates generally to electronic devices. More particularly, the present invention provides techniques related to a method of manufacture and a structure for bulk acoustic wave resonator devices, single crystal bulk acoustic wave resonator devices, single crystal filter and resonator devices, and the like. Merely by way of example, the invention has been applied to a single crystal resonator device for a communication device, mobile device, computing device, among others.

Mobile telecommunication devices have been successfully deployed world-wide. Over a billion mobile devices, including cell phones and smartphones, were manufactured in a single year and unit volume continues to increase year-over-year. With ramp of 4G/LTE in about 2012, and explosion of mobile data traffic, data rich content is driving the growth of the smartphone segment—which is expected to reach 2B per annum within the next few years. Coexistence of new and legacy standards and thirst for higher data rate requirements is driving RF complexity in smartphones. Unfortunately, limitations exist with conventional RF technology that is problematic, and may lead to drawbacks in the future.

With 4G LTE and 5G growing more popular by the day, wireless data communication demands high performance RF filters with frequencies around 5 GHz and higher. Bulk acoustic wave resonators (BAWR) using crystalline piezoelectric thin films are leading candidates for meeting such demands. Current BAWRs using polycrystalline piezoelectric thin films are adequate for bulk acoustic wave (BAW) filters operating at frequencies ranging from 1 to 3 GHz; however, the quality of the polycrystalline piezoelectric films degrades quickly as the thicknesses decrease below around 0.5 um, which is required for resonators and filters operating at frequencies around 5 GHz and above. Single crystalline or epitaxial piezoelectric thin films grown on compatible crystalline substrates exhibit good crystalline quality and high piezoelectric performance even down to very thin thicknesses, e.g., 0.4 um. Even so, there are challenges to using and transferring single crystal piezoelectric thin films in the manufacture of BAWR and BAW filters.

From the above, it is seen that techniques for improving methods of manufacture and structures for acoustic resonator devices are highly desirable.

BRIEF SUMMARY OF THE INVENTION

According to the present invention, techniques generally related to electronic devices are provided. More particularly, the present invention provides techniques related to a method of manufacture and structure for bulk acoustic wave resonator devices, single crystal resonator devices, single crystal filter and resonator devices, and the like. Merely by way of example, the invention has been applied to a single crystal resonator device for a communication device, mobile device, computing device, among others.

In an example, the present invention provides an RF diplexer circuit device. The diplexer can include a first filter circuit and a second filter circuit coupled to a multiplexer or inductor device. The first filter circuit can be configured to receive a first input signal and to produce a first filtered signal, while the second filter circuit configured to receive a second input signal and to produce a second filtered signal. Each of these filter circuits includes a plurality of series resonators and a plurality of shunt resonators. The multiplexer or inductor device is coupled to the first filter circuit and the second filter circuit and can be configured to select between the first filtered signal and the second filtered signal.

Each of the resonators can include a substrate member, which has a cavity region and an upper surface region contiguous with an opening in the first cavity region. Each resonator device can include a bottom electrode within a portion of the cavity region and a piezoelectric material overlying the upper surface region and the bottom electrode. Also, each resonator can include a top electrode overlying the piezoelectric material and the bottom electrode, as well as an insulating material overlying the top electrode and configured with a thickness to tune the resonator. As used, the terms "top" and "bottom" are not terms in reference to a direction of gravity. Rather, these terms are used in reference to each other in context of the present device and related circuits. Those of ordinary skill in the art would recognize other modifications, variations, and alternatives.

In an example, the piezoelectric materials can include single crystal materials, polycrystalline materials, or combinations thereof and the like. The piezoelectric materials can also include a substantially single crystal material that exhibits certain polycrystalline qualities, i.e., an essentially single crystal material. In a specific example, the first, second, third, and fourth piezoelectric materials are each essentially a single crystal aluminum nitride (AlN) bearing material or aluminum scandium nitride (AlScN) bearing material, a single crystal gallium nitride (GaN) bearing material or gallium aluminum nitride (GaAlN) bearing material, a magnesium hafnium aluminum nitride (MgHfAlN) material, or the like. In other specific examples, these piezoelectric materials each comprise a polycrystalline aluminum nitride (AlN) bearing material or aluminum scandium nitride (AlScN) bearing material, or a polycrystalline gallium nitride (GaN) bearing material or gallium aluminum nitride (GaAlN) bearing material, a magnesium hafnium aluminum nitride (MgHfAlN) material, or the like. In other examples, the piezoelectric materials can include aluminum gallium nitride ($Al_xGa_{1-x}N$) material or an aluminum scandium nitride ($Al_xSc_{1-x}N$) material characterized by a composition of $0 \leq X < 1.0$. As discussed previously, the thicknesses of the piezoelectric materials can vary, and in some cases can be greater than 250 nm.

In a specific example, the insulating materials include a silicon nitride bearing material, an oxide bearing material, or combinations thereof.

In an example, a first circuit response of the first filter can be configured between the first input port and the output port and configured from the serial configuration and the parallel configuration of the first filter device to achieve a first transmission loss from a first pass-band. Further, a second circuit response can be configured between the second input port and the output port and configured from the serial configuration and the parallel configuration of the second filter device to achieve a second transmission loss from a second pass-band.

In a specific example, the each of the pass-bands is characterized by a band edge on each side of the pass-band and having an amplitude difference ranging from 10 dB to 60 dB. Each of the pass-bands has a pair of band edges; each of which has a transition region from the pass-band to a stop band such that the transition region is no greater than 250 MHz. In another example, each of the pass-bands can include a pair of band edges and each of these band edges can have a transition region from the pass-band to a stop band such that the transition region ranges from 5 MHz to 250 MHz.

In an example, the resonators of the first and second filter devices can be configured in ladder configuration. In this case, the plurality of series resonators is configured in a serial configuration and the plurality of shunt resonators is configured in a parallel configuration. In a specific example, the serial configuration forms a resonance profile and an anti-resonance profile. The parallel configuration also forms a resonance profile and an anti-resonance profile. These profiles are such that the resonance profile from the serial configuration is off-set with the anti-resonance profile of the parallel configuration to form the pass-band.

In an example, the resonators of the first and second filter devices can be configured in a lattice configuration. In this case, the plurality of series resonators includes a first plurality configured in a first serial configuration and a second plurality configured in a second serial configuration. The plurality of shunt resonators includes a plurality of shunt resonator pairs, each of which are cross-coupled between one of the first plurality of series resonators in the first serial configuration and one of the second plurality of series resonators in the second serial configuration. In a specific example, this lattice configuration can include a plurality of baluns or inductors, each of which is coupled between the first and second serial configurations and configured between each of the plurality of shunt resonator pairs.

One or more benefits are achieved over pre-existing techniques using the invention. In particular, the present device can be manufactured in a relatively simple and cost-effective manner while using conventional materials and/or methods according to one of ordinary skill in the art. The present device provides an ultra-small form factor RF resonator filter with high rejection, high power rating, and low insertion loss. Such filters or resonators can be implemented in an RF filter device, an RF filter system, or the like. Depending upon the embodiment, one or more of these benefits may be achieved.

A further understanding of the nature and advantages of the invention may be realized by reference to the latter portions of the specification and attached drawings.

BRIEF DESCRIPTION OF THE DRAWINGS

In order to more fully understand the present invention, reference is made to the accompanying drawings. Understanding that these drawings are not to be considered limitations in the scope of the invention, the presently described embodiments and the presently understood best mode of the invention are described with additional detail through use of the accompanying drawings in which:

FIGS. 4D and 4E are simplified diagrams illustrating an alternative method for conducting the method step of forming a topside micro-trench as described in FIG. 4A.

FIGS. 16A-16C through FIGS. 31A-31C are simplified diagrams illustrating various cross-sectional views of a single crystal acoustic resonator device and of method steps for a transfer process using a sacrificial layer for single crystal acoustic resonator devices according to an example of the present invention.

FIGS. 32A-32C through FIGS. 46A-46C are simplified diagrams illustrating various cross-sectional views of a single crystal acoustic resonator device and of method steps for a cavity bond transfer process for single crystal acoustic resonator devices according to an example of the present invention.

FIGS. 59A-59C are simplified diagrams illustrating various cross-sectional views of a single crystal acoustic resonator device and of method steps for a solidly mounted transfer process for single crystal acoustic resonator devices according to an example of the present invention.

FIG. 60 is a simplified diagram illustrating filter passband requirements in a radio frequency spectrum according to an example of the present invention.

FIG. 64A is a simplified circuit diagram of a diplexer device according to an example of the present invention.

FIGS. 69A and 69B are simplified tables of filter parameters according to examples of the present invention.

DETAILED DESCRIPTION OF THE INVENTION

According to the present invention, techniques generally related to electronic devices are provided. More particularly, the present invention provides techniques related to a method of manufacture and structure for bulk acoustic wave resonator devices, single crystal resonator devices, single crystal filter and resonator devices, and the like. Merely by way of example, the invention has been applied to a single crystal resonator device for a communication device, mobile device, computing device, among others.

Figure 1A:
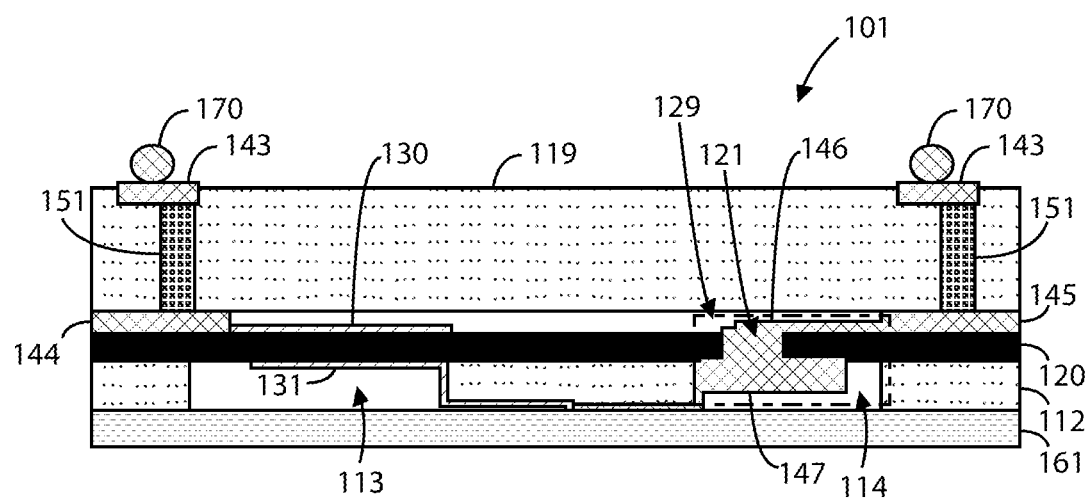
FIG. 1A is a simplified diagram illustrating an acoustic resonator device having topside interconnections according to an example of the present invention.

FIG. 1A is a simplified diagram illustrating an acoustic resonator device 101 having topside interconnections according to an example of the present invention. As shown, device 101 includes a thinned seed substrate 112 with an overlying single crystal piezoelectric layer 120, which has a micro-via 129. The micro-via 129 can include a topside micro-trench 121, a topside metal plug 146, a backside trench 114, and a backside metal plug 147. Although device 101 is depicted with a single micro-via 129, device 101 may have multiple micro-vias. A topside metal electrode 130 is formed overlying the piezoelectric layer 120. A top cap structure is bonded to the piezoelectric layer 120. This top cap structure includes an interposer substrate 119 with one or more through-vias 151 that are connected to one or more top bond pads 143, one or more bond pads 144, and topside metal 145 with topside metal plug 146. Solder balls 170 are electrically coupled to the one or more top bond pads 143.

The thinned substrate 112 has the first and second backside trenches 113, 114. A backside metal electrode 131 is formed underlying a portion of the thinned seed substrate 112, the first backside trench 113, and the topside metal electrode 130. The backside metal plug 147 is formed underlying a portion of the thinned seed substrate 112, the second backside trench 114, and the topside metal 145. This backside metal plug 147 is electrically coupled to the topside metal plug 146 and the backside metal electrode 131. A backside cap structure 161 is bonded to the thinned seed substrate 112, underlying the first and second backside trenches 113, 114. Further details relating to the method of manufacture of this device will be discussed starting from FIG. 2.

Figure 1B:
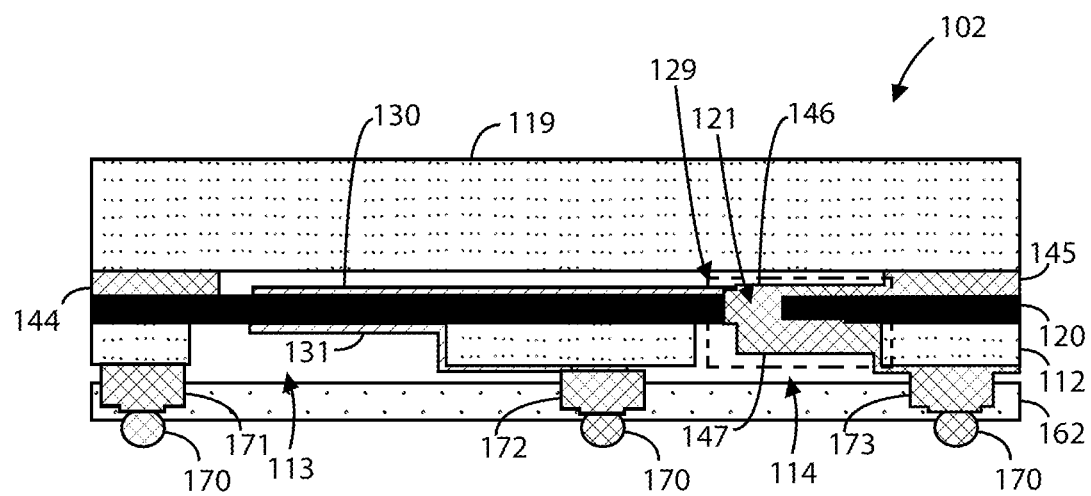
FIG. 1B is a simplified diagram illustrating an acoustic resonator device having bottom-side interconnections according to an example of the present invention.

FIG. 1B is a simplified diagram illustrating an acoustic resonator device 102 having backside interconnections according to an example of the present invention. As shown, device 101 includes a thinned seed substrate 112 with an overlying piezoelectric layer 120, which has a micro-via 129. The micro-via 129 can include a topside micro-trench 121, a topside metal plug 146, a backside trench 114, and a backside metal plug 147. Although device 102 is depicted with a single micro-via 129, device 102 may have multiple micro-vias. A topside metal electrode 130 is formed overlying the piezoelectric layer 120. A top cap structure is bonded to the piezoelectric layer 120. This top cap structure 119 includes bond pads which are connected to one or more bond pads 144 and topside metal 145 on piezoelectric layer 120. The topside metal 145 includes a topside metal plug 146.

The thinned substrate 112 has the first and second backside trenches 113, 114. A backside metal electrode 131 is formed underlying a portion of the thinned seed substrate 112, the first backside trench 113, and the topside metal electrode 130. A backside metal plug 147 is formed underlying a portion of the thinned seed substrate 112, the second backside trench 114, and the topside metal plug 146. This backside metal plug 147 is electrically coupled to the topside metal plug 146. A backside cap structure 162 is bonded to the thinned seed substrate 112, underlying the first and second backside trenches. One or more backside bond pads (171, 172, 173) are formed within one or more portions of the backside cap structure 162. Solder balls 170 are electrically coupled to the one or more backside bond pads 171-173. Further details relating to the method of manufacture of this device will be discussed starting from FIG. 14A.

Figure 1C:
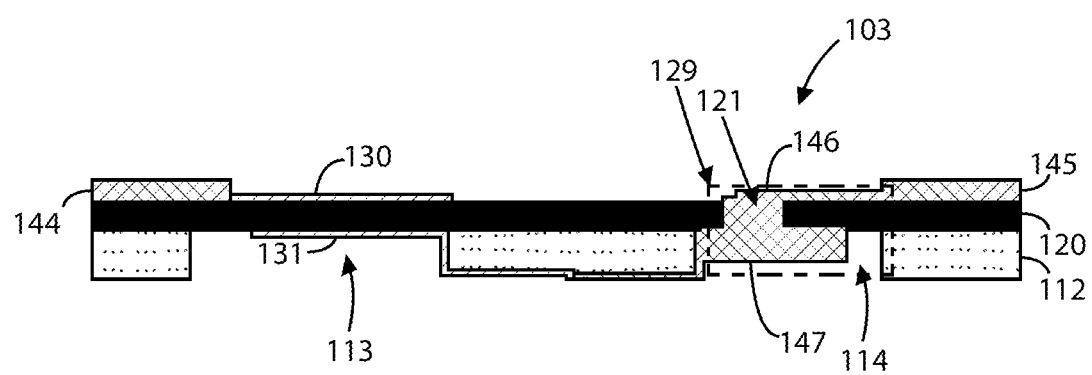
FIG. 1C is a simplified diagram illustrating an acoustic resonator device having interposer/cap-free structure interconnections according to an example of the present invention.

FIG. 1C is a simplified diagram illustrating an acoustic resonator device having interposer/cap-free structure interconnections according to an example of the present invention. As shown, device 103 includes a thinned seed substrate 112 with an overlying single crystal piezoelectric layer 120, which has a micro-via 129. The micro-via 129 can include a topside micro-trench 121, a topside metal plug 146, a backside trench 114, and a backside metal plug 147. Although device 103 is depicted with a single micro-via 129, device 103 may have multiple micro-vias. A topside metal electrode 130 is formed overlying the piezoelectric layer 120. The thinned substrate 112 has the first and second backside trenches 113, 114. A backside metal electrode 131 is formed underlying a portion of the thinned seed substrate 112, the first backside trench 113, and the topside metal electrode 130. A backside metal plug 147 is formed underlying a portion of the thinned seed substrate 112, the second backside trench 114, and the topside metal 145. This backside metal plug 147 is electrically coupled to the topside metal plug 146 and the backside metal electrode 131. Further details relating to the method of manufacture of this device will be discussed starting from FIG. 2.

Figure 1D:
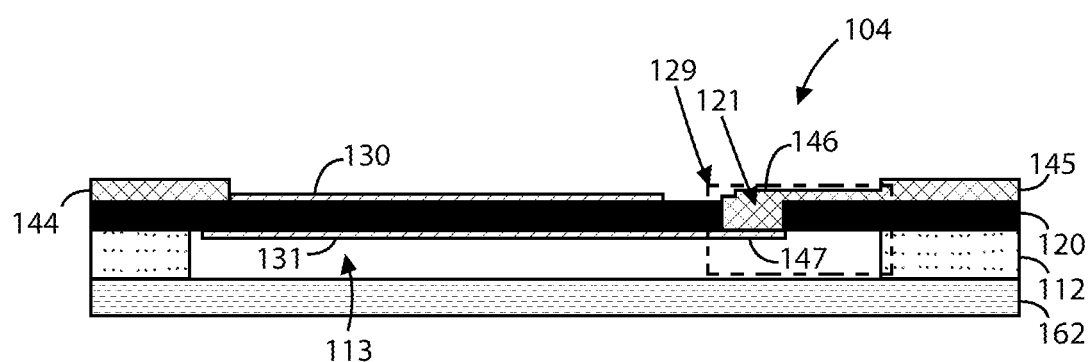
FIG. 1D is a simplified diagram illustrating an acoustic resonator device having interposer/cap-free structure interconnections with a shared backside trench according to an example of the present invention.

FIG. 1D is a simplified diagram illustrating an acoustic resonator device having interposer/cap-free structure interconnections with a shared backside trench according to an example of the present invention. As shown, device 104 includes a thinned seed substrate 112 with an overlying single crystal piezoelectric layer 120, which has a micro-via 129. The micro-via 129 can include a topside micro-trench 121, a topside metal plug 146, and a backside metal 147. Although device 104 is depicted with a single micro-via 129, device 104 may have multiple micro-vias. A topside metal electrode 130 is formed overlying the piezoelectric layer 120. The thinned substrate 112 has a first backside trench 113. A backside metal electrode 131 is formed underlying a portion of the thinned seed substrate 112, the first backside trench 113, and the topside metal electrode 130. A backside metal 147 is formed underlying a portion of the thinned seed substrate 112, the second backside trench 114, and the topside metal 145. This backside metal 147 is electrically coupled to the topside metal plug 146 and the backside metal electrode 131. Further details relating to the method of manufacture of this device will be discussed starting from FIG. 2.

Figure 2:
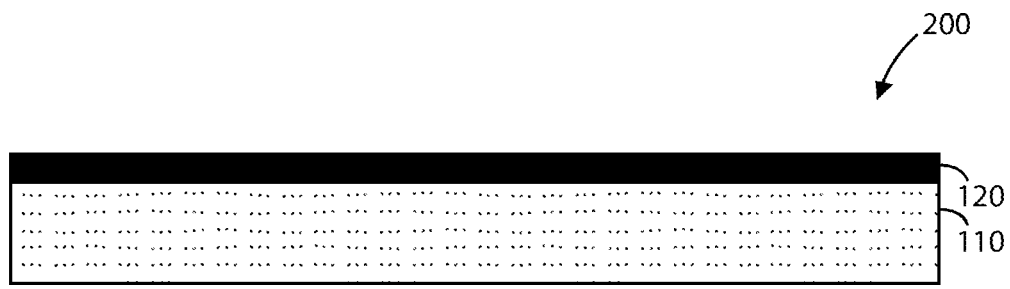
FIGS. 2 and 3 are simplified diagrams illustrating steps for a method of manufacture for an acoustic resonator device according to an example of the present invention.
Figure 3:
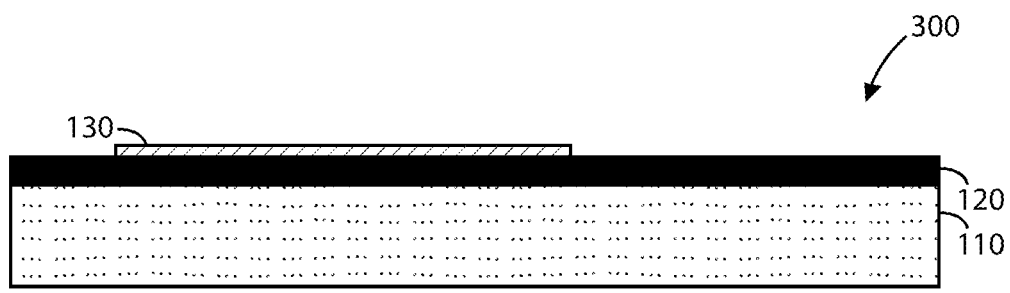

FIGS. 2 and 3 are simplified diagrams illustrating steps for a method of manufacture for an acoustic resonator device according to an example of the present invention. This method illustrates the process for fabricating an acoustic resonator device similar to that shown in FIG. 1A. FIG. 2 can represent a method step of providing a partially processed piezoelectric substrate. As shown, device 102 includes a seed substrate 110 with a piezoelectric layer 120 formed overlying. In a specific example, the seed substrate can include silicon, silicon carbide, aluminum oxide, or single crystal aluminum gallium nitride materials, or the like. The piezoelectric layer 120 can include a piezoelectric single crystal layer or a thin film piezoelectric single crystal layer.

FIG. 3 can represent a method step of forming a top side metallization or top resonator metal electrode 130. In a specific example, the topside metal electrode 130 can include a molybdenum, aluminum, ruthenium, or titanium material, or the like and combinations thereof. This layer can be deposited and patterned on top of the piezoelectric layer by a lift-off process, a wet etching process, a dry etching process, a metal printing process, a metal laminating process, or the like. The lift-off process can include a sequential process of lithographic patterning, metal deposition, and lift-off steps to produce the topside metal layer. The wet/dry etching processes can includes sequential processes of metal deposition, lithographic patterning, metal deposition, and metal etching steps to produce the topside metal layer. Those of ordinary skill in the art will recognize other variations, modifications, and alternatives.

Figure 4A:
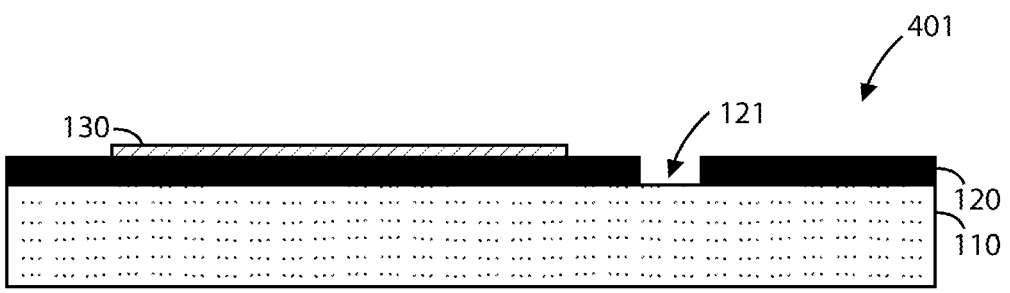
FIG. 4A is a simplified diagram illustrating a step for a method creating a topside micro-trench according to an example of the present invention.
Figure 4B:
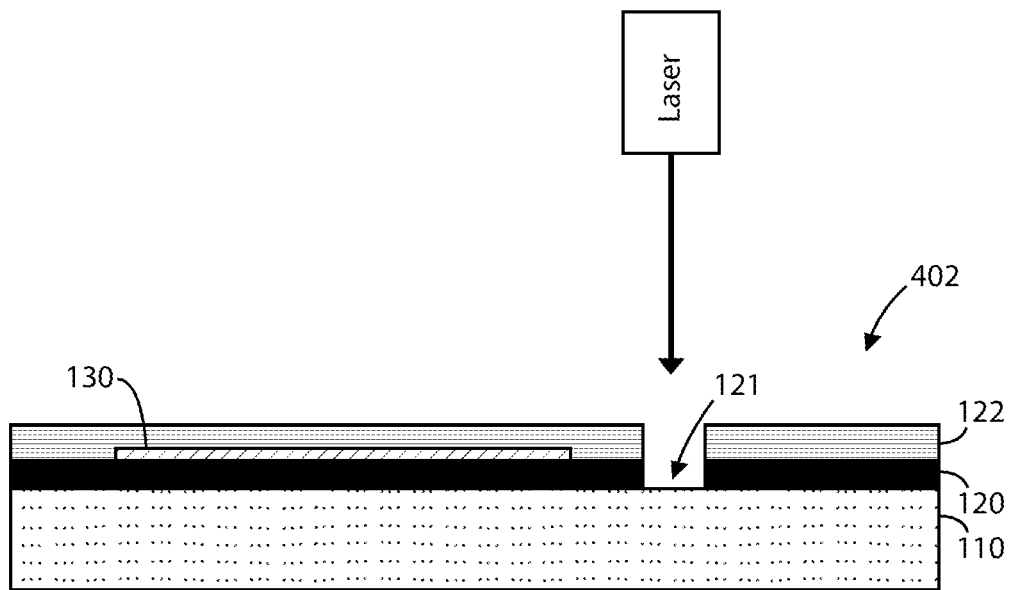
FIGS. 4B and 4C are simplified diagrams illustrating alternative methods for conducting the method step of forming a topside micro-trench as described in FIG. 4A.
Figure 4C:
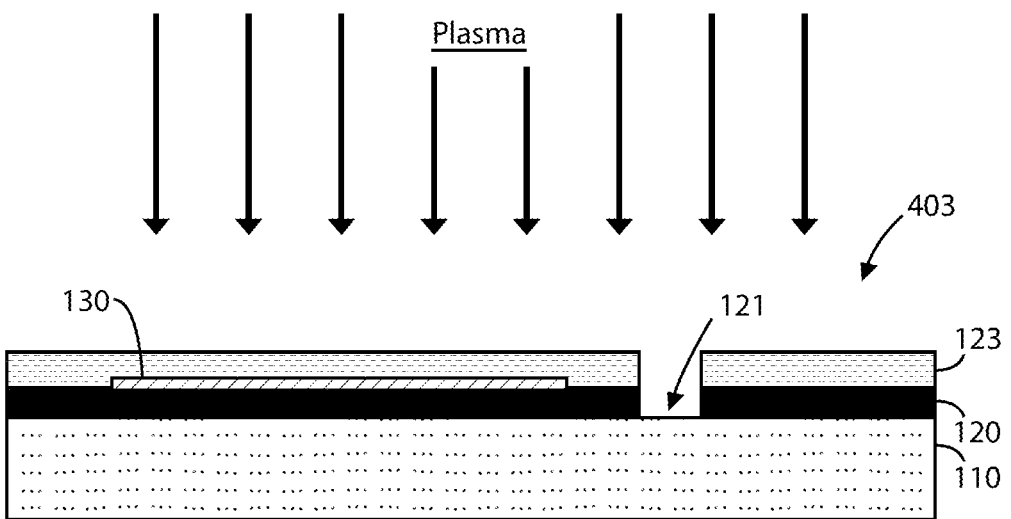

FIG. 4A is a simplified diagram illustrating a step for a method of manufacture for an acoustic resonator device 401 according to an example of the present invention. This figure can represent a method step of forming one or more topside micro-trenches 121 within a portion of the piezoelectric layer 120. This topside micro-trench 121 can serve as the main interconnect junction between the top and bottom sides of the acoustic membrane, which will be developed in later method steps. In an example, the topside micro-trench 121 is extends all the way through the piezoelectric layer 120 and stops in the seed substrate 110. This topside micro-trench 121 can be formed through a dry etching process, a laser drilling process, or the like. FIGS. 4B and 4C describe these options in more detail.

FIGS. 4B and 4C are simplified diagrams illustrating alternative methods for conducting the method step as described in FIG. 4A. As shown, FIG. 4B represents a method step of using a laser drill, which can quickly and accurately form the topside micro-trench 121 in the piezoelectric layer 120. In an example, the laser drill can be used to form nominal 50 um holes, or holes between 10 um and 500 um in diameter, through the piezoelectric layer 120 and stop in the seed substrate 110 below the interface between layers 120 and 110. A protective layer 122 can be formed overlying the piezoelectric layer 120 and the topside metal electrode 130. This protective layer 122 can serve to protect the device from laser debris and to provide a mask for the etching of the topside micro-via 121. In a specific example, the laser drill can be an 11W high power diode-pumped UV laser, or the like. This mask 122 can be subsequently removed before proceeding to other steps. The mask may also be omitted from the laser drilling process, and air flow can be used to remove laser debris.

FIG. 4C can represent a method step of using a dry etching process to form the topside micro-trench 121 in the piezoelectric layer 120. As shown, a lithographic masking layer 123 can be forming overlying the piezoelectric layer 120 and the topside metal electrode 130. The topside micro-trench 121 can be formed by exposure to plasma, or the like.

FIGS. 4D and 4E are simplified diagrams illustrating an alternative method for conducting the method step as described in FIG. 4A. These figures can represent the method step of manufacturing multiple acoustic resonator devices simultaneously. In FIG. 4D, two devices are shown on Die #1 and Die #2, respectively. FIG. 4E shows the process of forming a micro-via 121 on each of these dies while also etching a scribe line 124 or dicing line. In an example, the etching of the scribe line 124 singulates and relieves stress in the piezoelectric single crystal layer 120.

Figure 5:
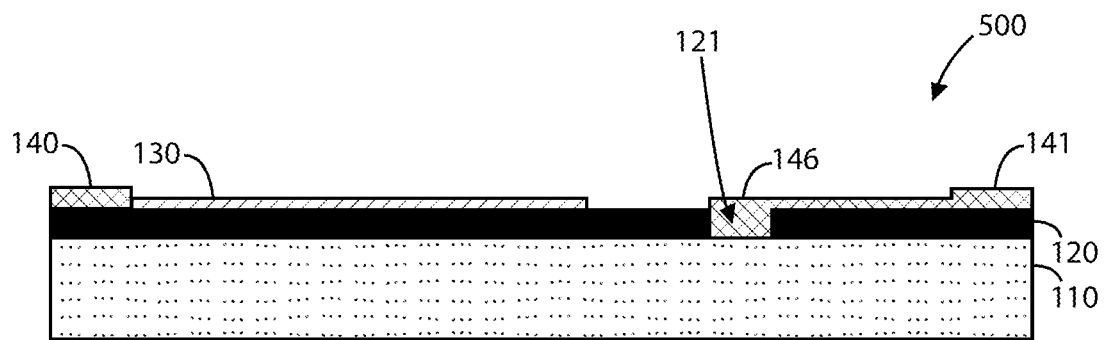
FIGS. 5 to 8 are simplified diagrams illustrating steps for a method of manufacture for an acoustic resonator device according to an example of the present invention.

FIGS. 5 to 8 are simplified diagrams illustrating steps for a method of manufacture for an acoustic resonator device according to an example of the present invention. FIG. 5 can represent the method step of forming one or more bond pads 140 and forming a topside metal 141 electrically coupled to at least one of the bond pads 140. The topside metal 141 can include a topside metal plug 146 formed within the topside micro-trench 121. In a specific example, the topside metal plug 146 fills the topside micro-trench 121 to form a topside portion of a micro-via.

In an example, the bond pads 140 and the topside metal 141 can include a gold material or other interconnect metal material depending upon the application of the device. These metal materials can be formed by a lift-off process, a wet etching process, a dry etching process, a screen-printing process, an electroplating process, a metal printing process, or the like. In a specific example, the deposited metal materials can also serve as bond pads for a cap structure, which will be described below.

Figure 6:
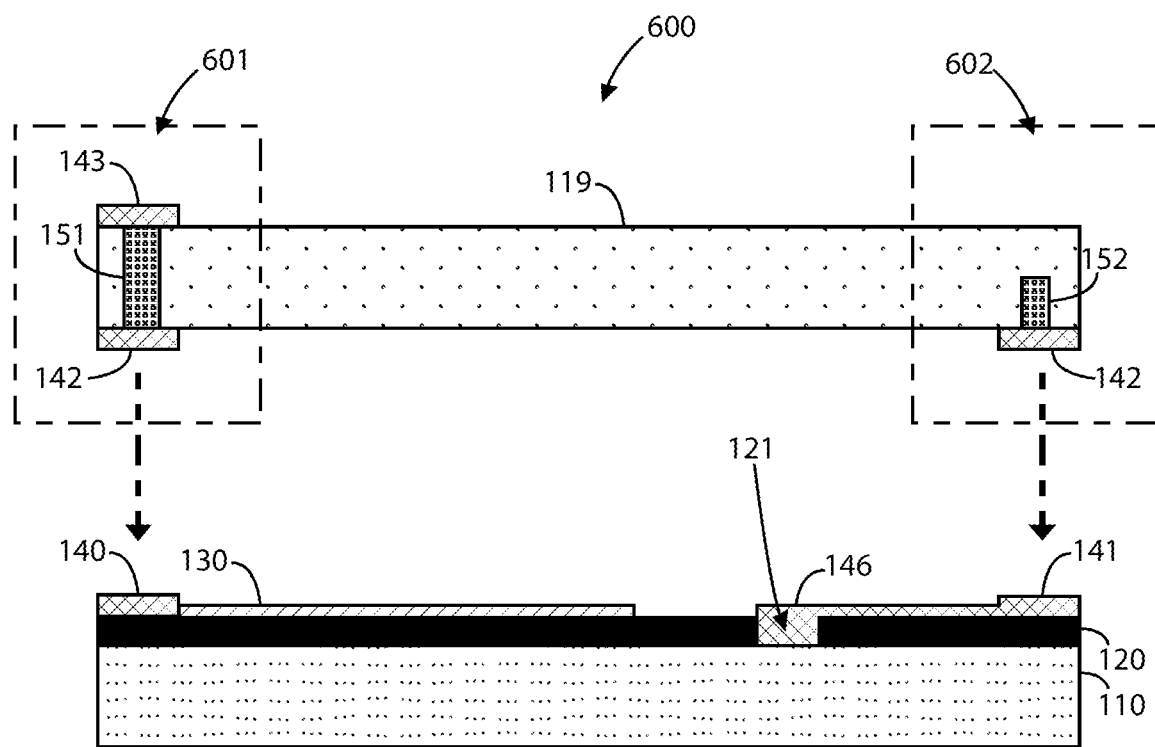

FIG. 6 can represent a method step for preparing the acoustic resonator device for bonding, which can be a hermetic bonding. As shown, a top cap structure is positioned above the partially processed acoustic resonator device as described in the previous figures. The top cap structure can be formed using an interposer substrate 119 in two configurations: fully processed interposer version 601 (through glass via) and partially processed interposer version 602 (blind via version). In the 601 version, the interposer substrate 119 includes through-via structures 151 that extend through the interposer substrate 119 and are electrically coupled to bottom bond pads 142 and top bond pads 143. In the 602 version, the interposer substrate 119 includes blind via structures 152 that only extend through a portion of the interposer substrate 119 from the bottom side. These blind via structures 152 are also electrically coupled to bottom bond pads 142. In a specific example, the interposer substrate can include a silicon, glass, smart-glass, or other like material.

Figure 7:
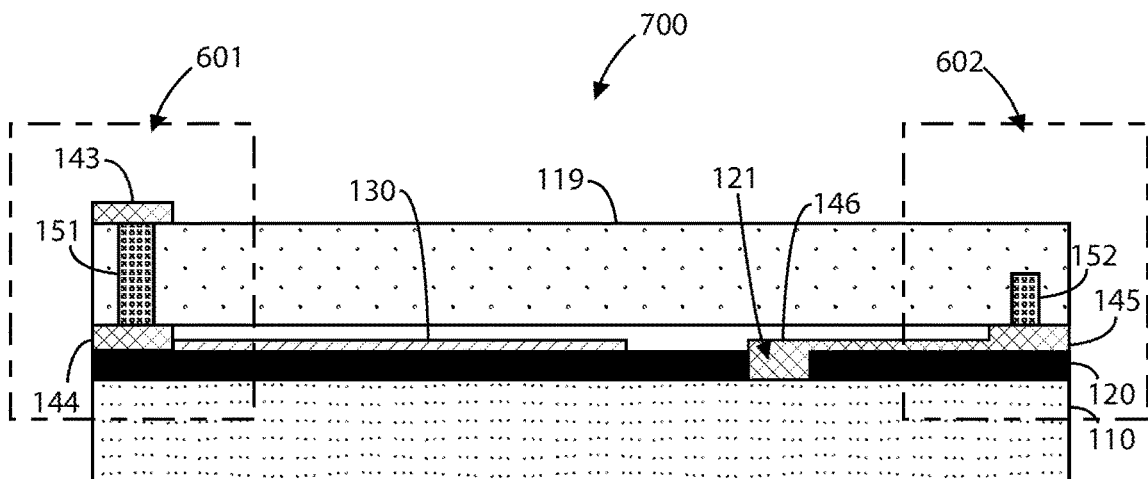
Figure 8:
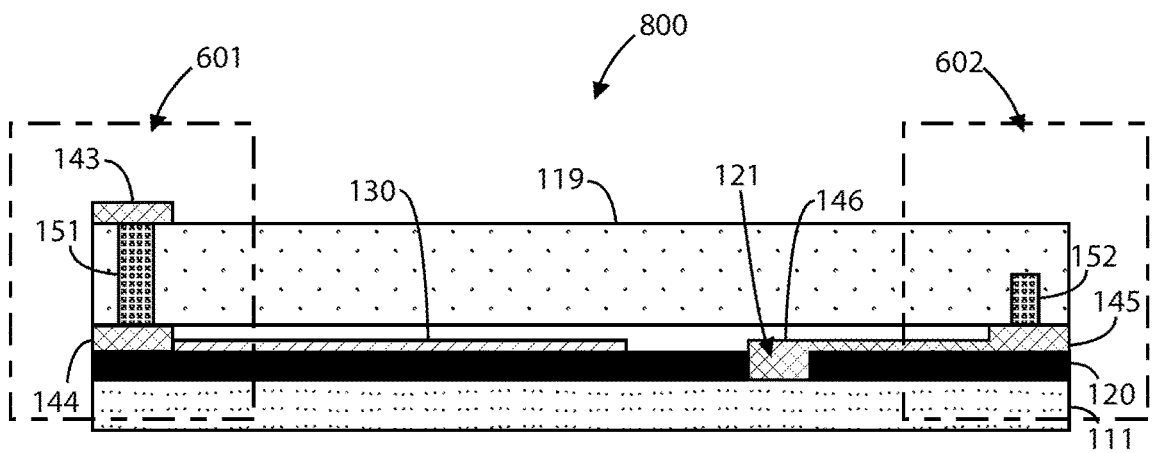

FIG. 7 can represent a method step of bonding the top cap structure to the partially processed acoustic resonator device. As shown, the interposer substrate 119 is bonded to the piezoelectric layer by the bond pads (140, 142) and the topside metal 141, which are now denoted as bond pad 144 and topside metal 145. This bonding process can be done using a compression bond method or the like. FIG. 8 can represent a method step of thinning the seed substrate 110, which is now denoted as thinned seed substrate 111. This substrate thinning process can include grinding and etching processes or the like. In a specific example, this process can include a wafer backgrinding process followed by stress removal, which can involve dry etching, CMP polishing, or annealing processes.

Figure 9A:
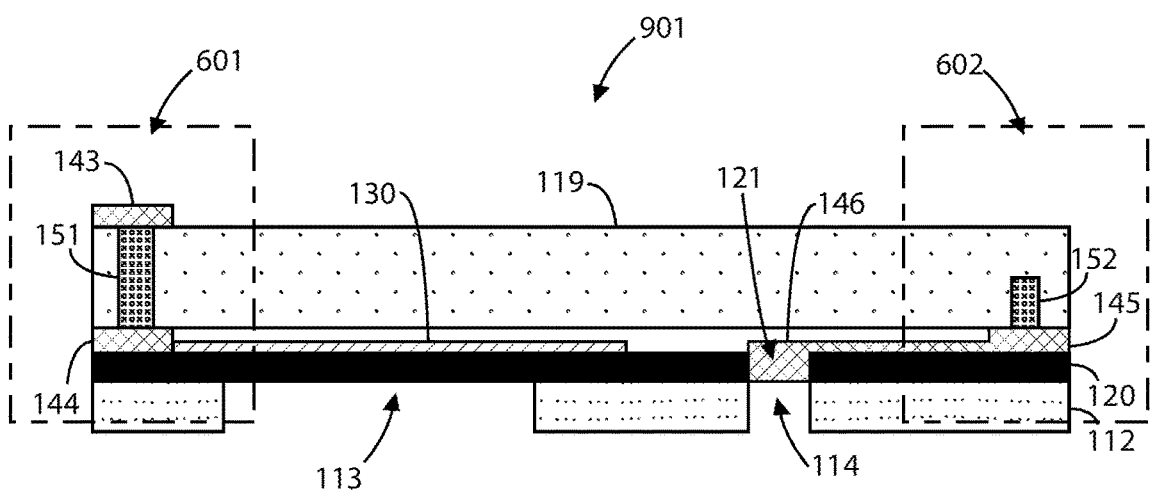
FIG. 9A is a simplified diagram illustrating a method step for forming backside trenches according to an example of the present invention.

FIG. 9A is a simplified diagram illustrating a step for a method of manufacture for an acoustic resonator device 901 according to an example of the present invention. FIG. 9A can represent a method step for forming backside trenches 113 and 114 to allow access to the piezoelectric layer from the backside of the thinned seed substrate 111. In an example, the first backside trench 113 can be formed within the thinned seed substrate 111 and underlying the topside metal electrode 130. The second backside trench 114 can be formed within the thinned seed substrate 111 and underlying the topside micro-trench 121 and topside metal plug 146. This substrate is now denoted thinned substrate 112. In a specific example, these trenches 113 and 114 can be formed using deep reactive ion etching (DRIE) processes, Bosch processes, or the like. The size, shape, and number of the trenches may vary with the design of the acoustic resonator device. In various examples, the first backside trench may be formed with a trench shape similar to a shape of the topside metal electrode or a shape of the backside metal electrode. The first backside trench may also be formed with a trench shape that is different from both a shape of the topside metal electrode and the backside metal electrode.

Figure 9B:
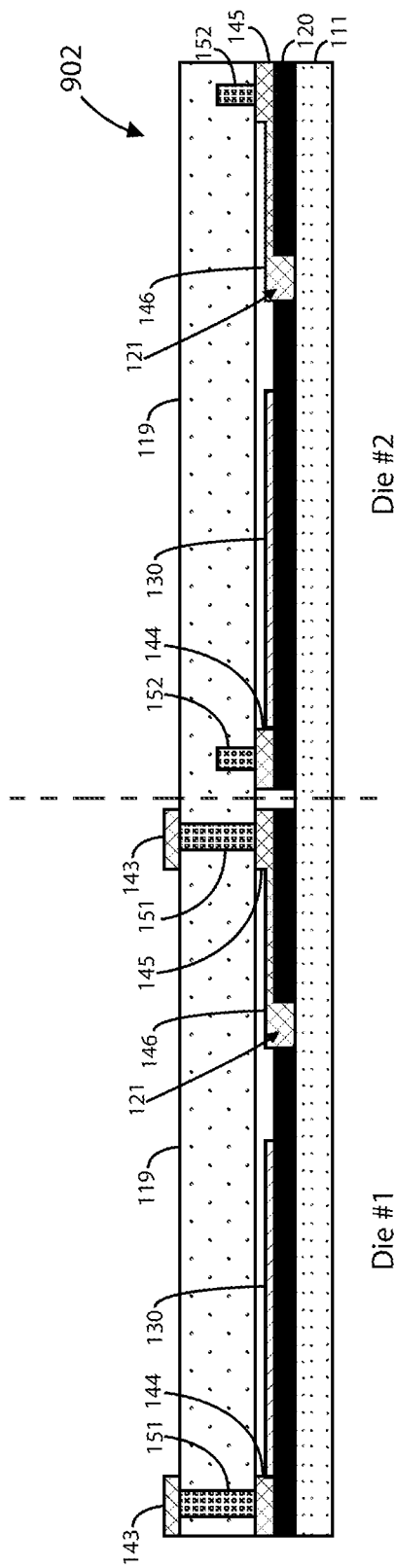
FIGS. 9B and 9C are simplified diagrams illustrating an alternative method for conducting the method step of forming backside trenches, as described in FIG. 9A, and simultaneously singulating a seed substrate according to an embodiment of the present invention.
Figure 9C:
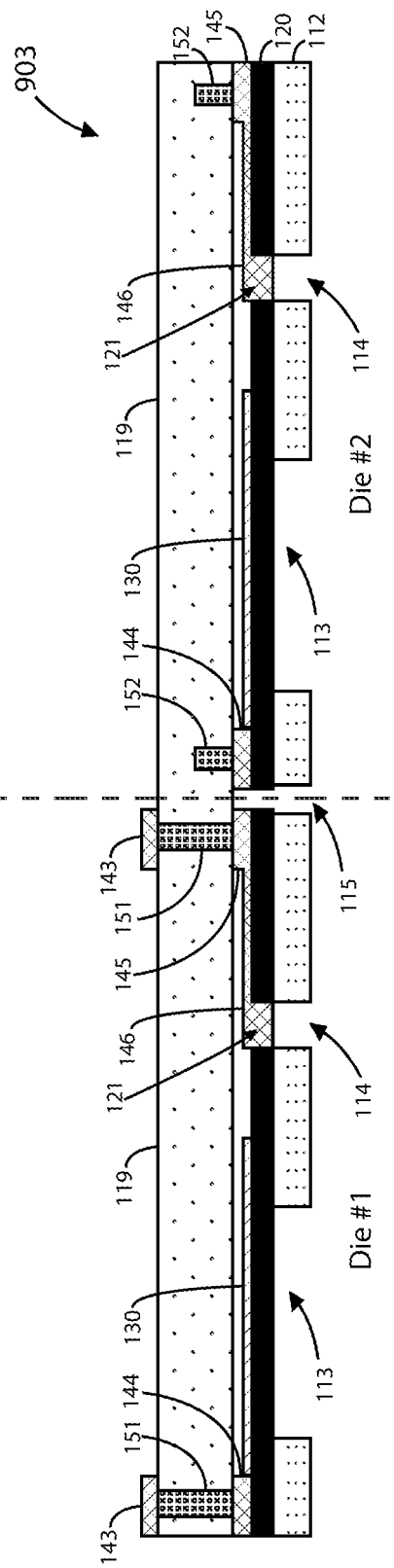

FIGS. 9B and 9C are simplified diagrams illustrating an alternative method for conducting the method step as described in FIG. 9A. Like FIGS. 4D and 4E, these figures can represent the method step of manufacturing multiple acoustic resonator devices simultaneously. In FIG. 9B, two devices with cap structures are shown on Die #1 and Die #2, respectively. FIG. 9C shows the process of forming backside trenches (113, 114) on each of these dies while also etching a scribe line 115 or dicing line. In an example, the etching of the scribe line 115 provides an optional way to singulate the backside wafer 112.

Figure 10:
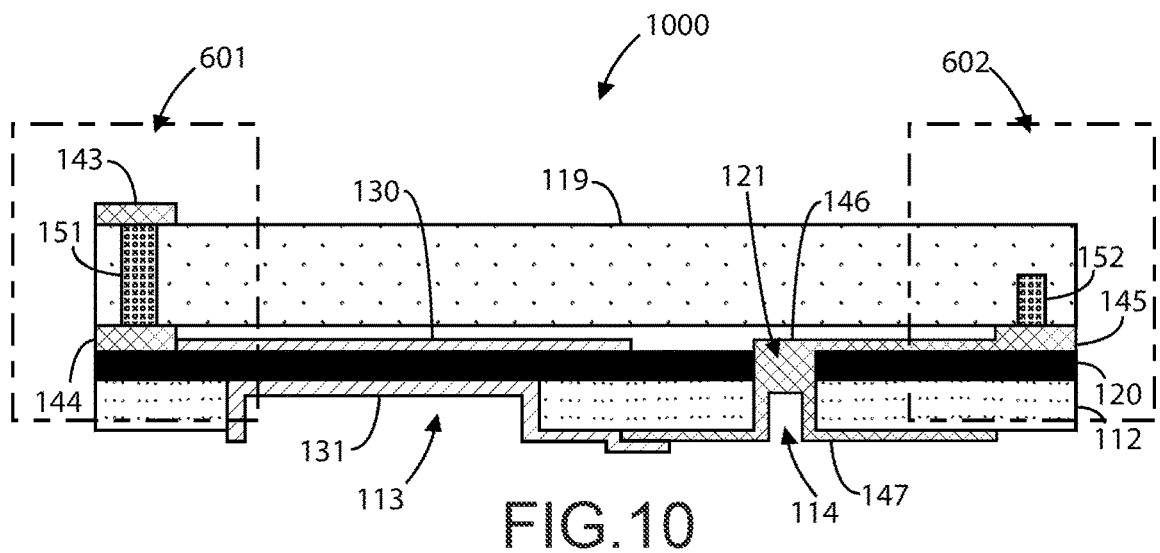
FIG. 10 is a simplified diagram illustrating a method step forming backside metallization and electrical interconnections between top and bottom sides of a resonator according to an example of the present invention.

FIG. 10 is a simplified diagram illustrating a step for a method of manufacture for an acoustic resonator device 1000 according to an example of the present invention. This figure can represent a method step of forming a backside metal electrode 131 and a backside metal plug 147 within the backside trenches of the thinned seed substrate 112. In an example, the backside metal electrode 131 can be formed underlying one or more portions of the thinned substrate 112, within the first backside trench 113, and underlying the topside metal electrode 130. This process completes the resonator structure within the acoustic resonator device. The backside metal plug 147 can be formed underlying one or more portions of the thinned substrate 112, within the second backside trench 114, and underlying the topside micro-trench 121. The backside metal plug 147 can be electrically coupled to the topside metal plug 146 and the backside metal electrode 131. In a specific example, the backside metal electrode 130 can include a molybdenum, aluminum, ruthenium, or titanium material, or the like and combinations thereof. The backside metal plug can include a gold material, low resistivity interconnect metals, electrode metals, or the like. These layers can be deposited using the deposition methods described previously.

Figure 11A:
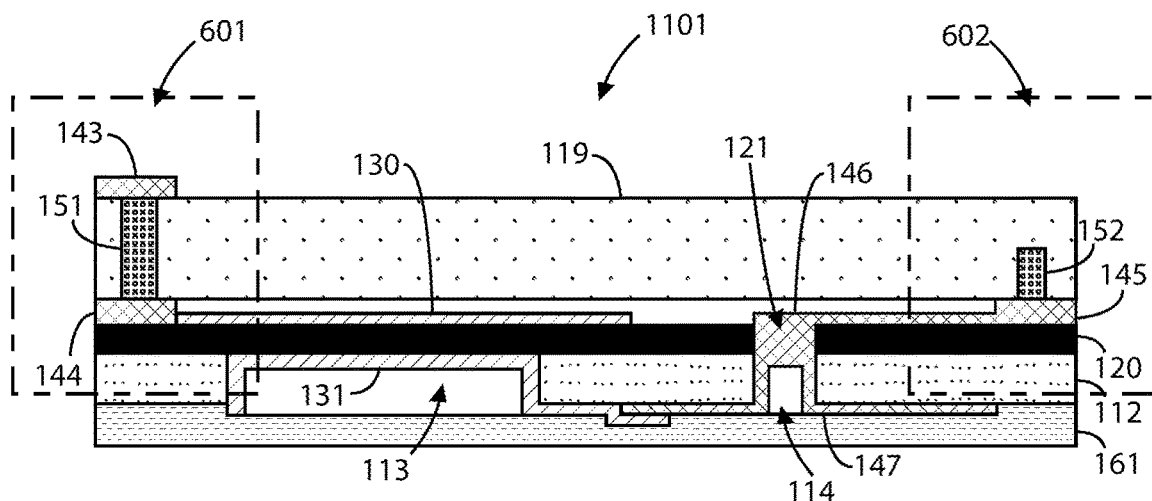
FIGS. 11A and 11B are simplified diagrams illustrating alternative steps for a method of manufacture for an acoustic resonator device according to an example of the present invention.
Figure 11B:
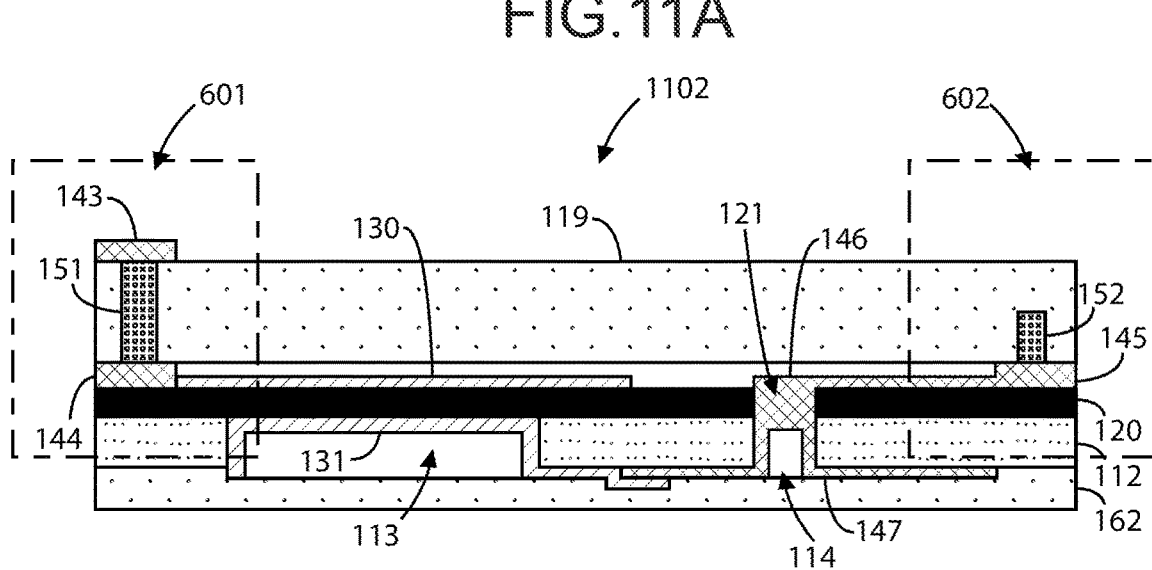

FIGS. 11A and 11B are simplified diagrams illustrating alternative steps for a method of manufacture for an acoustic resonator device according to an example of the present invention. These figures show methods of bonding a backside cap structure underlying the thinned seed substrate 112. In FIG. 11A, the backside cap structure is a dry film cap 161, which can include a permanent photo-imageable dry film such as a solder mask, polyimide, or the like. Bonding this cap structure can be cost-effective and reliable, but may not produce a hermetic seal. In FIG. 11B, the backside cap structure is a substrate 162, which can include a silicon, glass, or other like material. Bonding this substrate can provide a hermetic seal, but may cost more and require additional processes. Depending upon application, either of these backside cap structures can be bonded underlying the first and second backside vias.

Figure 12A:
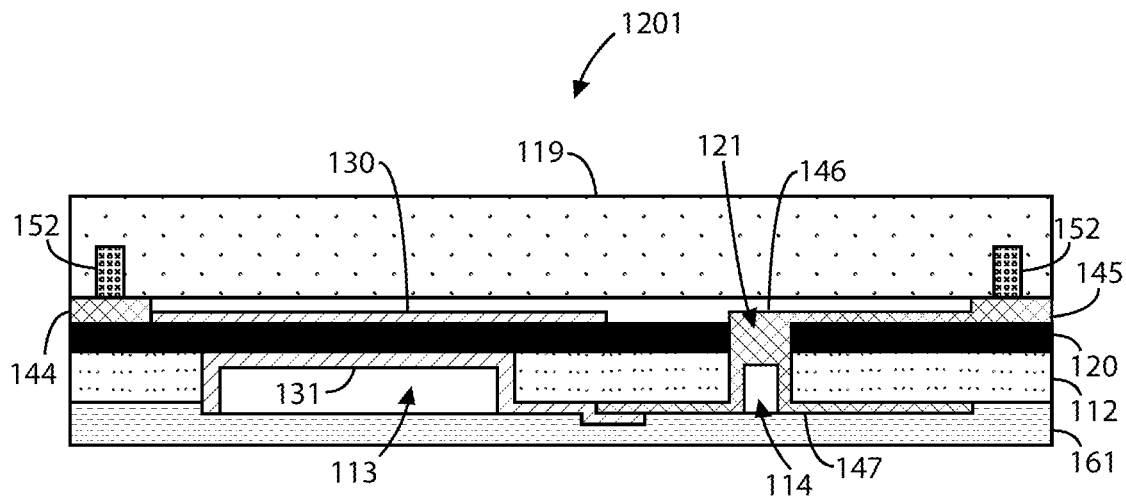
FIGS. 12A to 12E are simplified diagrams illustrating steps for a method of manufacture for an acoustic resonator device using a blind via interposer according to an example of the present invention.
Figure 12B:
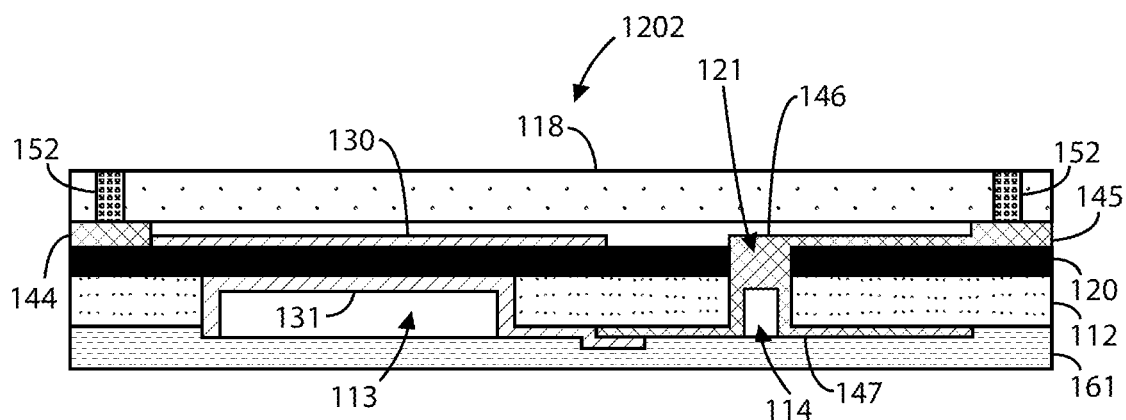
Figure 12C:
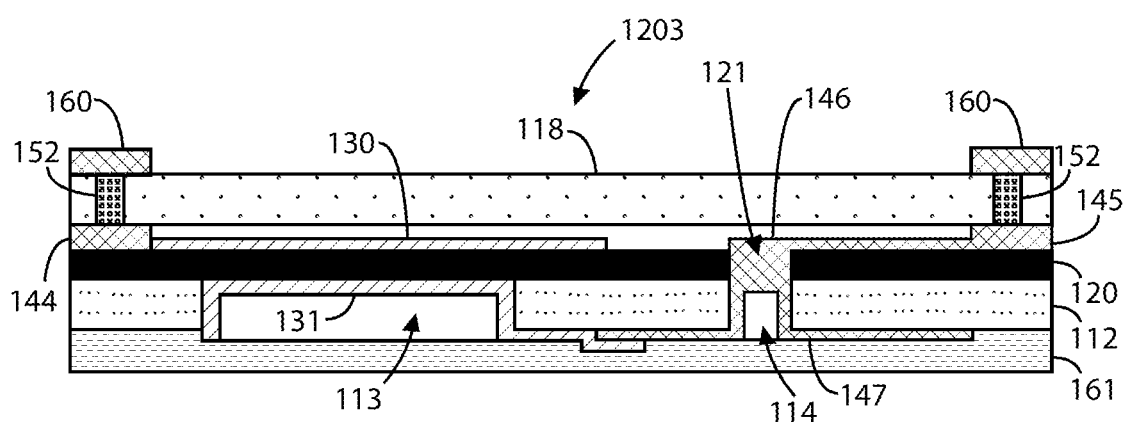
Figure 12D:
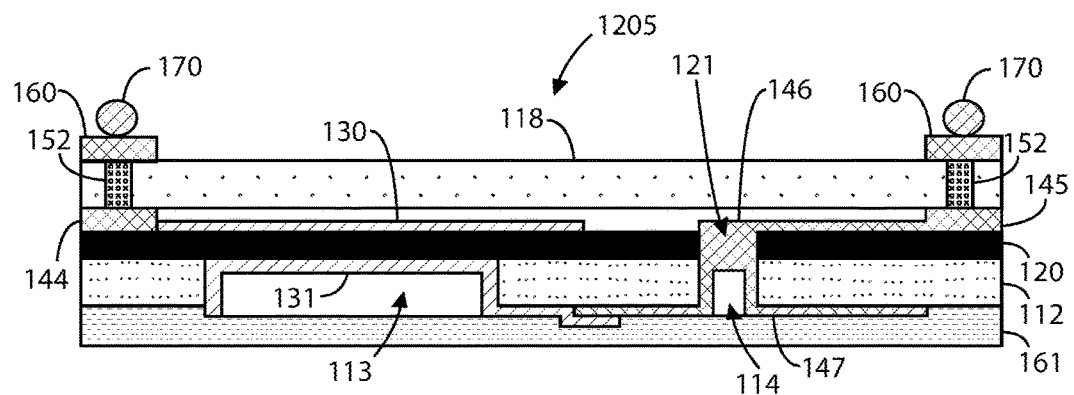
Figure 12E:
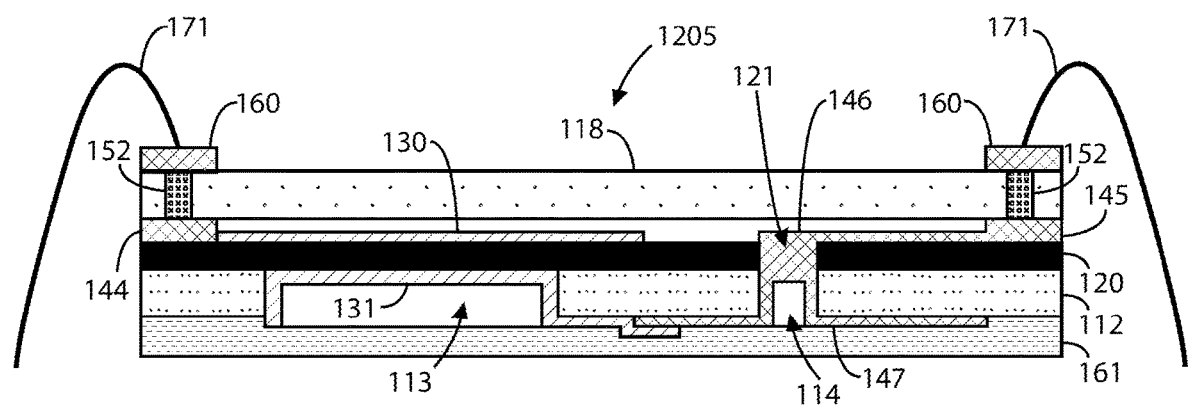

FIGS. 12A to 12E are simplified diagrams illustrating steps for a method of manufacture for an acoustic resonator device according to an example of the present invention. More specifically, these figures describe additional steps for processing the blind via interposer "602" version of the top cap structure. FIG. 12A shows an acoustic resonator device 1201 with blind vias 152 in the top cap structure. In FIG. 12B, the interposer substrate 119 is thinned, which forms a thinned interposer substrate 118, to expose the blind vias 152. This thinning process can be a combination of a grinding process and etching process as described for the thinning of the seed substrate. In FIG. 12C, a redistribution layer (RDL) process and metallization process can be applied to create top cap bond pads 160 that are formed overlying the blind vias 152 and are electrically coupled to the blind vias 152. As shown in FIG. 12D, a ball grid array (BGA) process can be applied to form solder balls 170 overlying and electrically coupled to the top cap bond pads 160. This process leaves the acoustic resonator device ready for wire bonding 171, as shown in FIG. 12E.

Figure 13:
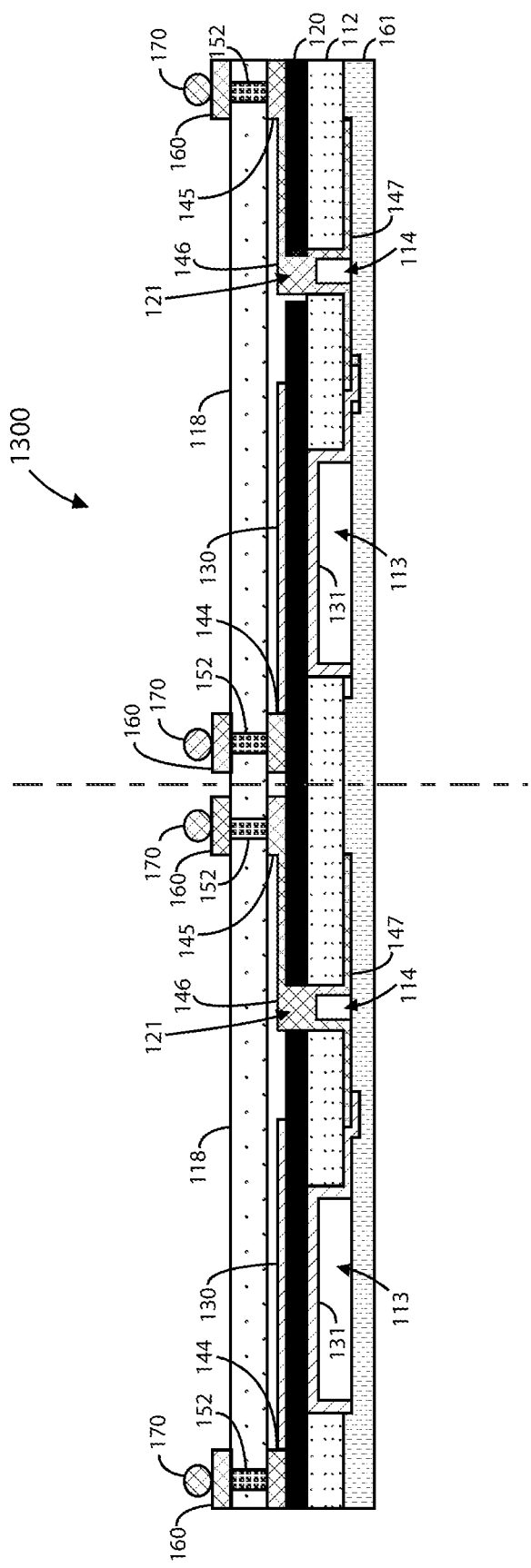
FIG. 13 is a simplified diagram illustrating a step for a method of manufacture for an acoustic resonator device according to an example of the present invention.

FIG. 13 is a simplified diagram illustrating a step for a method of manufacture for an acoustic resonator device according to an example of the present invention. As shown, device 1300 includes two fully processed acoustic resonator devices that are ready to singulation to create separate devices. In an example, the die singulation process can be done using a wafer dicing saw process, a laser cut singulation process, or other processes and combinations thereof.

Figure 14A:
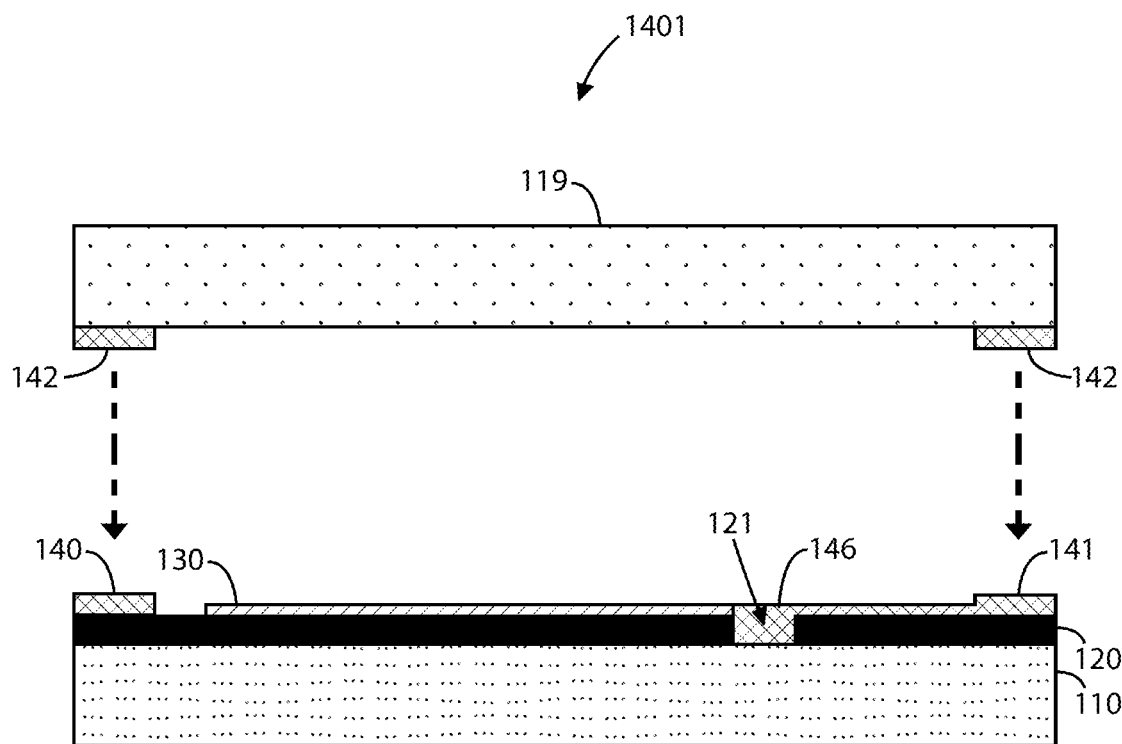
FIGS. 14A to 14G are simplified diagrams illustrating method steps for a cap wafer process for an acoustic resonator device according to an example of the present invention.

FIGS. 14A to 14G are simplified diagrams illustrating steps for a method of manufacture for an acoustic resonator device according to an example of the present invention. This method illustrates the process for fabricating an acoustic resonator device similar to that shown in FIG. 1B. The method for this example of an acoustic resonator can go through similar steps as described in FIGS. 1-5. FIG. 14A shows where this method differs from that described previously. Here, the top cap structure substrate 119 and only includes one layer of metallization with one or more bottom bond pads 142. Compared to FIG. 6, there are no via structures in the top cap structure because the interconnections will be formed on the bottom side of the acoustic resonator device.

Figure 14B:
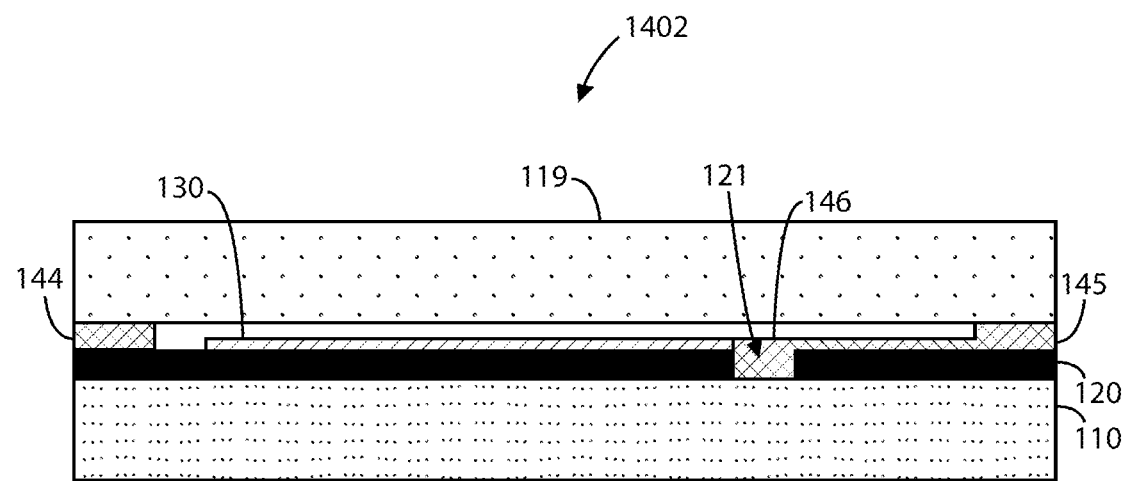
Figure 14C:
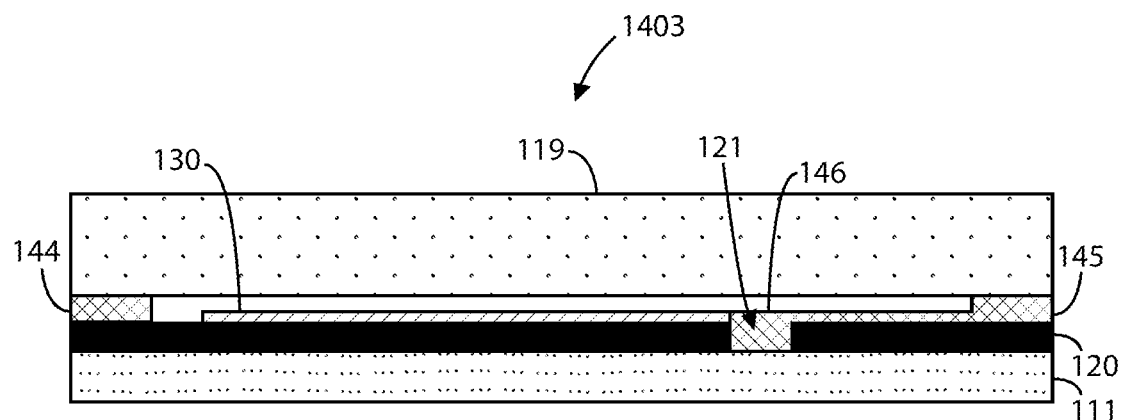
Figure 14D:
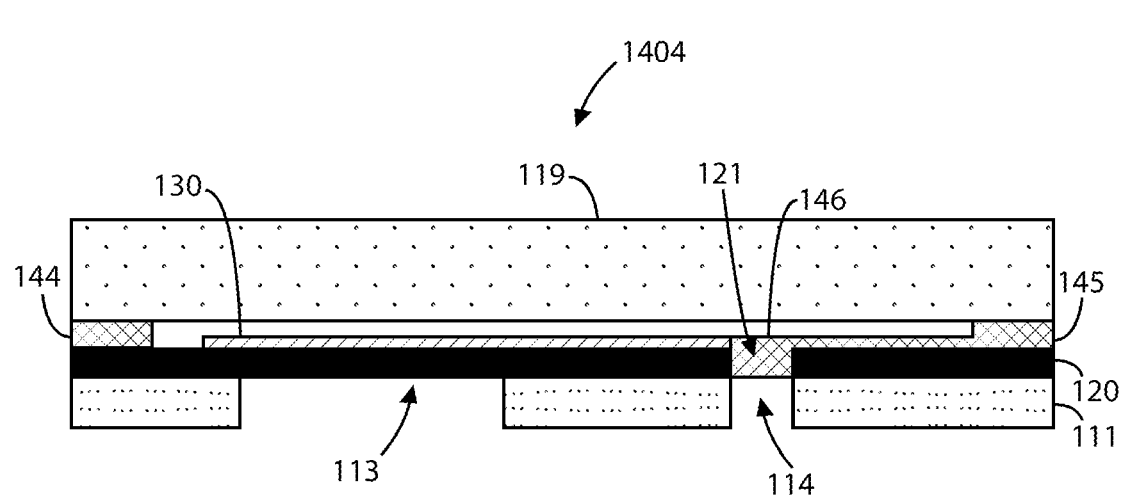
Figure 14E:
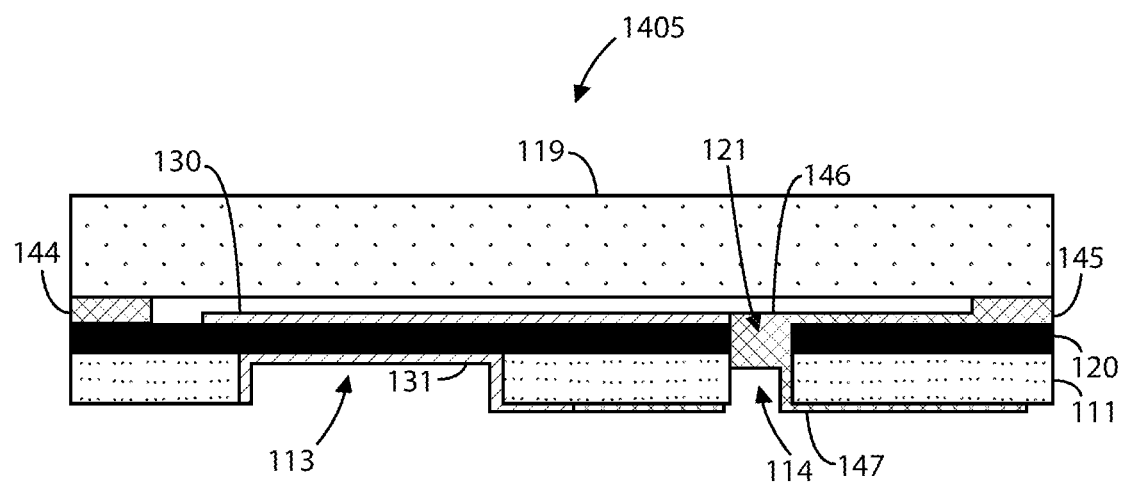
Figure 14F:
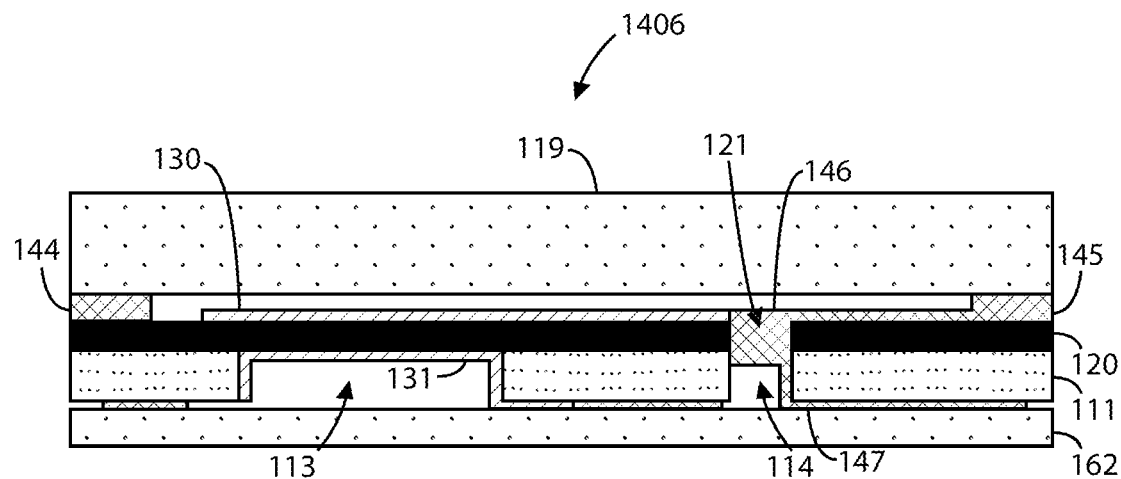

FIGS. 14B to 14F depict method steps similar to those described in the first process flow. FIG. 14B can represent a method step of bonding the top cap structure to the piezoelectric layer 120 through the bond pads (140, 142) and the topside metal 141, now denoted as bond pads 144 and topside metal 145 with topside metal plug 146. FIG. 14C can represent a method step of thinning the seed substrate 110, which forms a thinned seed substrate 111, similar to that described in FIG. 8. FIG. 14D can represent a method step of forming first and second backside trenches, similar to that described in FIG. 9A. FIG. 14E can represent a method step of forming a backside metal electrode 131 and a backside metal plug 147, similar to that described in FIG. 10. FIG. 14F can represent a method step of bonding a backside cap structure 162, similar to that described in FIGS. 11A and 11B.

Figure 14G:
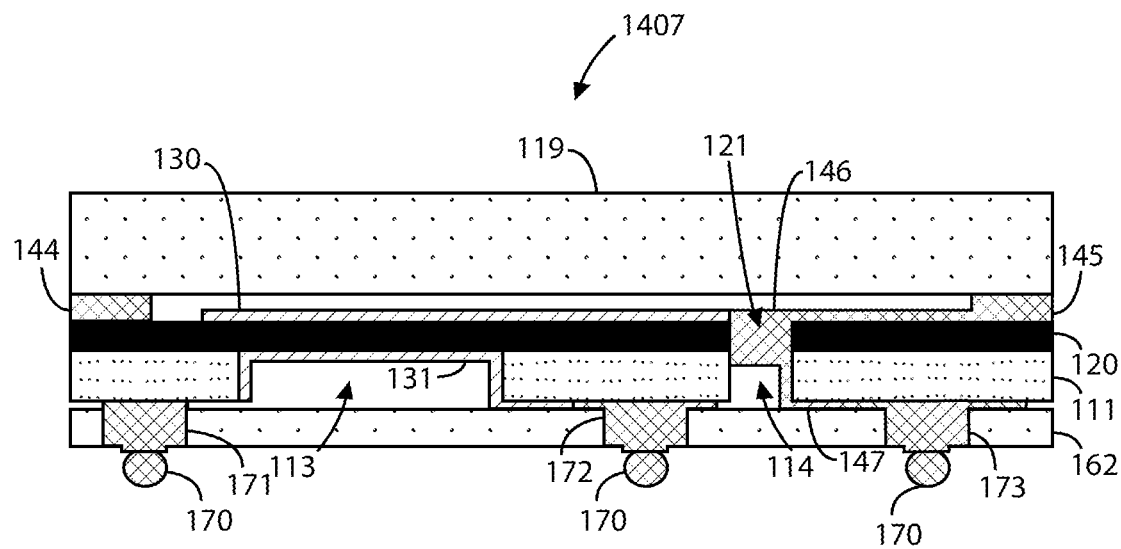

FIG. 14G shows another step that differs from the previously described process flow. Here, the backside bond pads 171, 172, and 173 are formed within the backside cap structure 162. In an example, these backside bond pads 171-173 can be formed through a masking, etching, and metal deposition processes similar to those used to form the other metal materials. A BGA process can be applied to form solder balls 170 in contact with these backside bond pads 171-173, which prepares the acoustic resonator device 1407 for wire bonding.

Figure 15A:
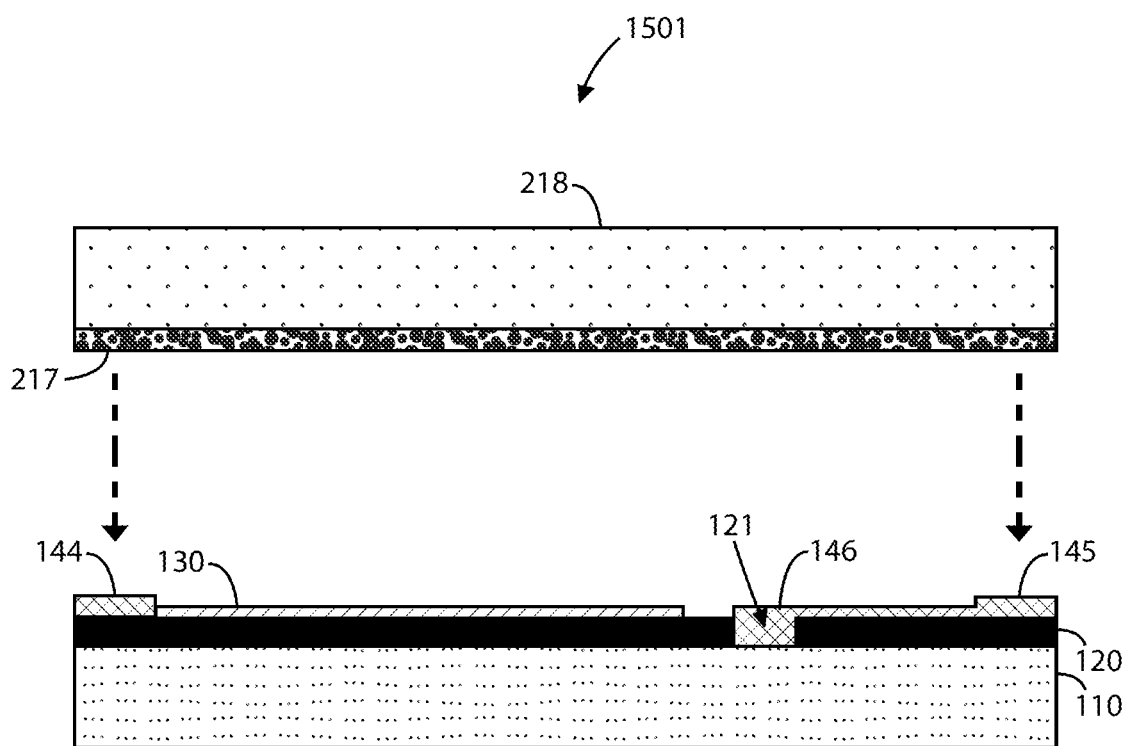
FIGS. 15A-15E are simplified diagrams illustrating method steps for making an acoustic resonator device with shared backside trench, which can be implemented in both interposer/cap and interposer free versions, according to examples of the present invention.

FIGS. 15A to 15E are simplified diagrams illustrating steps for a method of manufacture for an acoustic resonator device according to an example of the present invention. This method illustrates the process for fabricating an acoustic resonator device similar to that shown in FIG. 1B. The method for this example can go through similar steps as described in FIG. 1-5. FIG. 15A shows where this method differs from that described previously. A temporary carrier 218 with a layer of temporary adhesive 217 is attached to the substrate. In a specific example, the temporary carrier 218 can include a glass wafer, a silicon wafer, or other wafer and the like.

Figure 15B:
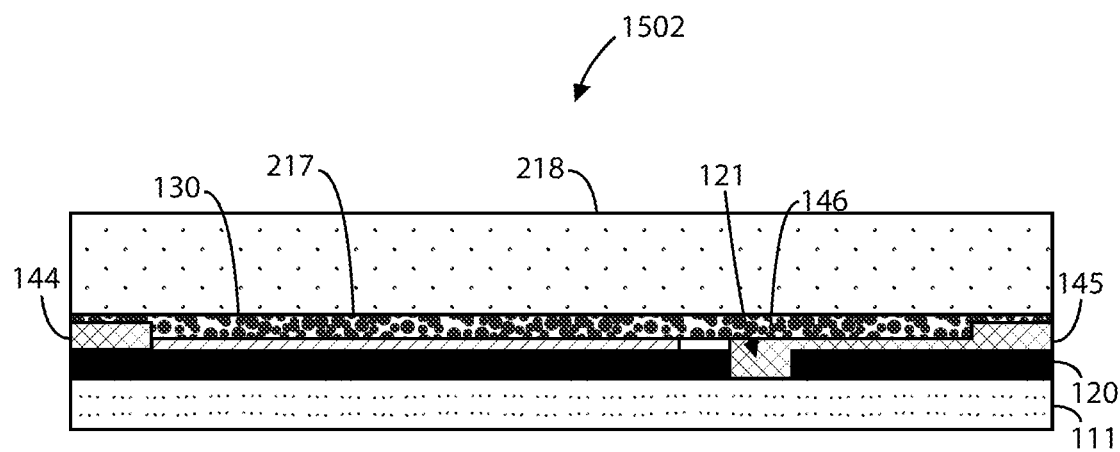

FIGS. 15B to 15F depict method steps similar to those described in the first process flow. FIG. 15B can represent a method step of thinning the seed substrate 110, which forms a thinned substrate 111, similar to that described in FIG. 8. In a specific example, the thinning of the seed substrate 110 can include a back side grinding process followed by a stress removal process. The stress removal process can include a dry etch, a Chemical Mechanical Planarization (CMP), and annealing processes.

Figure 15C:
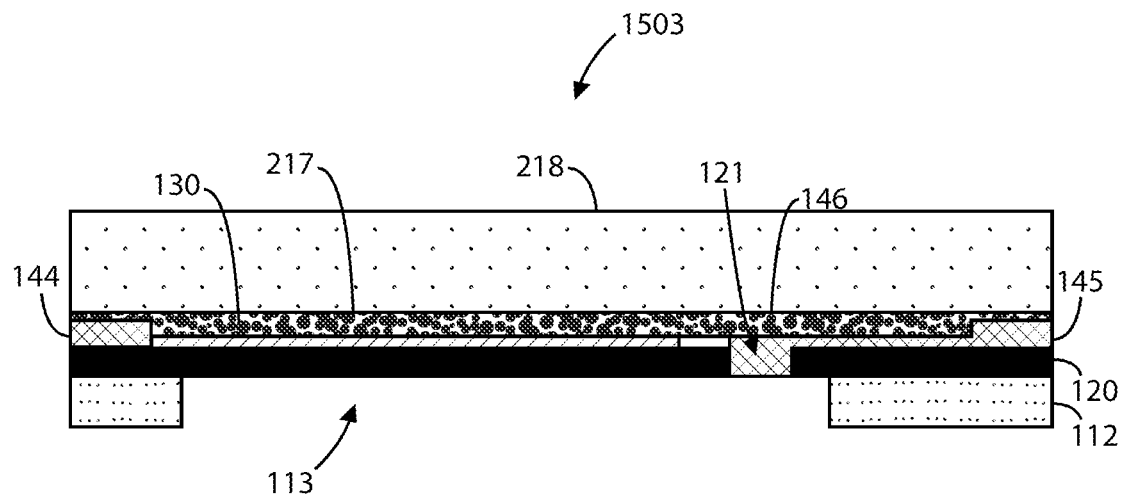

FIG. 15C can represent a method step of forming a shared backside trench 113, similar to the techniques described in FIG. 9A. The main difference is that the shared backside trench is configured underlying both topside metal electrode 130, topside micro-trench 121, and topside metal plug 146. In an example, the shared backside trench 113 is a backside resonator cavity that can vary in size, shape (all possible geometric shapes), and side wall profile (tapered convex, tapered concave, or right angle). In a specific example, the forming of the shared backside trench 113 can include a litho-etch process, which can include a back-to-front alignment and dry etch of the backside substrate 111. The piezoelectric layer 120 can serve as an etch stop layer for the forming of the shared backside trench 113.

Figure 15D:
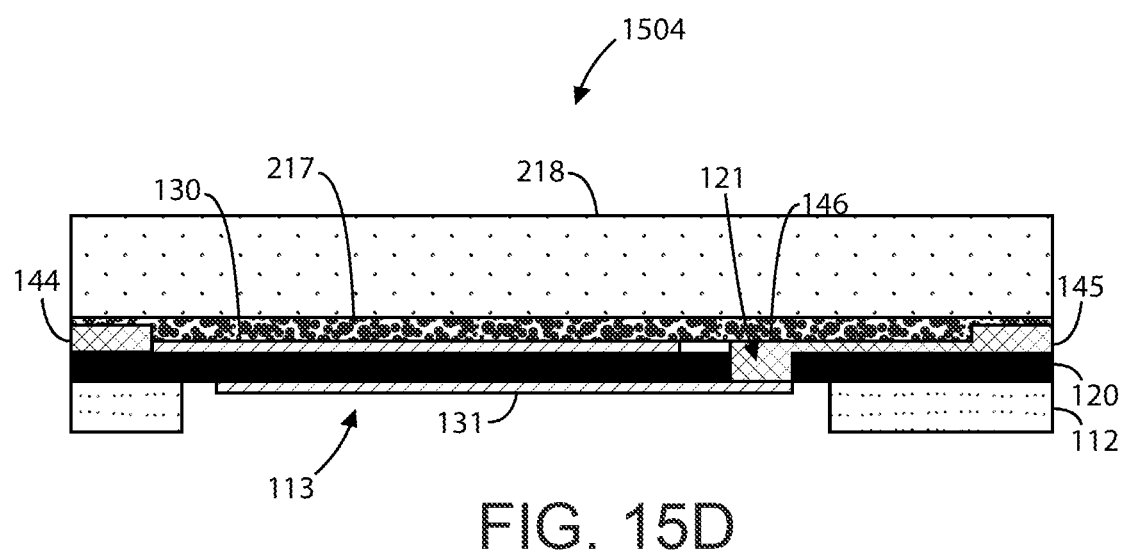

FIG. 15D can represent a method step of forming a backside metal electrode 131 and a backside metal 147, similar to that described in FIG. 10. In an example, the forming of the backside metal electrode 131 can include a deposition and patterning of metal materials within the shared backside trench 113. Here, the backside metal 131 serves as an electrode and the backside plug/connect metal 147 within the micro-via 121. The thickness, shape, and type of metal can vary as a function of the resonator/filter design. As an example, the backside electrode 131 and via plug metal 147 can be different metals. In a specific example, these backside metals 131, 147 can either be deposited and patterned on the surface of the piezoelectric layer 120 or rerouted to the backside of the substrate 112. In an example, the backside metal electrode may be patterned such that it is configured within the boundaries of the shared backside trench such that the backside metal electrode does not come in contact with one or more side-walls of the seed substrate created during the forming of the shared backside trench.

Figure 15E:
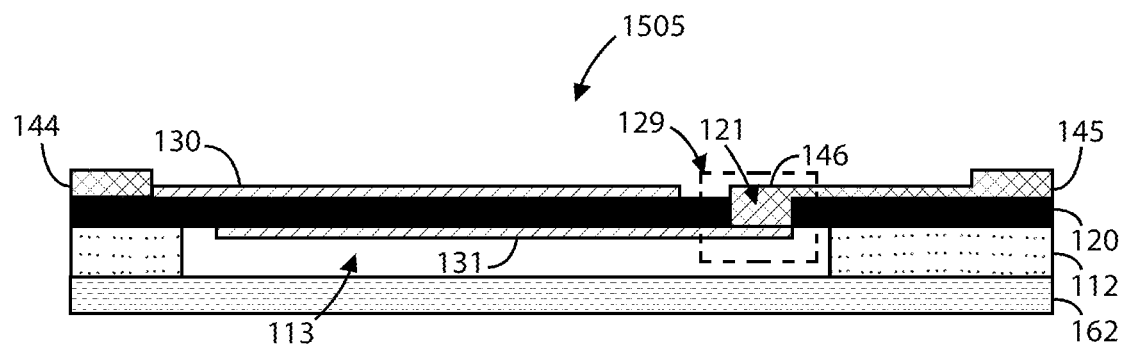

FIG. 15E can represent a method step of bonding a backside cap structure 162, similar to that described in FIGS. 11A and 11B, following a de-bonding of the temporary carrier 218 and cleaning of the topside of the device to remove the temporary adhesive 217. Those of ordinary skill in the art will recognize other variations, modifications, and alternatives of the methods steps described previously.

As used herein, the term "substrate" can mean the bulk substrate or can include overlying growth structures such as an aluminum, gallium, or ternary compound of aluminum and gallium and nitrogen containing epitaxial region, or functional regions, combinations, and the like.

One or more benefits are achieved over pre-existing techniques using the invention. In particular, the present device can be manufactured in a relatively simple and cost effective manner while using conventional materials and/or methods according to one of ordinary skill in the art. Using the present method, one can create a reliable single crystal based acoustic resonator using multiple ways of three-dimensional stacking through a wafer level process. Such filters or resonators can be implemented in an RF filter device, an RF filter system, or the like. Depending upon the embodiment, one or more of these benefits may be achieved. Of course, there can be other variations, modifications, and alternatives.

With 4G LTE and 5G growing more popular by the day, wireless data communication demands high performance RF filters with frequencies around 5 GHz and higher. Bulk acoustic wave resonators (BAWR), widely used in such filters operating at frequencies around 3 GHz and lower, are leading candidates for meeting such demands. Current bulk acoustic wave resonators use polycrystalline piezoelectric AlN thin films where each grain's c-axis is aligned perpendicular to the film's surface to allow high piezoelectric performance whereas the grains' a- or b-axis are randomly distributed. This peculiar grain distribution works well when the piezoelectric film's thickness is around 1 um and above, which is the perfect thickness for bulk acoustic wave (BAW) filters operating at frequencies ranging from 1 to 3 GHz. However, the quality of the polycrystalline piezoelectric films degrades quickly as the thicknesses decrease below around 0.5 um, which is required for resonators and filters operating at frequencies around 5 GHz and above.

Single crystalline or epitaxial piezoelectric thin films grown on compatible crystalline substrates exhibit good crystalline quality and high piezoelectric performance even down to very thin thicknesses, e.g., 0.4 um. The present invention provides manufacturing processes and structures for high quality bulk acoustic wave resonators with single crystalline or epitaxial piezoelectric thin films for high frequency BAW filter applications.

BAWRs require a piezoelectric material, e.g., AlN, in crystalline form, i.e., polycrystalline or single crystalline. The quality of the film heavy depends on the chemical, crystalline, or topographical quality of the layer on which the film is grown. In conventional BAWR processes (including film bulk acoustic resonator (FBAR) or solidly mounted resonator (SMR) geometry), the piezoelectric film is grown on a patterned bottom electrode, which is usually made of molybdenum (Mo), tungsten (W), or ruthenium (Ru). The surface geometry of the patterned bottom electrode significantly influences the crystalline orientation and crystalline quality of the piezoelectric film, requiring complicated modification of the structure.

Thus, the present invention uses single crystalline piezoelectric films and thin film transfer processes to produce a BAWR with enhanced ultimate quality factor and electromechanical coupling for RF filters. Such methods and structures facilitate methods of manufacturing and structures for RF filters using single crystalline or epitaxial piezoelectric films to meet the growing demands of contemporary data communication.

In an example, the present invention provides transfer structures and processes for acoustic resonator devices, which provides a flat, high-quality, single-crystal piezoelectric film for superior acoustic wave control and high Q in high frequency. As described above, polycrystalline piezoelectric layers limit Q in high frequency. Also, growing epitaxial piezoelectric layers on patterned electrodes affects the crystalline orientation of the piezoelectric layer, which limits the ability to have tight boundary control of the resulting resonators. Embodiments of the present invention, as further described below, can overcome these limitations and exhibit improved performance and cost-efficiency.

FIGS. 16A-16C through FIGS. 31A-31C illustrate a method of fabrication for an acoustic resonator device using a transfer structure with a sacrificial layer. In these figure series described below, the "A" figures show simplified diagrams illustrating top cross-sectional views of single crystal resonator devices according to various embodiments of the present invention. The "B" figures show simplified diagrams illustrating lengthwise cross-sectional views of the same devices in the "A" figures. Similarly, the "C" figures show simplified diagrams illustrating widthwise cross-sectional views of the same devices in the "A" figures. In some cases, certain features are omitted to highlight other features and the relationships between such features. Those of ordinary skill in the art will recognize variations, modifications, and alternatives to the examples shown in these figure series.

FIGS. 16A-16C are simplified diagrams illustrating various cross-sectional views of a single crystal acoustic resonator device and of method steps for a transfer process using a sacrificial layer for single crystal acoustic resonator devices according to an example of the present invention. As shown, these figures illustrate the method step of forming a piezoelectric film 1620 overlying a growth substrate 1610. In an example, the growth substrate 1610 can include silicon (S), silicon carbide (SiC), or other like materials. The piezoelectric film 1620 can be an epitaxial film including aluminum nitride (AlN), gallium nitride (GaN), or other like materials. Additionally, this piezoelectric substrate can be subjected to a thickness trim.

FIGS. 17A-17C are simplified diagrams illustrating various cross-sectional views of a single crystal acoustic resonator device and of method steps for a transfer process using a sacrificial layer for single crystal acoustic resonator devices according to an example of the present invention. As shown, these figures illustrate the method step of forming a first electrode 1710 overlying the surface region of the piezoelectric film 1620. In an example, the first electrode 1710 can include molybdenum (Mo), ruthenium (Ru), tungsten (W), or other like materials. In a specific example, the first electrode 1710 can be subjected to a dry etch with a slope. As an example, the slope can be about 60 degrees.

FIGS. 18A-18C are simplified diagrams illustrating various cross-sectional views of a single crystal acoustic resonator device and of method steps for a transfer process using a sacrificial layer for single crystal acoustic resonator devices according to an example of the present invention. As shown, these figures illustrate the method step of forming a first passivation layer 1810 overlying the first electrode 1710 and the piezoelectric film 1620. In an example, the first passivation layer 1810 can include silicon nitride (SiN), silicon oxide (SiO), or other like materials. In a specific example, the first passivation layer 1810 can have a thickness ranging from about 50 nm to about 100 nm.

FIGS. 19A-19C are simplified diagrams illustrating various cross-sectional views of a single crystal acoustic resonator device and of method steps for a transfer process using a sacrificial layer for single crystal acoustic resonator devices according to an example of the present invention. As shown, these figures illustrate the method step of forming a sacrificial layer 1910 overlying a portion of the first electrode 1810 and a portion of the piezoelectric film 1620. In an example, the sacrificial layer 1910 can include polycrystalline silicon (poly-Si), amorphous silicon (a-Si), or other like materials. In a specific example, this sacrificial layer 1910 can be subjected to a dry etch with a slope and be deposited with a thickness of about 1 um. Further, phosphorous doped $SiO_2$ (PSG) can be used as the sacrificial layer with different combinations of support layer (e.g., SiNx).

FIGS. 20A-20C are simplified diagrams illustrating various cross-sectional views of a single crystal acoustic resonator device and of method steps for a transfer process using a sacrificial layer for single crystal acoustic resonator devices according to an example of the present invention. As shown, these figures illustrate the method step of forming a support layer 2010 overlying the sacrificial layer 1910, the first electrode 1710, and the piezoelectric film 1620. In an example, the support layer 2010 can include silicon dioxide ($SiO_2$), silicon nitride (SiN), or other like materials. In a specific example, this support layer 2010 can be deposited with a thickness of about 2-3 um. As described above, other support layers (e.g., SiNx) can be used in the case of a PSG sacrificial layer.

FIGS. 21A-21C are simplified diagrams illustrating various cross-sectional views of a single crystal acoustic resonator device and of method steps for a transfer process using a sacrificial layer for single crystal acoustic resonator devices according to an example of the present invention. As shown, these figures illustrate the method step of polishing the support layer 2010 to form a polished support layer 2011. In an example, the polishing process can include a chemical-mechanical planarization process or the like.

FIGS. 22A-22C are simplified diagrams illustrating various cross-sectional views of a single crystal acoustic resonator device and of method steps for a transfer process using a sacrificial layer for single crystal acoustic resonator devices according to an example of the present invention. As shown, these figures illustrate flipping the device and physically coupling overlying the support layer 2011 overlying a bond substrate 2210. In an example, the bond substrate 2210 can include a bonding support layer 2220 ($SiO_2$ or like material) overlying a substrate having silicon (Si), sapphire ($Al_2O_3$), silicon dioxide ($SiO_2$), silicon carbide (SiC), or other like materials. In a specific embodiment, the bonding support layer 2220 of the bond substrate 2210 is physically coupled to the polished support layer 2011. Further, the physical coupling process can include a room temperature bonding process followed by a 300 degrees Celsius annealing process.

FIGS. 23A-23C are simplified diagrams illustrating various cross-sectional views of a single crystal acoustic resonator device and of method steps for a transfer process using a sacrificial layer for single crystal acoustic resonator devices according to an example of the present invention. As shown, these figures illustrate the method step of removing the growth substrate 1610 or otherwise the transfer of the piezoelectric film 1620. In an example, the removal process can include a grinding process, a blanket etching process, a film transfer process, an ion implantation transfer process, a laser crack transfer process, or the like and combinations thereof.

Figure 24C:
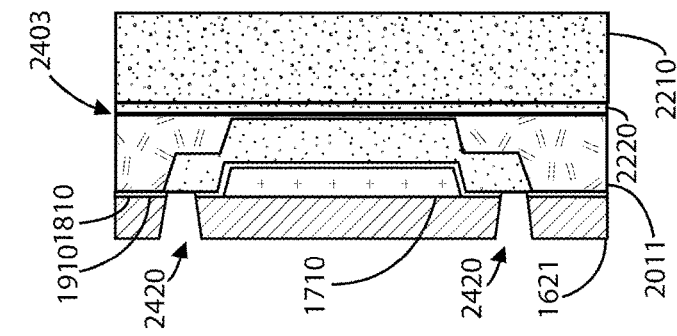
Figure 24A:
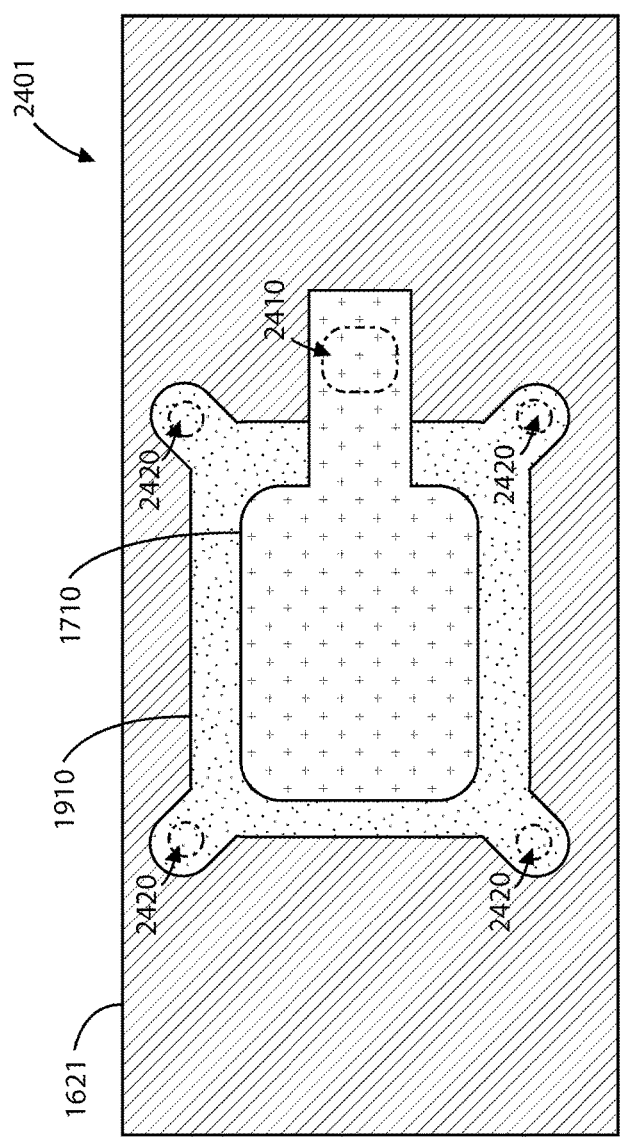
Figure 24B:
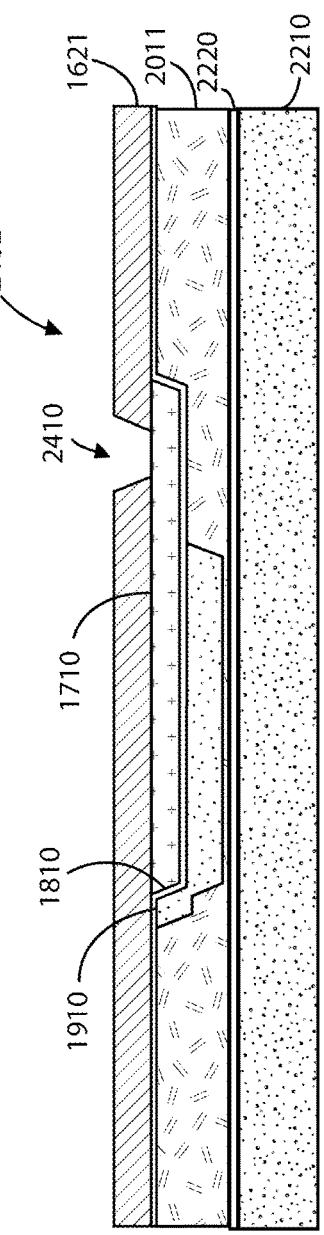

FIGS. 24A-24C are simplified diagrams illustrating various cross-sectional views of a single crystal acoustic resonator device and of method steps for a transfer process using a sacrificial layer for single crystal acoustic resonator devices according to an example of the present invention. As shown, these figures illustrate the method step of forming an electrode contact via 2410 within the piezoelectric film 1620 (becoming piezoelectric film 1621) overlying the first electrode 1710 and forming one or more release holes 2420 within the piezoelectric film 1620 and the first passivation layer 1810 overlying the sacrificial layer 1910. The via forming processes can include various types of etching processes.

FIGS. 25A-25C are simplified diagrams illustrating various cross-sectional views of a single crystal acoustic resonator device and of method steps for a transfer process using a sacrificial layer for single crystal acoustic resonator devices according to an example of the present invention. As shown, these figures illustrate the method step of forming a second electrode 2510 overlying the piezoelectric film 1621. In an example, the formation of the second electrode 2510 includes depositing molybdenum (Mo), ruthenium (Ru), tungsten (W), or other like materials; and then etching the second electrode 2510 to form an electrode cavity 2511 and to remove portion 2511 from the second electrode to form a top metal 2520. Further, the top metal 2520 is physically coupled to the first electrode 1720 through electrode contact via 2410.

Figure 26C:
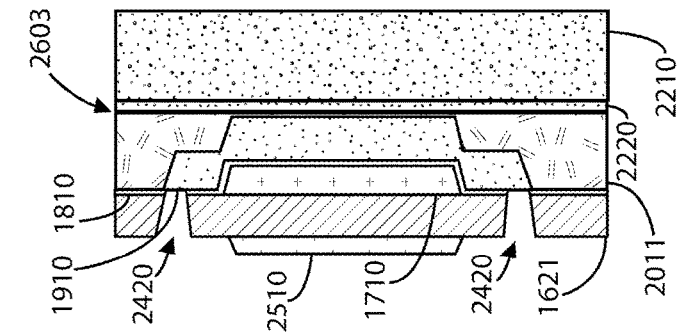
Figure 26A:
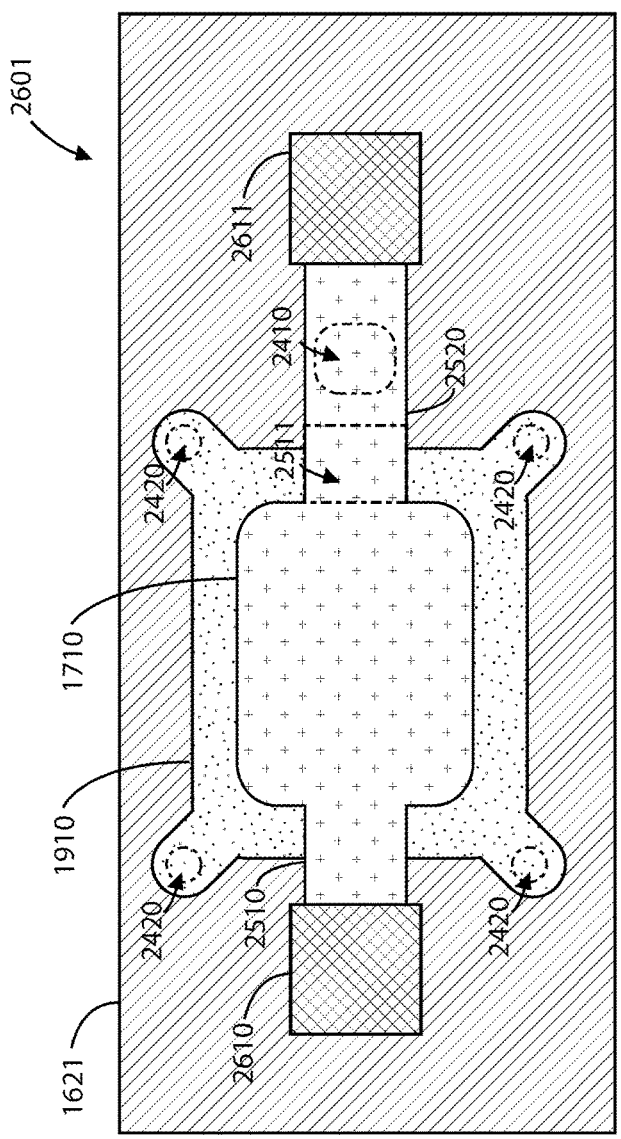
Figure 26B:
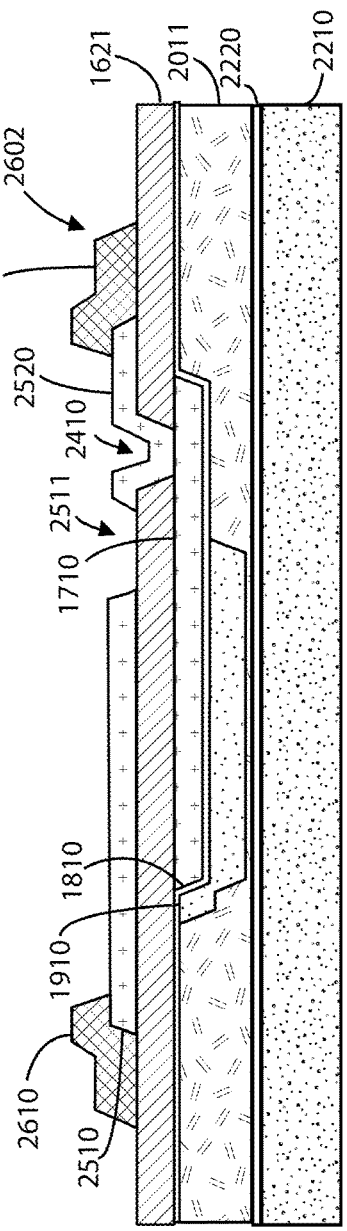

FIGS. 26A-26C are simplified diagrams illustrating various cross-sectional views of a single crystal acoustic resonator device and of method steps for a transfer process using a sacrificial layer for single crystal acoustic resonator devices according to an example of the present invention. As shown, these figures illustrate the method step of forming a first contact metal 2610 overlying a portion of the second electrode 2510 and a portion of the piezoelectric film 1621, and forming a second contact metal 2611 overlying a portion of the top metal 2520 and a portion of the piezoelectric film 1621. In an example, the first and second contact metals can include gold (Au), aluminum (Al), copper (Cu), nickel (Ni), aluminum bronze (AlCu), or related alloys of these materials or other like materials.

FIGS. 27A-27C are simplified diagrams illustrating various cross-sectional views of a single crystal acoustic resonator device and of method steps for a transfer process using a sacrificial layer for single crystal acoustic resonator devices according to an example of the present invention. As shown, these figures illustrate the method step of forming a second passivation layer 2710 overlying the second electrode 2510, the top metal 2520, and the piezoelectric film 1621. In an example, the second passivation layer 2710 can include silicon nitride (SiN), silicon oxide ($SiO_X$), or other like materials. In a specific example, the second passivation layer 2710 can have a thickness ranging from about 50 nm to about 100 nm.

FIGS. 28A-28C are simplified diagrams illustrating various cross-sectional views of a single crystal acoustic resonator device and of method steps for a transfer process using a sacrificial layer for single crystal acoustic resonator devices according to an example of the present invention. As shown, these figures illustrate the method step of removing the sacrificial layer 1910 to form an air cavity 2810. In an example, the removal process can include a poly-Si etch or an a-Si etch, or the like.

FIGS. 29A-29C are simplified diagrams illustrating various cross-sectional views of a single crystal acoustic resonator device and of method steps for a transfer process using a sacrificial layer for single crystal acoustic resonator devices according to another example of the present invention. As shown, these figures illustrate the method step of processing the second electrode 2510 and the top metal 2520 to form a processed second electrode 2910 and a processed top metal 2920. This step can follow the formation of second electrode 2510 and top metal 2520. In an example, the processing of these two components includes depositing molybdenum (Mo), ruthenium (Ru), tungsten (W), or other like materials; and then etching (e.g., dry etch or the like) this material to form the processed second electrode 2910 with an electrode cavity 2912 and the processed top metal 2920. The processed top metal 2920 remains separated from the processed second electrode 2910 by the removal of portion 2911. In a specific example, the processed second electrode 2910 is characterized by the addition of an energy confinement structure configured on the processed second electrode 2910 to increase Q.

Figure 30C:
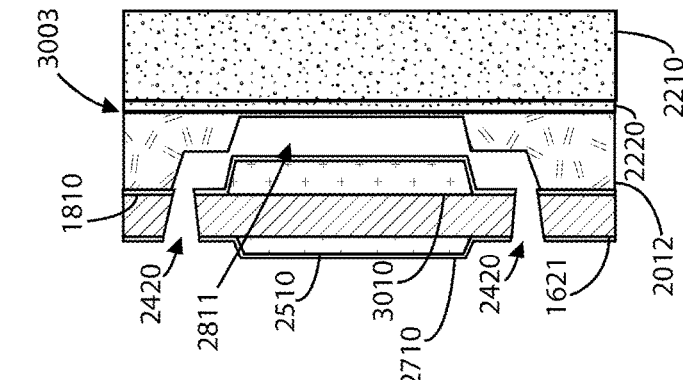
Figure 30A:
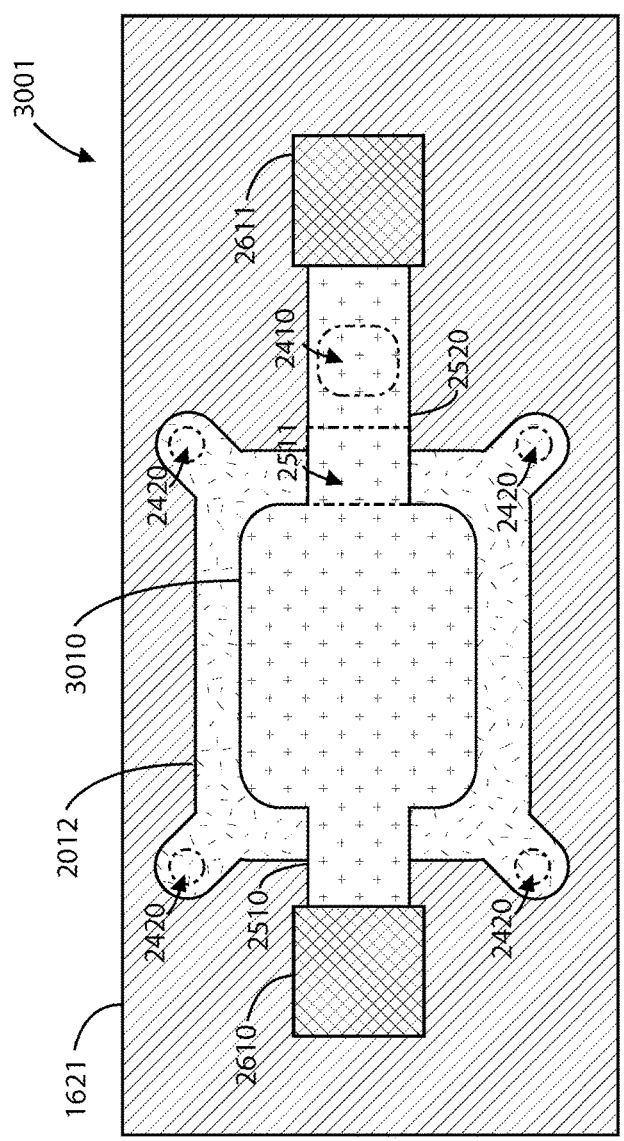
Figure 30B:
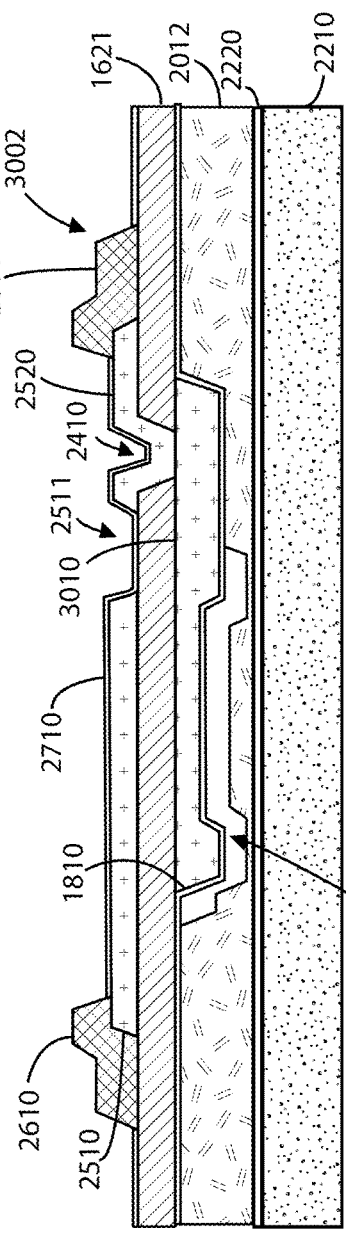

FIGS. 30A-30C are simplified diagrams illustrating various cross-sectional views of a single crystal acoustic resonator device and of method steps for a transfer process using a sacrificial layer for single crystal acoustic resonator devices according to another example of the present invention. As shown, these figures illustrate the method step of processing the first electrode 1710 to form a processed first electrode 2310. This step can follow the formation of first electrode 1710. In an example, the processing of these two components includes depositing molybdenum (Mo), ruthenium (Ru), tungsten (W), or other like materials; and then etching (e.g., dry etch or the like) this material to form the processed first electrode 3010 with an electrode cavity, similar to the processed second electrode 2910. Air cavity 2811 shows the change in cavity shape due to the processed first electrode 3010. In a specific example, the processed first electrode 3010 is characterized by the addition of an energy confinement structure configured on the processed second electrode 3010 to increase Q.

Figure 31C:
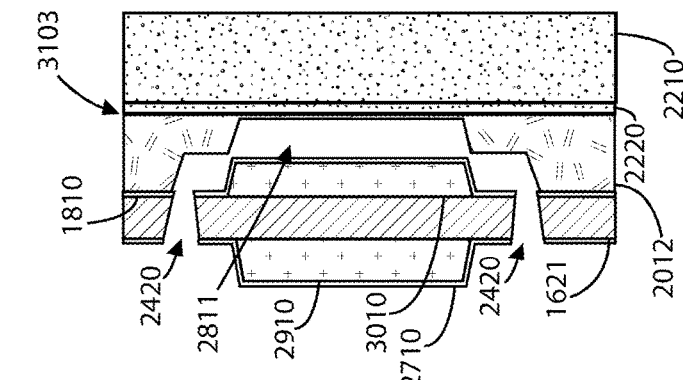
Figure 31A:
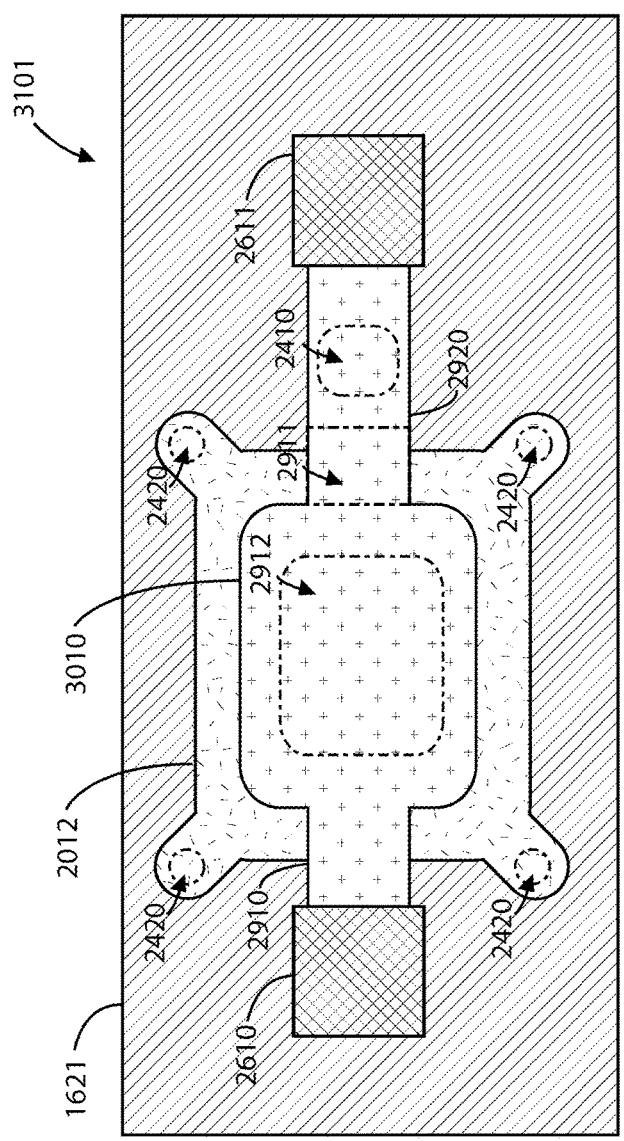
Figure 31B:
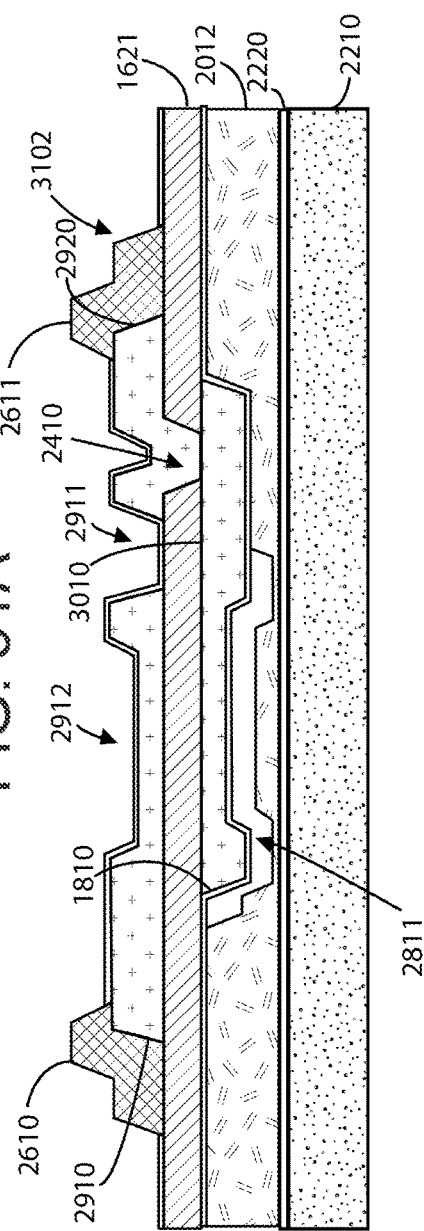

FIGS. 31A-31C are simplified diagrams illustrating various cross-sectional views of a single crystal acoustic resonator device and of method steps for a transfer process using a sacrificial layer for single crystal acoustic resonator devices according to another example of the present invention. As shown, these figures illustrate the method step of processing the first electrode 1710, to form a processed first electrode 2310, and the second electrode 2510/top metal 2520 to form a processed second electrode 2910/processed top metal 2920. These steps can follow the formation of each respective electrode, as described for FIGS. 29A-29C and 30A-30C. Those of ordinary skill in the art will recognize other variations, modifications, and alternatives.

FIGS. 32A-32C through FIGS. 46A-46C illustrate a method of fabrication for an acoustic resonator device using a transfer structure without sacrificial layer. In these figure series described below, the "A" figures show simplified diagrams illustrating top cross-sectional views of single crystal resonator devices according to various embodiments of the present invention. The "B" figures show simplified diagrams illustrating lengthwise cross-sectional views of the same devices in the "A" figures. Similarly, the "C" figures show simplified diagrams illustrating widthwise cross-sectional views of the same devices in the "A" figures. In some cases, certain features are omitted to highlight other features and the relationships between such features. Those of ordinary skill in the art will recognize variations, modifications, and alternatives to the examples shown in these figure series.

Figure 32C:
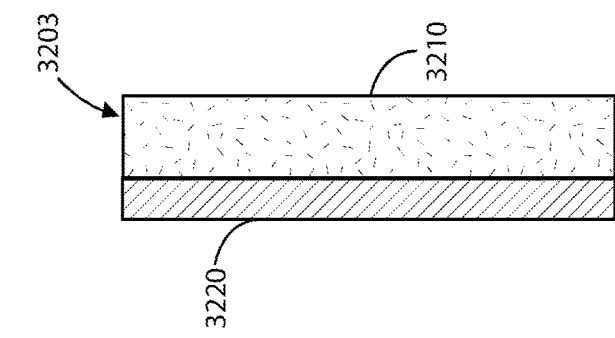
Figure 32A:
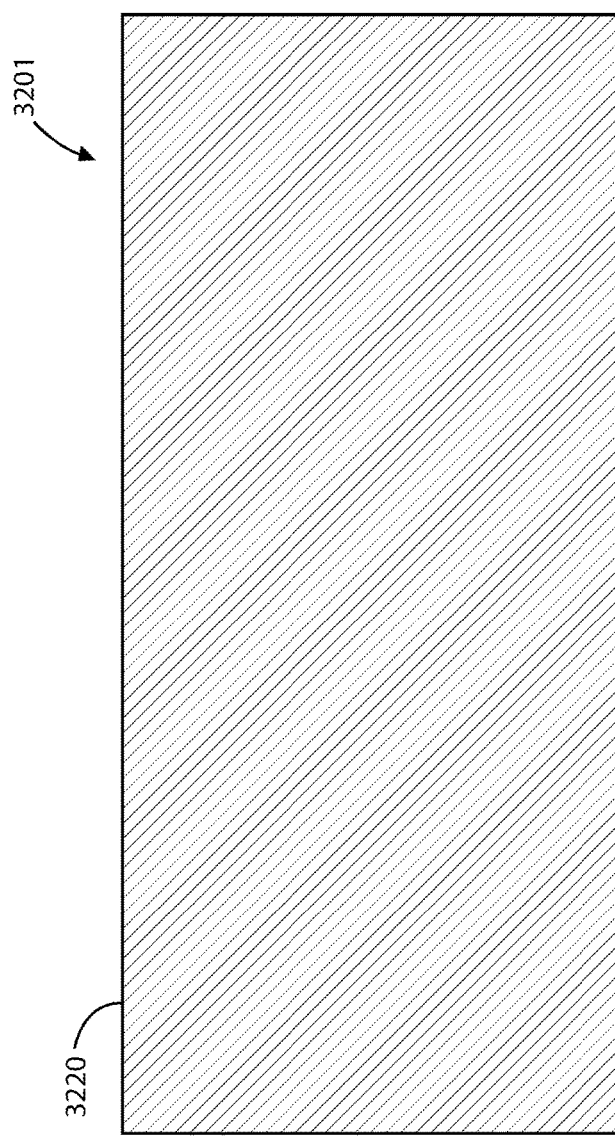
Figure 32B:
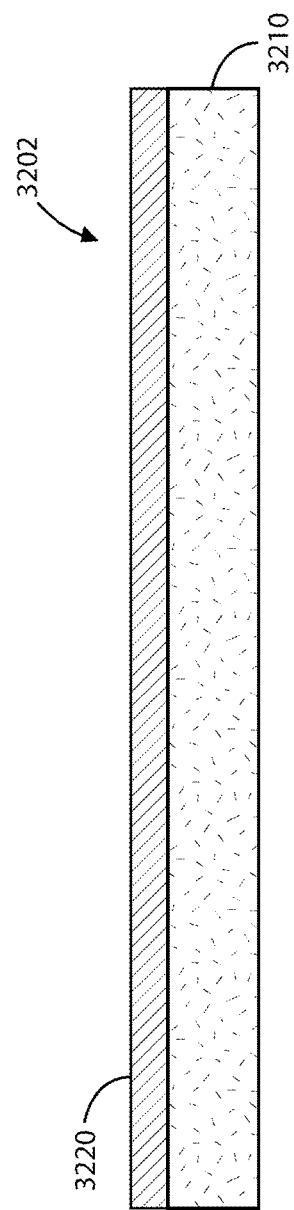

FIGS. 32A-32C are simplified diagrams illustrating various cross-sectional views of a single crystal acoustic resonator device and of method steps for a transfer process for single crystal acoustic resonator devices according to an example of the present invention. As shown, these figures illustrate the method step of forming a piezoelectric film 3220 overlying a growth substrate 3210. In an example, the growth substrate 3210 can include silicon (S), silicon carbide (SiC), or other like materials. The piezoelectric film 3220 can be an epitaxial film including aluminum nitride (AlN), gallium nitride (GaN), or other like materials. Additionally, this piezoelectric substrate can be subjected to a thickness trim.

FIGS. 33A-33C are simplified diagrams illustrating various cross-sectional views of a single crystal acoustic resonator device and of method steps for a transfer process for single crystal acoustic resonator devices according to an example of the present invention. As shown, these figures illustrate the method step of forming a first electrode 3310 overlying the surface region of the piezoelectric film 3220. In an example, the first electrode 3310 can include molybdenum (Mo), ruthenium (Ru), tungsten (W), or other like materials. In a specific example, the first electrode 3310 can be subjected to a dry etch with a slope. As an example, the slope can be about 60 degrees.

Figure 34C:
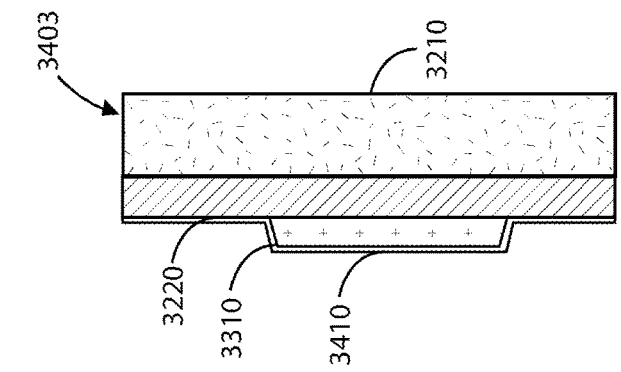
Figure 34A:
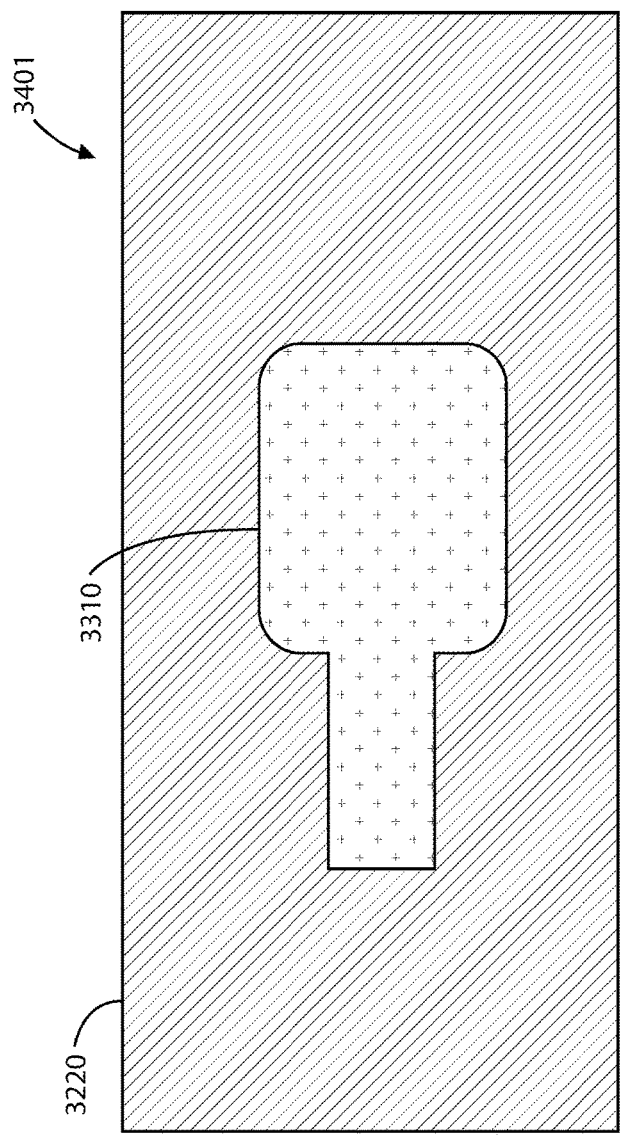
Figure 34B:
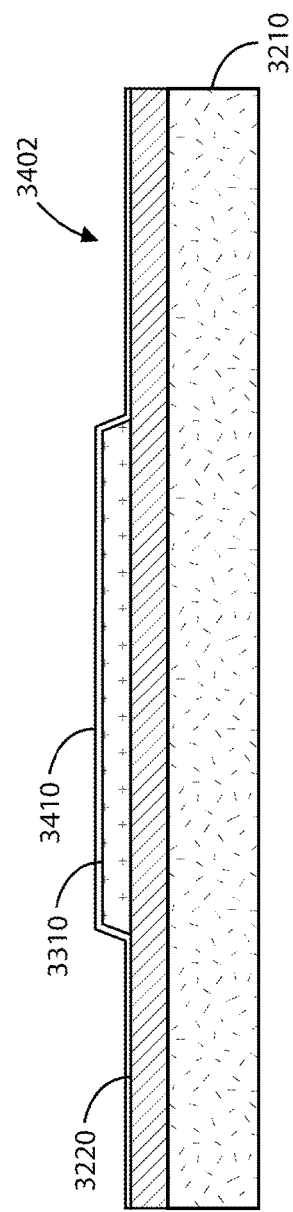

FIGS. 34A-34C are simplified diagrams illustrating various cross-sectional views of a single crystal acoustic resonator device and of method steps for a transfer process for single crystal acoustic resonator devices according to an example of the present invention. As shown, these figures illustrate the method step of forming a first passivation layer 3410 overlying the first electrode 3310 and the piezoelectric film 3220. In an example, the first passivation layer 3410 can include silicon nitride (SiN), silicon oxide ($SiO_x$), or other like materials. In a specific example, the first passivation layer 3410 can have a thickness ranging from about 50 nm to about 100 nm.

Figure 35C:
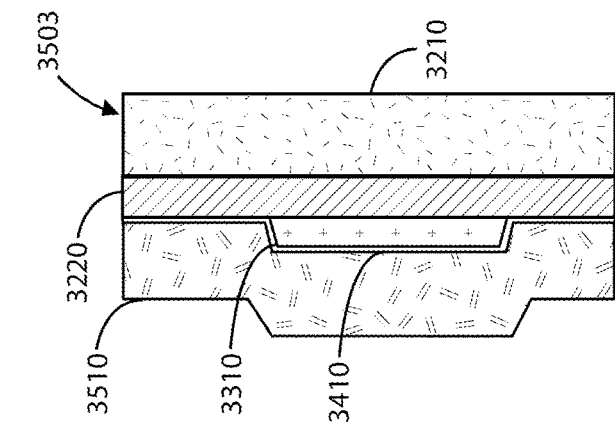
Figure 35A:
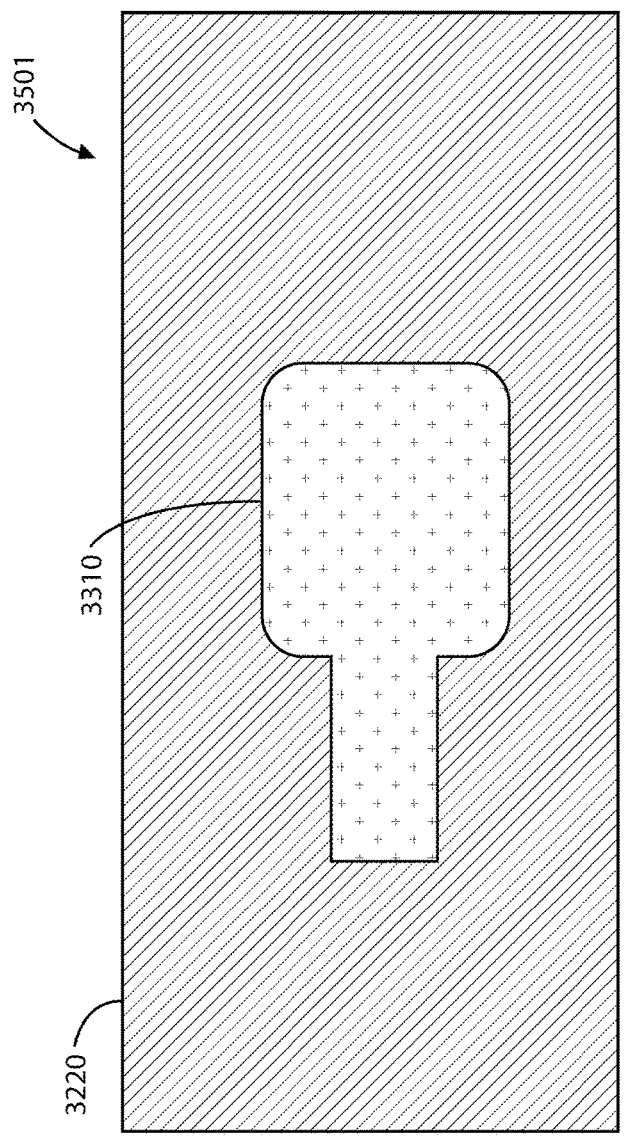
Figure 35B:
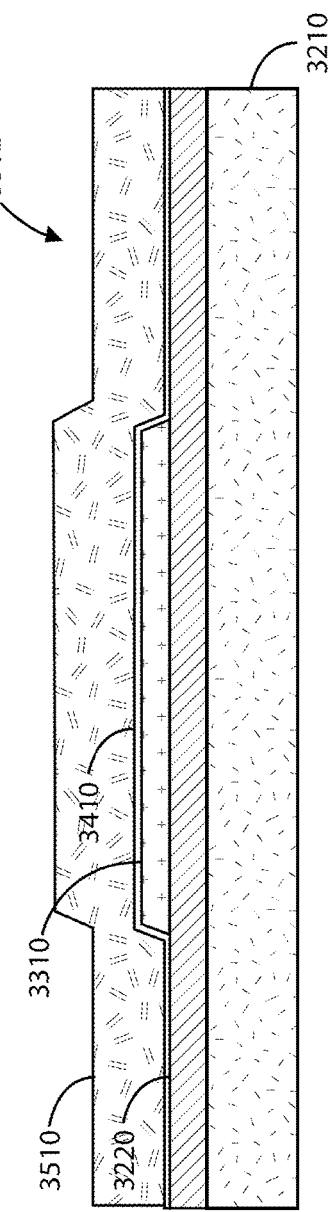

FIGS. 35A-35C are simplified diagrams illustrating various cross-sectional views of a single crystal acoustic resonator device and of method steps for a transfer process for single crystal acoustic resonator devices according to an example of the present invention. As shown, these figures illustrate the method step of forming a support layer 3510 overlying the first electrode 3310, and the piezoelectric film 3220. In an example, the support layer 3510 can include silicon dioxide ($SiO_2$), silicon nitride (SiN), or other like materials. In a specific example, this support layer 3510 can be deposited with a thickness of about 2-3 um. As described above, other support layers (e.g., SiNx) can be used in the case of a PSG sacrificial layer.

FIGS. 36A-36C are simplified diagrams illustrating various cross-sectional views of a single crystal acoustic resonator device and of method steps for a transfer process for single crystal acoustic resonator devices according to an example of the present invention. As shown, these figures illustrate the optional method step of processing the support layer 3510 (to form support layer 3511) in region 3610. In an example, the processing can include a partial etch of the support layer 3510 to create a flat bond surface. In a specific example, the processing can include a cavity region. In other examples, this step can be replaced with a polishing process such as a chemical-mechanical planarization process or the like.

FIGS. 37A-37C are simplified diagrams illustrating various cross-sectional views of a single crystal acoustic resonator device and of method steps for a transfer process for single crystal acoustic resonator devices according to an example of the present invention. As shown, these figures illustrate the method step of forming an air cavity 3710 within a portion of the support layer 3511 (to form support layer 3512). In an example, the cavity formation can include an etching process that stops at the first passivation layer 3410.

Figure 38C:
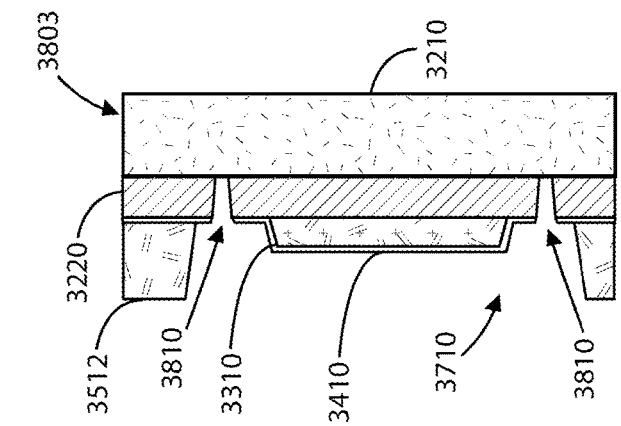
Figure 38A:
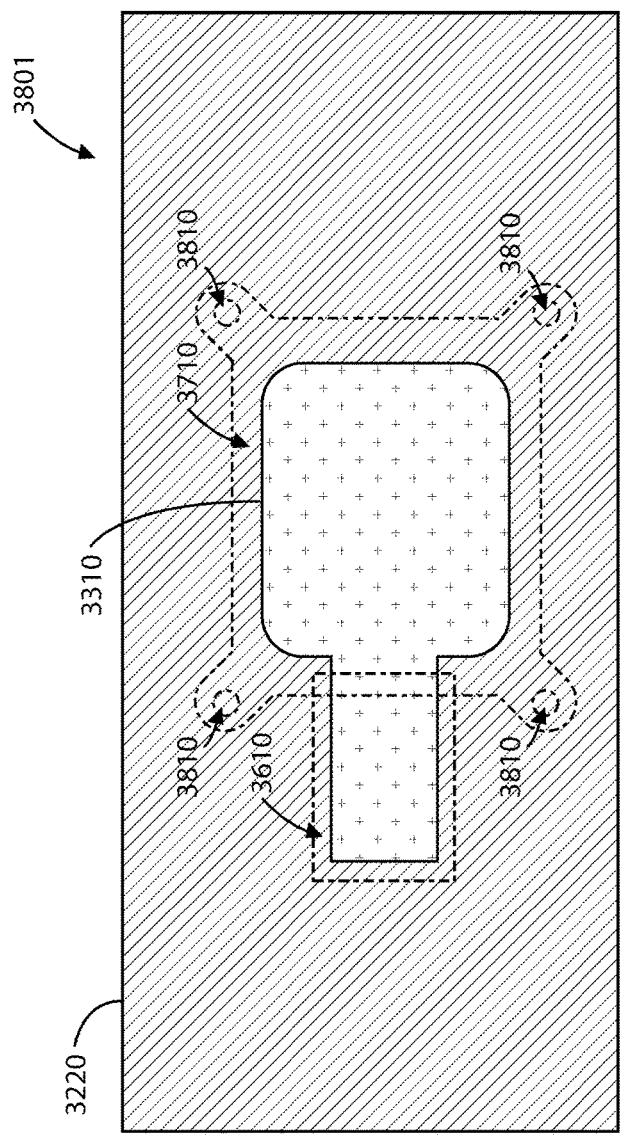
Figure 38B:
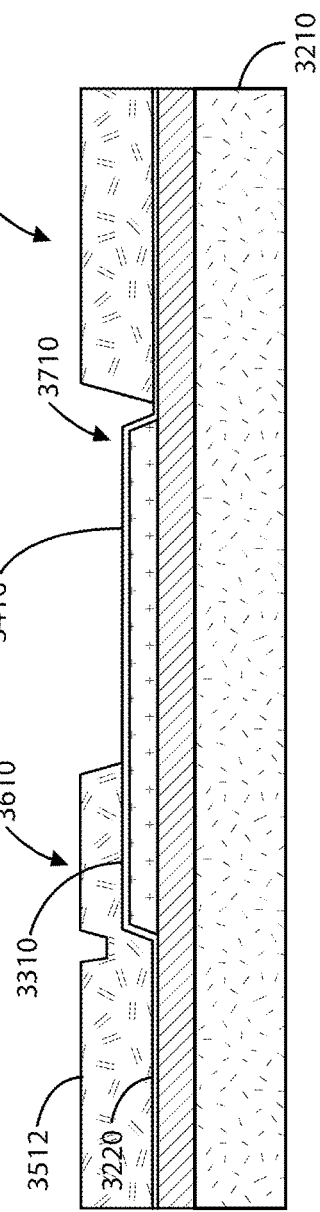

FIGS. 38A-38C are simplified diagrams illustrating various cross-sectional views of a single crystal acoustic resonator device and of method steps for a transfer process for single crystal acoustic resonator devices according to an example of the present invention. As shown, these figures illustrate the method step of forming one or more cavity vent holes 3810 within a portion of the piezoelectric film 3220 through the first passivation layer 3410. In an example, the cavity vent holes 3810 connect to the air cavity 3710.

FIGS. 39A-39C are simplified diagrams illustrating various cross-sectional views of a single crystal acoustic resonator device and of method steps for a transfer process for single crystal acoustic resonator devices according to an example of the present invention. As shown, these figures illustrate flipping the device and physically coupling overlying the support layer 3512 overlying a bond substrate 3910. In an example, the bond substrate 3910 can include a bonding support layer 3920 ($SiO_2$ or like material) overlying a substrate having silicon (Si), sapphire ($Al_2O_3$), silicon dioxide ($SiO_2$), silicon carbide (SiC), or other like materials. In a specific embodiment, the bonding support layer 3920 of the bond substrate 3910 is physically coupled to the polished support layer 3512. Further, the physical coupling process can include a room temperature bonding process followed by a 300 degrees Celsius annealing process.

FIGS. 40A-40C are simplified diagrams illustrating various cross-sectional views of a single crystal acoustic resonator device and of method steps for a transfer process for single crystal acoustic resonator devices according to an example of the present invention. As shown, these figures illustrate the method step of removing the growth substrate 3210 or otherwise the transfer of the piezoelectric film 3220. In an example, the removal process can include a grinding process, a blanket etching process, a film transfer process, an ion implantation transfer process, a laser crack transfer process, or the like and combinations thereof.

FIGS. 41A-41C are simplified diagrams illustrating various cross-sectional views of a single crystal acoustic resonator device and of method steps for a transfer process for single crystal acoustic resonator devices according to an example of the present invention. As shown, these figures illustrate the method step of forming an electrode contact via 4110 within the piezoelectric film 3220 overlying the first electrode 3310. The via forming processes can include various types of etching processes.

FIGS. 42A-42C are simplified diagrams illustrating various cross-sectional views of a single crystal acoustic resonator device and of method steps for a transfer process for single crystal acoustic resonator devices according to an example of the present invention. As shown, these figures illustrate the method step of forming a second electrode 4210 overlying the piezoelectric film 3220. In an example, the formation of the second electrode 4210 includes depositing molybdenum (Mo), ruthenium (Ru), tungsten (W), or other like materials; and then etching the second electrode 4210 to form an electrode cavity 4211 and to remove portion 4211 from the second electrode to form a top metal 4220. Further, the top metal 4220 is physically coupled to the first electrode 3310 through electrode contact via 4110.

FIGS. 43A-43C are simplified diagrams illustrating various cross-sectional views of a single crystal acoustic resonator device and of method steps for a transfer process for single crystal acoustic resonator devices according to an example of the present invention. As shown, these figures illustrate the method step of forming a first contact metal 4310 overlying a portion of the second electrode 4210 and a portion of the piezoelectric film 3220, and forming a second contact metal 4311 overlying a portion of the top metal 4220 and a portion of the piezoelectric film 3220. In an example, the first and second contact metals can include gold (Au), aluminum (Al), copper (Cu), nickel (Ni), aluminum bronze (AlCu), or other like materials. This figure also shows the method step of forming a second passivation layer 4320 overlying the second electrode 4210, the top metal 4220, and the piezoelectric film 3220. In an example, the second passivation layer 4320 can include silicon nitride (SiN), silicon oxide ($SiO_x$), or other like materials. In a specific example, the second passivation layer 4320 can have a thickness ranging from about 50 nm to about 100 nm.

Figure 44C:
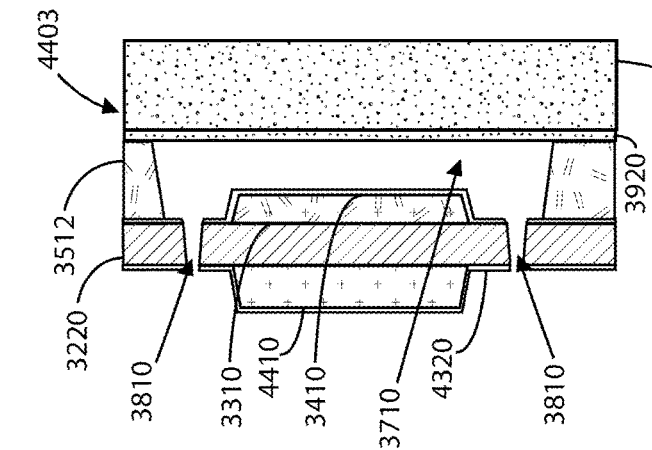
Figure 44A:
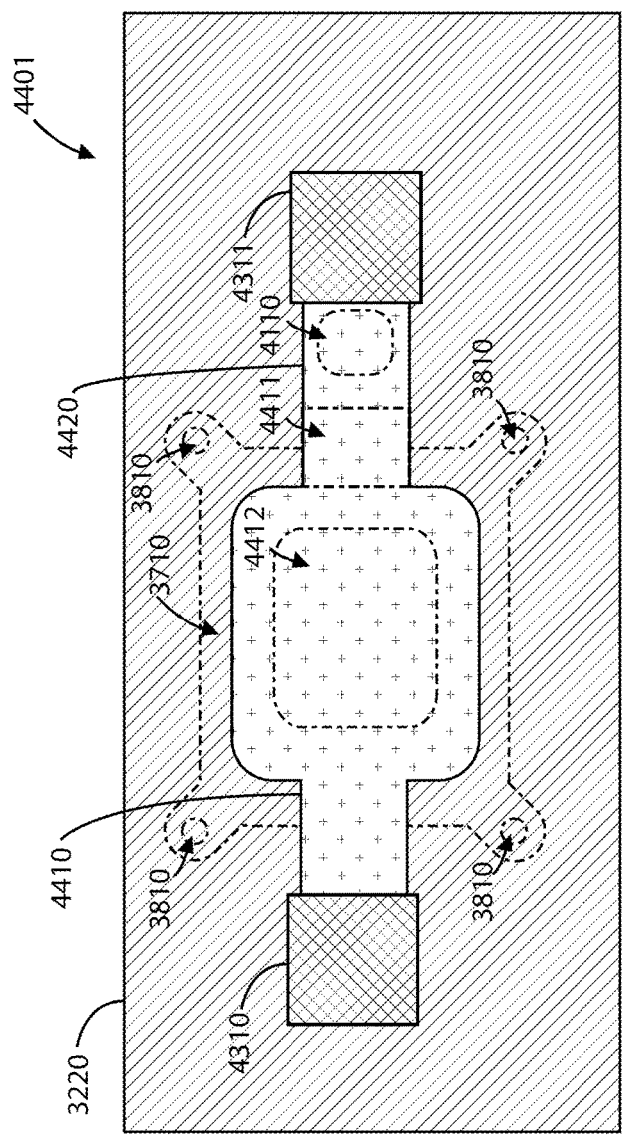
Figure 44B:
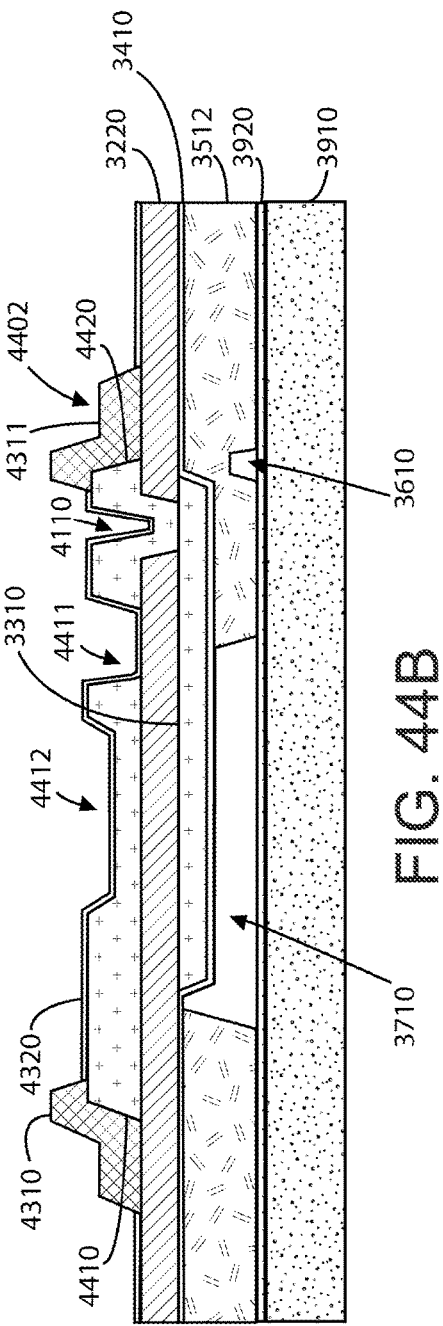

FIGS. 44A-44C are simplified diagrams illustrating various cross-sectional views of a single crystal acoustic resonator device and of method steps for a transfer process for single crystal acoustic resonator devices according to another example of the present invention. As shown, these figures illustrate the method step of processing the second electrode 4210 and the top metal 4220 to form a processed second electrode 4410 and a processed top metal 4420. This step can follow the formation of second electrode 4210 and top metal 4220. In an example, the processing of these two components includes depositing molybdenum (Mo), ruthenium (Ru), tungsten (W), or other like materials; and then etching (e.g., dry etch or the like) this material to form the processed second electrode 4410 with an electrode cavity 4412 and the processed top metal 4420. The processed top metal 4420 remains separated from the processed second electrode 4410 by the removal of portion 4411. In a specific example, the processed second electrode 4410 is characterized by the addition of an energy confinement structure configured on the processed second electrode 4410 to increase Q.

FIGS. 45A-45C are simplified diagrams illustrating various cross-sectional views of a single crystal acoustic resonator device and of method steps for a transfer process using a sacrificial layer for single crystal acoustic resonator devices according to another example of the present invention. As shown, these figures illustrate the method step of processing the first electrode 3310 to form a processed first electrode 4510. This step can follow the formation of first electrode 3310. In an example, the processing of these two components includes depositing molybdenum (Mo), ruthenium (Ru), tungsten (W), or other like materials; and then etching (e.g., dry etch or the like) this material to form the processed first electrode 4510 with an electrode cavity, similar to the processed second electrode 4410. Air cavity 3711 shows the change in cavity shape due to the processed first electrode 4510. In a specific example, the processed first electrode 4510 is characterized by the addition of an energy confinement structure configured on the processed second electrode 4510 to increase Q.

FIGS. 46A-46C are simplified diagrams illustrating various cross-sectional views of a single crystal acoustic resonator device and of method steps for a transfer process using a sacrificial layer for single crystal acoustic resonator devices according to another example of the present invention. As shown, these figures illustrate the method step of processing the first electrode 3310, to form a processed first electrode 4510, and the second electrode 4210/top metal 4220 to form a processed second electrode 4410/processed top metal 4420. These steps can follow the formation of each respective electrode, as described for FIGS. 44A-44C and 45A-45C. Those of ordinary skill in the art will recognize other variations, modifications, and alternatives.

FIGS. 47A-47C through FIGS. 59A-59C illustrate a method of fabrication for an acoustic resonator device using a transfer structure with a multilayer mirror structure. In these figure series described below, the "A" figures show simplified diagrams illustrating top cross-sectional views of single crystal resonator devices according to various embodiments of the present invention. The "B" figures show simplified diagrams illustrating lengthwise cross-sectional views of the same devices in the "A" figures. Similarly, the "C" figures show simplified diagrams illustrating widthwise cross-sectional views of the same devices in the "A" figures. In some cases, certain features are omitted to highlight other features and the relationships between such features. Those of ordinary skill in the art will recognize variations, modifications, and alternatives to the examples shown in these figure series.

Figure 47C:
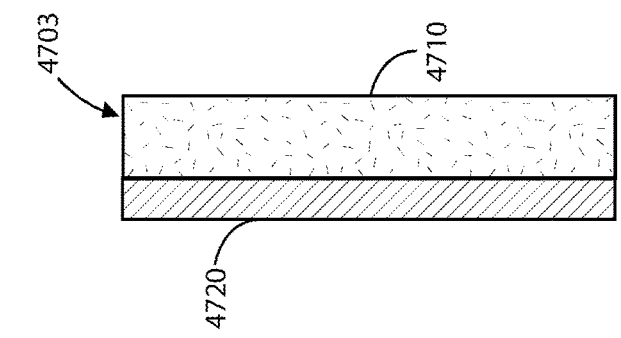
FIGS. 47A-47C though
Figure 47A:
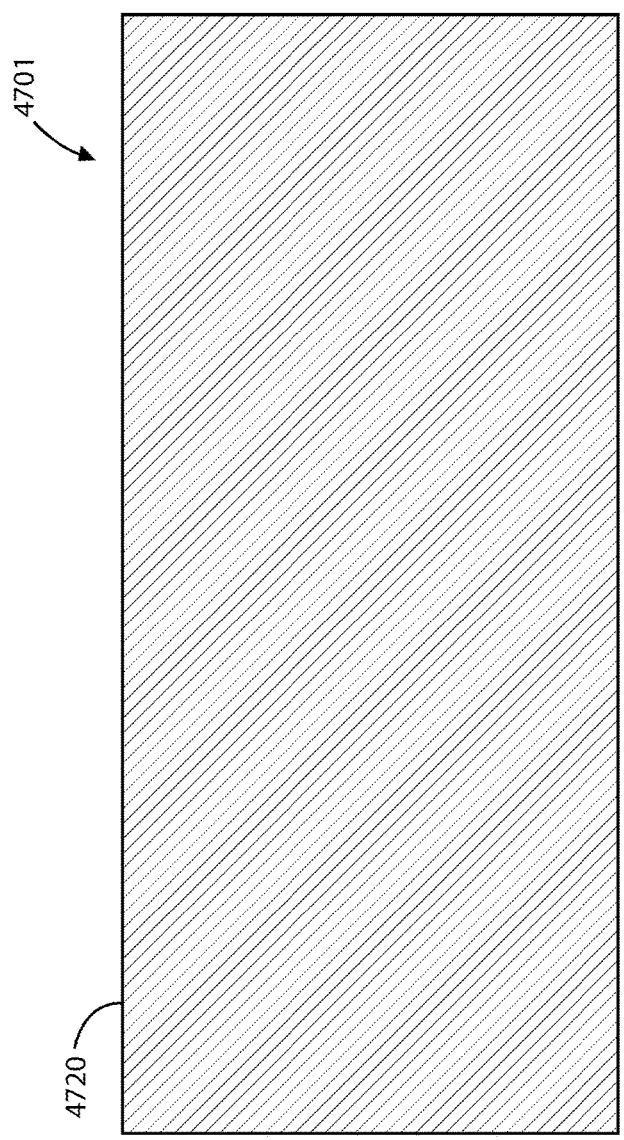
Figure 47B:
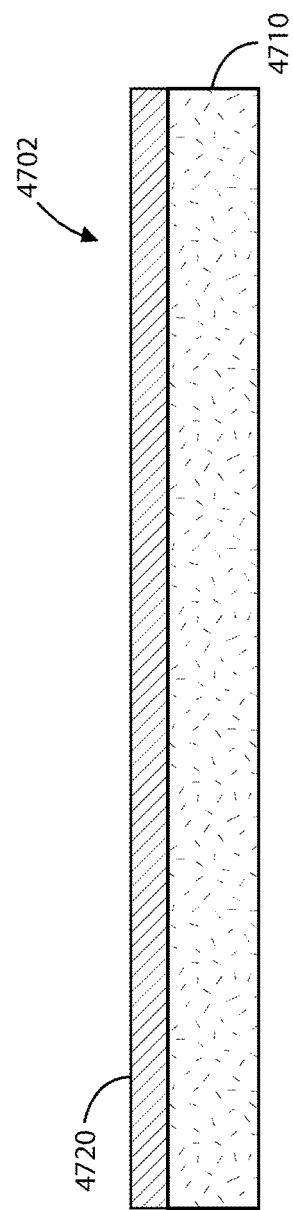

FIGS. 47A-47C are simplified diagrams illustrating various cross-sectional views of a single crystal acoustic resonator device and of method steps for a transfer process with a multilayer mirror for single crystal acoustic resonator devices according to an example of the present invention. As shown, these figures illustrate the method step of forming a piezoelectric film 4720 overlying a growth substrate 4710. In an example, the growth substrate 4710 can include silicon (S), silicon carbide (SiC), or other like materials. The piezoelectric film 4720 can be an epitaxial film including aluminum nitride (AlN), gallium nitride (GaN), or other like materials. Additionally, this piezoelectric substrate can be subjected to a thickness trim.

Figure 48C:
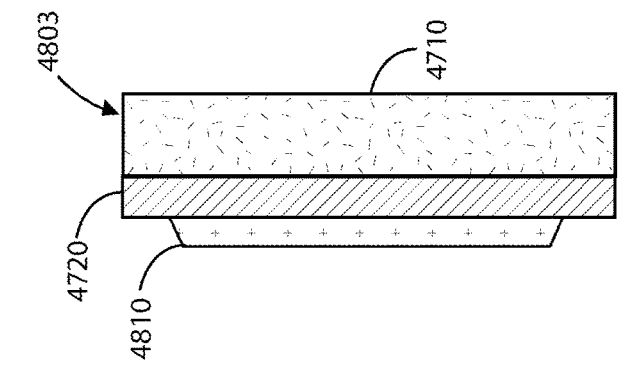
Figure 48A:
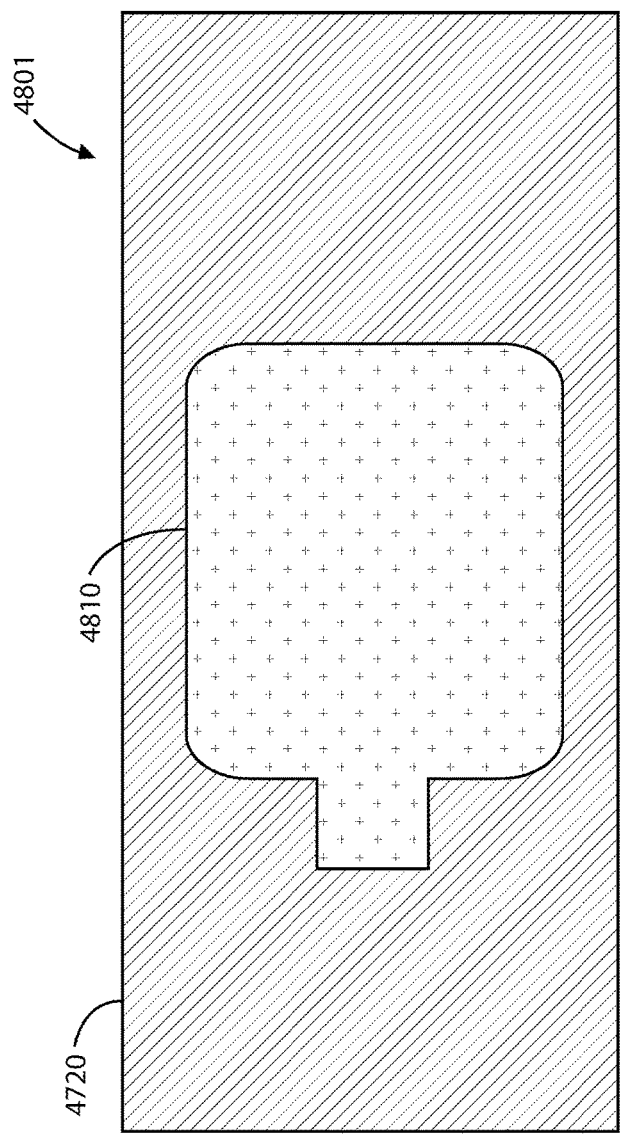
Figure 48B:
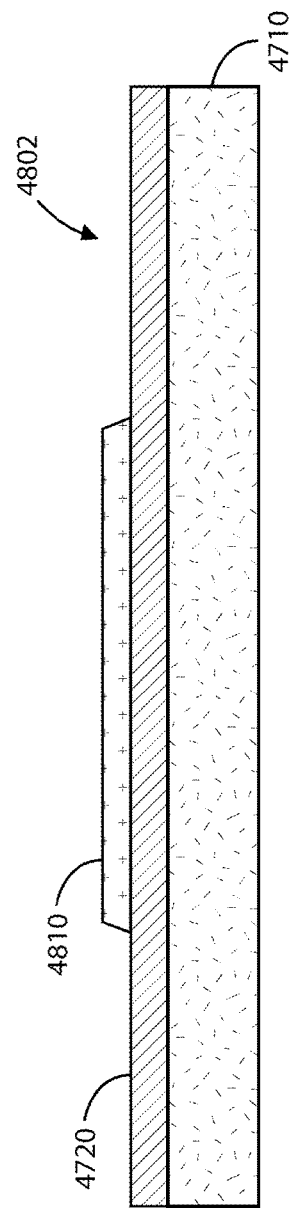

FIGS. 48A-48C are simplified diagrams illustrating various cross-sectional views of a single crystal acoustic resonator device and of method steps for a transfer process with a multilayer mirror for single crystal acoustic resonator devices according to an example of the present invention. As shown, these figures illustrate the method step of forming a first electrode 4810 overlying the surface region of the piezoelectric film 4720. In an example, the first electrode 4810 can include molybdenum (Mo), ruthenium (Ru), tungsten (W), or other like materials. In a specific example, the first electrode 4810 can be subjected to a dry etch with a slope. As an example, the slope can be about 60 degrees.

FIGS. 49A-49C are simplified diagrams illustrating various cross-sectional views of a single crystal acoustic resonator device and of method steps for a transfer process with a multilayer mirror for single crystal acoustic resonator devices according to an example of the present invention. As shown, these figures illustrate the method step of forming a multilayer mirror or reflector structure. In an example, the multilayer mirror includes at least one pair of layers with a low impedance layer 4910 and a high impedance layer 4920. In FIGS. 49A-49C, two pairs of low/high impedance layers are shown (low: 4910 and 4911; high: 4920 and 4921). In an example, the mirror/reflector area can be larger than the resonator area and can encompass the resonator area. In a specific embodiment, each layer thickness is about ¼ of the wavelength of an acoustic wave at a targeting frequency. The layers can be deposited in sequence and be etched afterwards, or each layer can be deposited and etched individually. In another example, the first electrode 4810 can be patterned after the mirror structure is patterned.

Figure 50C:
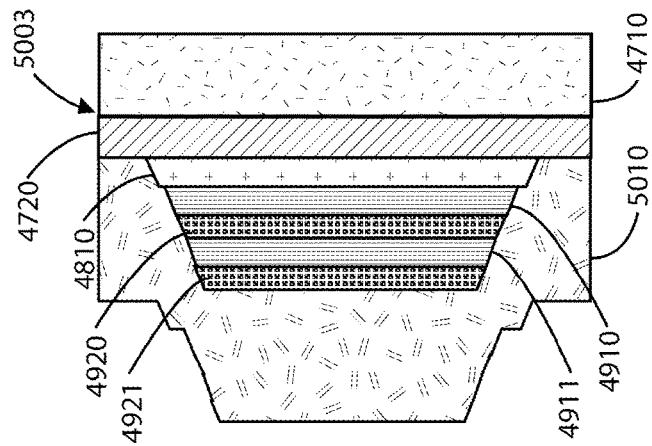
Figure 50A:
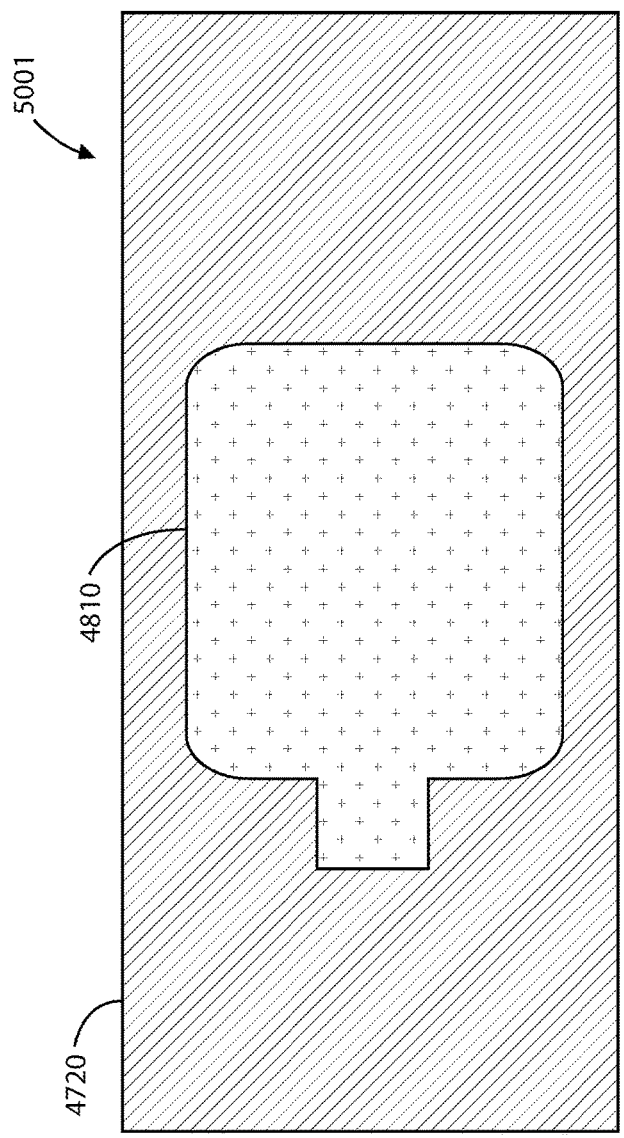
Figure 50B:
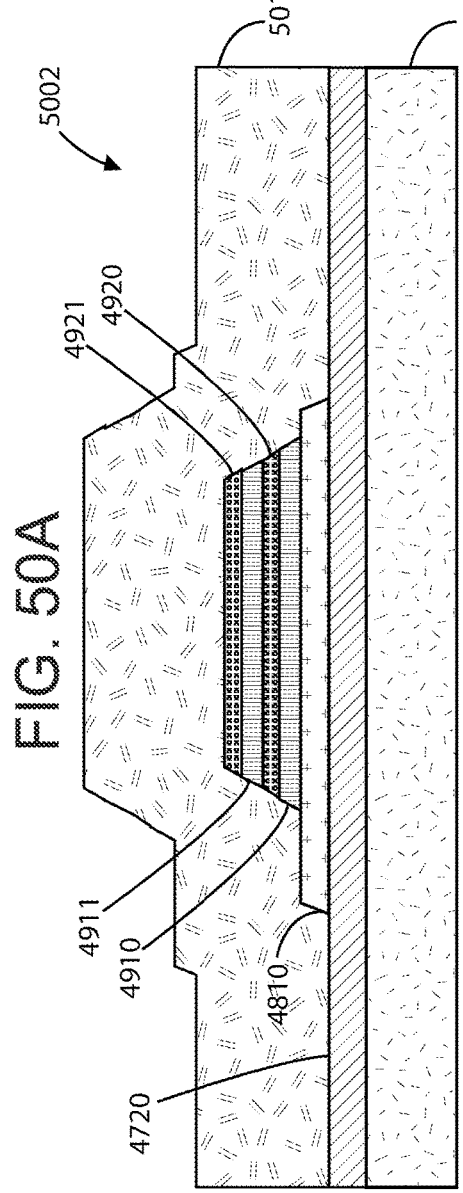

FIGS. 50A-50C are simplified diagrams illustrating various cross-sectional views of a single crystal acoustic resonator device and of method steps for a transfer process with a multilayer mirror for single crystal acoustic resonator devices according to an example of the present invention. As shown, these figures illustrate the method step of forming a support layer 5010 overlying the mirror structure (layers 4910, 4911, 4920, and 4921), the first electrode 4810, and the piezoelectric film 4720. In an example, the support layer 5010 can include silicon dioxide ($SiO_2$), silicon nitride (SiN), or other like materials. In a specific example, this support layer 5010 can be deposited with a thickness of about 2-3 um. As described above, other support layers (e.g., SiNx) can be used.

FIGS. 51A-51C are simplified diagrams illustrating various cross-sectional views of a single crystal acoustic resonator device and of method steps for a transfer process with a multilayer mirror for single crystal acoustic resonator devices according to an example of the present invention. As shown, these figures illustrate the method step of polishing the support layer 5010 to form a polished support layer 5011. In an example, the polishing process can include a chemical-mechanical planarization process or the like.

FIGS. 52A-52C are simplified diagrams illustrating various cross-sectional views of a single crystal acoustic resonator device and of method steps for a transfer process with a multilayer mirror for single crystal acoustic resonator devices according to an example of the present invention. As shown, these figures illustrate flipping the device and physically coupling overlying the support layer 5011 overlying a bond substrate 5210. In an example, the bond substrate 5210 can include a bonding support layer 5220 ($SiO_2$ or like material) overlying a substrate having silicon (Si), sapphire ($Al_2O_3$), silicon dioxide ($SiO_2$), silicon carbide (SiC), or other like materials. In a specific embodiment, the bonding support layer 5220 of the bond substrate 5210 is physically coupled to the polished support layer 5011. Further, the physical coupling process can include a room temperature bonding process followed by a 300 degrees Celsius annealing process.

Figure 53C:
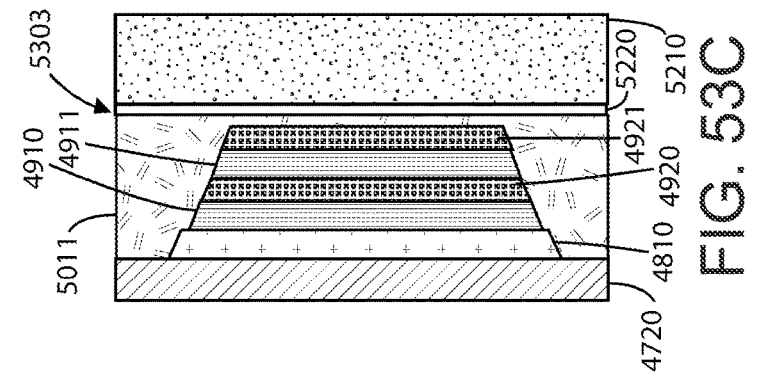
Figure 53A:
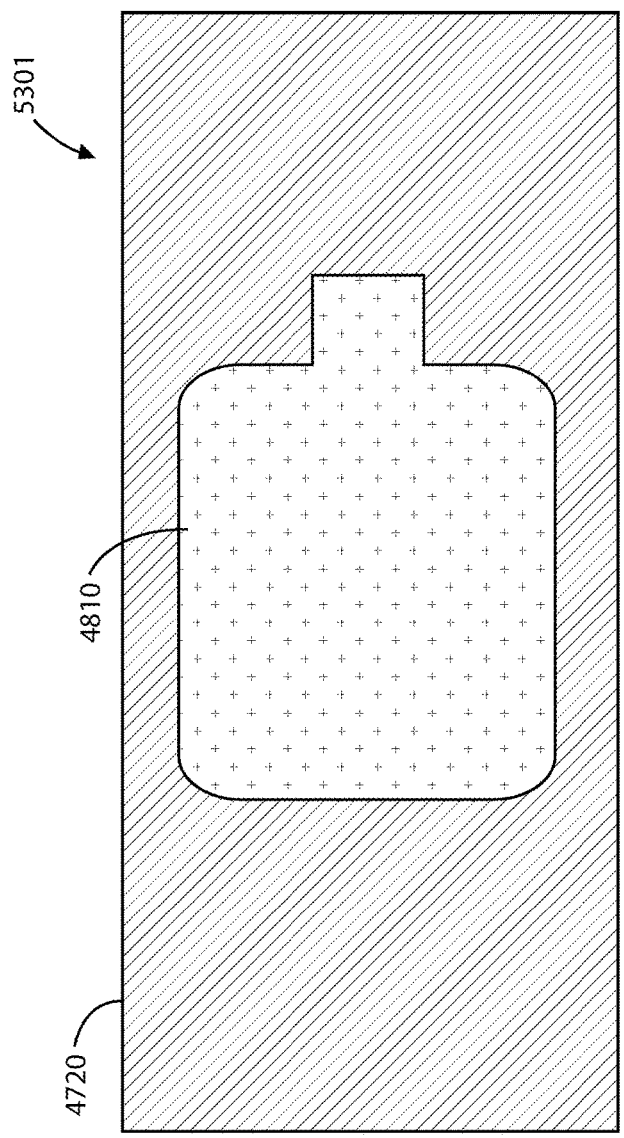
Figure 53B:
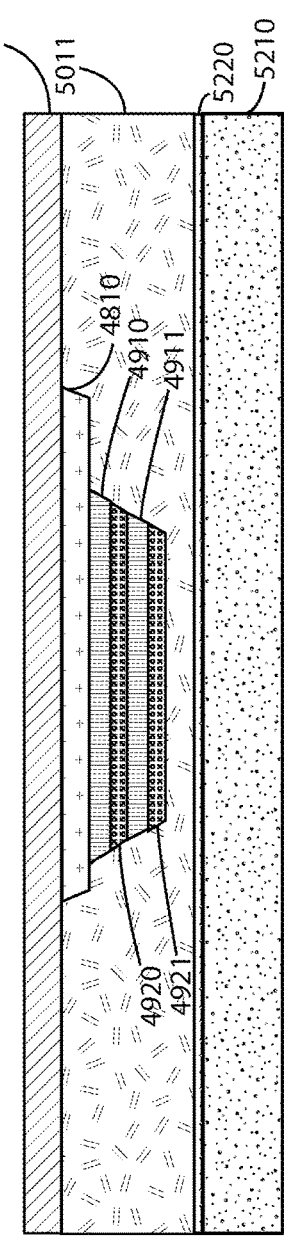

FIGS. 53A-53C are simplified diagrams illustrating various cross-sectional views of a single crystal acoustic resonator device and of method steps for a transfer process with a multilayer mirror for single crystal acoustic resonator devices according to an example of the present invention. As shown, these figures illustrate the method step of removing the growth substrate 4710 or otherwise the transfer of the piezoelectric film 4720. In an example, the removal process can include a grinding process, a blanket etching process, a film transfer process, an ion implantation transfer process, a laser crack transfer process, or the like and combinations thereof.

Figure 54C:
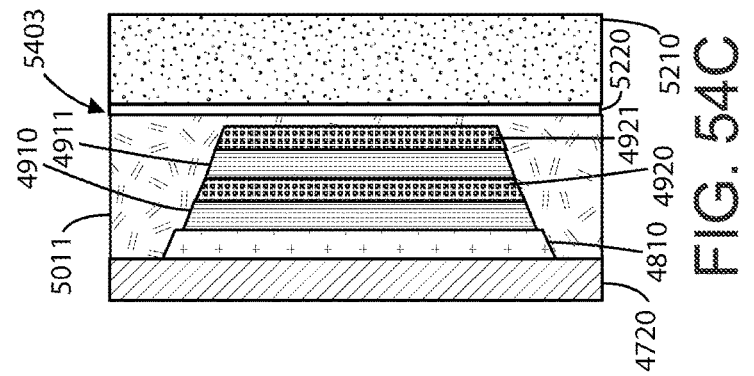
Figure 54A:
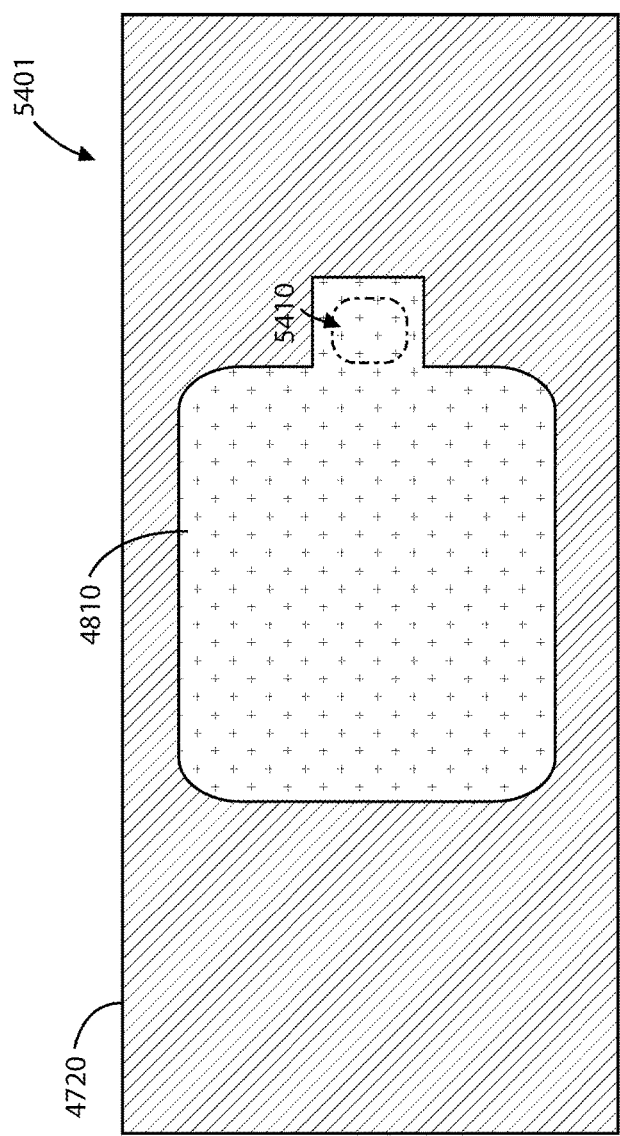
Figure 54B:
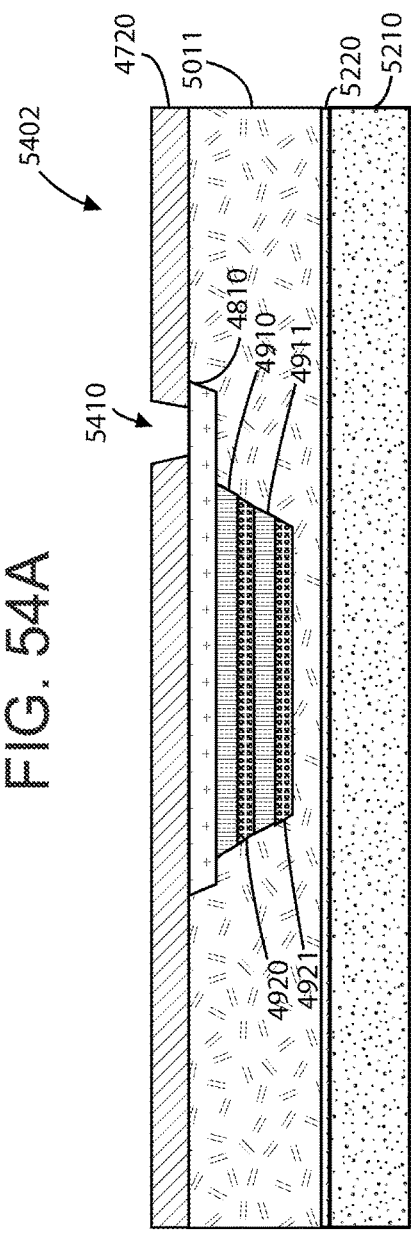

FIGS. 54A-54C are simplified diagrams illustrating various cross-sectional views of a single crystal acoustic resonator device and of method steps for a transfer process with a multilayer mirror for single crystal acoustic resonator devices according to an example of the present invention. As shown, these figures illustrate the method step of forming an electrode contact via 5410 within the piezoelectric film 4720 overlying the first electrode 4810. The via forming processes can include various types of etching processes.

FIGS. 55A-55C are simplified diagrams illustrating various cross-sectional views of a single crystal acoustic resonator device and of method steps for a transfer process with a multilayer mirror for single crystal acoustic resonator devices according to an example of the present invention. As shown, these figures illustrate the method step of forming a second electrode 5510 overlying the piezoelectric film 4720. In an example, the formation of the second electrode 5510 includes depositing molybdenum (Mo), ruthenium (Ru), tungsten (W), or other like materials; and then etching the second electrode 5510 to form an electrode cavity 5511 and to remove portion 5511 from the second electrode to form a top metal 5520. Further, the top metal 5520 is physically coupled to the first electrode 5520 through electrode contact via 5410.

FIGS. 56A-56C are simplified diagrams illustrating various cross-sectional views of a single crystal acoustic resonator device and of method steps for a transfer process with a multilayer mirror for single crystal acoustic resonator devices according to an example of the present invention. As shown, these figures illustrate the method step of forming a first contact metal 5610 overlying a portion of the second electrode 5510 and a portion of the piezoelectric film 4720, and forming a second contact metal 5611 overlying a portion of the top metal 5520 and a portion of the piezoelectric film 4720. In an example, the first and second contact metals can include gold (Au), aluminum (Al), copper (Cu), nickel (Ni), aluminum bronze (AlCu), or other like materials. This figure also shows the method step of forming a second passivation layer 5620 overlying the second electrode 5510, the top metal 5520, and the piezoelectric film 4720. In an example, the second passivation layer 5620 can include silicon nitride (SiN), silicon oxide ($SiO_x$), or other like materials. In a specific example, the second passivation layer 5620 can have a thickness ranging from about 50 nm to about 100 nm.

Figure 57C:
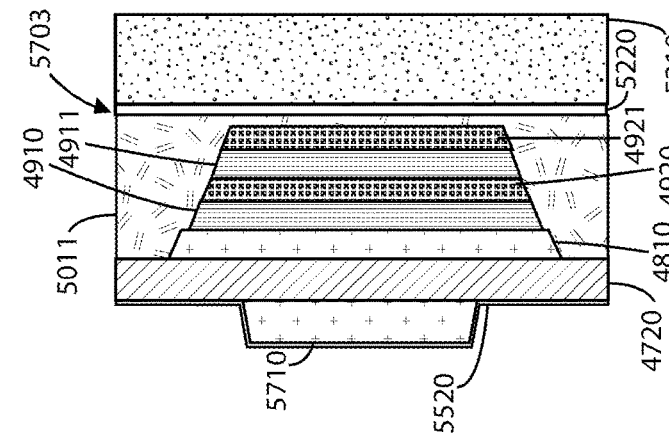
Figure 57A:
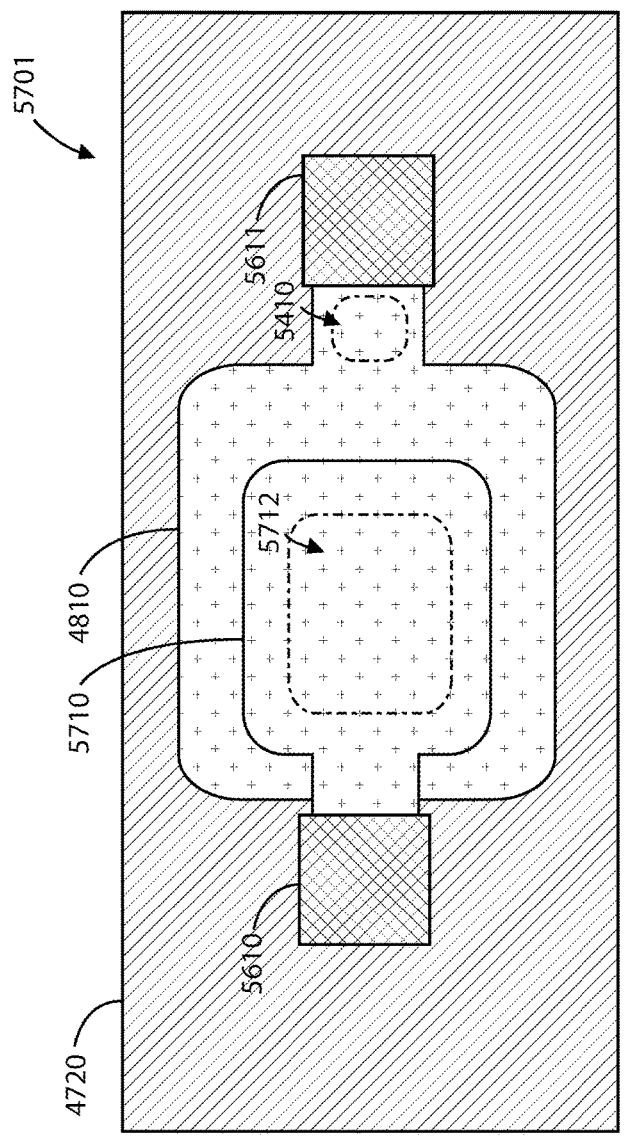
Figure 57B:
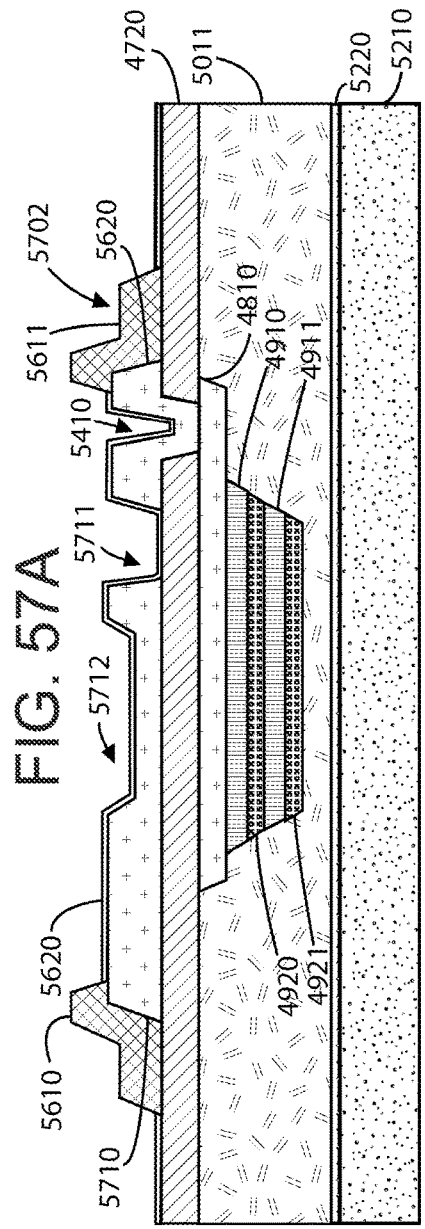

FIGS. 57A-57C are simplified diagrams illustrating various cross-sectional views of a single crystal acoustic resonator device and of method steps for a transfer process with a multilayer mirror for single crystal acoustic resonator devices according to another example of the present invention. As shown, these figures illustrate the method step of processing the second electrode 5510 and the top metal 5520 to form a processed second electrode 5710 and a processed top metal 5720. This step can follow the formation of second electrode 5710 and top metal 5720. In an example, the processing of these two components includes depositing molybdenum (Mo), ruthenium (Ru), tungsten (W), or other like materials; and then etching (e.g., dry etch or the like) this material to form the processed second electrode 5410 with an electrode cavity 5712 and the processed top metal 5720. The processed top metal 5720 remains separated from the processed second electrode 5710 by the removal of portion 5711. In a specific example, this processing gives the second electrode and the top metal greater thickness while creating the electrode cavity 5712. In a specific example, the processed second electrode 5710 is characterized by the addition of an energy confinement structure configured on the processed second electrode 5710 to increase Q.

FIGS. 58A-58C are simplified diagrams illustrating various cross-sectional views of a single crystal acoustic resonator device and of method steps for a transfer process with a multilayer mirror for single crystal acoustic resonator devices according to another example of the present invention. As shown, these figures illustrate the method step of processing the first electrode 4810 to form a processed first electrode 5810. This step can follow the formation of first electrode 4810. In an example, the processing of these two components includes depositing molybdenum (Mo), ruthenium (Ru), tungsten (W), or other like materials; and then etching (e.g., dry etch or the like) this material to form the processed first electrode 5810 with an electrode cavity, similar to the processed second electrode 5710. Compared to the two previous examples, there is no air cavity. In a specific example, the processed first electrode 5810 is characterized by the addition of an energy confinement structure configured on the processed second electrode 5810 to increase Q.

FIGS. 59A-59C are simplified diagrams illustrating various cross-sectional views of a single crystal acoustic resonator device and of method steps for a transfer process with a multilayer mirror for single crystal acoustic resonator devices according to another example of the present invention. As shown, these figures illustrate the method step of processing the first electrode 4810, to form a processed first electrode 5810, and the second electrode 5510/top metal 5520 to form a processed second electrode 5710/processed top metal 5720. These steps can follow the formation of each respective electrode, as described for FIGS. 57A-57C and 58A-58C. Those of ordinary skill in the art will recognize other variations, modifications, and alternatives.

In each of the preceding examples relating to transfer processes, energy confinement structures can be formed on the first electrode, second electrode, or both. In an example, these energy confinement structures are mass loaded areas surrounding the resonator area. The resonator area is the area where the first electrode, the piezoelectric layer, and the second electrode overlap. The larger mass load in the energy confinement structures lowers a cut-off frequency of the resonator. The cut-off frequency is the lower or upper limit of the frequency at which the acoustic wave can propagate in a direction parallel to the surface of the piezoelectric film. Therefore, the cut-off frequency is the resonance frequency in which the wave is travelling along the thickness direction and thus is determined by the total stack structure of the resonator along the vertical direction. In piezoelectric films (e.g., AlN), acoustic waves with lower frequency than the cut-off frequency can propagate in a parallel direction along the surface of the film, i.e., the acoustic wave exhibits a high-band-cut-off type dispersion characteristic. In this case, the mass loaded area surrounding the resonator provides a barrier preventing the acoustic wave from propagating outside the resonator. By doing so, this feature increases the quality factor of the resonator and improves the performance of the resonator and, consequently, the filter.

In addition, the top single crystalline piezoelectric layer can be replaced by a polycrystalline piezoelectric film. In such films, the lower part that is close to the interface with the substrate has poor crystalline quality with smaller grain sizes and a wider distribution of the piezoelectric polarization orientation than the upper part of the film close to the surface. This is due to the polycrystalline growth of the piezoelectric film, i.e., the nucleation and initial film have random crystalline orientations. Considering AlN as a piezoelectric material, the growth rate along the c-axis or the polarization orientation is higher than other crystalline orientations that increase the proportion of the grains with the c-axis perpendicular to the growth surface as the film grows thicker. In a typical polycrystalline AlN film with about a 1 um thickness, the upper part of the film close to the surface has better crystalline quality and better alignment in terms of piezoelectric polarization. By using the thin film transfer process contemplated in the present invention, it is possible to use the upper portion of the polycrystalline film in high frequency BAW resonators with very thin piezoelectric films. This can be done by removing a portion of the piezoelectric layer during the growth substrate removal process. Of course, there can be other variations, modifications, and alternatives.

In an example, the present invention provides a high-performance, ultra-small pass-band Bulk Acoustic Wave (BAW) Radio Frequency (RF) Diplexer for use in 5 and 6 GHz Wi-Fi applications. This diplexer circuit device can be configured with two passbands, a first passband covering U-NII-1 through U-NII-3 and a second passband covering U-NII-5 through U-NII-8 bands, and at least two stopbands, a first stopband rejecting at least a portion of signals in the U-NII-5 through U-NII-8 bands and a second stopband rejecting at least a portion of signals below in the U-NII-1 through U-NII-3 bands. Further details of these bands are shown in FIG. 60.

FIG. 60 is a simplified diagram illustrating filter passband requirements in a radio frequency spectrum according to an example of the present invention. As shown, the frequency spectrum 6000 shows a range from about 3.3 GHz to about 7.125 GHz. Here, a first application band (3.3 GHz-4.2 GHz) 6010 is configured for 5G n77 applications. This band includes a 5G sub-band (3.3 GHz-3.8 GHz) 6011, which includes further LTE sub-bands (3.4 GHz-3.6 GHz) 6012, B43 (3.6 GHz-3.8 GHz) 6013, and CBRS (3.55

GHz-3.7 GHz) 6014. The CBRS band 6014 covers the CBRS LTE B48 and B49 bands. A second application band (4.4 GHz-5.0 GHz) 6020 is configured for 5G n79 applications. Those of ordinary skill in the art will recognize other variations, modifications, and alternatives.

A third application band 6030, labeled (5.15 GHz-5.925), can be configured for the 5.5 GHz Wi-Fi and 5G applications. In an example, this band can include a B252 sub-band (5.15 GHz-5.25 GHz) 6031, a B255 sub-band (5.735 GHz-5850 GHz) 6032, and a B47 sub-band (5.855 GHz-5.925 GHz) 6033. These sub-bands can be configured alongside a UNII-1 band (5.15 GHz-5.25 GHz) 6034, a UNII-2A band (5.25 GHz-5.33 GHz) 6035, a UNII-2C band (5.49 GHz-5.735 GHz) 6036, a UNII-3 band (5.725 GHz-5.835 GHz) 6037, and a UNII-4 band (5.85 GHz-5.925 GHz) 6038. These bands can coexist with additional bands configured following the third application band 6030 for other applications. In an example, there can be a UNII-5 band (5.925 GHz-6.425 GHz) 6040, a UNII-6 band (6.425 GHz-6.525 GHz) 6050, a UNII-7 band (6.525 GHz-6875 GHz) 6060, and a UNII-8 band (6.875 GHz-7.125 GHz) 6070. Of course, there can be other variations, modifications, and alternatives.

In an embodiment, the present diplexer utilizes high purity piezoelectric XBAW technology, as described in the previous figures, which provides leading RF diplexer performance. This filter provides low insertion loss across U-NII-1 through U-NII-3 bands and U-NII-5 through U-NII-8 bands and meets the stringent rejection requirements enabling coexistence with U-NII-1 through U-NII-3 bands and U-NII-5 through U-NII-8 bands. The high-power rating satisfies the demanding power requirements of the latest Wi-Fi (e.g., Wi-Fi6E) and 5G standards.

Figure 61:
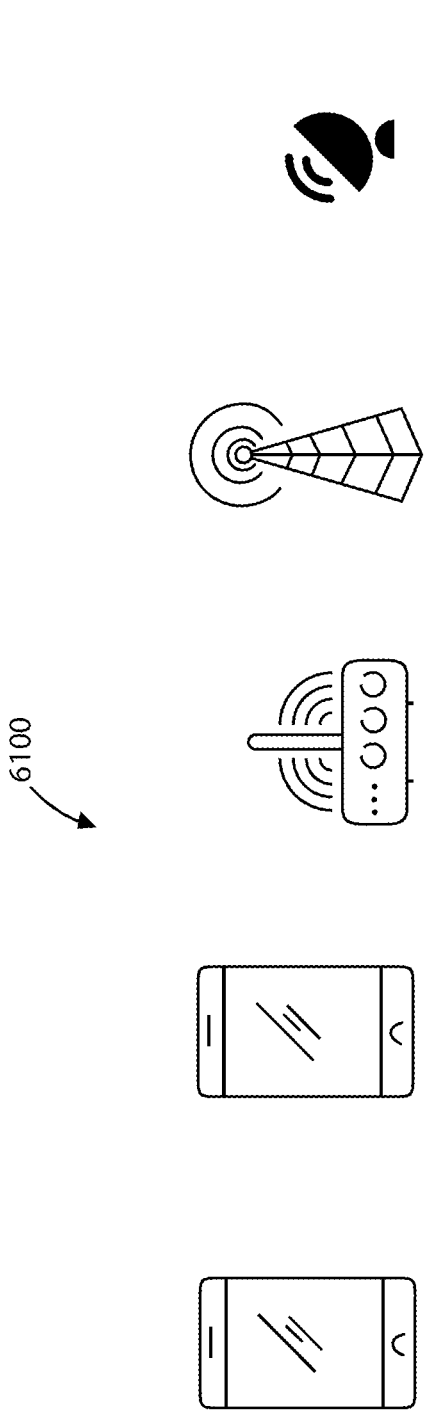
FIG. 61 is a simplified diagram illustrating an overview of key markets that are applications for acoustic wave RF filters according to an example of the present invention.

FIG. 61 is a simplified diagram illustrating an overview of key markets that are applications for acoustic wave RF filters according to an example of the present invention. The application chart 6100 for 5.5 GHz BAW RF filters shows mobile devices, smartphones, automobiles, Wi-Fi tri-band routers, tri-band mobile devices, tri-band smartphones, integrated cable modems, Wi-Fi tri-band access points, 5G small cells, and the like. A schematic representation of the frequency spectrum used in a Wi-Fi/5G system is provided in FIG. 62.

Figure 62:
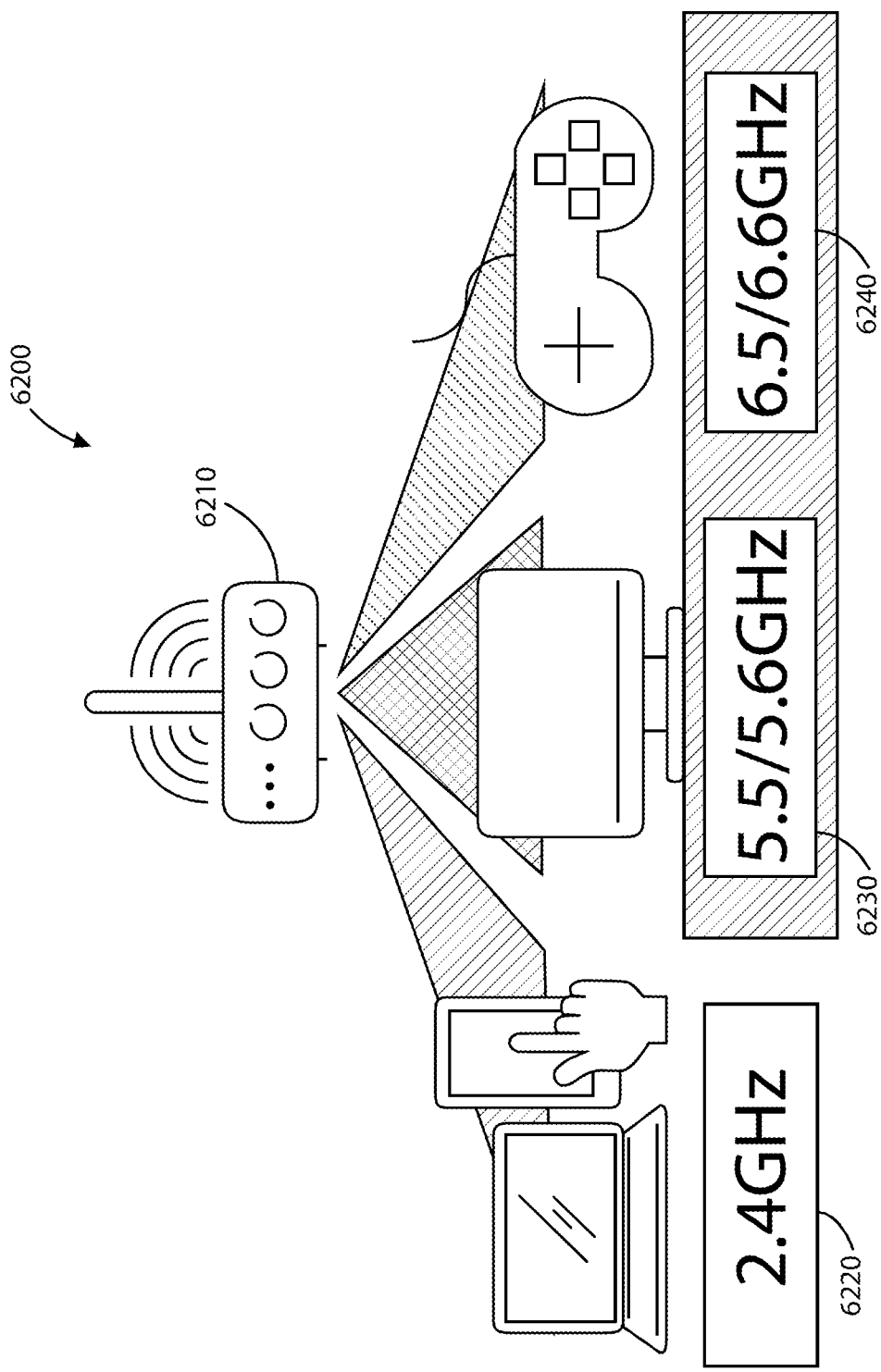
FIG. 62 is a simplified diagram illustrating application areas for RF filters in mobile applications according to examples of the present invention.

FIG. 62 is a simplified diagram illustrating application areas for RF filters in Tri-Band Wi-Fi radios according to examples of the present invention. As shown, RF filters used by communication devices 6210 can be configured for specific applications at three separate bands of operation. In a specific example, application area 6220 operates at 2.4 GHz and includes computing and mobile devices, application area 6230 operates at 5.5/5.6 GHz and includes television and display devices, and application area 6240 operates at 6.5/6.6 GHz and includes video game console and handheld devices. Those of ordinary skill in the art will recognize other variations, modifications, and alternatives.

The present invention includes resonator and RF filter devices using both textured polycrystalline materials (deposited using PVD methods) and single crystal piezoelectric materials (grown using CVD technique upon a seed substrate). Various substrates can be used for fabricating the acoustic devices, such silicon substrates of various crystallographic orientations and the like. Additionally, the present method can use sapphire substrates, silicon carbide substrates, gallium nitride (GaN) bulk substrates, or aluminum nitride (AlN) bulk substrates. The present method can also use GaN templates, AlN templates, and $Al_xGa_{1-x}N$ templates (where x varies between 0.0 and 1.0). These substrates and templates can have polar, non-polar, or semi-polar crystallographic orientations. Further the piezoelectric materials deposed on the substrate can include allows selected from at least one of the following: AlN, AlGaN, MgHfAlN, GaN, InN, InGaN, AlInN, AlInGaN, ScAlN, ScAlGaN, ScGaN, ScN, BAlN, BAlScN, and BN.

The resonator and filter devices may employ process technologies including but not limited to Solidly-Mounted Resonator (SMR), Film Bulk Acoustic Resonator (FBAR), or XBAW technology. Representative cross-sections are shown below in FIGS. 63A-63C. For clarification, the terms "top" and "bottom" used in the present specification are not generally terms in reference of a direction of gravity. Rather, the terms "top" and "bottom" are used in reference to each other in the context of the present device and related circuits. Those of ordinary skill in the art will recognize other variations, modifications, and alternatives.

In an example, the piezoelectric layer ranges between 0.1 and 2.0 um and is optimized to produced optimal combination of resistive and acoustic losses. The thickness of the top and bottom electrodes range can between 250 Å and 2500 Å and the metal consists of a refractory metal with high acoustic velocity and low resistivity. In a specific example, the resonators can be "passivated" with a dielectric (not shown in FIGS. 63A-63C) consisting of a nitride and or an oxide and whose range is between 100 Å and 2000 Å. In this case, the dielectric layer is used to adjust resonator resonance frequency. Extra care is taken to reduce the metal resistivity between adjacent resonators on a metal layer called the interconnect metal. The thickness of the interconnect metal can range between 500 Å and 5 um. The resonators contain at least one air cavity interface in the case of SMRs and two air cavity interfaces in the case of FBARs and XBAWs. In an example, the shape of the resonators can be selected from asymmetrical shapes including ellipses, rectangles, and polygons, and the like. Further, the resonators contain reflecting features near the resonator edge on one or both sides of the resonator.

Figure 63A:
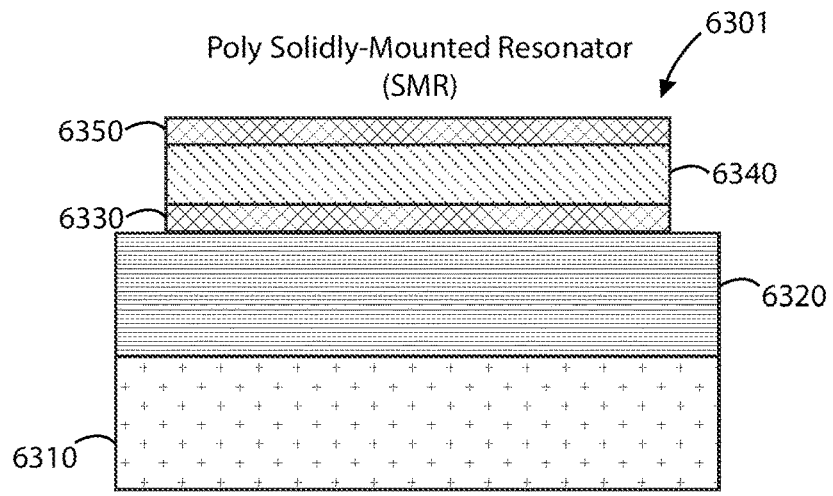
FIGS. 63A-63C are simplified diagrams illustrating cross-sectional views of resonator devices according to various examples of the present invention.
Figure 63B:
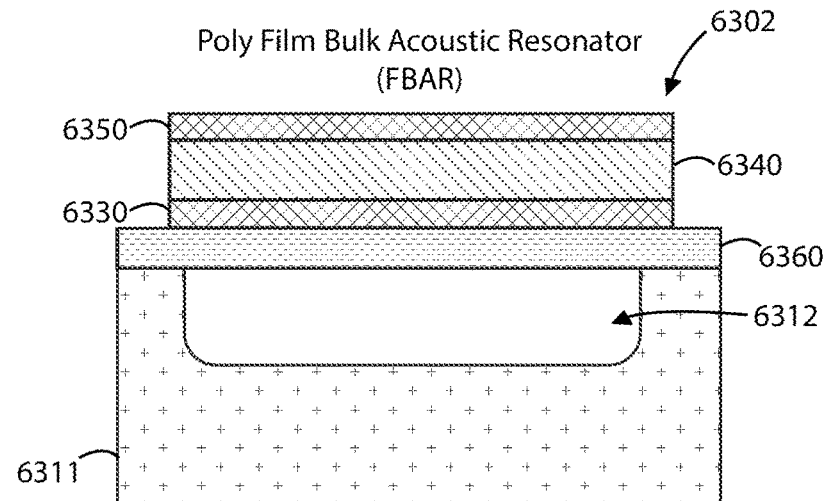
Figure 63C:
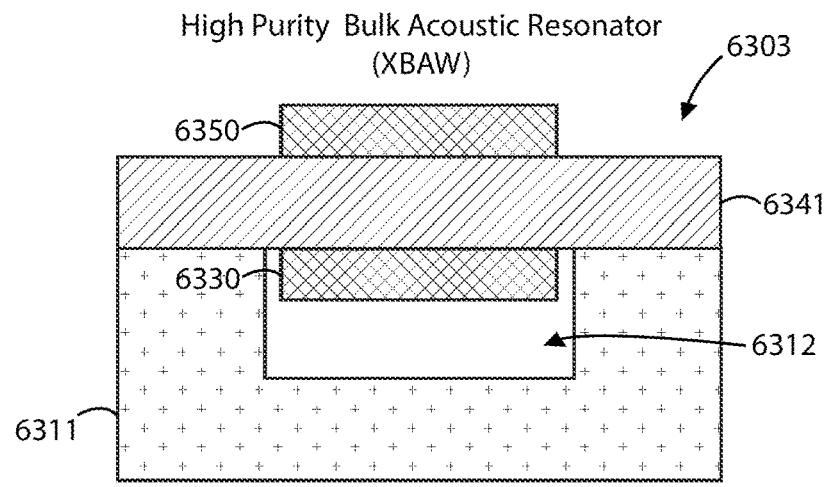

FIGS. 63A-63C are simplified diagrams illustrating cross-sectional views of resonator devices according to various examples of the present invention. More particularly, device 6301 of FIG. 63A shows a BAW resonator device including an SMR, FIG. 63B shows a BAW resonator device including an FBAR, and FIG. 63C shows a BAW resonator device with a high purity XBAW. As shown in SMR device 6301, a reflector device 6320 is configured overlying a substrate member 6310. The reflector device 6320 can be a Bragg reflector or the like. A bottom electrode 6330 is configured overlying the reflector device 6320. A polycrystalline piezoelectric layer 6340 is configured overlying the bottom electrode 6330. Further, a top electrode 6350 is configured overlying the polycrystalline layer 6340. As shown in the FBAR device 6302, the layered structure including the bottom electrode 6330, the polycrystalline layer 6340, and the top electrode 6350 remains the same. The substrate member 6311 includes an air cavity 6312, and a dielectric layer is formed overlying the substrate member 6311 and covering the air cavity 6312. As shown in XBAW device 6303, the substrate member 6311 also contains an air cavity 6312, but the bottom electrode 6330 is formed within a region of the air cavity 6312. A high purity piezoelectric layer 6341 is formed overlying the substrate member 6311, the air cavity 6312, and the bottom electrode 6341. Further, a top electrode 6350 is formed overlying a portion of the high purity piezoelectric layer 6341. This high purity piezoelectric layer 6341 can include piezoelectric materials as described throughout this specification. These resonators can be scaled and configured into circuit configurations shown in FIGS. 65A-65C.

FIG. 64A is a simplified circuit diagram of a diplexer device according to an example of the present invention. As shown, device 6401 includes a first BAW resonator device 6411 and a second BAW resonator device 6412. Each of these BAW resonator devices have inductors coupled of both ends (inductors 6421 and 6423 coupled to the first BAW resonator 6411; and inductors 6422 and 6424 coupled to the second BAW resonator 6412). Inductors 6423 and 6424 are also coupled to a common node, which is also coupled to another inductor 6425. A first port (P1) 6441 is coupled to inductor 6421 and a second port (P2) 6442 is coupled to the BAW resonator device 6410. A third port, which can be an antenna port, is coupled to inductor 6425. Those of ordinary skill in the art will recognize other variations, modifications, and alternatives.

In an example, the present invention provides an RF diplexer circuit device. The diplexer can include a first filter circuit and a second filter circuit coupled to a multiplexer or inductor device. The first filter circuit can be configured to receive a first input signal and to produce a first filtered signal, while the second filter circuit configured to receive a second input signal and to produce a second filtered signal. Each of these filter circuits includes a plurality of series resonators and a plurality of shunt resonators. The multiplexer or inductor device is coupled to the first filter circuit and the second filter circuit and can be configured to select between the first filtered signal and the second filtered signal. An example inductor configuration is shown in FIG. 64B.

In an example, the resonators of the first and second filter devices can be configured in ladder configuration. In this case, the plurality of series resonators is configured in a serial configuration and the plurality of shunt resonators is configured in a parallel configuration. In a specific example, the serial configuration forms a resonance profile and an anti-resonance profile. The parallel configuration also forms a resonance profile and an anti-resonance profile. These profiles are such that the resonance profile from the serial configuration is off-set with the anti-resonance profile of the parallel configuration to form the pass-band.

In an example, the resonators of the first and second filter devices can be configured in a lattice configuration. In this case, the plurality of series resonators includes a first plurality configured in a first serial configuration and a second plurality configured in a second serial configuration. The plurality of shunt resonators includes a plurality of shunt resonator pairs, each of which are cross-coupled between one of the first plurality of series resonators in the first serial configuration and one of the second plurality of series resonators in the second serial configuration. In a specific example, this lattice configuration can include a plurality of baluns or inductors, each of which is coupled between the first and second serial configurations and configured between each of the plurality of shunt resonator pairs.

Figure 64B:
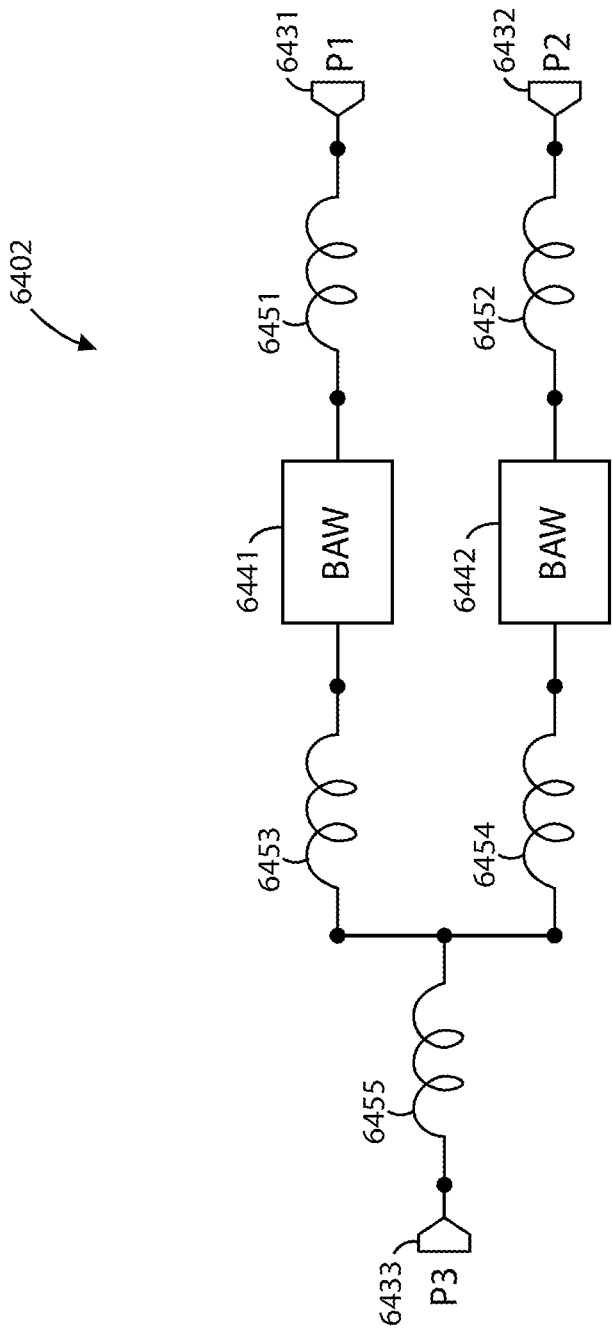
FIG. 64B is a simplified circuit diagram of a diplexer device according to an example of the present invention.

FIG. 64B is a simplified circuit diagram of a diplexer device according to an example of the present invention. As shown, device 6402 includes a first BAW resonator device 6441 and a second BAW resonator device 6442. Each of these BAW resonator devices have inductors coupled of both ends (inductors 6451 and 6453 coupled to the first BAW resonator 6441; and inductors 6452 and 6454 coupled to the second BAW resonator 6442). Inductors 6453 and 6454 are also coupled to a common node, which is also coupled to another inductor 6445. A first port (P1) 6431 is coupled to inductor 6451 and a second port (P2) 6432 is coupled to inductor 6452. A third port (P3) 6433, which can be an antenna port, is coupled to inductor 6455. The topologies of the filter circuits 6411/6412 of FIG. 64A and resonator devices 6441/6442 in FIG. 64B can include those discussed below.

Figure 65A:
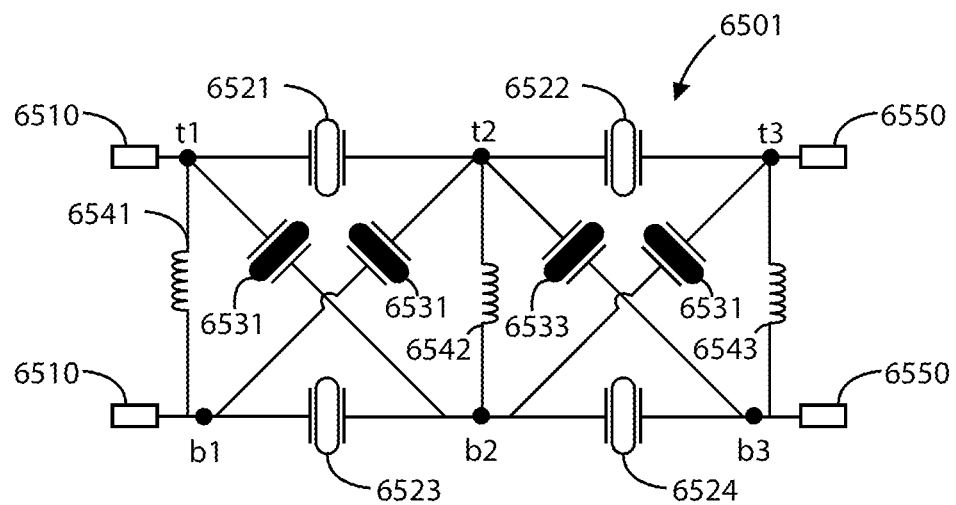
FIGS. 65A-65C are simplified circuit diagrams illustrating representative lattice and ladder configurations for acoustic filter designs according to examples of the present invention.
Figure 65B:
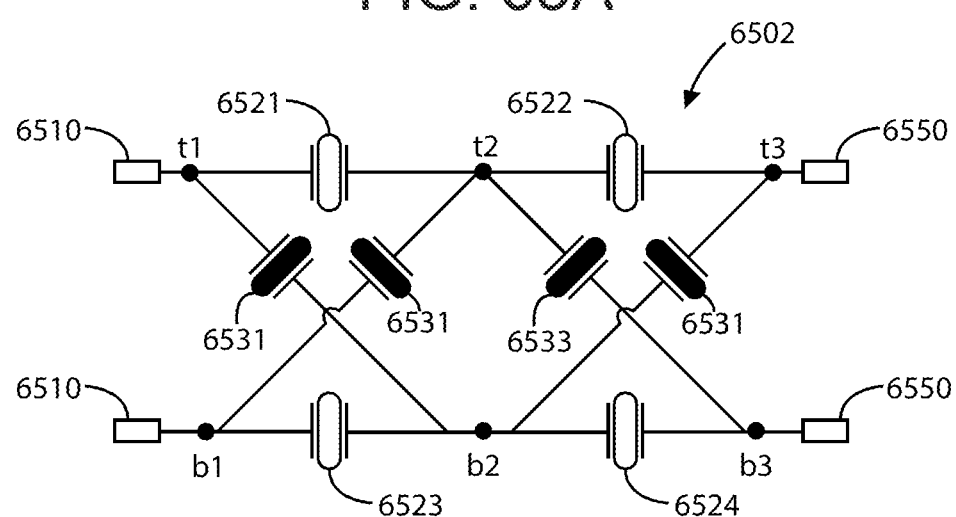
Figure 65C:
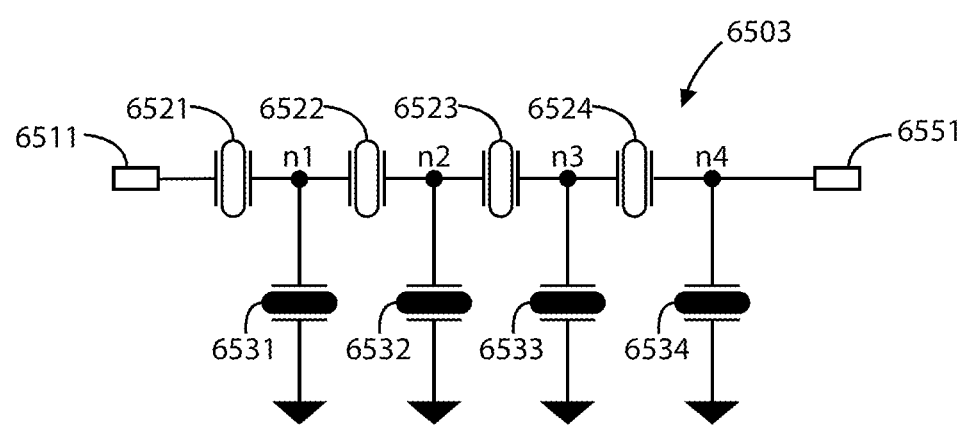

The RF filter circuit can comprise various circuit topologies, including modified lattice ("I") 6501, lattice ("II") 6502, and ladder ("III") 6503 circuit configurations, as shown in FIGS. 65A, 65B, and 65C, respectively. These figures are representative lattice and ladder diagrams for acoustic filter designs including resonators and other passive components. The lattice and modified lattice configurations include differential input ports 6510 and differential output ports 6550, while the ladder configuration includes a single-ended input port 6511 and a single-ended output port 6550. In the lattice configurations, nodes are denoted by top nodes (t1-t3) and bottom nodes (b1-b3), while in the ladder configuration the nodes are denoted as one set of nodes (n1-n4). The series resonator elements (in cases I, II, and III) are shown with white center elements 6521-6524 and the shunt resonator elements have darkened center circuit elements 6531-6534. The modified lattice circuit diagram (FIG. 65A) includes inductors 6541-6543. The filter circuit contains resonators with at least two resonance frequencies. The center of the pass-band frequency can be adjusted by a trimming step (using an ion milling technique or other like technique) and the shape the filter skirt can be adjusted by trimming individual resonator elements (to vary the resonance frequency of one or more elements) in the circuit. The BAW resonators with their sharp impedance variations over frequency can be responsible for the high filter steepness of the filter circuit device.

In an example, the inductors and capacitors shown in FIGS. 64B and 65A-65C and any other matching elements can be realized on-chip (in proximity to the resonator elements) or off-chip (nearby to the resonator chip) and can be used to adjust frequency pass-band and/or matching of impedance (to achieve the return loss specification) for the filter circuit. Furthermore, inductors in the shunt resonator paths can be used as additional design parameters. In various examples, this has proven to be especially effective to control the wideband response of the filter for high rejection.

Additionally, Surface Mount Device (SMD) components, such as inductors and capacitors, can be employed externally to the device to improve its overall electrical performance. In FIG. 64B, these elements are represented as series inductors at the filter input and output. Of course, there can be variations, modifications, and alternatives.

In an example, the present invention provides an RF filter circuit device using a ladder configuration including a plurality of resonator devices and a plurality of shunt configuration resonator devices. Each of the plurality of resonator devices includes at least a capacitor device, a bottom electrode, a piezoelectric material, a top electrode, and an insulating material configured in accordance to any of the resonator examples described previously. The plurality of resonator devices is configured in a serial configuration, while the plurality of shunt configuration resonators is configured in a parallel configuration such that one of the plurality of shunt configuration resonators is coupled to the serial configuration following each of the plurality of resonator devices.

In an example, the RF filter circuit device in a ladder configuration can also be described as follows. The device can include an input port, a first node coupled to the input port, a first resonator coupled between the first node and the input port. A second node is coupled to the first node and a second resonator is coupled between the first node and the second node. A third node is coupled to the second node and a third resonator is coupled between the second node and the third node. A fourth node is coupled to the third node and a fourth resonator is coupled between the third node and the output port. Further, an output port is coupled to the fourth node. Those of ordinary skill in the art will recognize other variations, modifications, and alternatives.

Each of the first, second, third, and fourth resonators can include a capacitor device. Each such capacitor device can include a substrate member, which has a cavity region and an upper surface region contiguous with an opening in the first cavity region. Each capacitor device can include a bottom electrode within a portion of the cavity region and a piezoelectric material overlying the upper surface region and the bottom electrode. Also, each capacitor device can include a top electrode overlying the piezoelectric material and the bottom electrode, as well as an insulating material overlying the top electrode and configured with a thickness to tune the resonator.

The diplexer device includes a first filter device and a second filter device. In a ladder configuration, each filter device includes a serial configuration a parallel configuration. Further, a first circuit response can be configured between the first input port and the output port and configured from the serial and parallel configurations of the first filter device to achieve a first transmission loss from a first pass-band and a second circuit response can be configured between the second input port and the output port and configured from the serial and parallel configurations of the second filter device to achieve a second transmission loss from a second pass-band.

In an example, the first pass-band has a characteristic frequency centered around 5.4925 GHz and having a bandwidth from 5.150 GHz to 5.835 GHz such that the characteristic frequency centered around 5.4925 GHz is tuned from a lower frequency ranging from about 4.9 GHz to 5.4 GHz. In this case, the second pass-band has a characteristic frequency centered around 6.535 GHz and having a bandwidth from 5.945 GHz to 7.125 GHz such that the characteristic frequency centered around 6.535 GHz is tuned from a lower frequency ranging from about 5.9 GHz to 6.4 GHz.

In an example, the first pass-band has a characteristic frequency centered around 5.5225 GHz and having a bandwidth from 5.150 GHz to 5.895 GHz such that the characteristic frequency centered around 5.5225 GHz is tuned from a lower frequency ranging from about 4.9 GHz to 5.4 GHz. In this case, the second pass-band has a characteristic frequency centered around 6.615 GHz and having a bandwidth from 6.105 GHz to 7.125 GHz such that the characteristic frequency centered around 6.535 GHz is tuned from a lower frequency ranging from about 5.9 GHz to 6.4 GHz.

In an example, the piezoelectric materials can include single crystal materials, polycrystalline materials, or combinations thereof and the like. The piezoelectric materials can also include a substantially single crystal material that exhibits certain polycrystalline qualities, i.e., an essentially single crystal material. In a specific example, the first, second, third, and fourth piezoelectric materials are each essentially a single crystal aluminum nitride (AlN) bearing material or aluminum scandium nitride (AlScN) bearing material, a single crystal gallium nitride (GaN) bearing material or gallium aluminum nitride (GaAlN) bearing material, a magnesium hafnium aluminum nitride (MgHfAlN) material, or the like. In other specific examples, these piezoelectric materials each comprise a polycrystalline aluminum nitride (AlN) bearing material or aluminum scandium nitride (AlScN) bearing material, or a polycrystalline gallium nitride (GaN) bearing material or gallium aluminum nitride (GaAlN) bearing material, a magnesium hafnium aluminum nitride (MgHfAlN) material, or the like. In other examples, the piezoelectric materials can include aluminum gallium nitride ($Al_xGa_{1-x}N$) material or an aluminum scandium nitride ($Al_xSc_{1-x}N$) material characterized by a composition of $0 \leq X < 1.0$. As discussed previously, the thicknesses of the piezoelectric materials can vary, and in some cases can be greater than 250 nm.

In a specific example, the piezoelectric material can be configured as a layer characterized by an x-ray diffraction (XRD) rocking curve full width at half maximum ranging from 0 degrees to 2 degrees. The x-ray rocking curve FWHM parameter can depend on the combination of materials used for the piezoelectric layer and the substrate, as well as the thickness of these materials. Further, an FWHM profile is used to characterize material properties and surface integrity features, and is an indicator of crystal quality/purity. The acoustic resonator devices using single crystal materials exhibit a lower FWHM compared to devices using polycrystalline material, i.e., single crystal materials have a higher crystal quality or crystal purity.

In a specific example, the serial configuration forms a resonance profile and an anti-resonance profile. The parallel configuration also forms a resonance profile and an anti-resonance profile. These profiles are such that the resonance profile from the serial configuration is off-set with the anti-resonance profile of the parallel configuration to form the pass-band.

In a specific example, the each of the pass-bands is characterized by a band edge on each side of the pass-band and having an amplitude difference ranging from 10 dB to 60 dB. Each of the pass-bands has a pair of band edges; each of which has a transition region from the pass-band to a stop band such that the transition region is no greater than 250 MHz. In another example, each of the pass-bands can include a pair of band edges and each of these band edges can have a transition region from the pass-band to a stop band such that the transition region ranges from 5 MHz to 250 MHz.

In a specific example, the insulating materials include a silicon nitride bearing material, an oxide bearing material, or combinations thereof.

In a specific example, the present device can be configured as a bulk acoustic wave (BAW) filter device. Each of the first, second, third, and fourth resonators can be a BAW resonator. Similarly, each of the first, second, third, and fourth shunt resonators can be BAW resonators. The present device can further include one or more additional resonator devices numbered from N to M, where N is four and M is twenty. Similarly, the present device can further include one or more additional shunt resonator devices numbered from N to M, where N is four and M is twenty. In other examples, the present device can include a plurality of resonator devices configured with a plurality of shunt resonator devices in a ladder configuration, a lattice configuration, or other configuration as previously described.

In an example, the present invention provides an RF filter circuit device using a lattice configuration including a plurality of top resonator devices, a plurality of bottom resonator devices, and a plurality of shunt configuration resonator devices. Similar to the ladder configuration RF filter circuit, each of the plurality of top and bottom resonator devices includes at least a capacitor device, a bottom electrode, a piezoelectric material, a top electrode, and an insulating material configured in accordance to any of the resonator examples described previously. The plurality of top resonator devices is configured in a top serial configuration and the plurality of bottom resonator devices is configured in a bottom serial configuration. Further, the plurality of shunt configuration resonators is configured in a cross-coupled configuration such that a pair of the plurality of shunt configuration resonators is cross-coupled between the top serial configuration and the bottom serial configuration and between one of the plurality of top resonator devices and one of the plurality of the bottom resonator devices. In a specific example, this device also includes a plurality of inductor devices, wherein the plurality of inductor devices are configured such that one of the plurality of inductor devices is coupled between the differential input port, one of the plurality of inductor devices is coupled between the differential output port, and one of the plurality of inductor devices is coupled to the top serial configuration and the bottom serial configuration between each cross-coupled pair of the plurality of shunt configuration resonators.

In an example, the RF circuit device in a lattice configuration can also be described as follows. The device can include a differential input port, a top serial configuration, a bottom serial configuration, a first lattice configuration, a second lattice configuration, and a differential output port. The top serial configuration can include a first top node, a second top node, and a third top node. A first top resonator can be coupled between the first top node and the second top node, while a second top resonator can be coupled between the second top node and the third top node. Similarly, the bottom serial configuration can include a first bottom node, a second bottom node, and a third bottom node. A first bottom resonator can be coupled between the first bottom node and the second bottom node, while a second bottom resonator can be coupled between the second bottom node and the third bottom node.

In an example, the first lattice configuration includes a first shunt resonator cross-coupled with a second shunt resonator and coupled between the first top resonator of the top serial configuration and the first bottom resonator of the bottom serial configuration. Similarly, the second lattice configuration can include a first shunt resonator cross-coupled with a second shunt resonator and coupled between the second top resonator of the top serial configuration and the second bottom resonator of the bottom serial configuration. The top serial configuration and the bottom serial configuration can each be coupled to both the differential input port and the differential output port.

In a specific example, the device further includes a first balun coupled to the differential input port and a second balun coupled to the differential output port. The device can further include an inductor device coupled between the differential input and output ports. In a specific example, the device can further include a first inductor device coupled between the first top node of the top serial configuration and the first bottom node of the bottom serial configuration; a second inductor device coupled between the second top node of the top serial configuration and the second bottom node of the bottom serial configuration; and a third inductor device coupled between the third top node of the top serial configuration and the third bottom node of the bottom serial configuration.

The packaging approach includes but is not limited to wafer level packaging (WLP), WLP-plus-cap wafer approach, flip-chip, chip and bond wire, as shown in FIGS. 66A, 66B, 67A and 67B. One or more RF filter chips and one or more filter bands can be packaged within the same housing configuration. Each RF filter band within the package can include one or more resonator filter chips and passive elements (capacitors, inductors) can be used to tailor the bandwidth and frequency spectrum characteristic. For a 5G-Wi-Fi system application, a package configuration including 5 RF filter bands, including the n77, n78, n79, and a 5.15-5.835 GHz (U-NII-1, U-NII-2A, UNII-2C and U-NII-3) bandpass solutions is capable using BAW RF filter technology. For a Tri-Band Wi-Fi system application, a package configuration including 3 RF filter bands, including the 2.4-2.5 GHz, 5.15-5.835 GHz and 5.945-7.125 GHz bandpass solutions, is capable using BAW RF filter technology. The 2.4-2.5 GHz filter solution can be either surface acoustic wave (SAW) or BAW, whereas the 5.15-5.835 GHz and 5.945-7.125 GHz bands are likely BAW given the high frequency capability of BAW.

Figure 66A:
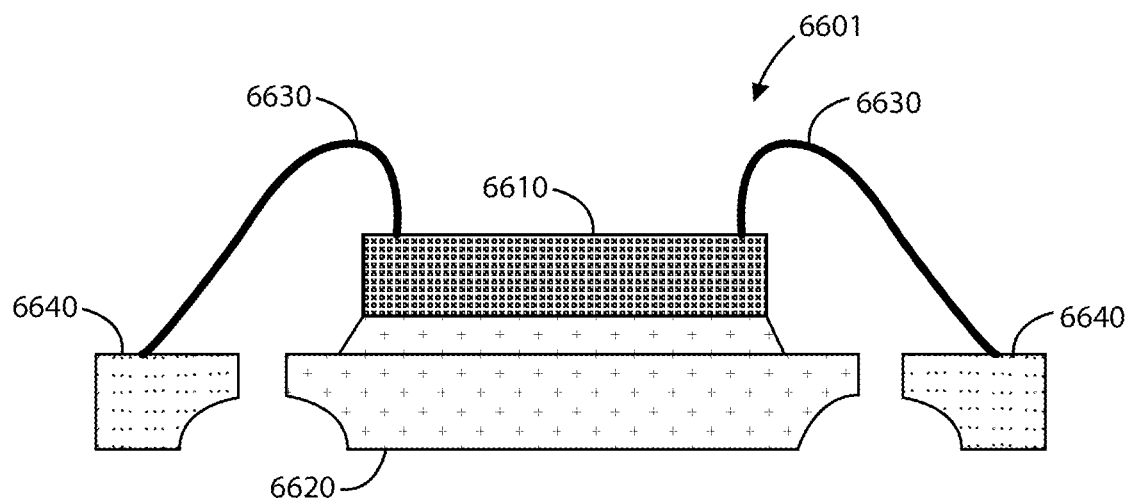
FIGS. 66A-66B are simplified diagrams illustrating packing approaches according to various examples of the present invention.

FIG. 66A is a simplified diagram illustrating a packing approach according to an example of the present invention. As shown, device 6601 is packaged using a conventional die bond of an RF filter die 6610 to the base 6620 of a package and metal bond wires 6630 to the RF filter chip from the circuit interface 6640.

Figure 66B:
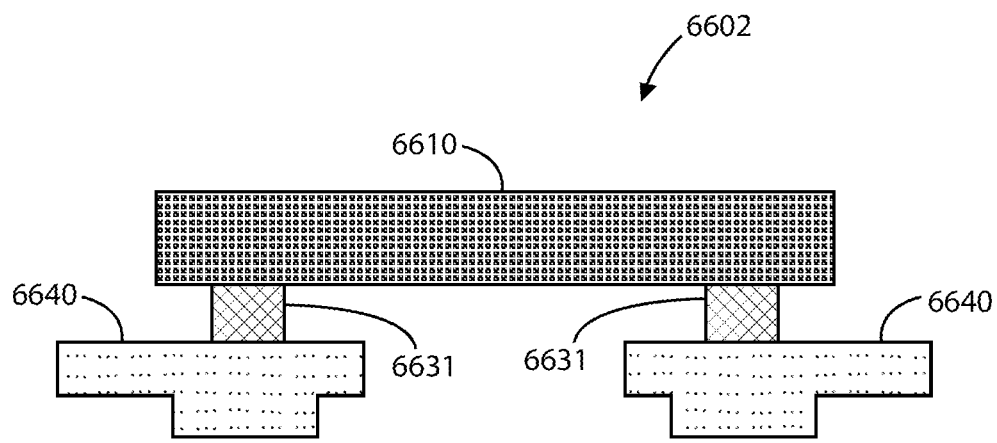

FIG. 66B is as simplified diagram illustrating a packing approach according to an example of the present invention. As shown, device 6602 is packaged using a flip-mount wafer level package (WLP) showing the RF filter silicon die 6610 mounted to the circuit interface 6640 using copper pillars 6631 or other high-conductivity interconnects.

Figure 67A:
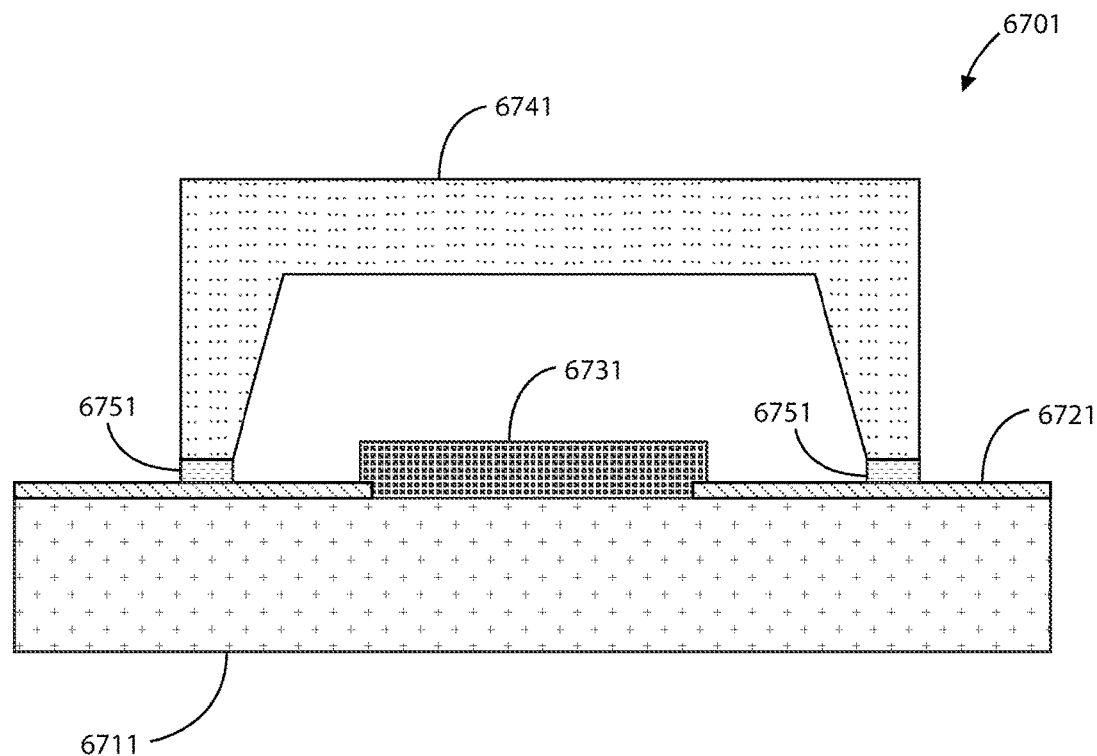
FIGS. 67A-67B are simplified diagrams illustrating packing approaches according to an example of the present invention.
Figure 67B:
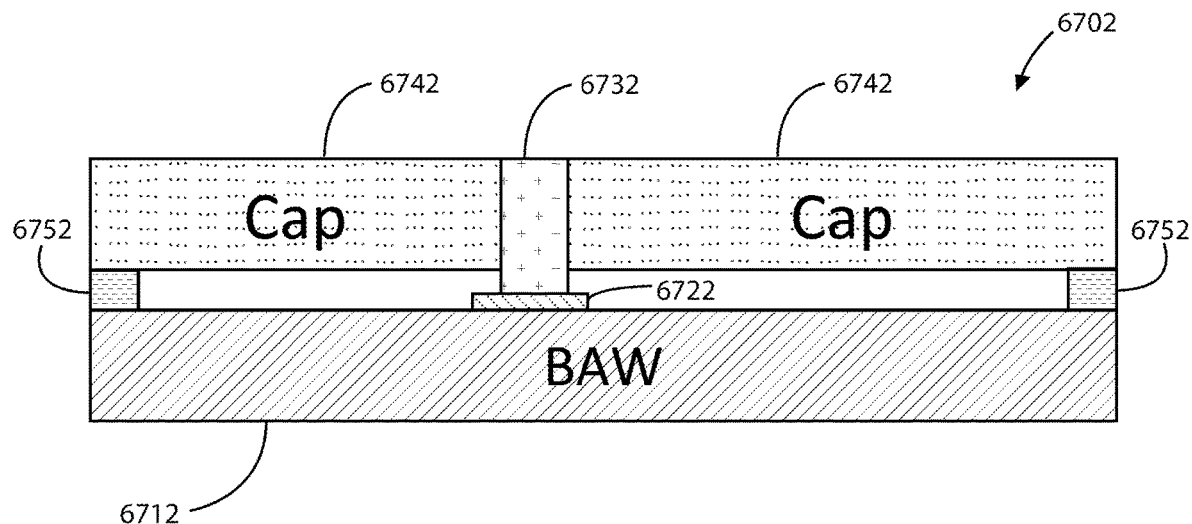

FIGS. 67A-67B are simplified diagrams illustrating packing approaches according to examples of the present invention. In FIG. 67A, device 6701 shows an alternate version of a WLP utilizing a BAW RF filter circuit MEMS device 6731 and a substrate 6711 to a cap wafer 6741. In an example, the cap wafer 6741 may include thru-silicon-vias (TSVs) to electrically connect the RF filter MEMS device 6731 to the topside of the cap wafer (not shown in the figure). The cap wafer 6741 can be coupled to a dielectric layer 6721 overlying the substrate 6711 and sealed by sealing material 6751.

In FIG. 67B, device 6702 shows another version of a WLP bonding a processed BAW substrate 6712 to a cap layer 6742. As discussed previously, the cap wafer 6742 may include thru-silicon vias (TSVs) 6732 spatially configured through a dielectric layer 6722 to electrically connect the BAW resonator within the BAW substrate 6712 to the topside of the cap wafer. Similar to the device of FIG. 67A, the cap wafer 6742 can be coupled to a dielectric layer overlying the BAW substrate 6712 and sealed by sealing material 6752. Of course, there can be other variations, modifications, and alternatives.

In an example, the present diplexer passes frequencies in the two ranges and rejects frequencies outside of these two passbands. Additional features of the 5.1-7.1 GHz acoustic wave diplexer circuit are provided below. The circuit symbol which is used to reference the RF diplexer building block is provided in FIG. 68. The electrical performance specifications of the diplexer are provided in FIG. 69 and the passband performance of the diplexer is provided in FIGS. 70A and 70B.

In various examples, the present diplexer can have certain features. The multiple RF resonator filter circuit chip die configurations can be less than 2 mm×2 mm×0.5 mm; in a specific example, the die configuration is typically less than 1 mm×1 mm×0.2 mm. The packaged device has an ultra-small form factor, such as a 1.1 mm×0.9 mm×0.3 mm for a WLP approach, shown in FIGS. 66B, 67A, and 67B. A larger form factor, such as a 2 mm×2.5 mm×0.9 mm, is available using a wire bond approach, shown in FIG. 66A, for higher power applications. In a specific example, the device is configured with a single-ended 50-Ohm antenna, and transmitter/receiver (Tx/Rx) ports. The high rejection of the device enables coexistence with adjacent Wi-Fi U-NII-1 to U-NII-3 and U-NII-5 to U-NII-8 bands. The device can also be characterized by a high power rating (maximum greater than +30 dBm), a low insertion loss pass-band filter with less than 3.0 dB transmission loss, and performance over a temperature range from −40 degrees Celsius to +85 degrees Celsius. Further, in a specific example, the device is RoHS (Restriction of Hazardous Substances) compliant and uses Pb-free (lead-free) packaging.

Figure 68:
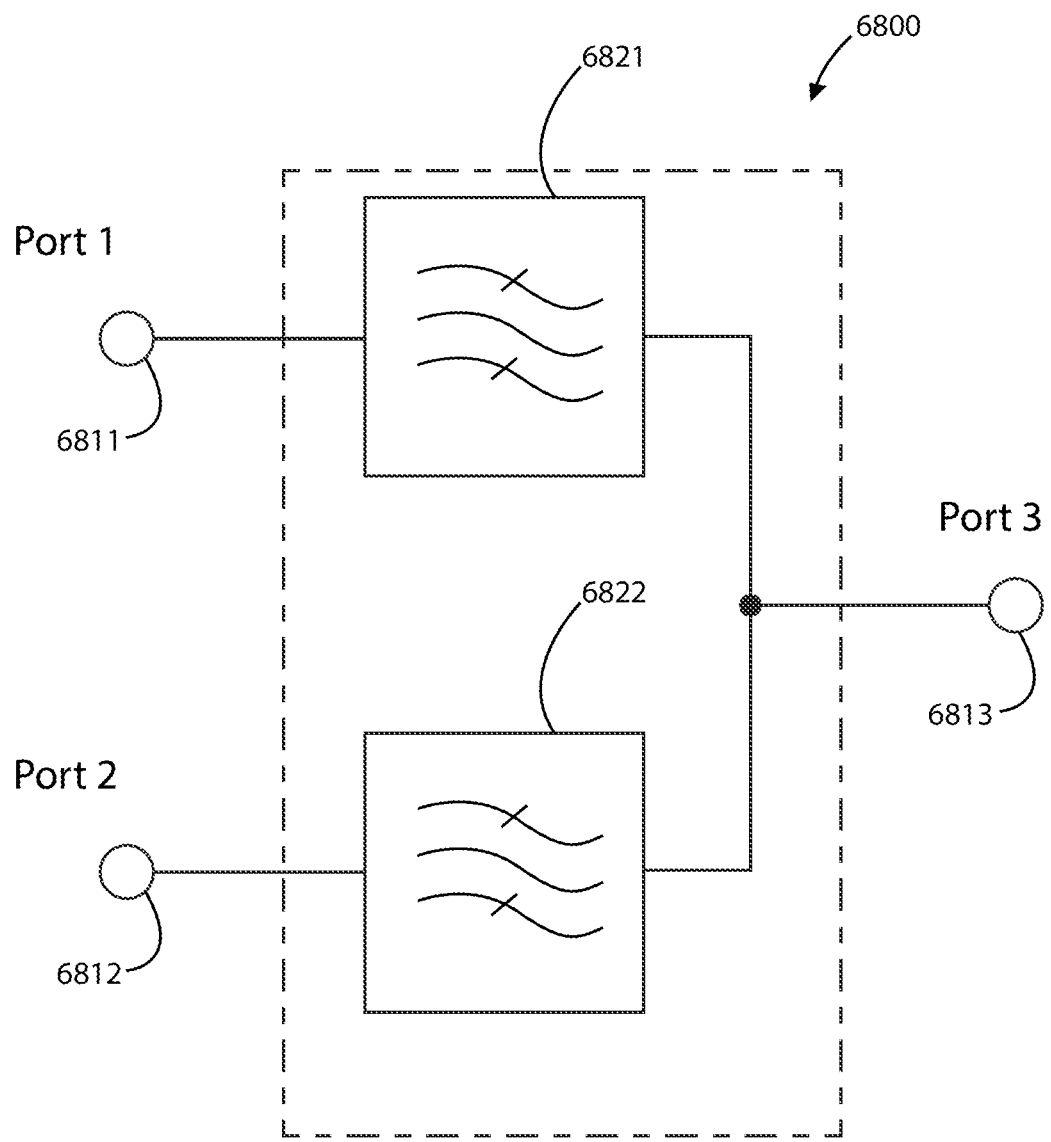
FIG. 68 is a simplified circuit diagram illustrating a 3-port BAW RF circuit according to an example of the present invention.

FIG. 68 is a simplified circuit diagram illustrating a 3-port BAW RF diplexer circuit according to an example of the present invention. As shown, circuit 6800 includes a first port ("Port 1") 6811 coupled to a first filter 6821 and a second port ("Port 2") 6812 coupled to a second filter 6822. A third port ("Port 3") is also coupled to both the first filter 6821 and the second filter 6821. In an example, the first port 6811 represents a connection from a transmitter (TX) or receiver (RX) to the first filter 6821, the second port represents a connection from a TX or RX to the second filter 6822 and the third port represents a connection from the diplexer, including the first and second filters 6821, 6822, to an antenna (ANT). The TX, RX, and ANT components of the diplexer can be configured for the particular frequency passbands of first and second filters. Examples of the first and second filters are described with reference to FIGS. 69A and 69B, which show different passband frequency gaps between the first and second filters.

FIG. 69A is a simplified table of diplexer parameters according to an example of the present invention. As shown, table 6901 includes electrical specifications for a 5.1-7.1 GHz RF resonator diplexer circuit including parameters for a first filter and a second filter. The circuit parameters are provided along with the specification units, minimum, typical and maximum specification values.

In this case, the first filter is characterized by a passband ranging from 5150 MHz to 5895 MHz (5522.5 MHz center frequency). Insertion loss in the passband is typically around 2 dB, with a maximum of 3 dB. Ripple in the passband is typically around 1 dB, with a maximum of 2.0 dB. Return loss in the passband is typically around 12 dB, with a minimum of 10 dB. Also, the first filter can have a minimum attenuation of 25 dB (typically around 35 dB) for a frequency range of 700 MHz to 2400 MHz; a minimum attenuation of 30 dB (typically around 40 dB) for a frequency range of 2400 MHz to 2500 MHz; a minimum attenuation of 25 dB (typically around 35 dB) for a frequency range of 3300 MHz to 5000 MHz; a minimum attenuation of 35 dB (typically around 40 dB) for a frequency range of 5935 MHz to 6015 MHz; a minimum attenuation of 45 dB (typically around 50 dB) for a frequency range of 6015 MHz to 7125 MHz; and a minimum attenuation of 25 dB (typically around 35 dB) for a frequency range of 7200 MHz to 12000 MHz.

The second filter is characterized by a passband ranging from 5945 MHz to 7125 MHz (6535 MHz center frequency). Insertion loss in the passband is typically around 2 dB, with a maximum of 3 dB. Ripple in the passband is typically around 1 dB, with a maximum of 2.0 dB. Return loss in the passband is typically around 12 dB, with a minimum of 10 dB. Also, the second filter can have a minimum attenuation of 25 dB (typically around 35 dB) for a frequency range of 700 MHz to 2400 MHz; a minimum attenuation of 30 dB (typically around 40 dB) for a frequency range of 2400 MHz to 2500 MHz; a minimum attenuation of 25 dB (typically around 35 dB) for a frequency range of 3300 MHz to 5000 MHz; a minimum attenuation of 45 dB (typically around 50 dB) for a frequency range of 5150 MHz to 5815 MHz; a minimum attenuation of 35 dB (typically around 40 dB) for a frequency range of 5815 MHz to 5895 MHz; and a minimum attenuation of 45 dB (typically around 50 dB) for a frequency range of 6000 MHz to 12000 MHz.

The diplexer can have a minimum third order intercept of 49 dB, and a maximum RF input power of 1 W. The I/O resistance is 50 ohms nominal for all three ports. The device operating temperature ranges from −40 degrees Celsius to 85 degrees Celsius. Further, the diplexer package size can be 2.7 mm×2.7 mm×0.8 mm.

FIG. 69B is a simplified table of diplexer parameters according to an example of the present invention. As shown, table 6902 includes electrical specifications for a 5.1-7.1 GHz RF resonator diplexer circuit including parameters for a first filter and a second filter. The circuit parameters are provided along with the specification units, minimum, typical and maximum specification values.

In this case, the first filter is characterized by a passband ranging from 5150 MHz to 5895 MHz (5522.5 MHz center frequency). Insertion loss in the passband is typically around 2 dB, with a maximum of 2.5 dB. Ripple in the passband is typically around 0.8 dB, with a maximum of 1.2 dB. Return loss in the passband is typically around 15 dB, with a minimum of 12 dB. Also, the first filter can have a minimum attenuation of 40 dB (typically around 45 dB) for a frequency range of 30 MHz to 1000 MHz; a minimum attenuation of 35 dB (typically around 40 dB) for a frequency range of 1000 MHz to 2700 MHz; a minimum attenuation of 30 dB (typically around 35 dB) for a frequency range of 3300 MHz to 4200 MHz; a minimum attenuation of 30 dB (typically around 35 dB) for a frequency range of 4400 MHz to 5000 MHz; a minimum attenuation of 50 dB (typically around 55 dB) for a frequency range of 6105 MHz to 7125 MHz; a minimum attenuation of 25 dB (typically around 30 or 35 dB) for a frequency range of 7300 MHz to 8000 MHz; and a minimum attenuation of 30 dB (typically around 35 dB) for a frequency range of 10000 MHz to 11750 MHz.

The second filter is characterized by a passband ranging from 6105 MHz to 7125 MHz (6615 MHz center frequency). Insertion loss in the passband is typically around 2 dB, with a maximum of 2.5 dB. Ripple in the passband is typically around 0.8 dB, with a maximum of 1.2 dB. Return loss in the passband is typically around 15 dB, with a minimum of 12 dB. Also, the second filter can have a minimum attenuation of 40 dB (typically around 45 dB) for a frequency range of 30 MHz to 1000 MHz; a minimum attenuation of 35 dB (typically around 40 dB) for a frequency range of 1000 MHz to 2700 MHz; a minimum attenuation of 30 dB (typically around 35 dB) for a frequency range of 3300 MHz to 4200 MHz; a minimum attenuation of 30 dB (typically around 35 dB) for a frequency range of 4400 MHz to 5000 MHz; a minimum attenuation of 50 dB (typically around 55 dB) for a frequency range of 5170 MHz to 5895 MHz; a minimum attenuation of 25 dB (typically around 30 or 35 dB) for a frequency range of 7300 MHz to 8000 MHz; and a minimum attenuation of 30 dB (typically around 35 dB) for a frequency range of 11500 MHz to 14300 MHz.

The diplexer can have a typical input power of 28 dBm, with a maximum of 30 dBm. The I/O resistance is 50 ohms nominal for all three ports. The device operating temperature ranges from −40 degrees Celsius to 85 degrees Celsius. Further, the diplexer package size can be 2.5 mm×2.5 mm×0.8 mm.

Figure 70A:
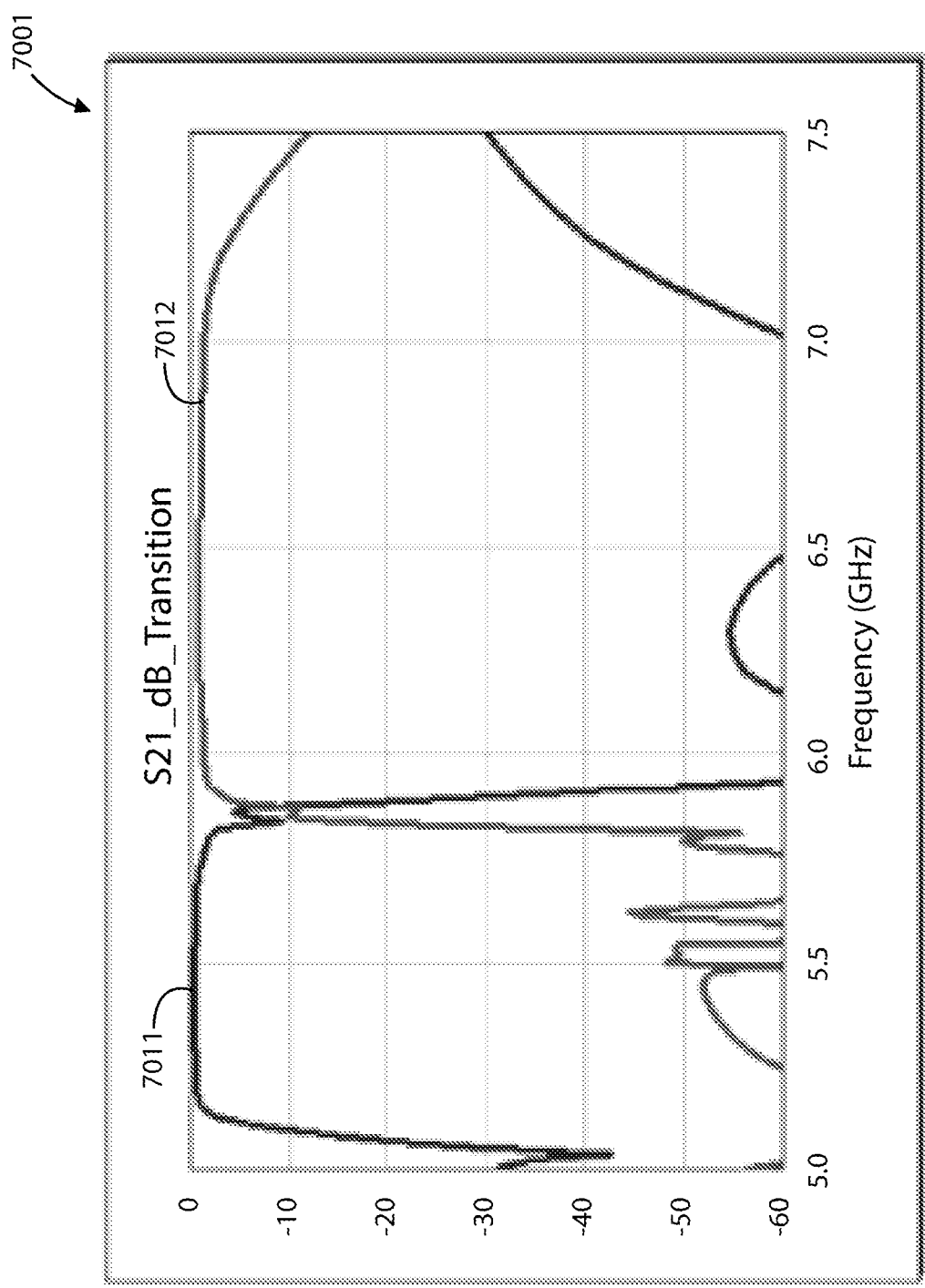
FIGS. 70A and 70B are simplified graphs representing passband insertion loss over frequency according to examples of the present invention.

FIG. 70A is a simplified graph representing insertion loss over frequency according to an example of the present invention. As shown, graph 7001 represents passband modeled responses 7011, 7012 for a 5.1-7.1 GHz RF diplexer (i.e., diplexer described in FIG. 69A) using a ladder RF filter configuration (curve 7011 represents the 5.15-5.835 GHz filter of the diplexer and curve 7012 represents the 5.945-7.125 GHz filter of the diplexer). The modeled curves 7011 and 7012 are the transmission losses (s21) predicted from a linear simulation tool incorporating non-linear, full 3-dimensional (3D) electromagnetic (EM) simulation.

Figure 70B:
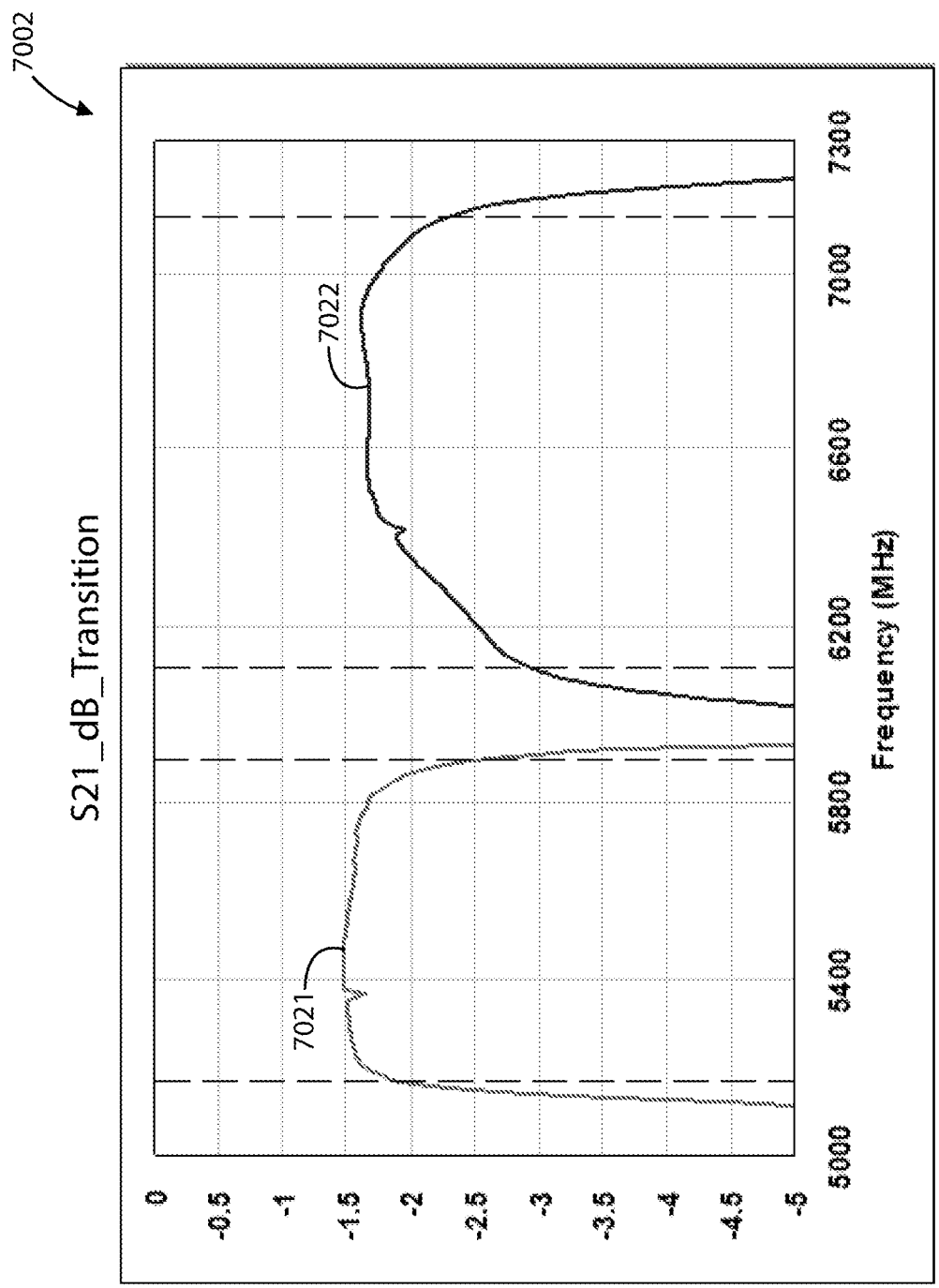

FIG. 70B is a simplified graph representing insertion loss over frequency according to an example of the present invention. As shown, graph 7002 represents passband modeled responses 7021, 7022 for a 5.1-7.1 GHz RF diplexer (i.e., diplexer described in FIG. 69B) using a ladder RF filter configuration (curve 7021 represents the 5.15-5.895 GHz filter of the diplexer and curve 7022 represents the 6.105-7.125 GHz filter of the diplexer). The modeled curves 7021 and 7022 are the transmission losses (s21) predicted from a linear simulation tool incorporating non-linear, full 3-dimensional (3D) electromagnetic (EM) simulation.

Figure 71A:
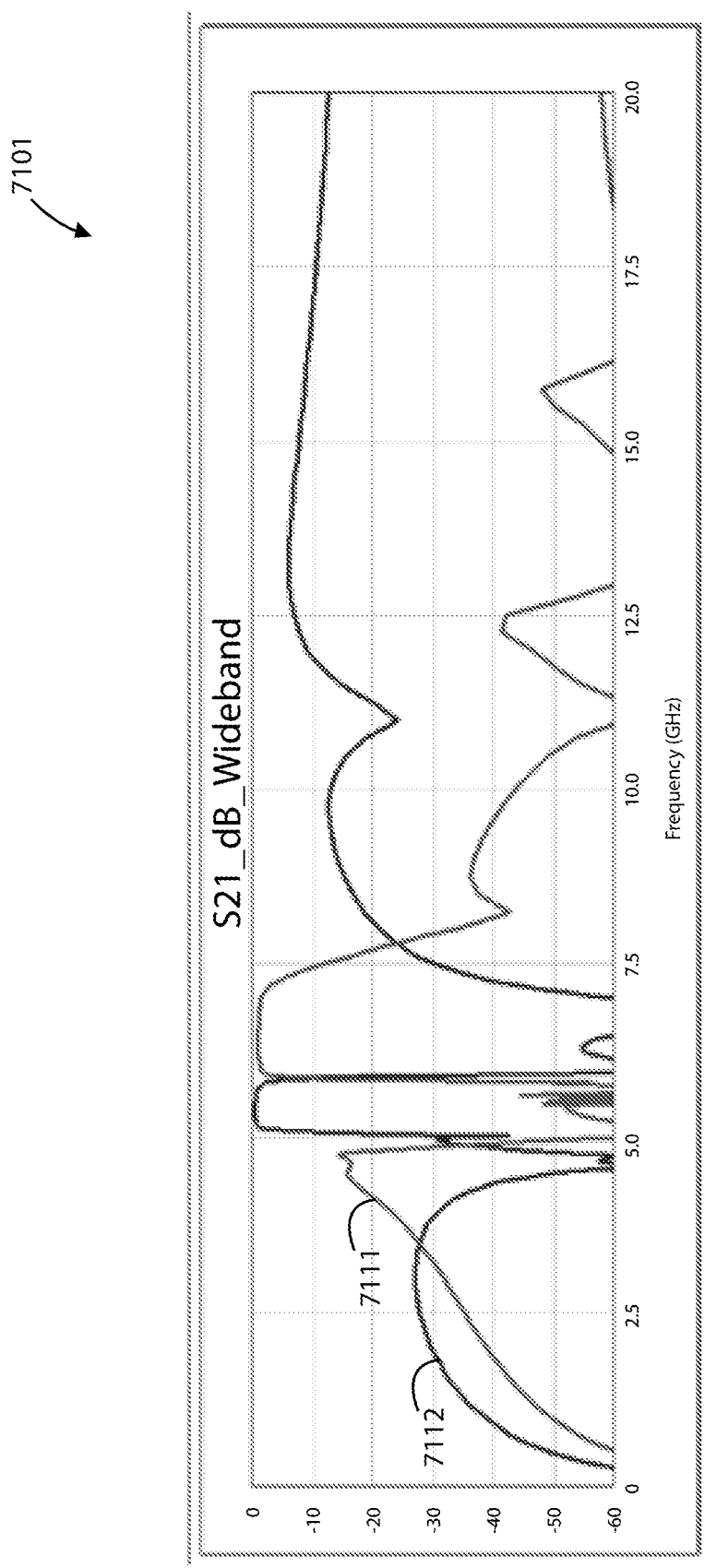
FIGS. 71A and 71B are simplified graphs representing wideband insertion loss over frequency according to examples of the present invention.

FIG. 71A is a simplified graph representing insertion loss over frequency according to an example of the present invention. As shown, graph 7101 represents wideband modeled responses 7112, 7111 for a 5.1-7.1 GHz RF diplexer (i.e., diplexer described in FIG. 69A) using a ladder RF filter configuration (curve 7111 represents the 5.15-5.835 GHz filter of the diplexer and curve 7112 represents the 5.945-7.125 GHz filter of the diplexer). The modeled curves 7111 and 7112 are the transmission losses (s21) predicted from a linear simulation tool incorporating non-linear, full 3-dimensional (3D) electromagnetic (EM) simulation.

Figure 71B:
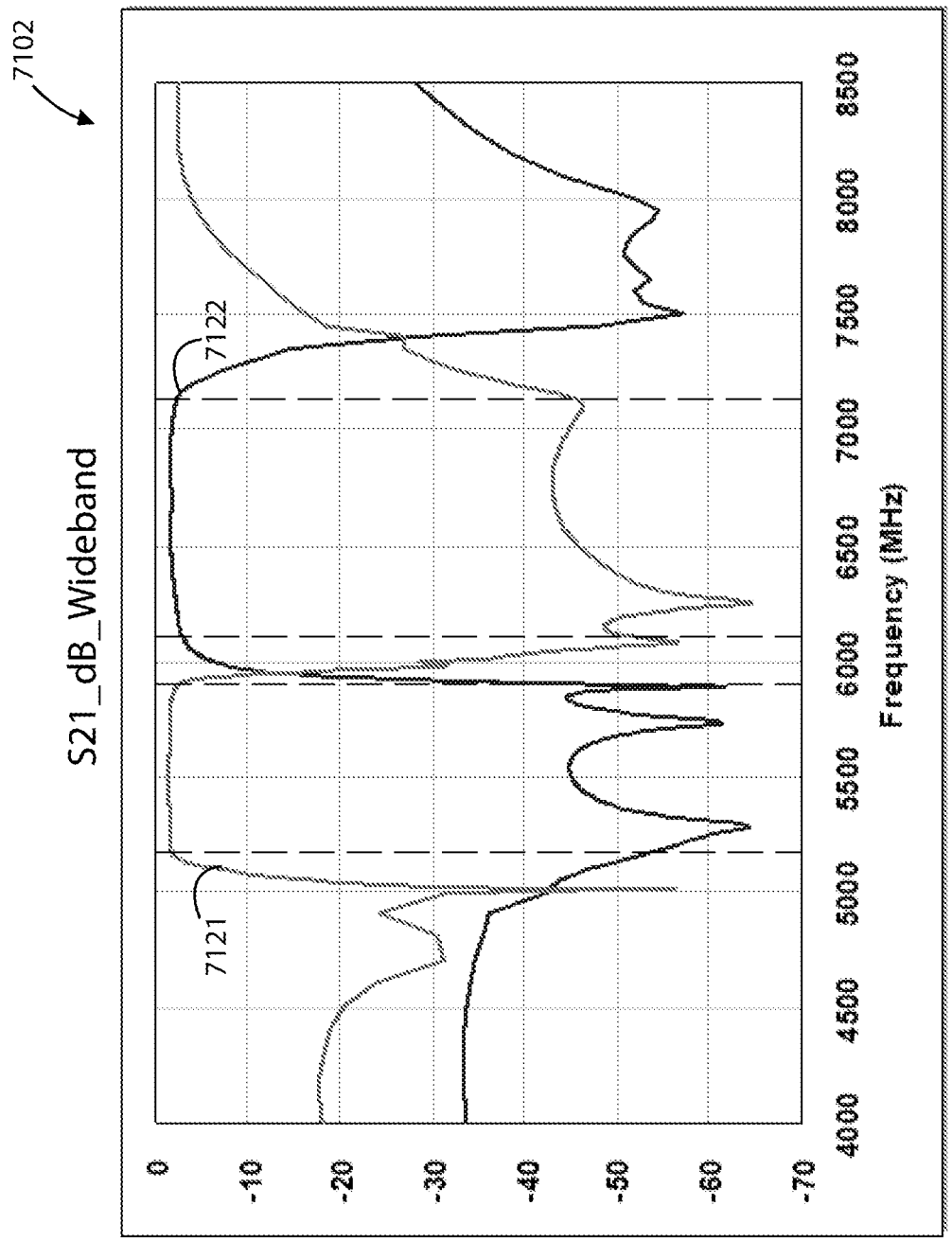

FIG. 71B is a simplified graph representing insertion loss over frequency according to an example of the present invention. As shown, graph 7102 represents wideband modeled responses 7121, 7122 for a 5.1-7.1 GHz RF diplexer (i.e., diplexer described in FIG. 69B) using a ladder RF filter configuration (curve 7121 represents the 5.15-5.895 GHz filter of the diplexer and curve 7122 represents the 6.105-7.125 GHz filter of the diplexer). The modeled curves 7121 and 7122 are the transmission losses (s21) predicted from a linear simulation tool incorporating non-linear, full 3-dimensional (3D) electromagnetic (EM) simulation.

While the above is a full description of the specific embodiments, various modifications, alternative constructions and equivalents may be used. As an example, the packaged device can include any combination of elements described above, as well as outside of the present specification. Therefore, the above description and illustrations should not be taken as limiting the scope of the present invention which is defined by the appended claims.

What is claimed is:
1. An RF diplexer device, the device comprising:
a first filter circuit configured to receive a first input signal and to produce a first filtered signal;
a second filter circuit configured to receive a second input signal and to produce a second filtered signal;
wherein each of the first and second filter circuits comprises a plurality of series resonators and a plurality of shunt resonators;
wherein each of the plurality of series resonators comprises a substrate member having a cavity region and an upper surface region contiguous with an opening of the cavity region,
a bottom electrode within a portion of the cavity region,
a piezoelectric material overlying the upper surface region and the bottom electrode,
a top electrode overlying the piezoelectric material and overlying the bottom electrode, and
an insulating material overlying the top electrode;
wherein the first filter circuit has a first circuit response configured from the serial configuration of the first filter circuit and the parallel configuration of the first filter circuit to achieve a first transmission loss from a first pass band having a first characteristic frequency centered around 5.4925 GHz and having a bandwidth from 5.150 GHz to 5.835 GHz; and
wherein the second filter circuit has a second circuit response configured from the serial configuration of the second filter circuit and the parallel configuration of the second filter circuit to achieve a second transmission loss from a second pass band having a second characteristic frequency centered around 6.535 GHz and having a bandwidth from 5.945 GHz to 7.125 GHz; and
a multiplexer coupled to the first filter circuit and the second filter circuit and configured to select between the first filtered signal and the second filtered signal,
wherein the first filter circuit comprises a maximum insertion loss of 3.0 dB within the first pass band, a maximum amplitude variation characterizing the pass-band of less than 2.0 dB, and a minimum return loss characterizing the pass-band of 10 dB; and
wherein the second filter circuit comprises a maximum insertion loss of 3.0 dB within the second pass band, a maximum amplitude variation characterizing the pass-band of 2.0 dB, and a minimum return loss characterizing the pass-band of 10 dB; and
wherein the RF diplexer device has an operating temperature ranging from −40 Degrees Celsius to 85 Degrees Celsius, a microwave characteristic impedance of 50 Ohms, a maximum power handling capability within the pass-band of +30 dBm or 1 Watt.

2. The RF diplexer device of claim 1 wherein the piezoelectric material comprises a single crystal aluminum nitride (AlN) bearing material, a single crystal aluminum scandium nitride (AlScN) bearing material, a single crystal gallium nitride (GaN) bearing material, a single crystal gallium aluminum nitride (GaAlN) bearing material, or a single crystal magnesium hafnium aluminum nitride (MgHfAlN) material.

3. The R diplexer device of claim 1 wherein the piezoelectric material comprises a polycrystalline aluminum nitride (AlN) bearing material, a polycrystalline aluminum scandium nitride (AlScN) bearing material, a polycrystalline gallium nitride (GaN) bearing material, a polycrystalline gallium aluminum nitride (GaAlN) bearing material, or a polycrystalline magnesium hafnium aluminum nitride (MgHfAlN) material.

4. The RF diplexer device of claim 1 wherein the insulating material comprises a silicon nitride bearing material or an oxide bearing material.

5. The RF diplexer device of claim 1 wherein each of the first pass band and the second pass band is characterized by a band edge on each side of the pass band having an amplitude difference ranging from 10 dB to 60 dB; and
wherein each of the first pass band and the second pass band has a pair of band edges, each of the band edges having a transition region from the pass-band to a stop band such that the transition region ranges from 5 MHz to 250 MHz.

6. The RF diplexer device of claim 1
wherein the first filter circuit comprises
a minimum attenuation of 25 dB for a frequency range of 700 MHz to 2400 MHZ,
a minimum attenuation of 30 dB for a frequency range of 2400 MHz to 2500 MHZ,
a minimum attenuation of 25 dB for a frequency range of 3300 MHz to 5000 MHZ,
a minimum attenuation of 35 dB for a frequency range of 5935 MHz to 6015 MHZ,
a minimum attenuation of 45 dB for a frequency range of 6015 MHz to 7125 MHZ,
a minimum attenuation of 25 dB for a frequency range 7200 MHz to 12000 MHz; and
wherein the second filter circuit comprises
a minimum attenuation of 25 dB for a frequency range of 9 MHz to 2400 MHZ,
a minimum attenuation of 30 dB for a frequency range of 2400 MHz to 2500 MHZ,
a minimum attenuation of 25 dB for a frequency range of 3300 MHz to 5000 MHZ,
a minimum attenuation of 45 dB for a frequency range of 5150 MHz to 5815 MHZ,
a minimum attenuation of 35 dB for a frequency range of 5815 MHz to 5895 MHz,
a minimum attenuation of 45 dB for a frequency range 6000 MHz to 12000 MH.

7. The RF diplexer device of claim 1 wherein, for each of the first and second filter circuits, the plurality of series resonators is configured in the serial configuration and the plurality of shunt resonators is configured in the parallel configuration, the serial configuration and the parallel configuration being configured as a ladder configuration;
wherein the serial configuration of the first filter circuit forms a resonance profile and an anti-resonance profile; and the parallel configuration of the first filter circuit forms a resonance profile and an anti-resonance profile such that the resonance profile from the serial configuration of the first filter circuit is off-set with the anti-resonance profile of the parallel configuration of the first filter circuit to form the first pass band; and
wherein the serial configuration of the second filter circuit forms a resonance profile and an anti-resonance profile; and the parallel configuration of the second filter circuit forms a resonance profile and an anti-resonance profile such that the resonance profile from the serial configuration of the second filter circuit is off-set with the anti-resonance profile of the parallel configuration of the second filter circuit to form the second pass band.

8. The RF diplexer device of claim 1 wherein, for each of the first and second filter circuits, the plurality of series resonators comprises a first plurality of series resonators and a second plurality of series resonators, the first plurality of series resonators being configured in a first serial configuration and the second plurality of series resonators being configured in a second serial configuration; and
wherein, for each of the first and second filter circuits, the plurality of shunt resonators comprises a plurality of shunt resonator pairs in a lattice configuration, each of the plurality of shunt resonator pairs being cross-coupled between one of the first plurality of series resonators and one of the second plurality of series resonators.

9. The RF diplexer device of claim 8 wherein each of the first and second filter circuits comprises a plurality of baluns; and
wherein, for each of the first and second filter circuits, each of the plurality of baluns is coupled between the first serial configuration and the second serial configuration, and each of the plurality of baluns is configured between each of the plurality of shunt resonator pairs.

10. An RF diplexer device, the device comprising:
a first input inductor;
a first filter circuit coupled to the first input inductor, the first filter circuit configured to receive a first input signal over the first input inductor and to produce a first filtered signal;
a second input inductor;
a second filter circuit coupled to the second input inductor, the second filter circuit configured to receive a second input signal over the second input inductor and to produce a second filtered signal;
wherein each of the first and second filter circuits comprises a plurality of series resonators and a plurality of shunt resonators;
wherein each of the plurality of series resonators comprises
a substrate member having a cavity region and an upper surface region contiguous with an opening of the cavity region,
a bottom electrode within a portion of the cavity region, a piezoelectric material overlying the upper surface region and the bottom electrode,
a top electrode overlying the piezoelectric material and overlying the bottom electrode, and
an insulating material overlying the top electrode;
wherein the first filter circuit has a first circuit response configured from the serial configuration of the first filter circuit and the parallel configuration of the first filter circuit to achieve a first transmission loss from a first pass band having a first characteristic frequency centered around 5.4925 GHz and having a bandwidth from 5.150 GHz to 5.835 GHz; and
wherein the second filter circuit has a second circuit response configured from the serial configuration of the second filter circuit and the parallel configuration of the second filter circuit to achieve a second transmission loss from a second pass band having a second characteristic frequency centered around 6.535 GHz and having a bandwidth from 5.945 GHz to 7.125 GHz
a first output inductor coupled to the first filter circuit;
a second output inductor coupled to the second filter circuit; and
a third output inductor coupled to the first and second output inductors;
wherein the third output inductor is configured to receive the first filtered signal over the first output inductor and to receive the second filtered signal over the second output inductor; and
wherein, for each of the first and second filter circuits, the plurality of series resonators is configured in the serial configuration and the plurality of shunt resonators is configured in the parallel configuration, the serial configuration and the parallel configuration being configured as a ladder configuration.

11. The RF diplexer device of claim 10 wherein the piezoelectric material comprises a single crystal aluminum nitride (AlN) bearing material, a single crystal aluminum scandium nitride (AlScN) bearing material, a single crystal gallium nitride (GaN) bearing material, a single crystal gallium aluminum nitride (GaAlN) bearing material, or a single crystal magnesium hafnium aluminum nitride (MgHfAlN) material.

12. The RF diplexer device of claim 10 wherein the piezoelectric material comprises a polycrystalline aluminum nitride (AlN) bearing material, a polycrystalline aluminum scandium nitride (AlScN) bearing material, a polycrystalline gallium nitride (GaN) bearing material, a polycrystalline gallium aluminum nitride (GaAlN) bearing material, or a polycrystalline magnesium hafnium aluminum nitride (MgHfAlN) material.

13. The RF diplexer device of claim 10 wherein the insulating material comprises a silicon nitride bearing material or an oxide bearing material.

14. An RF diplexer device, the device comprising:
a first input inductor;
a first filter circuit coupled to the first input inductor, the first filter circuit configured to receive a first input signal over the first input inductor and to produce a first filtered signal;
a second input inductor;
a second filter circuit coupled to the second input inductor, the second filter circuit configured to receive a second input signal over the second input inductor and to produce a second filtered signal;
wherein each of the first and second filter circuits comprises a plurality of series resonators and a plurality of shunt resonators;
wherein each of the plurality of series resonators comprises
a substrate member having a cavity region and an upper surface region contiguous with an opening of the cavity region,
a bottom electrode within a portion of the cavity region,
a piezoelectric material overlying the upper surface region and the bottom electrode, and
a top electrode overlying the piezoelectric material and overlying the bottom electrode, and
an insulating material overlying the top electrode;
wherein the first filler circuit has a first circuit response configured from the serial configuration of the first filter circuit and the parallel configuration of the first filter circuit to achieve a first transmission loss from a first pass band having a first characteristic frequency centered around 5.4925 GHZ and having a bandwidth from 5.150 GHz to 5.835 GHz; and
wherein the second filter circuit has a second circuit response configured from the serial configuration of the second filter circuit a e parallel configuration of the second filter circuit to achieve a second transmission loss from a second pass band having a second characteristic frequency centered around 6.535 GHz and having bandwidth from 5.945 GHz to 7.125 GHZ
a first output in or coupled to the first filter circuit;
a second out inductor coupled to the second filter circuit; and
a third output inductor coupled to the first and second output inductors;
wherein the third output inductor is configured to receive the first filtered signal over the first output inductor and to receive the second filtered signal over the second output inductor; and
wherein, for each of the first and second filter circuits, the plurality of series resonators comprises a first plurality of series resonators and a second plurality of series resonators, the first plurality of series resonators being configured in a first serial configuration and the second plurality of series resonators being configured in a second serial configuration; and
wherein, for each of the first and second filter circuits, the plurality of shunt resonators comprises a plurality of shunt resonator pairs in a lattice configuration, each of the plurality of shunt resonator pairs being cross-coupled between one of the first plurality of series resonators and one of the second plurality of series resonators.

15. The RF diplexer device of claim 14 wherein each of the first and second filter circuits comprises a plurality of baluns; and
wherein, for each of the first and second filter circuits, each of the plurality of baluns is coupled between the first serial configuration and the second serial configuration, and each of the plurality of baluns is configured between each of the plurality of shunt resonator pairs.

16. An RF diplexer device, the device comprising:
a first filter circuit configured to receive a first input signal and to produce a first filtered signal;
a second filter circuit configured to receive a second input signal and to produce a second filtered signal;
wherein each of the first and second filter circuits comprises a plurality of series resonators and a plurality of shunt resonators;
wherein each of the plurality of series resonators comprises
a substrate member having a cavity region and an upper surface region contiguous with an opening of the cavity region,
a bottom electrode within a portion of the cavity region,
a piezoelectric material overlying the upper surface region and the bottom electrode,
a top electrode overlying the piezoelectric material and overlying the bottom electrode, and
an insulating material overlying the top electrode;
wherein the first filter circuit has a first circuit response configured from the serial configuration of the first filter circuit and the parallel configuration of the first filter circuit to achieve a first transmission loss from a first pass band having a first characteristic frequency centered around 5.5225 GHz and having a bandwidth from 5.150 GHz to 5.895 GHz; and
wherein the second filter circuit has a second circuit response configured from the serial configuration of the second filter circuit and the parallel configuration of the second filter circuit to achieve a second transmission loss from a second pass band having a second characteristic frequency centered around 6.615 GHz and having a bandwidth from 6.105 GHz to 7.125 GHZ; and
a multiplexer coupled to the first filter circuit and the second filter circuit and configured to select between the first filtered signal and the second filtered signal;
wherein the first filter circuit comprises a maximum insertion loss of 2.5 dB within the first pass band, a maximum amplitude variation characterizing the pass-band of 1.2 dB, and a minimum return loss characterizing the pass-band of 12 dB; and
wherein the second filter circuit comprises a maximum insertion loss of 2.5 dB within the second pass band, a maximum amplitude variation characterizing the pass-band of 1.2 dB, and a minimum return loss characterizing the pass-band of 12 dB; and
wherein the RF diplexer device has an operating temperature ranging from −40 Degrees Celsius to 85 Degrees Celsius, a microwave characteristic impedance of 50

Ohms, a maximum power handling capability within the pass-band of +30 dBm or 1 Watt.

17. The RF diplexer device of claim 16 wherein the piezoelectric material comprises a single crystal aluminum nitride (AlN) bearing material, a single crystal aluminum scandium nitride (AlScN) bearing material, a single crystal gallium nitride (GaN) bearing material, a single crystal gallium aluminum nitride (GaAlN) bearing material, or a single crystal magnesium hafnium aluminum nitride (MgHfAlN) material.

18. The RF diplexer device of claim 16 wherein the piezoelectric material comprises a polycrystalline aluminum nitride (AlN) bearing material, a polycrystalline aluminum scandium nitride (AlScN) bearing material, a polycrystalline gallium nitride (GaN) bearing material, a polycrystalline gallium aluminum nitride (GaAlN) bearing material, or a polycrystalline magnesium hafnium aluminum nitride (MgHfAlN) material.

19. The RF diplexer device of claim 16 wherein the insulating material comprises a silicon nitride bearing material or an oxide bearing material.

20. The RF diplexer device of claim 16 wherein each of the first pass band and the second pass band is characterized by a band edge on each side of the pass band having an amplitude difference ranging from 10 dB to 60 dB; and
wherein each of the first pass band and the second pass band has a pair of band edges, each of the band edges having a transition region from the pass-band to a stop band such that the transition region ranges from 5 MHz to 250 MHz.

21. The RF diplexer device of claim 16
wherein the first filter circuit comprises
a minimum attenuation of 40 dB for a frequency range of 30 MHz to 1000 MHZ,
a minimum attenuation of 35 dB for a frequency range of 1000 MHz to 2700 MHZ,
a minimum attenuation of 30 dB for a frequency range of 3300 MHz to 4200 MHZ,
a minimum attenuation of 30 dB for a frequency range of 4400 MHz to 5000 MHZ,
a minimum attenuation of 50 dB for a frequency range of 6105 MHz to 7125 MHZ,
a minimum attenuation of 25 dB for a frequency range of 7300 MHz to 8000 MHz, and
a minimum attenuation of 30 dB for a frequency range 10000 MHz to 11750 MHz; and
wherein the second filter circuit comprises
a minimum attenuation of 40 dB for a frequency range of 30 MHz to 1000 MHz,
a minimum attenuation of 35 dB for a frequency range of 1000 MHz to 2700 MHZ,
a minimum attenuation of 30 dB for a frequency range of 3300 MHz to 4200 MHZ,
a minimum attenuation of 30 dB for a frequency range of 4400 MHz to 5000 MHZ,
a minimum attenuation of 50 dB for a frequency range of 5170 MHz to 5895 MHZ,
a minimum attenuation of 25 dB for a frequency range of 7300 MHz to 8000 MHz, and
a minimum attenuation of 30 dB for a frequency range 11500 MHz to 12000 MHz.

22. The RF diplexer device of claim 16 wherein, for each of the first and second filter circuits, the plurality of series resonators is configured in the serial configuration and the plurality of shunt resonators is configured in the parallel configuration, the serial configuration and the parallel configuration being configured as a ladder configuration;
wherein the serial configuration of the first filter circuit forms a resonance profile and an anti-resonance profile; and the parallel configuration of the first filter circuit forms a resonance profile and an anti-resonance profile such that the resonance profile from the serial configuration of the first filter circuit is off-set with the anti-resonance profile of the parallel configuration of the first filter circuit to form the first pass band; and
wherein the serial configuration of the second filter circuit forms a resonance profile and an anti-resonance profile; and the parallel configuration of the second filter circuit forms a resonance profile and an anti-resonance profile such that the resonance profile from the serial configuration of the second filter circuit is off-set with the anti-resonance profile of the parallel configuration of the second filter circuit to form the second pass band.

23. The RF diplexer device of claim 16 wherein, for each of the first and second filter circuits, the plurality of series resonators comprises a first plurality of series resonators and a second plurality of series resonators, the first plurality of series resonators being configured in a first serial configuration and the second plurality of series resonators being configured in a second serial configuration; and
wherein, for each of the first and second filter circuits, the plurality of shunt resonators comprises a plurality of shunt resonator pairs in a lattice configuration, each of the plurality of shunt resonator pairs being cross-coupled between one of the first plurality of series resonators and one of the second plurality of series resonators.

24. The RF diplexer device of claim 23 wherein each of the first and second filter circuits comprises a plurality of baluns; and
wherein, for each of the first and second filter circuits, each of the plurality of baluns is coupled between the first serial configuration and the second serial configuration, and each of the plurality of baluns is configured between each of the plurality of shunt resonator pairs.

25. An RF diplexer device, the device comprising:
a first input inductor;
a first filter circuit coupled to the first input inductor, the first filter circuit configured to receive a first input signal over the first input inductor and to produce a first filtered signal;
a second input inductor;
a second filter circuit coupled to the second input inductor, the second filter circuit configured to receive a second input signal over the second input inductor and to produce a second filtered signal;
wherein each of the first and second filter circuits comprises a plurality of series resonators and a plurality of shunt resonators;
wherein each of the plurality of series resonators comprises
a substrate member having a cavity region and an upper surface region contiguous with an opening of the cavity region,
a bottom electrode within a portion of the cavity region,
a piezoelectric material overlying the upper surface region and the bottom electrode,
a top electrode overlying the piezoelectric material and overlying the bottom electrode, and
an insulating material overlying the top electrode;
wherein the first filter circuit has a first circuit response configured from the serial configuration of the first filter circuit and the parallel configuration of the first filter circuit to achieve a first transmission loss from a first pass band having a first characteristic frequency centered around 5.5225 GHz and having a bandwidth from 5.150 GHz to 5.895 GHz; and wherein the second filter circuit has a second circuit response configured from the serial configuration of the second filter circuit and the parallel configuration of the second filter circuit to achieve a second transmission loss from a second pass band having a second characteristic frequency centered around 6.615 GHz and having a bandwidth from 6.105 GHz to 7.125 GHZ;

a first output inductor coupled to the first filter circuit;

a second output inductor coupled to the second filter circuit; and a third output inductor coupled to the first and second output inductors;

wherein the third output inductor is configured to receive the first filtered signal over the first output inductor and to receive the second filtered signal over the second output inductor, wherein, for each of the first and second filter circuits, the plurality of series resonators is configured in the serial configuration and the plurality of shunt resonators is configured in the parallel configuration, the serial configuration and the parallel configuration being configured as a ladder configuration.

26. The RF diplexer device of claim 25 wherein the piezoelectric material comprises a single crystal aluminum nitride (AlN) bearing material, a single crystal aluminum scandium nitride (AlScN) bearing material, a single crystal gallium nitride (GaN) bearing material, a single crystal gallium aluminum nitride (GaAlN) bearing material, or a single crystal magnesium hafnium aluminum nitride (MgHfAlN) material.

27. The RF diplexer device of claim 25 wherein the piezoelectric material comprises a polycrystalline aluminum nitride (AlN) bearing material, a polycrystalline aluminum scandium nitride (AlScN) bearing material, a polycrystalline gallium nitride (GaN) bearing material, a polycrystalline gallium aluminum nitride (GaAlN) bearing material, or a polycrystalline magnesium hafnium aluminum nitride (MgHfAlN) material.

28. The RF diplexer device of claim 25 wherein the insulating material comprises a silicon nitride bearing material or an oxide bearing material.

29. An RF diplexer device, the device comprising:
a first input inductor;
a first filter circuit coupled to the first input inductor, the first filter circuit configured to receive a first input signal over the first input inductor and to produce a first filtered signal;
a second input inductor;
a second filter circuit coupled to the second input inductor, the second filter circuit configured to receive a second input signal over the second input inductor and to produce a second filtered signal;
wherein each of the first and second filter circuits comprises a plurality of series resonators and a plurality of shunt resonators;
wherein each of the plurality of series resonators comprises a substrate member having a cavity region and an upper surface region contiguous with an opening of the cavity region, a bottom electrode within a portion of the cavity region, a piezoelectric material overlying the upper surface region and the bottom electrode, and a top electrode overlying the piezoelectric material and overlying the bottom electrode, and an insulating material overlying the top electrode, wherein the first filler circuit has a first circuit response configured from the serial configuration of the first filter circuit and the parallel configuration of the first filter circuit to achieve a first transmission loss from a first pass band having a first characteristic frequency centered around 5.5225 GHZ and having a bandwidth from 5.150 GHz to 5.895 GHz; and wherein the second filter circuit has a second circuit response configured from the serial configuration of the second filter circuit a e parallel configuration of the second filter circuit to achieve a second transmission loss from a second pass band having a second characteristic frequency centered around 6.615 GHz and having bandwidth from 6.105 GHz to 7.125 GHZ;

a first output in or coupled to the first filter circuit;

a second out inductor coupled to the second filter circuit; and a third output inductor coupled to the first and second output inductors;

wherein the third output inductor is configured to receive the first filtered signal over the first output inductor and to receive the second filtered signal over the second output inductor;

wherein, for each of the first and second filter circuits, the plurality of series resonators comprises a first plurality of series resonators and a second plurality of series resonators, the first plurality of series resonators being configured in a first serial configuration and the second plurality of series resonators being configured in a second serial configuration; and wherein, for each of the first and second filter circuits, the plurality of shunt resonators comprises a plurality of shunt resonator pairs in a lattice configuration, each of the plurality of shunt resonator pairs being cross-coupled between one of the first plurality of series resonators and one of the second plurality of series resonators.

30. The RF diplexer device of claim 29 wherein each of the first and second filter circuits comprises a plurality of baluns; and wherein, for each of the first and second filter circuits, each of the plurality of baluns is coupled between the first serial configuration and the second serial configuration, and each of the plurality of baluns is configured between each of the plurality of shunt resonator pairs.

* * * * *